United States Patent
Asai

(10) Patent No.: US 7,070,207 B2
(45) Date of Patent: Jul. 4, 2006

(54) SUBSTRATE FOR MOUNTING IC CHIP, MULTILAYERD PRINTED CIRCUIT BOARD, AND DEVICE FOR OPTICAL COMMUNICATION

(75) Inventor: Motoo Asai, Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/419,849

(22) Filed: Apr. 22, 2003

(65) Prior Publication Data

US 2004/0212030 A1 Oct. 28, 2004

(51) Int. Cl.
*H02B 6/12* (2006.01)

(52) U.S. Cl. .............................. 285/14; 257/40; 257/80; 257/82; 257/113; 385/14; 385/49; 385/88; 385/129

(58) Field of Classification Search .................... 257/40, 257/81, 82, 113; 385/14, 24, 88, 129
See application file for complete search history.

(56) References Cited

U.S. PATENT DOCUMENTS

| 5,239,189 | A | * | 8/1993 | Lawrence | ..................... 257/81 |
| 6,330,377 | B1 | | 12/2001 | Kosemura | |
| 6,334,014 | B1 | | 12/2001 | Nitta et al. | |
| 2004/0047539 | A1 | * | 3/2004 | Okubora et al. | .............. 385/14 |

FOREIGN PATENT DOCUMENTS

| EP | 1 194 025 | 4/2002 |
| JP | 61-117882 | 6/1986 |
| JP | 5-55633 | 3/1993 |
| JP | 6-69490 | 3/1994 |
| JP | 6-132516 | 5/1994 |
| JP | 6-281831 | 10/1994 |
| JP | 8-330686 | 12/1996 |
| JP | 11-12465 | 1/1999 |
| JP | 11-287926 | 10/1999 |
| JP | 2000-81524 | 3/2000 |
| JP | 2000-147275 | 5/2000 |
| JP | 2000-299562 | 10/2000 |
| JP | 2000-332301 | 11/2000 |
| JP | 2001-57466 | 2/2001 |
| JP | 2001-196643 | 7/2001 |
| JP | 2002-120230 | 4/2002 |
| JP | 2002-1202300 | 4/2002 |
| JP | 2002-236228 | 8/2002 |
| JP | 2002-236229 | 8/2002 |
| JP | 2002-237684 | 8/2002 |
| JP | 2002-250830 | 9/2002 |
| JP | 2002-270860 | 9/2002 |
| JP | 2002-277664 | 9/2002 |

(Continued)

*Primary Examiner*—David Nelms
*Assistant Examiner*—Dao H. Nguyen
(74) *Attorney, Agent, or Firm*—Oblon, Spivak, McClelland, Maier & Neustadt, P.C.

(57) ABSTRACT

The present invention provides a device for optical communication comprising: a substrate for mounting an IC chip having a light emitting element and a light receiving element mounted at predetermined positions; and a multilayered printed circuit board having an optical waveguide formed at a predetermined position, which is low in connection loss among the mounted optical components and which has excellent connection reliability.

The device for optical communication according to the present invention comprises the substrate for mounting an IC chip and the multilayered printed circuit board, wherein the substrate for mounting an IC chip includes conductor circuits, interlaminar insulating layers and via-holes for connecting the conductor circuits, with the interlaminar insulating layers interposed therebetween, to each other, and a light receiving element and a light emitting element are mounted on the substrate for mounting an IC chip.

68 Claims, 49 Drawing Sheets

FOREIGN PATENT DOCUMENTS

| | | |
|---|---|---|
| JP | 2002-289911 | 10/2002 |
| JP | 2002-296435 | 10/2002 |
| JP | 2002-329891 | 11/2002 |
| JP | 2002-331532 | 11/2002 |
| JP | 2003-46021 | 2/2003 |
| JP | 2003-46061 | 2/2003 |
| JP | 2003-46256 | 2/2003 |
| JP | 2003-101080 | 4/2003 |
| JP | 2003-110245 | 4/2003 |
| JP | 2003-215372 | 7/2003 |
| JP | 2004-4426 | 1/2004 |
| JP | 2004-4427 | 1/2004 |
| JP | 2004-4428 | 1/2004 |

\* cited by examiner (a)

(b)

(c)

(a)

(b)

SUBSTRATE FOR MOUNTING IC CHIP, MULTILAYERD PRINTED CIRCUIT BOARD, AND DEVICE FOR OPTICAL COMMUNICATION

TECHNICAL FIELD

The present invention relates to a substrate for mounting an IC chip, a multilayered printed circuit board and a device for optical communication.

BACKGROUND ART

Recently, attention has been focused on optical fibers mainly in communication fields. Particularly in the IT (Information Technology) field, a communication technique of employing the optical fibers is necessary to provide a high speed Internet network.

The optical fiber has features: (1) low loss, (2) high band, (3) small diameter and light weight, (4) non-induction, (5) resource saving and the like. A communication system which employs the optical fibers having these features can considerably decrease the number of relays as compared with a communication system which employs conventional metallic cables, can be easily constructed and maintained, and can improve its economical development and reliability.

Further, since the optical fiber can transmit not only light having a single wavelength but also light having many different wavelengths simultaneously, i.e., only one optical fiber can provide multiple transmission of light having many different wavelengths, it is possible to realize a large capacity of a transmission path capable of dealing with diversified purposes and deal with picture service and the like.

Therefore, in the field of the network communication such as the Internet communication, it is proposed that optical transmission using optical fibers apply not only to the communication of a basic network but also to the communication between the basic network and a terminal device (a personal computer, a mobile, a game machine or the like), and the communication between the terminal devices.

When the optical communication is used for the communication between the basic network and the terminal device, an IC which processes information (signals) in the terminal device operates by means of an electric signal, and the terminal device is, therefore, required to include a unit that converts an optical signal into an electric signal or vice versa such as an optical-to-electric converter or an electric-to-optical converter (which device will be also referred to as "optical/electric converter" hereinafter).

For this reason, the conventional terminal device is equipped with the following: a package substrate, on which an IC chip is mounted; an optical component such as a light receiving element or a light emitting element and the like which process optical signals; an optical waveguide which transmits an optical signal transmitted from the outside through an optical fiber or the like to an optical/electric converter and transmits an optical signal transmitted from the optical/electric converter to the optical fiber or the like; a multilayered printed circuit board which transmits an electric signal through a solder bump and the like; and electric wirings and the optical waveguide which are connected to these elements, thereby performing signal transmission and signal process.

SUMMARY OF THE INVENTION

Since the IC mounting package substrate and the optical components are equipped separately with the above-described conventional terminal device, the size of the overall device becomes large. Thus, this has been prevented miniatuarization of the terminal device.

Further, in the conventional terminal device, the IC mounting package substrate is distant from the optical components. Therefore, the distance of the electric wirings becomes large, whereby a signal error or the like due to cross-talk noise or the like tends to occur during the transmission of a signal.

Considering these, the present inventors dedicated themselves to the study of a substrate for mounting an IC chip capable of realizing optical communication having excellent connection reliability and contributing to the miniatuarization of a terminal device. As a result, the present inventors discovered that the above-described problems can be solved by mounting various optical components on the substrate for mounting an IC chip and completed a substrate for mounting an IC chip of the present invention constituted as follows.

That is, a substrate for mounting an IC:chip according to a first aspect of a first group of the present invention comprises a substrate and, as serially built up on both faces thereof, a conductor circuit and an interlaminar insulating layer in an alternate fashion and in repetition, wherein a light receiving element and a light emitting element are mounted on one face of the above-mentioned substrate for mounting an IC chip such that a light receiving part and a light emitting part are exposed, respectively.

A substrate for mounting an IC chip according to a second aspect of the first group of the present invention comprises a substrate and, as serially built up on both faces thereof, a conductor circuit and an interlaminar insulating layer in an alternate fashion and in repetition, wherein a light receiving element and a light emitting element are internalized or housed at one face side of the above-mentioned substrate for mounting an IC chip such that a light receiving part and a light emitting part are exposed, respectively.

A substrate for mounting an IC chip according to a third aspect of the first group of the present invention comprises a substrate and, as serially built up on both faces thereof, a conductor circuit and an interlaminar insulating layer in an alternate fashion and in repetition, wherein: a light receiving element and a light emitting element are embedded at one face side of the above-mentioned substrate for mounting an IC chip; and an optical path connecting a light receiving part of the above-mentioned light receiving element to an optical signal and an optical path connecting a light emitting part of the above-mentioned light emitting element to the optical signal are secured.

In the substrate for mounting an IC chip according to the third aspect of the first group of the present invention, it is desirable that the above-mentioned optical path is an opening for an optical path.

In the substrates for mounting an IC chip according to the first to third aspects of the first group of the present invention, it is desirable that a solder resist layer is formed on an outermost layer at one face side of the above-mentioned substrate for mounting an IC chip, and that a solder bump is formed at the above-mentioned solder resist layer.

In the substrates for mounting an IC chip according to the first to third aspects of the first group of the present invention, the solder resist layer may be formed or may not be formed.

In the substrates for mounting an IC chip according to the first to third aspects of the first group of the present invention, it is desirable that the conductor circuits with the substrate interposed therebetween are connected to each other by a plated-through hole, and that the conductor circuits with the interlaminar insulating layers interposed therebetween are connected to each other by a via hole.

In the substrates for mounting an IC chip according to the first to third aspects of the first group of the present invention, it is desirable that the light receiving element and the light emitting element can be connected to the substrate by a solder.

Examples of the light receiving element and the light emitting element which can be connected thereto by solder include ① flip-chip type components mounted on and electrically connected to the substrate for mounting an IC chip by solder pads provided on the same side as a light receiving surface and a light emitting surface, ② flip-chip type components mounted on and electrically connected to the substrate for mounting an IC chip by solder pads provided on the opposite side to the light receiving surface and the light emitting surface, ③ wire-bonding type components mounted on the substrate for mounting an IC chip by solder pads provided on the same side as the light receiving surface and the light emitting surface and electrically connected to the substrate for mounting an IC chip by being wire-bonded to wire-bonding pads provided on the opposite side to the light receiving surface and the light emitting surface, ④ wire-bonding type components mounted on the substrate for mounting an IC chip by solder pads provided on the opposite side to the light receiving surface and the light emitting surface and electrically connected to the substrate for mounting an IC chip by being wire-bonded to wire-bonding pads provided on the same side as the light receiving surface and the light emitting surface, and the like.

Among them, preferably the light receiving element and the light emitting element are ① or ② for the following reasons. The light receiving element and the light emitting element (light receiving part and light emitting part) can be accurately positioned to the light introducing paths (optical waveguides or the like) of an external substrate such as a motherboard using the self-alignment effect of solders. Therefore, it is possible to ensure excellent positioning accuracy for the light receiving element and the light emitting element. In addition, since it is unnecessary to employ wire-bonding, it is possible to easily mount these elements on the substrate for mounting an IC chip. The light receiving element and the light emitting element mounted on the substrate for mounting an IC chip according to the first group of the present invention are not necessarily limited to one kind of those mentioned in ① to ④ but two or more of them in ① to ④ may be used in combination.

Further, in case of the conventional terminal device, since the optical waveguide is mounted separately from the multilayered printed circuit board, the overall apparatus becomes disadvantageously large in size, thus hampering the miniatuarization of the terminal device.

Considering these, the present inventors dedicated themselves to the study of a multilayered printed circuit board capable of contributing to the miniatuarization of a terminal device. As a result, the present inventors discovered that the above-described problems can be solved by forming an optical waveguide on the multilayered printed circuit board and completed a multilayered printed circuit board of a second group of the present invention constituted as follows.

That is, a multilayered printed circuit board according to the second group of the present invention comprises a substrate and, as serially built up thereon, a conductor circuit and an interlaminar insulating layer in an alternate fashion and in repetition, wherein an optical waveguide is formed on the outermost interlaminar insulating layer.

In the multilayered printed circuit board according to the second group of the present invention, it is desirable that an optical waveguide for receiving light and an optical waveguide for emitting light are formed as the above-mentioned optical waveguide, and that the above-mentioned optical waveguide is an organic optical waveguide.

In the multilayered printed circuit board according to the second group of the present invention, it is desirable that the conductor circuits with the above-mentioned interlaminar insulating layers interposed therebetween are connected to each other by a via-hole.

In the multilayered printed circuit board according to the second group of the present invention, it is desirable that the above-mentioned conductor circuit is formed by an additive method.

Further, it is desirable that a solder resist layer having an opening for an optical path is formed at an outermost layer of the above-mentioned multilayered printed circuit board according to the second group of the present invention, and that an opening for mounting a substrate for mounting an IC chip is formed at the above-mentioned solder resist layer.

Moreover, the present inventors also completed, as a multilayered printed circuit board capable of contributing to miniatuarization of a terminal device, a multilayered printed circuit board according to a third group of the present invention constituted as follows.

A multilayered printed circuit board according to a first aspect of the third group of the present invention comprises: a substrate and, as serially built up on both faces thereof, a conductor circuit and an interlaminar insulating layer in an alternate fashion and in repetition; and a solder resist layer formed as an outermost layer, wherein an organic optical waveguide is formed at a part of the above-mentioned solder resist layer.

In the multilayered printed circuit board according to the first aspect of the third group of the present invention, it is desirable that an opening for mounting a substrate for mounting an IC chip is formed in the solder resist layer.

Further, a multilayered printed circuit board according to a second aspect of the third group of the present invention comprises a substrate and, as serially built up on both faces thereof, a conductor circuit and an interlaminar insulating layer in an alternate fashion and in repetition, wherein an organic optical waveguide is formed entirely on the outermost interlaminar insulating layer at one side.

In the multilayered printed circuit board according to the second aspect of the third group of the present invention, it is desirable that the above-mentioned organic optical waveguide is constituted by a core part and a cladding part.

In the multilayered printed circuit board according to the first or second aspect of the third group of the present invention, it is desirable that an optical waveguide for receiving light and an optical waveguide for emitting light are formed as the above-mentioned organic optical waveguide.

In the multilayered printed circuit board according to the first or second aspect of the third group of the present invention, it is desirable that the conductor circuits with the above-mentioned interlaminar insulating layers interposed therebetween are connected to each other by a via-hole, and that the above-mentioned conductor circuits are formed by an additive method.

Furthermore, in the multilayered printed circuit board having the optical waveguide internalized therein such as the multilayered printed circuit boards according to the second and third groups of the present invention, an optical path conversion mirror is normally formed on the end portion of the optical waveguide so as to efficiently connect the optical elements such as an optical fiber, a light receiving element and a light emitting element to the optical waveguide. Such an optical path conversion mirror is formed by machining process using a V-shaped 90°-diamond saw or the like.

In case of the optical path conversion mirror formed using machining or the like as menthioned above, a strong stress is applied to the substrate or the interlaminar insulating layer at the time of forming the optical path conversion mirror. This stress causes cracks to occur to the substrate or the interlaminar insulating layer in some cases.

In addition, it is possible to manufacture a multilayered printed circuit board having an optical waveguide formed thereon by bonding a film-shaped optical waveguide on which an optical path conversion mirror is formed. In this case, stress is applied to the optical waveguide at the time of bonding the optical waveguide, with the result that scratches, cracks and the like occur to the bonded optical waveguide in some cases.

Considering these, the present inventors dedicated themselves to solving the problem of the occurrence of scratches, cracks and the like. As a result, the present inventors discovered that it is possible to prevent cracks from occurring to a substrate or an interlaminar insulating layer during the formation of an optical waveguide, particularly during the formation of an optical path conversion mirror by forming a multilayered printed circuit board such that the optical waveguide is formed at outer side of the substrate or the interlaminar insulating layer through an elastic material layer, and completed a multilayered printed circuit board according to a fourth group of the present invention constituted as follows.

In addition, when the optical waveguide having the optical path conversion mirror formed in advance is bonded to the substrate or the interlaminar insulating layer during the formation of the optical waveguide, it is possible for the elastic material layer to moderate stress applied to the optical waveguide and to prevent scratches, cracks and the like from occurring to the optical waveguide.

A multilayered printed circuit board according to a first aspect of the fourth group of the present invention comprises: a substrate and, as serially built up on both faces thereof, a conductor circuit and an interlaminar insulating layer in an alternate fashion and in repetition; and an optical waveguide formed at outer side of the above-mentioned substrate, wherein an elastic material layer is formed between the above-mentioned substrate and the above-mentioned optical waveguide.

A multilayered printed circuit board according to a second aspect of the fourth group of the present invention comprises: a substrate and, as serially built up on both faces thereof, a conductor circuit and an interlaminar insulating layer in an alternate fashion and in repetition; and an optical waveguide formed at outer side of the outermost interlaminar insulating layer, wherein an elastic material layer is formed between the above-mentioned outermost interlaminar insulating layer and the above-mentioned optical waveguide.

In the multilayered printed circuit board according to the first or second aspect of the fourth group of the present invention, it is desirable that the above-mentioned elastic material layer has an elastic modulus of $2.5 \times 10^3$ MPa or less, and more desirable that the elastic modulus is 1.0 to $1.0 \times 10^3$ MPa.

In the multilayered printed circuit board according to the first or second aspect of the fourth group of the present invention, it is desirable that the above-mentioned elastic material layer comprises polyolefin resin and/or polyimide resin.

Furthermore, as a device for optical communication employed for an optical communication terminal device, there is proposed a device for optical communication which is provided with optical components such as: an optical waveguide transmitting an optical signal to a device on a substrate; and optical components such as a light receiving element and a light emitting element which process the optical signal.

However, the conventional device for optical communication has not been satisfactory enough in connection reliability.

The reason is considered to be because: it has been unsuccessful to fully ensure the factor for accomplishing optical communication that is excellent in connection reliability, i.e., low connection loss in the connection among the optical components (connection between the optical fiber and the optical waveguide, connection between the optical waveguide and the light receiving element or light emitting element and the like).

Considering these, the present inventors dedicated themselves to the study of ensuring low connection loss in the connection among the optical components. As a result, the present inventors discovered that it is possible to ensure low connection loss by mounting the respective optical components at predetermined positions at the time of mounting them on the substrate and/or in the substrate, i.e., by eliminating the positional deviation of the respective optical components, and completed a device for optical communication according to a fifth group of the present invention constituted as follows.

A device for optical communication according to the fifth group of the present invention comprises: a substrate for mounting an IC chip; and a multilayered printed circuit board, wherein: a light receiving element and a light emitting element are mounted on a side of the above-mentioned substrate for mounting an IC chip such that a light receiving part and a light emitting part are exposed, respectively, the above-mentioned side confronting the above-mentioned multilayered printed circuit board; an optical waveguide is formed on a side of the above-mentioned multilayered printed circuit board, the above-mentioned side confronting the above-mentioned substrate for mounting an IC chip; and the above-mentioned device for optical communication is constituted such that an optical signal can be transmitted through the above-mentioned optical waveguide, and the above-mentioned light receiving element or the above-mentioned light emitting element.

In the device for optical communication according to the fifth group of the present invention, it is desirable that the above-mentioned substrate for mounting an IC chip comprises a substrate and, as serially built up thereon, a conductor circuit and an interlaminar insulating layer in an alternate fashion and in repetition; the conductor circuits with the above-mentioned substrate interposed therebetween are connected to each other by a plated-through hole; and the conductor circuits with the above-mentioned interlaminar insulating layers interposed therebetween are connected to each other by a via-hole.

Additionally, at the device for optical communication according to the fifth group of the present invention, it is desirable that a solder bump is formed at each of the above-mentioned substrate for mounting an IC chip and the above-mentioned multilayered printed circuit board so as to transmit an electric signal.

Further, the present inventors completed a device for optical communication according to a sixth group of the present invention constituted as follows.

A device for optical communication according to the sixth group of the present invention comprises: a substrate for mounting an IC chip; and a multilayered printed circuit board, wherein the above-mentioned substrate for mounting an IC chip is constituted so as to comprise a conductor circuit, an interlaminar insulating layer, and a via-hole connecting the conductor circuits with the above-mentioned interlaminar insulating layers interposed therebetween to each other, and a light receiving element and a light emitting element are mounted on the above-mentioned substrate for mounting an IC chip.

In the device for optical communication according to the sixth group of the present invention, it is desirable that the above-mentioned light receiving element and the above-mentioned light emitting element are mounted on a face confronting the above-mentioned multilayered printed circuit board.

In the device for optical communication according to the sixth group of the present invention, it is also desirable that: the above-mentioned light receiving element and the above-mentioned light emitting element are mounted on an opposite face to a face confronting the above-mentioned multilayered printed circuit board; or one of the above-mentioned light receiving element and the above-mentioned light emitting element is mounted on a face confronting the above-mentioned multilayered printed circuit board; and the other element is mounted on an opposite face to the face confronting the above-mentioned multilayered printed circuit board. In this case, it is further desirable that an optical path for transmitting optical signal is formed so as to penetrate the above-mentioned substrate for mounting an IC chip.

In addition, in the multilayered printed circuit board, it is desirable that the above-mentioned conductor circuits and the above-mentioned interlaminar insulating layers are serially built up on both or one of face(s) of the substrate in an alternate fashion and in repetition.

In the device for optical communication according to the sixth group of the present invention, it is desirable that an optical waveguide is formed at the above-mentioned multilayered printed circuit board. In this case, it is desirable that an optical path for transmitting optical signal between: the above-mentioned light receiving element and the above-mentioned light emitting element; and the above-mentioned optical waveguide is formed at the above-mentioned multilayered printed circuit board.

Figure 1:
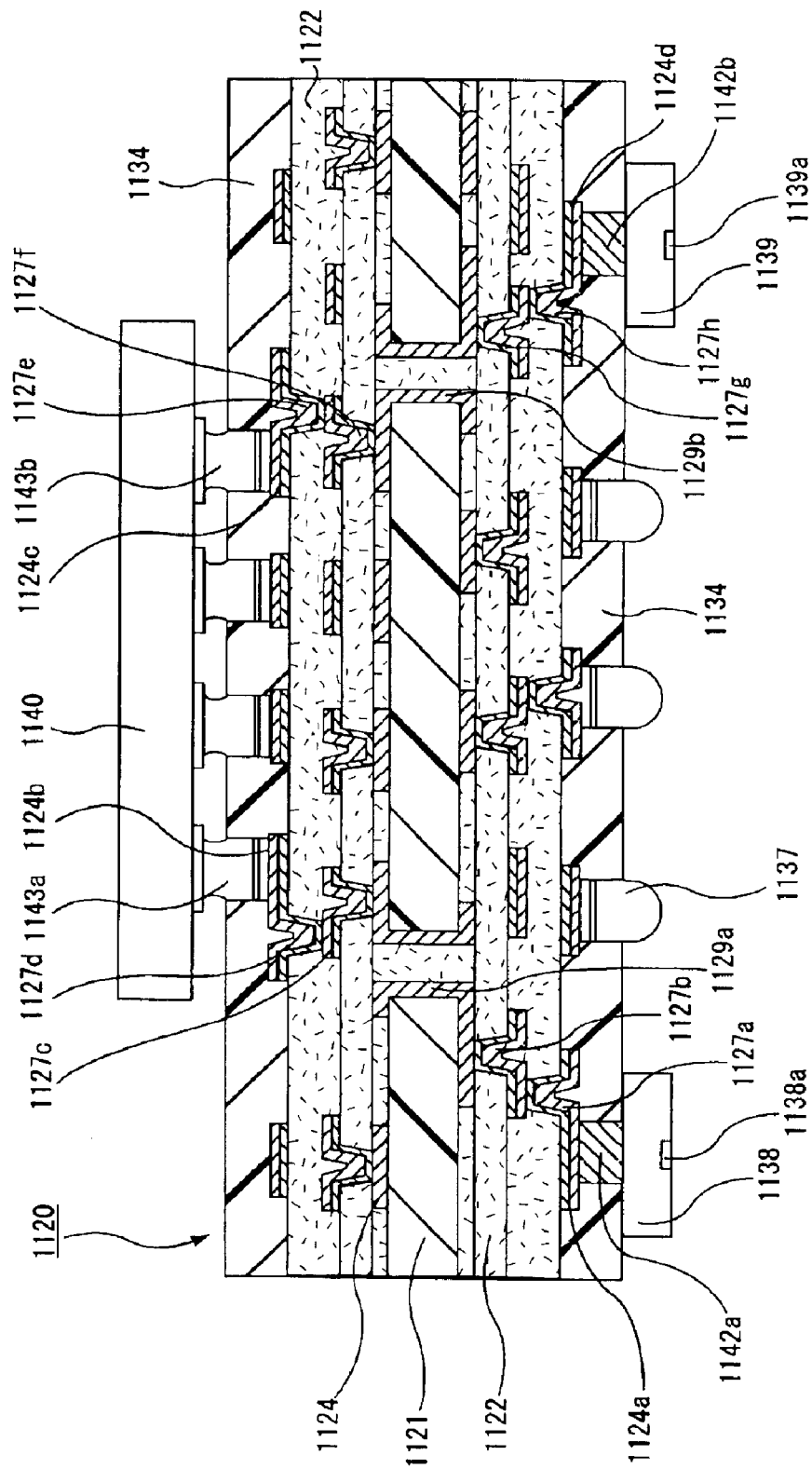
FIG. 1 is a cross-sectional view schematically showing one embodiment of a substrate for mounting an IC chip according to the first aspect of the first group of the present invention.

EXPLANATION OF SYMBOLS 1020 substrate for mounting an IC chip
1021 substrate
1022 interlaminar insulating layer
1024 conductor circuit
1027 via-hole
1029 plated-through hole
1031 opening for mounting optical element
1034 solder resist layer
1038 light receiving element
1039 light emitting element 1120, 1220, 1320 substrate for mounting an IC chip
1121, 1221, 1321 substrate
1122, 1222, 1322 interlaminar insulating layer
1124, 1224, 1324 conductor circuit
1127, 1227, 1327 via-hole
1129, 1229, 1329 plated-through hole
1131, 1231, 1331 opening for optical element
1134, 1234, 1334 solder resist layer
1138, 1238, 1338 light receiving element
1139, 1239, 1338 light emitting element
1140, 1240, 1340 IC chip
1142, 1242, 1342 conductor layer
2100 multilayered printed circuit board
2101 substrate
2102 interlaminar insulating layer
2104 conductor circuit
2107 via-hole
2109 plated-through hole
2111 opening for optical path
2114 solder resist layer
2117 solder bump
2118 optical waveguide
2119 optical conversion mirror
3100, 3200 multilayered printed circuit board
3101, 3201 substrate
3102, 3202 interlaminar insulating layer
3104, 3204 conductor circuit
3107, 3207 via-hole
3109, 3209 plated-through hole
3114, 3214 solder resist layer
3117, 3217 solder bump
3118, 3218 organic optical waveguide
3120, 3220 optical conversion mirror
4100, 4200 multilayered printed circuit board
4021, 4121, 4221 substrate
4022, 4122, 4222 interlaminar insulating layer
4024, 4124, 4224 conductor circuit
4025, 4125, 4225 conductor circuit
4027, 4127, 4227 via-hole
4029, 4129, 4229 plated-through hole
4038, 4138, 4238 opening for optical path
4034, 4134, 4234 solder resist layer
4036, 4136, 4236 solder pad
4037, 4137, 4237 solder bump
4050, 4150, 4150', 4250 optical waveguide
5100 multilayered printed circuit board
5101 substrate
5102 interlaminar insulating layer
5104 conductor circuit
5107 via-hole
5109 plated-through hole
5111 opening for optical path
5114 solder resist layer
5118 optical waveguide
5119 optical conversion mirror
5120 substrate for mounting an IC chip
5121 substrate
5122 interlaminar insulating layer
5124 conductor circuit
5127 via-hole
5129 plated-through hole
5131 opening for optical element
5134 solder resist layer
5138 light receiving element
5139 light emitting element
5140 IC chip
5141, 5143 solder connection part
5142 conductor layer
5150 device for optical communication
6100 multilayered printed circuit board
6101 substrate
6102 interlaminar insulating layer
6104 conductor circuit
6107 via-hole
6109 plated-through hole
6111 opening for optical path
6114 solder resist layer
6118 optical waveguide
6119 optical conversion mirror
6120 substrate for mounting an IC chip
6121 substrate
6122 interlaminar insulating layer
6124 conductor circuit
6127 via-hole
6129 plated-through hole
6131 opening for optical element
6134 solder resist layer
6138 light receiving element
6139 light emitting element
6140 IC chip
6141, 6143 solder connection part
6142 conductor layer
6150 device for optical communication
7120 IC chip
7200, 7300 optical element mounting element
8150 device for optical communication
8200 8300 optical element mounting element

DETAILED DISCLOSURE OF THE INVENTION

First, a substrate for mounting an IC chip according to a first aspect of a first group of the present invention will be described.

The substrate for mounting an IC chip, according to the first aspect of the first group of the present invention, comprises a substrate and, as serially built up on both faces thereof, a conductor circuit and an interlaminar insulating layer in an alternate fashion and in repetition, wherein a light receiving element and a light emitting element are mounted on one face of the above-mentioned substrate for mounting an IC chip such that a light receiving part and a light emitting part are exposed, respectively.

In the substrate for mounting an IC chip according to the first aspect of the first group of the present invention, the light receiving element and the light emitting element are mounted on the surface of the substrate. Therefore, when an IC chip is mounted on the substrate, the distance between the IC chip and the optical component is short and the reliability of the transmission of an electric signal is excellent.

Further, in the substrate for mounting an IC chip according to the first aspect of the first group of the present invention, at which an IC chip is mounted, since electronic components and optical components necessary for optical communication can be integrated thereto, it is possible to contribute to making an optical communication terminal device smaller in size.

Furthermore, in the substrate for mounting an IC chip according to the first aspect of the first group of the present invention, a solder resist layer is formed on the outermost layer on the side on which the light receiving element and the like are mounted. When solder bumps are formed on the solder resist layer, the substrate for mounting an IC chip can be connected to an external substrate through the solder bumps. In this case, the self-alignment function of the solders enables the substrate for mounting an IC chip to be arranged at a predetermined position.

The self-alignment function means a function that a solder is to be present near the center of an opening in a more stable form due to the fluidity of the solder itself. It is considered that this function is generated: by surface tension which strongly acts at the time the solder tends to be spherical when the solder adheres to metal and is repelled from the solder resist layer.

In utilizing this self-alignment function, even when the positions of the substrate for mounting an IC chip and the external substrate are deviated before reflow, at the time of connecting the substrate for mounting an IC chip to the external substrate through the solder bumps, the substrate for mounting an IC chip moves during the reflow and can be attached to an accurate position on the external substrate.

Therefore, when an optical signal is to be transmitted through the light receiving element and the light emitting element mounted on the substrate for mounting an IC chip and optical components (e.g., an optical waveguide) mounted on the external substrate, it is possible to accurately transmit the optical signal between the substrate for mounting an IC chip and the external substrate as long as the positions of the light receiving element and the light emitting element mounted on the substrate for mounting an IC chip are accurate.

The light receiving element and the light emitting element are mounted on one surface of the substrate for mounting an IC chip according to the first aspect of the first group of the present invention such that the light receiving part and the light emitting part are exposed, respectively.

Examples of the light receiving element include a PD (photodiode), an APD (avalanche photodiode) and the like.

These elements may be appropriately selected in view of the configuration, required characteristics and the like of the substrate for mounting an IC chip.

Examples of the material of the light receiving element include Si, Ge, InGaAs and the like.

Among these materials, InGaAs is desirable because of its excellent light receiving sensitivity.

Examples of the light emitting element, an LD (semiconductor laser), a DFB-LD (distributed feedback-type semiconductor laser), an LED (light emitting diode) and the like.

These elements may be appropriately selected in view of the configuration, required characteristics and the like of the substrate for mounting an IC chip.

Examples of the material of the light emitting element include a compound of gallium, arsenic and phosphorus (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorus (InGaAsP) and the like.

These materials may be selected in view of communication wavelength (in a range of 0.6 to 1.6 μm). When the communication wavelength is in a 0.85 μm band, GaAlAs can be used as the material of the light emitting element. When the communication wavelength is in a 1.3 μm band or 1.55 μm band, InGaAs or InGaAsP can be used as the material of the light emitting element.

As the light receiving element and the light emitting element, commercially available optical components can be used. The dimensions of the optical components are desirably such that the length of one side of the surface on which the light receiving element or the light emitting element exists is about 2 to 15 mm.

Hereinafter, the embodiment of the substrate for mounting an IC chip according to the first aspect of the first group of the present invention will be described with reference to the drawings.

FIG. 1 is a cross-sectional view schematically showing one embodiment of the substrate for mounting an IC chip according to the first aspect of the first group of the present invention. It is noted that FIG. 1 shows the substrate for mounting an IC chip in a state where an IC chip is mounted thereon.

As shown in FIG. 1, in the substrate for mounting an IC chip 1120, conductor circuits 1124 (1124a to 1124d) and interlaminar insulating layers 1122 are built up on each surface of a substrate 1121, and the conductor circuits having the substrate 1121 interposed therebetween and those having the interlaminar insulating layer 1122 interposed therebetween are electrically connected to one another by plated-through holes 1129 (1129a, 1129b) and via-holes 1127 (1127a to 1127h) respectively. In addition, a solder resist layer 1134 is formed on the outermost layer on each surface of the substrate 1121.

A light receiving element 1138 and a light emitting element 1139 are mounted on one surface of the substrate for mounting an IC chip 1120 such that a light receiving part 1138a and a light emitting part 1139a are exposed, respectively. In addition, solder bumps 1137 are formed on the solder resist layer on the surface of the substrate 1120 for mounting an IC chip on a side which the light receiving element 1138 and the like are mounted, whereas an IC chip 1140 is mounted on the other surface thereof through solder connection parts 1143 (1143a, 1143b).

In the substrate for mounting an IC chip 1120 formed as described above, an optical signal transmitted from the outside of the substrate through an optical fiber, an optical waveguide or the like (not shown) is received by the light receiving element 1138 (light receiving part 1138a), converted into an electric signal by the light receiving element 1138, and then fed to the IC chip 1140 through a conductor layer 1142a—the conductor circuit 1124a—via-holes 1127a, 1127b—a plated-through hole 1129a—via-holes 1127c, 1127d—the conductor circuit 1124b—the solder connection part 1143a.

Further, an electric signal outputted from the IC chip 1140 is transmitted to the light receiving element 1139 through the solder connection part 1143b—the conductor circuit 1124c—via-holes 1127e, 1127f—a plated-through hole 1129b—via-holes 1127g, 1127h—the conductor circuit 1124d—a conductor layer 1142b, and converted into an optical signal by the light emitting element 1139, and this optical signal is emitted from the light emitting element 1139 (light emitting part 1139a) to the optical fiber or the optical waveguide.

In the substrate for mounting an IC chip according to the first aspect of the first group of the present invention, the light receiving element and the light emitting element that are mounted at positions near the IC chip perform optical/electric signal conversion. Therefore, an electric signal transmission distance is short, the reliability of signal transmission is excellent, and it is possible to deal with higher speed communication.

In addition, in the substrate for mounting an IC chip, the solder bumps 1137 are formed on the solder resist layer on one surface of the substrate. Therefore, the electric signal outputted from the IC chip 1140 is converted into an optical signal and transmitted to the outside of the substrate through the optical waveguide or the like. The electric signal is also transmitted to an external substrate through the solder bumps.

Moreover, it is possible to supply power necessary to drive the IC chip from the outside of the substrate 1120 for mounting an IC chip through the solder bumps 1137.

Next, a method for manufacturing the substrate for mounting an IC chip according to the first aspect of the first group of the present invention will be described.

(1) Using an insulating substrate as a starting material, conductor circuits are formed on the insulating substrate.

Examples of the insulating substrate include a glass epoxy board, a polyester board, a polyimide board, a bismaleimide-triazine (BT) resin board, a thermoplastic polyphenylene ether resin board, a copper-clad laminate board, an RCC board and the like.

Alternatively, a ceramic board such as an aluminum nitride board or a silicon board may be used.

The conductor circuits can be formed by forming a conductor layer in a spread state on the surface of the insulating substrate by an electroless plating treatment or the like and then etching the resultant conductor layer. Alternatively, the conductor circuit may be formed by etching the copper-clad laminate plate or the RCC substrate.

Further, instead of performing the etching treatment, conductor circuits may be formed using a formation method of the conductor circuit, that is, the method: by forming a plating resist on a conductor layer in a spread state; then forming an electroplating layer on plating resist non-formed portions; and removing the plating resist and the conductor layer under the plating resist.

Further, in the case of connecting the conductor circuits having the substrate interposed therebetween by plated-through holes, through holes are formed in the insulating substrate using a drill, a laser or the like and then subjected to an electroless plating treatment or the like to form the plated-through holes. The diameter of the through hole is normally 100 to 300 µm.

When the plated-through holes are formed, it is desirable to fill the plated-through holes with a resin filler.

(2) Next, the surfaces of the conductor circuits is subjected to a surface roughening treatment, if necessary.

Examples of the roughening treatment include a blackening (oxidizing)-reducing treatment, an etching treatment using an etching solution containing a cupric complex and an organic acid, a treatment of Cu—Ni—P needle-like alloy plating treatment and the like.

Herein, when the roughened surfaces are formed, it is desirable that the lower limit of the mean roughness of the roughened surfaces is 0.1 µm and the upper limit thereof is 5 µm. When considering the adhesion between the conductor circuits and the interlaminar insulating layer, the influence of the conductor circuits on electric signal transmission capability and the like, it is more desirable that the lower limit of the mean roughness of the roughened surface is 2 µm and the upper limit thereof is 4 µm.

This roughening treatment may be performed before filling the plated-through holes with the resin filler and roughened surfaces may be formed on the wall surfaces of the plated-through holes. This is because the adhesion between the plated-through holes and the resin filler is improved.

(3) Next, either an uncured resin layer comprising thermosetting resin, photosensitive resin, resin obtained by acrylating a part of thermosetting resin or a resin complex containing these resins and thermoplastic resin is formed or a resin layer comprising thermoplastic resin is formed on a substrate on which the conductor circuits are formed.

The uncured resin layer can be formed by applying uncured resin by a roll coater, a curtain coater or the like or by thermally bonding an uncured (half-cured) resin film.

In addition, the resin layer comprising the thermoplastic resin can be formed by thermally bonding a resin formed body formed on a film.

Among them, the method of thermally bonding the uncured (half-cured) resin film is desirable. The thermally bonding of the resin film can be performed using a vacuum laminator or the like.

Bonding conditions are not limited to specific conditions but may be appropriately selected in view of the composition of the resin film or the like. Normally, however, it is desirable to perform bonding under conditions of a pressure of 0.25 to 1.0 MPa, a temperature of 40 to 70° C., degree of vacuum of 13 to 1300 Pa, a duration of about 10 to 120 seconds.

Examples of the thermosetting resin include epoxy resin, phenol resin, polyimide resin, polyester resin, bismaleimide resin, polyolefin resin, polyphenylene ether resin, polyphenylene resin, fluororesin and the like.

Specific examples of the epoxy resin include novolak type epoxy resins such as phenol-novolak type, cresol-novolak type, dicyclopentadiene-modified alicyclic epoxy resin and the like.

Examples of the photosensitive epoxy resin include acrylic resin and the like.

Further, examples of the resin obtained by acrylating a part of thermosetting resin include a resin obtained by acrylating the thermosetting group of the above-mentioned thermosetting resin with an methacrylic acid or an acrylic acid and the like.

Examples of the thermoplastic resin include phenoxy resin, polyethersulfone (PES), polysulfone (PSF), polyphenylenesulfone (PPS), polyphenylene sulfide (PPES), polyphenylene ether (PPE), polyetherimide (PI) and the like.

Further, the resin complexes are not particularly limited as long as they contain thermosetting resin, photosensitive resin (including resin obtained by acrylating a part of the thermosetting resin) and thermoplastic resin. Specific examples of the combination of the thermosetting resin and the thermoplastic resin include, for example, phenol resin/polyethersulfone, polyimide resin/polysulfone, epoxy resin/polyethersulfone, epoxy resin/phenoxy resin and the like. Further, specific examples of the combination of the photosensitive resin and the thermoplastic resin include acryl resin/phenoxy resin, epoxy resin obtained by acrylating a part of the epoxy group, polyethersulfone and the like.

Furthermore, the mixing ratio of the thermosetting resin or the photosensitive resin and the thermoplastic resin in the resin complex is desirably thermosetting resin or photosensitive resin/thermoplastic resin=95/5 to 50/50. With this ratio, it is possible to ensure high toughness without deteriorating heat resistance.

In addition, the resin layer may be formed of two or more different resin layers.

Specifically, the lower layer of the resin layer is formed of, for example, a resin complex having a mixing ratio of thermosetting resin or photosensitive resin/thermoplastic resin=50/50 and the upper layer thereof is formed of, for example, a resin complex having a mixing ratio of thermosetting resin or photosensitive resin/thermoplastic resin=90/10; and the like.

With this configuration, it is possible to ensure excellent adhesion between the resin layer and the substrate and to ensure easy formation of openings for via-holes and the like in later steps.

Moreover, in this step, instead of the resin layer, a layer which comprises a base material containing a metal core such as aluminum, copper, 42 alloy, SUS or the like, a glass epoxy resin-containing base material containing glass cloth and the like may be formed.

Further, the resin layer may be formed using resin compositions for roughened surface formation.

The resin compositions for roughened surface formation are, for example, those in which a substance soluble in a roughening solution containing at least one kind selected from an acid, an alkali and an oxidizing agent is dispersed in an uncured heat resistant resin matrix hardly soluble in a roughening solution containing at least one kind selected from an acid, an alkali and an oxidizing agent.

As for the terms "hardly soluble" and "soluble", substances which have a relatively high dissolution speed are called "soluble" substances and those which have a relatively slow dissolution speed are called "hardly soluble" substances for the sake of convenience when they are immersed in the same roughening solution for the same period of time.

The heat resistant resin matrix is desirably capable of keeping the shape of a roughened surface at the time of forming the roughened surface on an interlaminar insulating layer using the above-mentioned roughening solution, and examples thereof include thermosetting resin, thermoplastic resin, complexes thereof and the like. In addition, by using the photosensitive resin, openings for via-holes may be formed in the interlaminar insulating layer using exposure and development treatments.

Examples of the thermosetting resin include epoxy resin, phenol resin, polyimide resin, polyolefin resin, fluoro resin and the like. Further, when the thermosetting resin is photosensitized, the thermosetting group of the resin is (meth)acrylated using a methacrylic acid, an acrylic acid or the like.

Examples of the epoxy resin include cresol-novolak type epoxy resin, bisphenol A type epoxy resin, bisphenol F type epoxy resin, phenol-novolak type epoxy resin, alkyl phenol-novolak type epoxy resin, bisphenol F type epoxy resin, naphthalene type epoxy resin, dicyclopentadiene type epoxy resin, epoxylated compounds of condensates of phenols and aromatic aldehydes containing a phenolic hydroxyl group, triglycidyl isocyanurate, alicyclic epoxy resin and the like. They may be used alone or in combination of two or more of them. Accordingly, excellent heat resistance can be provided.

Examples of the thermoplastic resin include phenoxy resin, polyethersulfone, polysulfone, polyphenylenesulfone, polyphenylene sulfide, polyphenyl ether, polyetherimide and the like. They may be used alone or in combination of two or more of them.

The substance soluble to the roughening solution containing at least one kind of compounds selected from the above-mentioned acid, alkali and oxidizing agent is desirably at least one kind of those selected from inorganic particles, resin particles and metal particles.

Examples of the inorganic particles include those comprising aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc, silicon compounds such as silica and zeolite, titanium compounds such as titania and the like. They may be used alone or in combination of two or more of them.

The alumina particles can be dissolved in and removed by an hydrofluoric acid, and calcium carbonate can be dissolved in and removed by a hydrochloric acid. Sodium-containing silica and dolomite can be dissolved in and removed by an aqueous alkaline solution.

Examples of the resin particles include those comprising thermosetting resin, thermoplastic resin and the like, and those which have a higher dissolution speed than that of the heat resistant resin matrix when being immersed in a roughening solution containing at least one kind of compounds selected from an acid, an alkali and an oxidizing agent can be used without any specific limitation. Specific examples of the resin particles include amino resin (melamine resin, urea resin, guanamine resin and the like), epoxy resin, phenol resin, phenoxy resin, polyimide resin, polyphenylene resin, polyolefin resin, fluororesin, bismaleimide-triazine resin and the like. They may be used alone or in combination of two or more of them.

The resin particles are required to be previously subjected to a curing treatment. When the resin particles are not cured, they are dissolved in a solvent for dissolving the resin matrix and mixed evenly. As a result, the resin particles cannot be dissolved and removed selectively alone using an acid or an oxidizing agent.

As the resin particles, rubber particles, liquid-phase resin, liquid-phase rubber or the like may be used.

Examples of the rubber particles include those comprising acrylonitrile-butadiene rubber, polychloroprene rubber, polyisoprene rubber, acrylic rubber, polysulfide type synthetic rubber, fluoro rubber, urethane rubber, silicon rubber, ABS resin and the like.

Further, rubber particles comprising one of polybutadiene rubber, a variety of modified polybutadiene rubbers such as epoxy-modified, urethane-modified and (meth)acrylonitrile-modified rubbers, (meth)acrylonitrile-butadiene rubber having carboxyl group and the like may also be used.

As the liquid-phase resin, an uncured solution of the thermosetting resin can be used. Specific examples of the liquid-phase resin include a solution mixture containing uncured epoxy oligomer and an amino-type curing agent and the like.

As the liquid-phase rubber, polybutadiene rubber, an uncured solution of one of a variety of modified polybutadiene rubbers such as epoxy-modified, urethane-modified and (meth)acrylonitrile-modified rubbers, (meth) acrylonitrile-butadiene rubber having a carboxyl group and the like can be used.

When the photosensitive resin compositions are prepared using the liquid-phase resin or the liquid-phase rubber, it is necessary to select these substances such that the heat resistant resin matrix and the soluble substance are not uniformly, mutually dissolved (i.e., they are isolated from each other).

By mixing the heat resistant resin matrix and the soluble substance together, which are thus selected based on the above-mentioned standard, it is possible to prepare photosensitive resin compounds in a state where "islands" of the liquid-phase resin or liquid-phase rubber are distributed in the "sea" of the heat resistant resin matrix or in a state where "islands" of the heat resistant resin matrix are distributed in the "sea" of the liquid-phase resin or liquid-phase rubber.

After curing the photosensitive resin compositions in such a state, a roughened surface can be formed by removing the liquid-phase resin or liquid-phase rubber in the "sea" or "islands".

Examples of the metal particles include those comprising gold, silver, copper, tin, zinc, stainless steel, aluminum, nickel, iron, lead and the like. They may be used alone or in combination of two or more of them.

Further, the metal particles may be coated with resin on the surface layer in order to ensure the insulating property.

When two or more kinds of the soluble substances are mixed, a mixture combination of the two soluble substances is desirably a combination of resin particles and inorganic particles. The reason is as follows. Since both the resin particles and the inorganic particles are low in conductivity, it is possible to ensure the insulating property of the interlaminar insulating layer, facilitate adjusting thermal expansion in relation to the hardly soluble resin, to prevent the occurrence of cracks on the interlaminar insulating layer comprising the resin compositions for roughening surface formation, and to prevent the occurrence of peeling between the interlaminar insulating layer and the conductor circuits.

Examples of the acid used as the roughening solution include a phosphoric acid, a hydrochloric acid, a sulfuric acid, a nitric acid, organic acids such as a formic acid and an acetic acid and the like. Among them, it is desirable to use an organic acid for the roughening solution. This is because the organic acid makes it difficult to corrode the metallic conductor layers exposed from the via-holes when a roughening treatment is performed.

As the oxidizing agent, an aqueous solution containing a chromic acid, a chromic sulfide, an alkaline permanganic acid (e.g., potassium permanganate) or the like is desirably used.

As the alkali, an aqueous solution containing sodium hydroxide, potassium hydroxide or the like is desirable.

The average particle diameter of the soluble substance is desirably 10 µm or less.

Alternatively, coarse particles having a relatively large average particle diameter of 2 µm or less and fine particles having a relatively small average particle diameter may be combined. For example, a soluble substance having an average particle diameter of 0.1 to 0.5 µm and a soluble substance having an average particle diameter of 1 to 2 µm may be combined.

By thus combining the coarse particles having a relatively large average particle diameter with the fine particles having a relatively small average particle diameter, it is possible to eliminate the solution residue of the thin film conductor layer, to decrease the quantity of palladium catalyst under the plating resist and to form a shallow, complicated roughened surface.

Furthermore, by forming the complicated roughened surface, it is possible to maintain a practical peel strength even when the roughened surface has small irregularities.

Desirably, the average particle diameter of the coarse particles exceeds 0.8 µm and less than 2.0 µm, and that of the fine particles is 0.1 to 0.8 µm.

(4) Next, in case of forming an interlaminar insulating layer using the thermosetting resin or resin complex as a material, openings for via-holes are formed as well as an uncured resin layer is subjected to a curing treatment, thereby obtaining an interlaminar insulating layer. In this step, if necessary, through holes may be formed.

The openings for via-holes are desirably formed by a laser treatment. In addition, when a photosensitive resin is used as the material of the interlaminar insulating layer, the interlaminar insulating layer may be formed by an exposure development treatment.

In addition, in case of forming an interlaminar insulating layer using the thermoplastic resin as a material therefor, openings for via-holes are formed in the resin layer comprising the thermoplastic resin, thereby obtaining an interlaminar insulating layer. In this case, the openings for via-holes can be formed by performing a laser treatment.

When through holes are formed in this step, they may be formed by drilling, a laser treatment or the like.

Examples of a laser used for the laser treatment include a carbonic acid gas laser, a UV laser, an excimer laser and the like. Among them, the excimer laser or the carbonic acid gas laser having a short pulse is desirable.

Further, among various excimer lasers, a hologram type excimer laser is desirably used. A hologram type excimer laser is a laser which applies a laser beam onto a target through a hologram, a condensing lens, a laser mask, a transfer lens or the like. By using this scheme, it is possible to efficiently form a large number of openings in the resin film layer by application of the laser beam at one time.

When the carbonic acid gas laser is used, the pulse interval of the laser is desirably $10^{-4}$ to $10^{-8}$ seconds. In addition, a period of time for applying a laser beam to form openings is desirably 10 to 500 microseconds.

In addition, by applying a laser beam through an optical system lens and a mask, it is possible to form a large number of openings for via-holes at one time. This is because a laser beam can be applied to a plurality of parts with the same intensity and the same application intensity by passing the laser beam through the optical system lens and the mask.

After thus forming the openings for via-holes, a desmear treatment may be performed if necessary.

(5) Next, a thin film conductor layer is formed on the surface of the interlaminar insulating layer including inner walls of the openings for via-holes.

The thin film conductor layer can be formed by electroless plating, sputtering or the like.

Examples of the materials of the thin film conductor layer include copper, nickel, tin, zinc, cobalt, thallium, lead and the like.

Among these materials, the thin film conductor layer comprising copper or copper and nickel are desirable because of its or their excellent electric characteristics, economical advantage and the like.

Further, in case of forming the thin film conductor layer by electroless plating, the lower limit of the thickness of the thin film conductor layer is desirably 0.3 µm, more desirably 0.6 µm. The upper limit thereof is desirably 2.0 µm, more desirably 1.2 µm. Further, in case of forming the thin film conductor layer by sputtering, the thickness thereof is desirably 0.1 to 1.0 µm.

In case of forming the thin film conductor layer by electroless plating, it is desirable to apply a catalyst to the surface of the interlaminar insulating layer. Examples of the catalyst include palladium chloride and the like.

Alternatively, the roughened surface may be formed on the surface of the interlaminar insulating layer before the thin film conductor layer is formed. When the roughened surface is formed, it is possible to improve the adhesion between the interlaminar insulating layer and the thin film conductor layer. In case of forming the interlaminar insulating layer using the resin compositions for roughened surface formation, in particular, it is desirable to form the roughened surface using an acid, an oxidizing agent or the like.

Furthermore, when through holes are formed in the above-described step (4), the thin film conductor layer may be also formed on the wall surfaces of the through holes at the time of forming the thin film conductor layer on the interlaminar insulating layer, to thereby obtain plated-through holes.

(6) Next, a plating resist is formed on the substrate on the surface of which the thin film conductor layer is formed.

The plating resist can be formed by bonding a photosensitive dry film, closely arranging a photomask comprising a glass substrate or the like drawing a plating resist pattern, and performing exposure and development treatments.

(7) Thereafter, electroplating is performed using the thin film conductor layer as a plating lead to thereby form an electroplating layer in portions in which the plating resist is not formed. The electroplating is desirably copper plating.

Further, the thickness of the electroplating layer is desirably 5 to 20 μm.

Thereafter, the plating resist and the thin film conductor layer under the plating resist are removed, whereby conductor circuits (including via-holes) can be formed.

The removal of the plating resist may be performed using an aqueous alkaline solution or the like, and the removal of the thin film conductor layer may be performed using an etching solution containing a solution mixture of a sulfuric acid and peroxide, sodium persulfate, ammonium persulfate, ferric chloride, cupric chloride or the like.

Further, after forming the conductor circuits, the catalyst on the interlaminar insulating layer may be removed by an acid or an oxidizing agent if necessary. This is because: when the catalyst is removed, it is possible to prevent the deterioration of electric characteristics of the insulating layer.

Through the steps (5) to (7), it is possible to form the conductor circuits.

The method including the steps (5) to (7) is a semi-additive method. Alternatively, a full-additive method may be used in place of the semi-additive method to form the conductor circuits.

Specifically, after the electroplating layer is formed on the entire surface of the thin film conductor layer formed in the similar manner to that of the above-described step (5), an etching resist is formed on part of the electroplating layer using a dry film. The electroplating layer and conductor layer under etching resist non-formed portions are then etched away and the etching resist is peeled off. Therefore, independent conductor circuits may be formed.

This additive method can ensure high etching accuracy, so that fine conductor circuits can be formed and the degree of freedom for the design of the conductor circuits can be improved.

Alternatively, a subtractive method or a build-up method may be used to form the conductor circuits. Further, collective pressing or sequential pressing may be used to form the conductor circuits.

When the conductor circuits are formed by the subtractive method, they may be formed by the following manner.

First, an interlaminar insulating layer having openings for via-holes is formed, and then a thin film conductor layer is formed on the surface of the interlaminar insulating layer including the wall surfaces of the openings for via-holes in the similar manner to the above-described step (5).

Next, an electroplating layer or the like is formed on the entire surface of the thin film conductor layer, thereby making the conductor layer thick. It is noted that the formation of the electroplating layer or the like may be performed if necessary.

Thereafter, an etching resist is formed on the conductor layer.

The etching resist is formed by bonding a photosensitive dry film, closely arranging a photomask on the photosensitive dry film, performing exposure and development treatments, and the like.

In addition, the conductor layer under etching resist non formed portions is removed by an etching treatment and the etching resist is then peeled off, whereby independent conductor circuits (including via-holes) are formed on the interlaminar insulating layer.

It is noted that the etching treatment can be performed using an etching solution containing a solution mixture of a sulfuric acid and hydrogen peroxide, sodium persulfate, ammonium persulfate, ferric chloride, cupric chloride or the like, and the etching resist can be peeled off using an aqueous alkaline solution or the like.

Even when using this method, it is possible to form the conductor circuits on the interlaminar insulating layer.

The additive method or the subtractive method may be appropriately selected as a formation method of the conductor circuits on the basis of the width and distance of the conductor circuits, the number of connection terminals, the pitch and the like for an IC chip and an optical component to be mounted on the substrate and other various electronic components.

When plated-through holes are also formed in the above-described steps (4) and (5), the plated-through holes may be filled with a resin filler.

Furthermore, when the plated-through holes are filled with the resin filler, a cover plating layer which covers the surface layer portion of the resin filler layer by performing electroless plating may be formed if necessary.

(8) When the cover plating layer is formed, the surface of the cover plating layer is subjected to a roughening treatment, if necessary, and the above-described steps (3) to (7) are repeatedly executed if necessary, whereby interlaminar insulating layers and conductor circuits are formed on the both surfaces of the cover plating layer. In this step, plated-through holes may be formed or not formed.

(9) Next, solder resist layers are formed on the respective outermost layers of the substrate on which the conductor circuits and the interlaminar insulating layers are formed if necessary.

The solder resist layer can be formed using a solder resist composition comprising polyphenylene ether resin, polyolefin resin, fluororesin, thermoplastic elastomer, epoxy resin, polyimide resin and the like.

In addition, examples of the solder resist composition other than the above-mentioned ones include a paste-like fluid containing thermosetting resin comprising (meth) acrylate of novolak type epoxy resin, an imidazole curing agent, a bifunctional (meth)acrylic acid ester monomer, (meth)acrylic acid ester polymer with a molecular weight of about 500 to 5000, bisphenol type epoxy resin and the like, a photosensitive monomer such as a multivalent acrylic monomer and a glycol ether type solvent, and its viscosity is desirably adjusted to be 1 to 10 Pa·s at 25° C.

Further, the lower limit of the thickness of the solder resist layer is desirably 10 μm, more desirably 15 μm, and the upper limit thereof is desirably 30 μm, more desirably 25 μm. It is noted that the thickness of the solder resist layer is most desirably 20 μm.

(10) Then, openings for forming solder bump and openings for mounting optical element are formed in the solder resist layer.

The openings for forming solder bump and the openings for mounting optical element can be formed by the similar method to that for forming the openings for via-holes, i.e., using exposure and development treatments and a laser treatment.

Further, at the time of forming the solder resist layer, a resin film having openings formed at desired positions is produced and bonded thereon, whereby the solder resist layer having the openings for forming solder bump and the openings for mounting optical element may be formed. In addition, the opening diameter of each of the openings for mounting optical element may be appropriately adjusted to the pitch of a solder pad (connection terminal) for the light receiving element and the light emitting element (e.g., 100 to 250 μm) and the diameter of the solder pad (e.g., 50 to 200 μm). Specifically, the opening diameter may be approximately equal to the diameter of the solder pad, or larger by about 10 to 30 μm than the diameter of the solder pad. When the opening diameter is set larger than the diameter of the solder pad, it is possible to improve the bonding strength of the solder.

(11) Next, the conductor circuit portions, which is exposed by the formation of the openings for forming solder bump are coated with a corrosion resistant metal such as nickel, palladium, gold, silver and platinum to form solder pads if necessary. Among the corrosion resistant metallic materials, it is desirable to use nickel-gold, nickel-silver, nickel-palladium, nickel-palladium-gold and the like to form the coating layer.

The coating layer may be formed by plating, vapor deposition, electrodeposition or the like. Among them, plating is desirable from a viewpoint that the coating layer is excellent in evenness when being formed by plating.

Furthermore, in this step, it is desirable to form a coating layer even on the conductor circuit portions, which is exposed by the formation of the openings for mounting optical element.

(12) After filling the solder pads with solder paste through a mask having opening parts formed in portions corresponding to the solder pads, reflow is performed to thereby form solder bumps.

The solder paste composition may be, for example, Sn:Ag (weight ratio)=96.5:3.5 (melting point: 221° C., eutectic).

In addition, examples of the solder paste composition other than the above include SnAgCu based paste having Sn:Ag:Cu (weight ratio)=96.5:3.0:0.5 or the like, SnCu based paste having Sn:Cu (weight ratio)=99.3:0.7 or the like, SnSb based paste having Sn:Sb (weight ratio)=95.0:5.0 or the like.

(13) Further, optical elements (a light receiving element and a light emitting element) are mounted on the solder resist layer. The optical element may be mounted through a solder (conductor layer) by filling the openings for mounting optical element with solder paste in the above-described step (12) and positioning and attaching the optical elements during reflow.

Alternatively, the optical elements may be mounted on the solder resist layer using conductive adhesive or the like in place of the solder.

When one of these methods is used, the light receiving element and the light emitting element are mounted on the surface of the solder resist layer.

Through these steps, it is possible to manufacture the substrate for mounting an IC chip according to the first aspect of the first group of the present invention.

A substrate for mounting an IC chip according to the second aspect of the first group of the present invention will now be described.

The substrate for mounting an IC chip according to the second aspect of the first group of the present invention comprises a substrate and, as serially built up on both faces thereof, a conductor circuit and an interlaminar insulating layer in an alternate fashion and in repetition, wherein a light receiving element and a light emitting element are internalized or housed at one face side of the above-mentioned substrate for mounting an IC chip such that a light receiving part and a light emitting part are exposed, respectively.

In the substrate for mounting an IC chip according to the second aspect of the first group of the present invention, since the light receiving element and the light emitting element are mounted at the surface of the substrate, the distance between an IC chip and an optical component is short and the reliability of electric signal transmission is excellent when the IC chip is mounted on the substrate.

Further, in the substrate for mounting an IC chip, on which an IC chip is mounted, according to the second aspect of the first group of the present invention, since it is possible to integrate electronic components and optical components necessary for optical communication with one another, it is possible to contribute to miniatuarization of an optical communication terminal device.

In addition, in the substrate for mounting an IC chip according to the second aspect of the first group of the present invention, a solder resist layer is formed on the outermost layer on the side on which the light receiving element and the like are mounted. When solder bumps are formed on the solder resist layer, the substrate for mounting an IC chip can be connected to an external substrate through the solder bumps. In this case, the substrate for mounting an IC chip can be arranged at a predetermined position because of the self alignment function of solders, so that it is possible to accurately transmit optical signals.

The substrate for mounting an IC chip according to the second aspect of the first group of the present invention differs from the substrate for mounting an IC chip according to the first aspect of the first group of the present invention in a way of mounting the light receiving element and the light emitting element. Specifically, in the substrate for mounting an IC chip according to the first aspect of the first group of the present invention, the light receiving element and the light emitting element are mounted on one surface of the substrate for mounting an IC chip. In the substrate for mounting an IC chip according to the second aspect of the first group of the present invention, the light receiving element and the light emitting element are internalized or housed (simply referred to as "housed" hereinafter, by denoting the meaning of both) such that a light receiving part and a light emitting part are exposed, respectively, on one face side of the substrate for mounting an IC chip.

The embodiment of the substrate for mounting an IC chip according to the second aspect of the first group of the present invention will be described with reference to the drawings.

Figure 2:
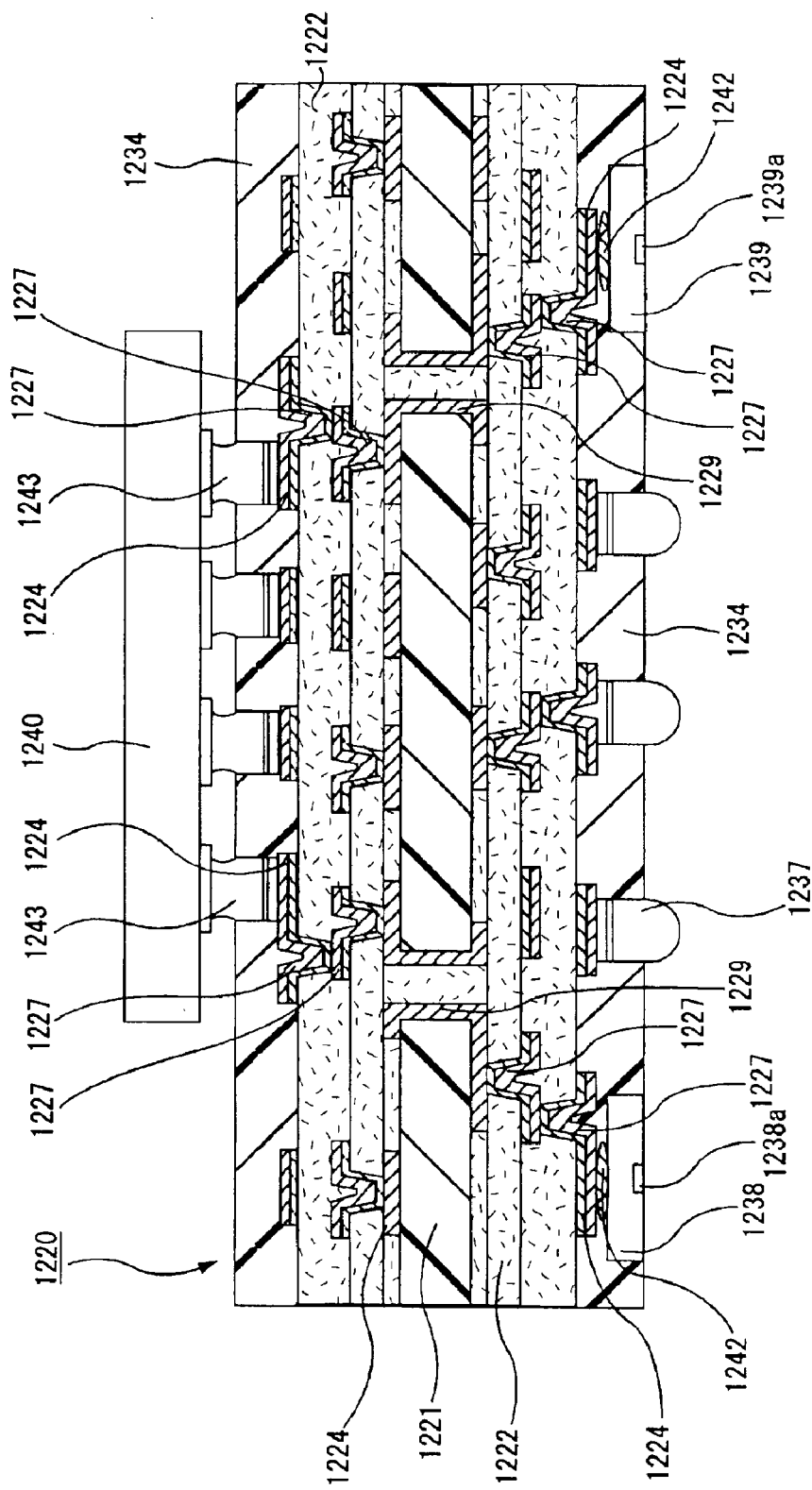
FIG. 2 is a cross-sectional view schematically showing one embodiment of a substrate for mounting an IC chip according to the second aspect of the first group of the present invention.

FIG. 2 is a cross-sectional view schematically showing one embodiment of the substrate for mounting an IC chip according to the second aspect of the first group of the present invention. It is noted that FIG. 2 shows the substrate for mounting an IC chip in a state where an IC chip is mounted on the substrate.

As shown in FIG. 2, in the substrate 1220 for mounting an IC chip, conductor circuits 1224 and an interlaminar insulating layers 1222 are built up on each surface of a substrate 1221, and the conductor circuits having the substrate 1221 interposed therebetween and those having the interlaminar insulating layer 1222 interposed therebetween are electrically connected to one another by plated-through holes 1229 and via-holes 1227, respectively.

A light receiving element 1238 and a light emitting element. 1239 are housed in a solder resist layer 1234 such that a light receiving part 1238a and a light emitting part 1239a are exposed, respectively, and the light receiving element 1238 and the light emitting element 1239 are connected to conductor circuits 1224 through a conductor layer 1242, respectively, on one surface of the substrate 1220 for mounting an IC chip.

In addition, solder bumps 1237 are formed on the solder resist layer 1234 on a side in which the light receiving element 1238 and the like are housed, whereas an IC chip 1240 is mounted on the other surface of the substrate for mounting an IC chip through solder connection parts 1243.

In the substrate for mounting an IC chip according to the second aspect of the first group of the present invention, the light receiving element and the light emitting element that are mounted at positions near the IC chip perform optical/electric signal conversion. Therefore, an electric signal transmission distance is short, the reliability of signal transmission is excellent and it is possible to deal with higher speed communication.

In addition, in the substrate 1220 for mounting an IC chip, the solder bumps 1237 are formed on the solder resist layer on one surface of the substrate. Therefore, the electric signal outputted from the IC chip can be transmitted to the external substrate through the solder bumps 1237.

Moreover, it is possible to supply power necessary to drive the IC chip from the outside of the substrate 1220 for mounting an IC chip through the solder bumps 1237.

Examples of the light receiving element and the light emitting element mounted on the substrate for mounting an IC chip according to the second aspect of the first group of the present invention include the similar light receiving element and light emitting element mounted on the substrate for mounting an IC chip according to the first aspect of the first group of the present invention.

Next, a method for manufacturing the substrate for mounting an IC chip according to the second aspect of the first group of the present invention will be described.

(1) First, similarly to the steps (1) to (8) of the method for manufacturing the substrate for mounting an IC chip according to the first aspect of the first group of the present invention, a substrate having conductor circuits and an interlaminar insulating layer built up on each surface thereof and via-holes and plated-through holes formed therein is manufactured.

(2) Next, a solder resist layer is formed on the outermost layer of the substrate on which the conductor circuits and the interlaminar insulating layer are built up, if necessary.

The solder resist layer can be formed similarly to the step (9) of the method for manufacturing the substrate for mounting an IC chip according to the first aspect of the first group of the present invention.

The exposed surface of the solder resist layer constitutes the same surface level as the light receiving surface-level of the light receiving element and the light emitting surface level of the light emitting element. The thickness of each of the light receiving element and the light emitting element is, for example, 300 μm. When the height of the solder connection of each of the elements is 50 μm, the thickness of the solder resist layer is 350 μm. In some cases, the thickness of the solder resist layer is not necessarily strictly 350 μm but may be, for example, 300 to 400 μm.

(3) Openings for forming solder bump and openings for housing optical elements are formed in the solder resist layer.

The openings for forming solder bump can be formed similarly to the step (10) of the method for manufacturing the substrate for mounting an IC chip according to the first aspect of the first group of the present invention, i.e., formed by a method similar to the formation method of the openings for via-holes.

Further, the openings for housing optical elements can be formed by a method similar to the formation method of the openings for forming solder bump.

In addition, at the time of forming the solder resist layer, a resin film having openings formed at desired positions is produced and bonded thereon, whereby the solder resist layer having the openings for forming solder bump and the openings for housing optical elements may be formed.

(4) Next, the conductor circuit portions, which is exposed by the formation of the openings for forming solder bump are coated to form solder pads if necessary. Specifically, the coating layer can be formed similarly to the step (11) of the method for manufacturing the substrate for mounting an IC chip according to the first aspect of the first group of the present invention.

In this step, it is desirable to form a coating layer even on the conductor circuit portions, which is exposed by the formation of the openings for housing optical elements.

(5) After filling the solder pads with solder paste through a mask having opening parts formed in portions corresponding to the solder pads, reflow is performed to thereby form solder bumps.

(6) Further, a light receiving element and a light emitting element are housed in the solder resist layer such that a light receiving part and a light emitting part are exposed, respectively. The optical elements (light receiving element and the light emitting element) may be mounted through a solder (conductor layer) by filling the openings for housing optical elements with solder paste in the above-described step (5) and attaching the optical elements during reflow.

Alternatively, the optical elements may be mounted using conductive adhesive or the like in place of the solder.

In the method in which the above-described steps (2) to (5) are performed, the solder resist layer is formed and then the optical elements are housed. Alternatively, the optical elements may be housed and the solder bumps may be formed by the following method.

Namely, after manufacturing the substrate on which the conductor circuits and the interlaminar insulating layer are built up on each surface of the substrate and the via-holes and the plated-through holes are formed through the above-described step (1),the optical elements are attached first to the conductor circuits through solder paste or conductive adhesive.

Next, a solder resist composition is applied onto optical element non-mounted parts or a solder resist composition, formed into the film shape, having openings formed in portions corresponding to the portions in which the optical elements are housed is pressure bonded, whereby a solder resist layer having the optical elements housed therein is formed.

Further, similarly to the above-described steps (3) to (5), solder bumps are formed by forming the openings for forming solder bump, forming the coating layer, if necessary, and filling the openings with the solder paste.

When one of these methods is used, the light receiving element and the light emitting element are internalized or housed in one face side of the substrate for mounting an IC chip.

Through these steps, it is possible to manufacture the substrate for mounting an IC chip according to the second aspect of the first group of the present invention.

A substrate for mounting an IC chip according to the third aspect of the first group of the present invention will now be described.

The substrate for mounting an IC chip according to the third aspect of the first group of the present invention comprises, a substrate and, as serially built up on both faces thereof a conductor circuit and an interlaminar insulating layer in an alternate fashion and in repetition, wherein: a light receiving element and a light emitting element are embedded at one face side of the above-mentioned substrate for mounting an IC chip; and
an optical path connecting a light receiving part of the above-mentioned light receiving element to an optical signal and an optical path connecting a light emitting part of the above-mentioned light emitting element to the optical signal are secured.

In the substrate for mounting an IC chip according to the third aspect of the first group of the present invention, since the light receiving element and the light emitting element are mounted at the surface of the substrate, the distance between an IC chip and an optical component is short and the reliability of electric signal transmission is excellent when the IC chip is mounted on the substrate.

Further, in the substrate for mounting an IC chip, on which an IC chip is mounted, according to the third aspect of the first group of the present invention, since it is possible to integrate electronic components and optical components necessary for optical communication with one another, it is possible to contribute to miniatuarization of an optical communication terminal device.

In addition, in the substrate for mounting an IC chip according to the third aspect of the first group of the present invention, in case that: a solder resist layer is formed on the outermost layer on the side on which the light receiving element and the like are mounted; and solder bumps are formed on the solder resist layer, the substrate for mounting an IC chip can be connected to an external substrate through the solder bumps,and thus the substrate for mounting an IC chip can be arranged at a predetermined position because of the self alignment function of solders. Therfore it is possible to accurately transmit optical signals.

The substrate for mounting an IC chip according to the third aspect of the first group of the present invention differs from the substrate for mounting an IC chip according to the first aspect of the first group of the present invention in a way of mounting the light receiving element and the light emitting element. Specifically, in the substrate for mounting an IC chip according to the first aspect of the first group of the present invention, the light receiving element and the light emitting element are mounted on one surface of the substrate for mounting an IC chip. Whereas, in the substrate for mounting an IC chip according to the third aspect of the first group of the present invention, the light receiving element and the light emitting element are embedded in one face side of the substrate for mounting an IC chip and optical paths connecting the light receiving part of the light receiving element and the light emitting part of the light emitting element to optical signals are secured on one face side of the substrate for mounting an IC chip.

The embodiment of the substrate for mounting an IC chip according to the third aspect of the first group of the present invention will be described with reference to the drawings.

Figure 3:
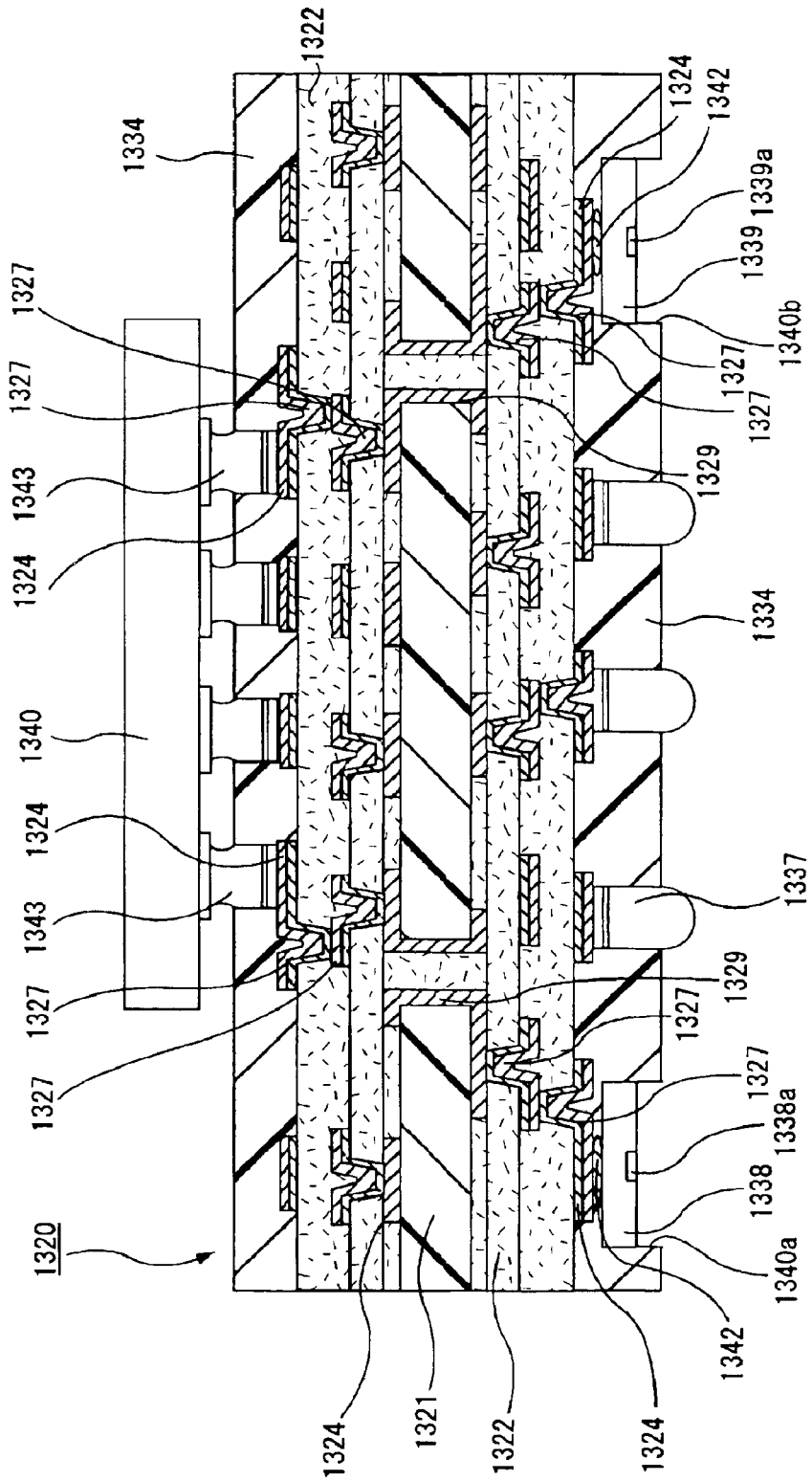
FIG. 3 is a cross-sectional view schematically showing one embodiment of a substrate for mounting an IC chip according to the third aspect of the first group of the present invention.

FIG. 3 is a cross-sectional view schematically showing one embodiment of the substrate for mounting an IC chip according to the third aspect of the first group of the present invention. It is noted that FIG. 3 shows the substrate for mounting an IC chip in a state where an IC chip is mounted on the substrate.

As shown in FIG. 3, regarding the substrate 1320 for mounting an IC chip, conductor circuits 1324 and an interlaminar insulating layers 1322 are built up on each surface of a substrate 1321, and the conductor circuits having the substrate 1321 interposed therebetween and those having the interlaminar insulating layer 1322 interposed therebetween are electrically connected to one another by plated-through holes 1329 and via-holes 1327, respectively.

Further, a light receiving element 1338 and a light emitting element 1339 are embedded in one face side of the substrate for mounting an IC chip 1320,and are connected to conductor circuits 1324 through conductor layer 1342. In addition, opening 1340 for connecting a light receiving part 1338a and a light emitting part 1339a by optical signals is secured.

In the substrate for mounting an IC chip according to the third aspect of the first group of the present invention, the light receiving element and the light emitting element that are mounted at positions near an IC chip perform optical/electric signal conversion. Therefore, an electric signal transmission distance is short, the reliability of signal transmission is excellent and it is possible to deal with higher speed communication.

In addition, since solder bumps 1337 are formed on the solder resist layer on one face side of the substrate 1320 for mounting an IC chip, an electric signal outputted from the IC chip can be transmitted to an external substrate through the solder bumps 1337.

Further, it is possible to supply power necessary to drive the IC chip from the outside of the substrate 1320 for mounting an IC chip through the solder bumps 1337.

Further, in the substrate 1320 for mounting an IC chip, openings for embedding optical elements provided to embed the light receiving element 1338 and the light emitting element 1339 are used as the openings 1340 (1340a, 1340b) for optical paths to serve as optical paths for connecting the light receiving element 1338 and the light emitting element 1339 to optical signals. The opening for optical path may be provided only in a portion which confronts the light receiving part of the light receiving element or the light emitting part of the light emitting element.

Moreover, in the substrate 1320 for mounting an IC chip, the light receiving element 1338 and the light emitting element 1339 are embedded in the solder resist layer. The positions in which the optical elements such as the light receiving element and the like are embedded are not limited to the solder resist layer. As long as the optical paths are secured, the optical elements may be embedded in the interlaminar insulating layer or the substrate or may be embedded in a plurality of layers.

In addition, the optical paths may be filled with resin or the like. In this case, it is possible to prevent dust from adhering to the light receiving part and the light emitting part and it is also possible to prevent the light receiving part and the light emitting part from being damaged. Therefore this invention makes it possible to further ensure high optical signal connection reliability.

A material for filling the optical paths is not limited to a specific material as long as the material has less absorbtion in a communication wavelength band, and examples thereof include epoxy resin, UV cured-type epoxy resin, polyolefin resin, acrylic resin such as PMMA (polymethyl methacrylate), PMMA deuteride and PMMA deuteride fluoride, polyimide resin such as polyimide fluoride, silicone resin such as silicone resin deuteride, polymer produced from benzocyclobutene and the like.

Examples of the light receiving element and the light emitting element mounted on the substrate for mounting an IC chip according to the third aspect of the first group of the present invention include the similar light receiving element and light emitting element mounted on the substrate for mounting an IC chip according to the first aspect of the first group of the present invention.

Next, a method for manufacturing the substrate for mounting an IC chip according to the third aspect of the first group of the present invention will be described.

(1) First, similarly to the steps (1) to (8) of the method for manufacturing the substrate for mounting an IC chip according to the first aspect of the first group of the present invention, a substrate having conductor circuits and an interlaminar insulating layer built up on each surface and via-holes and through holes formed therein is manufactured.

(2) Next, a solder resist layer is formed on the outermost layer of the substrate on which the conductor circuits and the interlaminar insulating layer are built up if necessary.

The solder resist layer can be formed similarly to the step (9) of the method for manufacturing the substrate for mounting an IC chip according to the first aspect of the first group of the present invention.

When a light receiving element and a light emitting element are flip-chip type components, it is sufficient that the thickness of the solder resist layer is larger than the sum of the thicknesses of the light receiving element and the light emitting element, and the height of solder connection parts therefor. When the light receiving element and the light emitting element are wire-bonding type components, it is sufficient that the thickness of the solder resist layer is larger than the sum of the thicknesses of the light receiving element and the light emitting element, the height of solder connection parts therefor and the height of wire portions, i.e., set larger by about 100 µm than that of the solder resist layer when the light receiving element and the light emitting element are flip-chip type components.

(3) Openings for forming solder bump and openings for embedding optical elements are formed in the solder resist layer.

The openings for forming solder bump can be formed similarly to the step (10) of the method for manufacturing the substrate for mounting an IC chip according to the first aspect of the first group of the present invention, i.e., formed by a method similar to the formation method of the openings for via-hole.

Further, the openings for embedding optical elements can be formed by a method similar to the formation method of the openings for forming solder bump.

In addition, at the time of forming the solder resist layer, a resin film having openings formed at desired positions is produced and bonded thereon, whereby the solder resist layer having the openings for forming solder bump and the openings for embedding optical elements may be formed.

(4) Next, the conductor circuit portions, which is exposed by the formation of the openings for forming solder bump are coated to form solder pads if necessary. Specifically, the coating layer can be formed similarly to the step (11) of the method for manufacturing the substrate for mounting an IC chip according to the first aspect of the first group of the present invention.

In this step, it is desirable to form a coating layer even on the conductor circuit portions, which is exposed by the formation of the openings for embedding optical elements.

(5) After filling the solder pads with solder paste through a mask having opening parts formed in portions corresponding to the solder pads, reflow is performed to thereby form solder bumps.

(6) Further, a light receiving element and a light emitting element are embedded in the openings for embedding optical elements in the solder resist layer, respectively. Specifically, the optical elements may be mounted through a solder (conductor layer) by filling the openings for embedding optical elements with solder paste in the above-described step (5) and attaching the optical elements during reflow.

Alternatively, the optical elements may be mounted using conductive adhesive or the like in place of the solder.

When the light receiving element and the light emitting element are wire-bonding type components, the wire portions are sealed with resin. Particularly when the wire portions are provided on the light receiving surface of the light receiving element and the light emitting surface of the light emitting element, the wire portions are sealed with the same resin as that for filling the optical paths.

In the method in which the above-described steps (2) to (5) are performed, the solder resist layer is formed and then the optical elements are embedded. Alternatively, the optical elements may be embedded and the solder bumps may be formed by the following method. The following method is particularly desirable when the optical path is formed only in the portion which confronts the light receiving part or the light emitting part of the optical elements.

Namely, after manufacturing the substrate on which the conductor circuits and the interlaminar insulating layer are built up on each surface of the substrate and the via-holes and the plated-through holes are formed through the above-described step (1), the optical elements are attached first to the conductor circuits through solder paste or conductive adhesive.

Next, a solder resist composition is applied onto the optical component non-mounted parts, or a solder resist composition, formed into the film shape, having openings formed in portions corresponding to the optical elements is laminated thereon, whereby a solder resist layer is formed.

Further, similarly to the above-described steps (3) to (5), the optical elements are embedded and solder bumps are formed by forming the openings for forming solder bump and the openings for optical paths, forming the coating layer, if necessary, and filling the openings with the solder paste.

When the optical elements are embedded by this method, it is desirable to use a photosensitive resin composition for a solder resist composition and to form the openings for optical paths by exposure and development treatments for the following reason. That is, when the openings for optical paths are formed by a laser treatment, the surfaces of the optical elements, particularly, those of the light receiving element and the light emitting element may possibly be damaged.

If the optical elements are embedded in a layer other than the solder resist layer, e.g., the interlaminar insulating layer, some the optical elements are mounted at the time of forming the interlaminar insulating layer, and then, the solder resist layer may be built up thereon, and the optical path is formed.

When one of these methods is used, the light receiving element and the light emitting element are embedded in one face side of the substrate for mounting an IC chip.

Through these steps, it is possible to manufacture the substrate for mounting an IC chip according to the third aspect of the first group of the present invention.

Next, a multilayered printed circuit board according to the second group of the present invention will be described.

The multilayered printed circuit board according to the second group of the present invention comprises a substrate and, as serially built up thereon, a conductor circuit and an interlaminar insulating layer in an alternate fashion and in repetition, wherein an optical waveguide is formed on the outermost interlaminar insulating layer.

Since the conductor circuits and the optical waveguide are formed on the multilayered printed circuit board according to the second group of the present invention, it is possible to transmit both optical signals and electric signals. Further, since the optical waveguide is internalized in the multilayered printed circuit board, it is possible to contribute to miniatuarization of an optical communication terminal device.

In the multilayered printed circuit board, the optical waveguide is formed on the outermost interlaminar insulating layer.

Accordingly, it is possible to transmit an optical signal through the optical waveguide.

Examples of the optical waveguide include an organic optical waveguide comprising a polymer material and the like, an inorganic optical waveguide comprising quartz glass, a compound semiconductor and the like, and the like. Among them, it is desirable to use the organic optical waveguide comprising the polymer material and the like. When the organic optical waveguide is used, excellent adhesion between the optical waveguide and the interlaminar insulating layer is ensured and processing is facilitated.

The polymer material is not limited to a specific material as long as it has less absorbtion in a communication wavelength band, and examples thereof include thermosetting resin, thermoplastic resin, photosensitive resin, resin obtained by photosensitizing a part of thermosetting resin, a resin complex containing thermosetting resin and thermoplastic resin, a complex of photosensitive resin and thermoplastic resin and the like.

The specific examples of the polymer material include acrylic resin such as PMMA (polymethyl methacrylate), PMMA deuteride and PMMA deuteride fluoride, polyimide resin such as polyimide fluoride, epoxy resin, UV cured-type epoxy resin, polyolefin resin and silicone resin such as silicone resin deuteride, polymers produced from siloxane resin, benzocyclobutene and the like.

When the optical waveguide is a multi-mode optical waveguide, a material therefor is desirably acrylic resin, epoxy resin, and UV cured-type epoxy resin. When the optical waveguide is a single-mode optical waveguide, a material therefor is desirably polyimide resin, silicone resin and siloxane resin.

The thickness of the core part of the optical waveguide is desirably 1 to 100 μm and the width thereof is desirably 1 to 100 μm. When the width is less than 1 μm, it is difficult to form the core part. On the other hand, when the width exceeds 100 μm, this may decrease the degree of freedom for the design of the conductor circuits and the like which constitute the multilayered printed circuit board in some cases.

The ratio of the above-mentioned thickness to width of the core part of the optical waveguide is desirably closer to 1:1. This is because: the plan shapes of the light receiving part of the light receiving element and the light emitting part of the light emitting element are normally circular. The ratio of the thickness to width is not particularly limited, and it is sufficient that the ratio is normally about 1:2 to 2:1.

When the optical waveguide is a single-mode optical waveguide having a communication wavelength of 1.31 μm or 1.55 μm, the thickness and width of the core part of the optical waveguide are desirably 5 to 15 μm, more desirably about 10 μm. When the optical waveguide is a multi-mode optical waveguide having a communication wavelength of 0.85 μm, the thickness and width of the core part of the optical waveguide are desirably 20 to 80 μm, more desirably about 50 μm.

Particles may be contained in the optical waveguide. By incorporating particles, cracks are less likely to occur to the optical waveguide. Specifically, when no particles are contained in the optical waveguide, cracks sometimes occur to the optical waveguide due to the difference in the thermal expansion coefficient between the optical waveguide and the other layer (substrate, interlaminar insulating layer or the like). However, by incorporating particles in the optical waveguide and adjusting the thermal expansion coefficient to narrow the difference between the optical waveguide and the other layer, cracks are less likely to occur to the optical waveguide.

The optical waveguide may contain not only the above-mentioned resin composition but also particles such as resin particles, inorganic particles and metal particles. By incorporating these particles, it is possible to adjust the thermal expansion coefficient of the optical waveguide to those of the interlaminar insulating layers, the solder resist layer and the like.

Examples of the resin particles include those comprising thermosetting resin, thermoplastic resin, photosensitive resin, resin obtained by photosensitizing a part of thermosetting resin, a resin complex of thermosetting resin and thermoplastic resin, a complex of photosensitive resin and thermoplastic resin and the like.

Specific examples of the resin particles include those comprising: thermosetting resins such as epoxy resin, phenol resin, polyimide resin, bismaleimide resin, polyphenylene resin, polyolefin resin and fluororesin; resin obtained by reacting the thermosetting groups (e.g., the epoxy group of the epoxy resin) of these thermosetting resins with a methacrylic acid or an acrylic acid to thereby acrylate it, thermoplastic resin such as phenoxy resin, polyethersulfone (PES), polysulfone (PSF), polyphenylenesulfone (PPS), polyphenylene sulfide (PPES), polyphenyl ether (PPE) and polyetherimide (PI), photosensitive resin such as acrylic resin and the like.

Further, a resin complex of the thermosetting resin and the thermoplastic resin, a resin complex of the acrylated resin, the photosensitive resin with the thermoplastic resin can be also used.

As the resin particles, rubber containing resin particles can be also used.

Examples of the inorganic particles include those comprising aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate, silicon compounds such as silica and zeolite, titanium compounds such as titania and the like. Further, the inorganic particles comprising a material obtained by mixing silica and titania with a certain rate, melting and making them uniform may be used.

As the inorganic particles, those comprising phosphorus and phosphorus compounds can be also used.

Examples of the metal particles include those comprising gold, silver, copper, palladium, nickel, platinum, iron, zinc, lead, aluminum, magnesium, calcium and the like.

These resin particles, organic particles and metal particles may be used alone or in combination of two or more of them.

The particles are desirably inorganic particles, which comprise silica, titania or alumina. It is also desirable to use particles having a mixture composition obtained by mixing and melting at least two kinds of silica, titania and alumina.

The shapes of the particles such as resin particles are not limited to specific shapes and the particles may be spherical, elliptic, crushed form, polygonal or the like.

The particle diameter of the particles is desirably smaller than a communication wavelength. When the particle diameter is larger than the communication wavelength, the transmission of an optical signal is hampered in some cases.

The lower limit and upper limit of the particle diameter are desirably 0.01 µm and 0.8 µm, respectively. When the particles includes those out of the range, the particle size distribution becomes too wide. As a result, when mixing the particles into the resin composition, the dispersion of the viscosity of the resin composition grows, thereby deteriorating reproducibility in preparing the resin composition and making it difficult to prepare a resin composition having a predetermined viscosity.

The lower limit and upper limit of the particle diameter are more desirably 0.1 µm and 0.8 µm, respectively. When the particle diameter is within the range, the particles are suitable for applying the resin composition using a spin coater, a roll coater or the like. In addition, it become easier to adjust the resin composition containing particles to have a predetermined viscosity.

The lower limit and upper limit of the particle diameter are particularly desirably 0.2 µm and 0.6 µm, respectively. This range is particularly suitable for the application of the resin composition and the formation of the core part of the optical waveguide. In addition, the dispersion of the optical waveguide thus formed, particularly that of the core part is minimized, thereby ensuring particularly excellent device for optical communication characteristics.

In addition, when the particles having particle diameters within this range are used, two or more kinds of particles having different particle diameters may be included.

The lower limit of the mixing amount of the particles is desirably 10% by weight, more desirably 20% by weight. The upper limit thereof is desirably 80% by weight, more desirably 70% by weight. When the mixing amount of the particles is less than 10% by weight, the effect of mixing particles cannot be expected in some cases. When it exceeds 80% by weight, the transmission of an optical signal is hampered in some cases.

The shape of the optical waveguide is not limited to a specific one. However, a sheet-like optical waveguide is desirable because it is easy to form.

When the optical waveguide is constituted by a core part and a cladding part, the particles may be mixed in both the core part and the cladding part. Desirably, no particles are mixed in the core part and particles are mixed only in the cladding part covering the surrounding of the core part. The reason is as follows.

When the particles are mixed in the optical waveguide, an air layer is often generated at the interface between the particles and the resin composition depending on the adhesion between the particles and the resin composition of the optical waveguide. In this case, the air layer changes the refraction direction of light, thereby increasing the transmission loss of the optical waveguide. On the other hand, when the particles are mixed only in the cladding part, the problem that the transmission loss of the optical waveguide increases does not occur and it is possible to make it difficult to cause cracks on the optical waveguide.

In the multilayered printed circuit board, it is desirable that an optical waveguide for receiving light and an optical waveguide for emitting light are formed as the optical waveguide.

The optical waveguide for receiving light is an optical waveguide for transmitting an optical signal transmitted from the outside through an optical fiber or the like to the light receiving element. The optical waveguide for emitting light is an optical waveguide for transmitting the optical signal transmitted from the light emitting element to the optical fiber or the like.

It is desirable that the optical waveguide for receiving light and the optical waveguide for emitting light are made of the same material. This is because it is possible to make it easier to adjust the thermal expansion coefficient of the optical waveguide to those of the other layers and make it easier the formation of the optical waveguide.

Further, it is desirable that an optical path conversion mirror is formed at the optical waveguide. By forming the optical path conversion mirror, it is possible to change the angle of the optical path to a desired angle.

The optical path conversion mirror can be formed by cutting one end of the optical waveguide as will be described later. Alternatively, a member that includes an optical path conversion part may be arranged on the tip end portion of the optical waveguide in place of forming the optical path conversion mirror on the optical waveguide.

In the multilayered printed circuit board according to the second group of the present invention, it is desirable that the conductor circuits with the interlaminar insulating layers interposed therebetween are connected to each other by via-holes.

By connecting the conductor circuits by via-holes, it is possible to arrange the conductor circuits with high density and improve the degree of freedom for the design of the conductor circuits, so that it is possible to easily secure formation area of an optical waveguide.

Further, as shown in the following description of a method for manufacturing the multilayered printed circuit board, the conductor circuits are desirably formed by the additive method.

This is because the additive method is suitable for the formation of conductor circuits having fine wirings interval of 50 µm or less.

The additive method may be the full-additive method or the semi-additive method.

Alternatively, the subtractive method or the build-up method may be used to form the conductor circuits. Further, the collective pressing or sequential pressing may be used to form the conductor circuits.

It is further desirable that a solder resist layer having an opening for optical path is formed on the outermost layer of the multilayered printed circuit board according to the second group of the present invention for the following reason.

By forming the solder resist layer, it is possible to protect the optical waveguide formed on the outermost interlaminar insulating layer and secure an optical path for transmitting an optical signal.

It is also desirable that openings for mounting the substrate for mounting an IC chip and those for mounting surface mount-type electronic components are formed in the solder resist layer. It is particularly desirable to form BGA pad openings for mounting the substrate for mounting an IC chip.

When these openings are formed in the solder resist layer, it is possible to mount the substrate for mounting an IC chip and the surface mount-type electronic components on the surface of the multilayered printed circuit board. Specifically, it is possible to mount a substrate for mounting an IC chip such as BGA on which the light emitting element and the light receiving element as well as the IC chip are mounted on a side of the multilayered printed circuit board on which side the optical waveguide is formed.

The solder resist layer may be formed on a side of the multilayered printed circuit board on which side the optical waveguide is not formed. In this solder resist layer, openings for mounting the surface mount-type electronic components and the like may be formed. When such openings are formed, pads for surface mount may be formed, if necessary, and then the surface mount-type electronic components can be mounted on the respective pads. In the openings, a PGA (Pin Grid Array) or a BGA (Ball Grid Array) can be provided, whereby it is possible to electrically connect the multilayered printed circuit board to an external substrate and the like.

Further, according to the second group of the present invention, in case of connecting the external substrate (substrate for mounting an IC chip or the like) equipped with the optical elements such as the light emitting element and the light receiving element to a side of the multilayered printed circuit, on the side which the optical waveguide is formed, through solder bumps, it is possible to ensure the arrangement of the multilayered printed circuit board and the above-mentioned external substrate at respective predetermined positions by the self-alignment function of the solders.

Therefore, as long as the position of the optical waveguide attached on the multilayered printed circuit board and the position of the optical elements attached on the external substrate are accurate, it is possible to accurately transmit the optical signal between the optical waveguide and the optical elements.

By utilizing this self-alignment function, even when their positions are deviated before reflow at the time of connecting the external substrate to the multilayered printed circuit board through the solder bumps, the external substrate moves during the reflow and can be attached to an accurate position on the multilayered printed circuit board.

The embodiment of the multilayered printed circuit board having the above-described configuration will be described with reference to the drawings.

Figure 8:
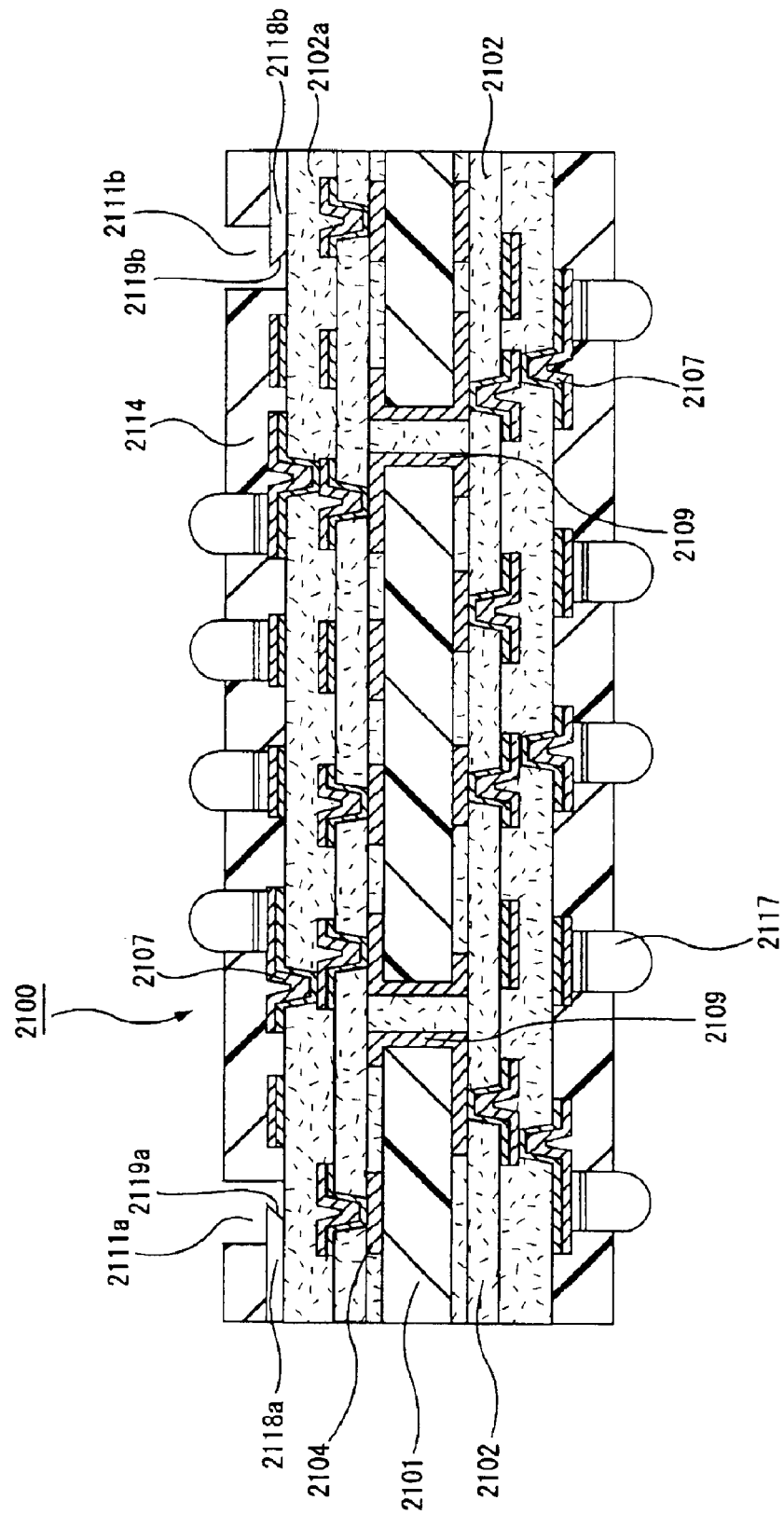
FIG. 8 is a cross-sectional view schematically showing one embodiment of a multilayered printed circuit board according to the second group of the present invention.

FIG. 8 is a cross-sectional view schematically showing one embodiment of the multilayered printed circuit board according to the second group of the present invention.

As shown in FIG. 8, in the multilayered printed circuit board 2100, conductor circuits 2104 and interlaminar insulating layers 2102 are built up on each surface of a substrate 2101, and the conductor circuits with the substrate 2101 interposed therebetween and the conductor circuits with the interlaminar insulating layers 2102 interposed there between are electrically connected to one another by plated-through holes 2109 and via-holes 2107, respectively.

Optical waveguides 2118 (2118*a*, 2118*b*) having optical conversion mirrors 2119 (2119*a*, 2119*b*) are formed on the outermost interlaminar insulating layer 2102*a*. One of the optical waveguides 2118*a* and 2118*b* is an optical waveguide for receiving light and the other is an optical waveguide for emitting light.

Further, a solder resist layer 2114 including openings 2111 (2111*a*, 2111*b*) for optical paths and solder bumps 2117 is formed on each outermost layer of the multilayered printed circuit board 2100. The openings 2111 for optical paths are formed immediately on the optical waveguides 2118.

In the multilayered printed circuit board 2100 having the above-described configuration, an optical signal transmitted from the outside through an optical fiber (not shown) is introduced into the optical waveguide 2118*a* and transmitted to a light receiving element (not shown) or the like through the optical path conversion mirror 2119*a* and the opening 2111*a* for optical path.

In addition, an optical signal outputted from a light emitting element (not shown) is introduced from the opening 2111*b* for optical path into the optical waveguide 2118*b* through the optical conversion mirror 2119*b* and transmitted as an optical signal to the outside through the optical fiber (not shown).

When the substrate for mounting an IC chip or the other external substrate (not shown) is connected to the multilayered printed circuit board 2100 through the solder bumps 2117, it is possible to electrically connect the multilayered printed circuit board 2100 to the substrate for mounting an IC chip or the like. When the optical elements are mounted on this substrate for mounting an IC chip, it is possible to transmit an optical signal and an electric signal between the multilayered printed circuit board 2100 and the external substrate.

The multilayered printed circuit board, having the above-described configuration, according to the present invention can be used as a package substrate, a mother board, a daughter board or the like by appropriately selecting whether: openings for mounting the substrate for mounting an IC chip and the surface mount-type electronic components are formed or not in the solder resist layer; or the BGA or the PGA is formed thereon or not.

A method for manufacturing the multilayered printed circuit board according to the second group of the present invention will now be described.

(1) Using an insulating substrate as a starting material, conductor circuits are formed on the insulating substrate.

Specifically, a method similar to that used in the step (1) of the method for manufacturing the substrate for mounting an IC chip according to the first aspect of the first group of the present invention or the like can be used.

(2) Next, the surfaces of the conductor circuits is subjected to a surface roughening treatment if necessary.

The roughened surface formation treatment can be performed in a method similar to that used in the step (2) of the method for manufacturing the substrate for mounting an IC chip according to the first aspect of the first group of the present invention.

(3) Either an uncured resin layer comprising thermosetting resin, photosensitive resin, resin obtained by acrylating a part of thermosetting resin, or a resin complex containing these resins and thermoplastic resin is formed or a resin layer comprising thermoplastic resin is formed on the substrate on which the conductor circuits are formed.

Specifically, a method similar to that used in the step (3) of the method for manufacturing the substrate for mounting an IC chip according to the first aspect of the first group of the present invention or the like can be used.

(4) Next, in case of forming interlaminar insulating layers using the thermosetting resin or resin complex as a material, the uncured resin layer is subjected to a curing treatment and via-hole openings are formed, thereby forming the interlaminar insulating layers. In this step, through holes may be formed if necessary.

Specifically, a similar method similar to that used in the step (4) of the method for manufacturing the substrate for mounting an IC chip according to the first aspect of the first group of the present invention or the like can be used.

(5) Next, conductor circuits are formed on the surfaces of the interlaminar insulating layers including the inner walls of the openings for via-holes.

A method similar to that used in the steps (5) to (7) of the method for manufacturing the substrate for mounting an IC chip according to the first aspect of the first group of the present invention or the like can be used to form the conductor circuits. Therefore, similarly to the method for manufacturing the substrate for mounting an IC chip according to the first aspect of the first group of the present invention, the conductor circuits may be formed by the additive method, the subtructive method or the build-up method.

Further, collective pressing or sequential pressing may be used to form the conductor circuits.

(6) When a cover plating layer is formed, the surface of the cover plating layer is subjected to a roughening treatment, if necessary, and the steps (3) to (6) are repeatedly performed if necessary, whereby interlaminar insulating layers and conductor circuits are formed on the both surfaces of the cover plating layer. In this step, plated-through holes may be formed or not formed.

(7) Optical waveguides are formed on conductor circuit non-formed parts on the outermost interlaminar insulating layer.

When organic optical waveguides made of a polymer material or the like are to be formed, a film for forming optical waveguide, which is formed into a film shape in advance on a base material or mold-releasing film may be bonded on the interlaminar insulating layer or directly formed on the interlaminar insulating layer, so that the optical waveguides can be formed.

Specifically, in order to form the optical waveguides, a method using reactive ion etching, an exposure-development method, a mold formation method, a resist formation method, a combination thereof or the like can be used.

The method by the reactive ion etching is performed as follows. (i) First, an under-cladding part is formed on the mold-releasing film, the interlaminar insulating layer or the like (simply referred to as "mold-releasing film or the like" hereinafter). (ii) Then, a resin composition for core part is applied onto the under-cladding part and, if necessary, a curing treatment is performed, thereby obtaining a resin layer for forming core part. (iii) Then, a resin layer for forming mask is then formed on the resin layer for forming core part, and this resin layer for forming mask are subjected to exposure and development treatments, thereby forming a mask (an etching resist) on the resin layer for forming core part.

(iv) Then, the resin layer for forming core part is subjected to reactive ion etching, thereby removing the resin layer for forming core part in mask non-formed parts and forming the core part on the under-cladding part. (v) Finally, an over-cladding part is formed on the under-cladding part so as to cover the core part, thus obtaining an optical waveguide.

When the method by the reactive ion etching is used, it is possible to form an optical waveguide excellent in dimension reliability. This method is also excellent in reproducibility.

The exposure-development method is performed as follows. (i) First, an under-cladding part is formed on the mold-releasing film or the like. (ii) Then, a resin composition for core part is applied onto this under-cladding part and a semi-curing treatment is performed if necessary, thereby forming a layer comprising the resin composition for forming core part.

(iii) Then, a mask drawing a pattern corresponding to a core part-forming portion is put on the resin composition for forming core layer and exposure and development treatments are performed, thereby forming a core part on the under-cladding part. (iv) Finally, an over-cladding part is formed on the under-cladding part so as to cover the core part, thus obtaining an optical waveguide.

Since this exposure-development method requires a small number of steps, it can be suitably used when mass-producing optical waveguides. In addition, since this method requires a small number of heating steps, it is possible to make it difficult to generate stress on the optical waveguide.

The mold formation method is performed as follows. (i) First, an under-cladding part is formed on the mold-releasing film or the like. (ii) Then, a groove for core part-formation is formed in the under-cladding part by forming a mold. (iii) Further, the groove is filled with a resin composition for core part by printing and a curing treatment is performed, thereby forming the core part. (iv) Finally, an over-cladding part is formed on the under-cladding part so as to cover the core part, thus obtaining an optical waveguide.

This mold formation method can be suitably used when mass-producing optical waveguides and optical waveguides excellent in dimension reliability can be formed. This method is also excellent in reproducibility.

The resist formation method is performed as follows. (i) First, an under-cladding part is formed on the mold-releasing film or the like. (ii) Further, a resin composition for resist is applied onto this under-cladding part and exposure and development treatments are performed, thereby forming a core part-forming resist in core part non-formed parts on the under-cladding part.

(iii) Then, a resin composition for core part is applied onto resist non-formed parts on the under-cladding part. (iv) Further, the resin composition for core part is cured and then the core part-forming resist is peeled off, thereby forming a core part on the under-cladding part. (v) Finally, an over-cladding part is formed on the under-cladding part so as to cover the core part, thus obtaining an optical waveguide.

This resist formation method can be suitably used when mass-producing optical waveguides and optical waveguides excellent in dimension reliability can be formed. This method is also excellent in reproducibility.

When the optical waveguides made of the polymer material are formed by one of these methods and the optical waveguides having particles mixed in the core parts are to be formed, the mold formation method rather than the exposure-development method is desirable for the following reason.

That is, when the core part is formed by the mold fomation method wherein the groove for core part formation is formed in the under-cladding part by the mold formation and then, the core part is formed in this groove, the particles mixed in the core part are all contained in the core part, so that the surface of the core part is flat and excellent in transmission of an optical signal. On the other hand, when the core part is formed by the exposure-development method, part of particles are protruded from the surface of the core part after development or recesses from which particles are removed are formed in the surface of the core part, whereby irregularities are formed on the surface of the core part in some cases. These irregularities prevent light from reflecting in a desired direction. As a result, the optical signal transmission characteristic may possibly be deteriorated.

When the optical waveguides are formed by one of the above-described methods, the viscosity of the resin composition is desirably 50 to 5000 cps (mPa·s).

These methods can be also used to form optical waveguides on the base material or the mold-releasing film and to directly form optical waveguides on the interlaminar insulating layer.

Further, when inorganic optical waveguides made of quartz glass, a compound semiconductor or the like are to be formed, a film is formed out of an inorganic material such as $LiNbO_2$ or $LiTaO_2$ by a liquid-phase epitaxial method, chemical vapor deposition method (CVD), a molecular beam epitaxial method or the like, or inorganic optical waveguides made of quartz glass and formed into a predetermined shape are attached to the film by adhesive.

It is desirable to form an optical path conversion mirror on each optical waveguide.

The optical path conversion mirror may be formed before attaching the optical waveguide onto the interlaminar insulating layer or may be formed after attaching it onto the interlaminar insulating layer. However, it is desirable to form the optical path conversion mirror in advance except for a case where the optical waveguide is directly formed on the interlaminar insulating layer. This is because it is possible to facilitate operation and to prevent other members constituting the multilayeredprinted circuit board, the conductor circuits, interlaminar insulating layers and the like from being damaged or broken at working.

A formation method of the optical path conversion mirror is not limited to a specific method and a conventional well-known method can be used. Specifically, machining process using a diamond saw having a 90°-V-shaped tip end, a blade or a cutter, processing by reactive ion etching, laser abrasion or the like can be performed to form the optical path conversion mirrors. Alternatively, an optical path conversion member may be embedded in the optical waveguide in place of forming the optical path conversion mirror.

(8) Next, a solder resist layer is formed on the outermost layer of the substrate on which the optical waveguides are formed if necessary.

The solder resist layer can be formed using a solder resist composition. As the solder resist composition, the similar solder resist composition to that used in the step (9) of the method for manufacturing the substrate for mounting an IC chip according to the first aspect of the first group of the present invention.

The solder resist layer is not necessarily formed on the outermost layer. However, by forming the solder resist layer, it is possible to prevent the optical waveguides from being damaged and protect them from heat and the like.

(9) Openings for optical paths and, if necessary, openings for mounting the substrate for mounting an IC chip and the surface mount-type electronic components are formed on the solder resist layer.

The openings for mounting the substrate for mounting an IC chip and the like and the openings for optical paths can be formed by a method similar to that for forming the openings for via-holes, i.e., by performing exposure and development treatments or a laser treatment.

At the time of forming the solder resist layer, the solder resist layer having openings for optical paths and the openings for mounting the substrate for mounting an IC chip and the like may be formed by manufacturing a resin film having openings formed at desired positions in advance and bonding the resin film thereon.

Among these methods, it is desirable to select the method of: applying the resin composition containing photosensitive resin; and then performing exposure and development treatments to form the openings for mounting the substrate for mounting an IC chip and the like and the openings for optical paths for the following reason.

When the openings for optical paths are formed by the exposure and development treatments, there is no possibility of damaging the optical waveguides present under the openings for optical paths at the time of forming the openings.

The diameter of the openings for mounting the substrate for mounting an IC chip and the like is desirably 500 to 1000 μm, and that of the openings for optical paths is desirably 100 to 500 μm.

Further, the shapes of the openings for mounting the substrate for mounting an IC chip and the like and the openings for optical paths are not limited to specific ones but the openings may be columnar, elliptical columnar, quadrangular columnar, polygonal columnar or the like.

(10) The conductor circuit portions, which is exposed by the formation of the openings for mounting the substrate for mounting an IC chip and the like are coated with corrosion resistant metal such as nickel, palladium, gold, silver or platinum, if necessary, to form pads for surface mount. Among the corrosion resistant metallic materials, it is desirable to use nickel-gold, nickel-silver, nickel-palladium, nickel-palladium-gold and the like to form the coating layer.

The coating layer may be formed by plating, vapor deposition, electrodeposition or the like. Among them, plating is desirable from a viewpoint that the coating layer is excellent in evenness when being formed by plating.

(13) After filling the pads for surface mount with solder paste (e.g., Sn/Ag=96.5/3.5 or the like) through a mask having opening portions formed in portions corresponding to the pads for surface mount, reflow is performed to thereby form solder bumps. In addition, in the solder resist layer on the opposite side to the side on which the optical waveguides are formed, pins may be arranged on the external substrate connection surface of the solder resist layer using conductive adhesive or the like or solder balls may be formed thereon to provide the PGA or the BGA. The type of the pins is not limited to a specific type but T-type pins are desirable. Examples of the material of the pins include 42 alloy and the like. Alternatively, after filling the pads with the solder paste, the substrate for mounting an IC chip and the surface mount-type electronic components may be placed thereon before conducting reflow to thereby solder the substrate for mounting an IC chip and the surface mount-type electronic components to the multilayered printed circuit board by reflowing. In this case, the order of mounting (soldering) the substrate for mounting an IC chip and the surface mount-type electronic components is not limited to a specific order but it is desirable to mount the member having many connection terminals later.

Further, in this step, the substrate for mounting an IC chip and the surface mount-type electronic components can be mounted on the multilayered printed circuit board by connecting the BGA formed on the substrate for mounting an IC chip and the bumps formed on the surface mount-type electronic components to the pads for surface mount without forming the solder bumps, PGA or BGA.

Through these steps, it is possible to manufacture the multilayered printed circuit board according to the second group of the present invention.

A Multilayered printed circuit board according to the third group of the present invention will now be described.

At first, a multilayered printed circuit board according to a first aspect of the third group of the present invention will now be described.

The multilayered printed circuit board according to the first aspect of the third group of the present invention comprises: a substrate and, as serially built up on both faces thereof, a conductor circuit and an interlaminar insulating layer in an alternate fashion and in repetition; and a solder resist layer formed as an outermost layer, wherein an organic optical waveguide is formed at a part of the above-mentioned solder resist layer.

Since the conductor circuits and the organic optical waveguide are formed on the multilayered printed circuit board according to the first aspect of the third group of the present invention, it is possible to transmit both an optical signal and an electric signal. Further, since the organic optical waveguide is formed in the multilayered printed circuit board, it is possible to contribute to miniatuarization of an optical communication terminal device.

The organic optical waveguide is formed on a part of the solder resist layer of the multilayered printed circuit board.

Accordingly, it is possible to transmit optical signals through the organic optical waveguide.

In addition, the organic optical wave guide has an excellent adhesion to an interlaminar insulating layer and, also, the processing thereof can be facilitated.

As a material for the organic optical waveguide, a polymer material can be used. Examples of the polymer material include the similar examples to those of the polymer material described as a material for the organic optical waveguide according to the second group of the invention and the like.

The organic optical waveguide may contain not only the above-mentioned resin composition but also particles such as resin particles, inorganic particles and metal particles. By incorporating these particles, it is possible to adjust the thermal expansion coefficient of the organic optical waveguide to those of the interlaminar insulating layers, the solder resist layers and the like.

Examples of the particles contained in the organic optical waveguide include the similar particles to those contained in the optical waveguide according to the second group of the present invention and the like. The shape, diameter, mixing amount of the particles are similar to those of the particles contained in the optical waveguide according to the second group of the present invention and the like.

The resin particles, inorganic particles and metal particles may be used alone or in combination of two or more of them.

When the optical waveguide is constituted by a core part and a cladding part, the particles may be mixed in both the core part and the cladding part. Desirably, no particles are mixed in the core part and particles are mixed only in the cladding part covering the surrounding of the core part. The reason is the same as that described above in relation to the second group of the present invention.

The thickness of the core part of the optical waveguide is desirably 1 to 100 μm and the width thereof is desirably 1 to 100 μm. When the width is less than 1 μm, it is difficult to form the core part in some cases. When the width exceeds 100 μm, this may decrease the degree of freedom for the design of the conductor circuits and the like which constitute the multilayered printed circuit board in some cases.

The ratio of the above-mentioned thickness to width of the core part of the optical waveguide is desirably closer to 1:1. The plan shapes of the light receiving part of the light receiving element and the light emitting part of the light emitting element are normally circular. The ratio of the thickness to width may be normally about 1:2 to 2:1.

When the optical waveguide is a single-mode optical waveguide having a communication wavelength of 1.31 μm or 1.55 μm, the thickness and width of the core part of the optical waveguide are desirably 5 to 15 μm, more desirably about 10 μm. When the optical waveguide is a multi-mode optical waveguide having a communication wavelength of 0.85 μm, the thickness and width of the core part of the optical waveguide are desirably 20 to 80 μm, more desirably about 50 μm.

In the multilayered printed circuit board, an optical waveguide for receiving light and an optical waveguide for emitting light are used as the organic optical waveguide.

It is also desirable that the optical waveguide for receiving light and the optical waveguide for emitting light are made of the same material. This is because it is easy to adjust the thermal expansion coefficients of the optical waveguides and easy to form them.

Further, it is desirable that an optical path conversion mirror is formed on the organic optical waveguide. By forming the optical path conversion mirror, it is possible to change the angle of the optical path to a desired angle.

The optical path conversion mirror can be formed by cutting one end of the organic optical waveguide. Alternatively, a member that includes an optical path conversion part may be arranged on the tip end portion of the optical waveguide in place of forming the optical path conversion mirror on the optical waveguide.

As described above, the organic optical waveguide is formed on a part of the solder resist layer. Accordingly, the solder resist layer is formed in organic optical waveguide non-formed parts on the outermost layer of the multilayered printed circuit board. Since the solder resist layer is formed, the solder resist layer can protect the interlaminar insulating layers and the conductor circuits.

It is desirable to form openings for mounting the substrate for mounting an IC chip and those for mounting surface mount-type electronic components in the solder resist layer. It is particularly desirable to form BGA pad openings for mounting the substrate for mounting an IC chip.

When these openings are formed in the solder resist layer, it is possible to mount the substrate for mounting an IC chip and the surface mount-type electronic components on the surface of the multilayered printed circuit board. Specifically, it is possible to mount a substrate for mounting an IC chip such as the one having BGA on which the light emitting element and the light receiving element as well as the IC chip are mounted on a side of the multilayered printed circuit board on which side the optical waveguide is formed.

The solder resist layer may be formed on the outermost layer at a side of the substrate, on which side the optical waveguide is not formed. In this solder resist layer, openings for mounting the surface mount-type electronic components and the like may be formed. When such openings are formed, after pads for surface mount are formed based on necessity, the surface mount-type electronic components can be mounted on the respective pads. In the openings, a PGA or a BGA can be provided, whereby it is possible to electrically connect the multilayered printed circuit board to an external substrate or the like.

Further, according to the first aspect of the third group of the present invention, in case of connecting the external substrate (substrate for mounting an IC chip or the like) equipped with the optical elements such as the light emitting element and the light receiving element to a side of the multilayered printed circuit board, on the side which the organic optical waveguide is formed, through solder bumps, it is possible to ensure arranging the multilayered printed circuit board and the external substrate at predetermined positions by the self-alignment function of the solders.

Therefore, as long as the position of the organic optical waveguide attached on the multilayered printed circuit board and the position of the optical elements attached on the external substrate are accurate, it is possible to accurately transmit the optical signal between the organic optical waveguide and the optical elements.

By utilizing this self-alignment function, even when their positions are deviated before reflow at the time of connecting the external substrate to the multilayered printed circuit board through the solder bumps, the external substrate moves during the reflow and can be attached to an accurate position on the multilayered printed circuit board.

In the multilayered printed circuit board according to the first aspect of the third group of the present invention, it is desirable that the conductor circuits with the interlaminar insulating layers interposed therebetween are connected to one another by via-holes.

By connecting the conductor circuits by via-holes, it is possible to arrange the conductor circuits with high density and improve the degree of freedom for the design of the conductor circuits, so that it is possible to easily secure formation area of an organic optical waveguide.

Further, as will be cleared by the following description of a method for manufacturing the multilayered printed circuit board, the conductor circuits are desirably formed by the additive method.

This is because the additive method is suitable for the formation of conductor circuits having fine wirings interval of 50 µm or less.

The additive method may be the full-additive method or the semi-additive method.

Alternatively, the subtractive method or the build-up method may be used to form the conductor circuits. Further, the collective pressing or sequential pressing may be used to form the conductor circuits.

One embodiment of the multilayered printed circuit board having the above-described configuration will now be described with reference to the drawings.

Figure 14:
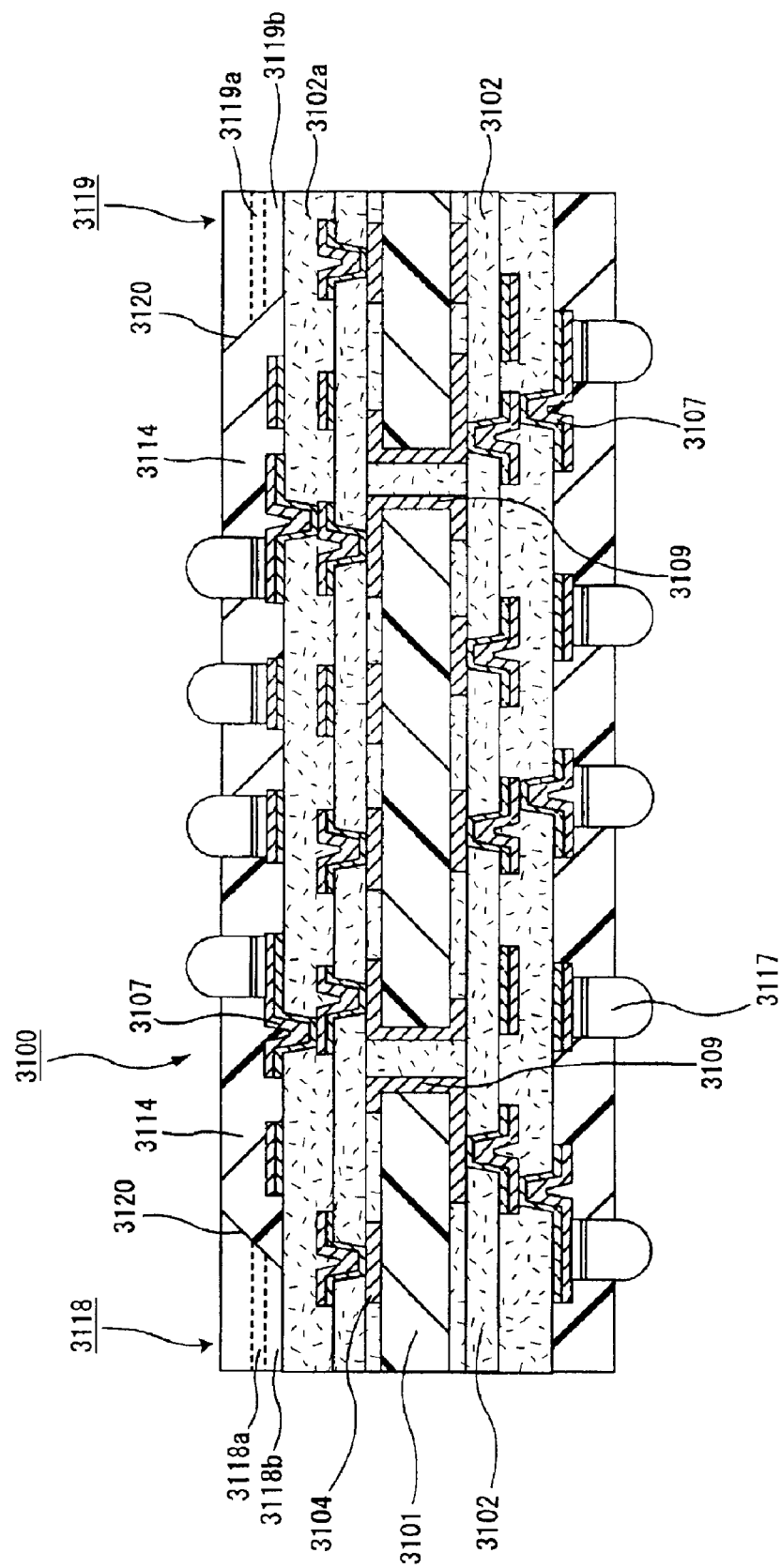
FIG. 14 is a cross-sectional view schematically showing one embodiment of a multilayered printed circuit board according to the first aspect of the third group of the present invention.

FIG. 14 is a cross-sectional view schematically showing one embodiment of the multilayered printed circuit board according to the first aspect of the third group of the present invention.

As shown in FIG. 14, regarding the multilayer printed circuit board 3100, conductor circuits 3104 and interlaminar insulating layers 3102 are built up on each surface of a substrate 3101, and the conductor circuits with the substrate 3101 interposed therebetween and the conductor circuits with the interlaminar insulating layers 3102 interposed therebetween are electrically connected to one another by plated-through holes 3109 and via-holes 3107, respectively.

A solder resist layer 3114 including solder bumps 3117 is formed on the outermost layer of the multilayered printed circuit board 3100. Organic optical waveguides 3118b and 3119b each including an optical path conversion mirror 3120 are formed on a part of the solder resist layer 3114.

The organic optical waveguides 3118 and 3119 comprise core parts 3118a and 3119a and cladding parts 3118 and 3119, respectively. One of the optical waveguides 3118 and 3119 is an optical waveguide for receiving light and the other is an optical waveguide for emitting light.

In the multilayered printed circuit board 3100 having the above-described configuration, an optical signal transmitted from the outside through an optical fiber (not shown) is introduced into the organic optical waveguide 3118 (core part 3118a) and transmitted to a light receiving element (not shown) or the like through the optical path conversion mirror 3120.

In addition, an optical signal outputted from the a light emitting element (not shown) is introduced into the organic optical waveguide 3119 (core part 3119a) through the optical path conversion mirror 3120 and transmitted as an optical signal to the outside through the optical fiber (not shown).

When the substrate for mounting an IC chip or the other external substrate (not shown) is connected to the multilayered printed circuit board 3100 through the solder bumps 3117, it is possible to electrically connect the multilayered printed circuit board 3100 to the substrate for mounting an IC chip or the like. When the optical elements are mounted on this substrate for mounting an IC chip, it is possible to transmit an optical signal and an electric signal between the multilayered printed circuit board 3100 and the external substrate.

The multilayered printed circuit board, having the above-described configuration, according to the first aspect of the third group of the present invention can be used as a package substrate, a mother board, a daughter board or the like by appropriately selecting whether: openings for mounting the substrate for mounting an IC chip and the surface mount-type electronic components are formed or not in the solder resist layer; or the BGA or the PGA is formed or not thereon.

A method for manufacturing the multilayered printed circuit board according to the first aspect of the third group of the present invention will now be described.

(1) A multilayered printed circuit board is manufactured similarly to the steps (1) to (6) of the method for manufacturing the multilayered printed circuit board according to the second group of the present invention.

In this manufacturing method, similarly to the method for manufacturing the multilayered printed circuit board according to the second group of the present invention, the conductor circuits may be formed by the additive method, subtractive method or build-up method.

Alternatively, the conductor circuits may be formed by collective pressing or sequential pressing.

(2) Next, organic optical waveguides are formed on apart of the outermost interlaminar insulating layer.

When the organic optical waveguides are to be formed, a film for forming optical waveguide formed into a film shape in advance on a base material or mold-releasing film may be bonded on the interlaminar insulating layer or directly formed on the interlaminar insulating layer by using the mehtod.

Specifically, in order to form the organic optical waveguides, methods similar to those described in relation to the method for manufacturing the multilayered printed circuit board according to the second group of the present invention, i.e., the method using reactive ion etching, the exposure-development method, the mold formation method, the resist formation method, a combination thereof or the like can be used.

As described above in relation to the second group of the present invention, when the optical waveguides having particles mixed in the core parts are to be formed, it is desirable to use the mold formation method rather than the exposure-development method. The reason is as follows.

It is desirable to form an optical path conversion mirror on the organic optical waveguide.

The optical path conversion mirror may be formed before attaching the organic optical waveguide onto the interlaminar insulating layer or may be formed after attaching it onto the interlaminar insulating layer. However, it is desirable to form the optical path conversion mirror in advance except for a case where the organic optical waveguide is directly formed on the interlaminar insulating layer. This is because it is possible to facilitate operation and to prevent the conductor circuits, interlaminar insulating layers and the other members that constitute the multilayered printed circuit board from being damaged or broken during the working.

A formation method of the optical path conversion mirror is not limited to a specific method and a conventional well-known method can be used. Specifically, machining process using a diamond saw having a 90°-V-shaped tip end, a blade or a cutter, processing by reactive ion etching, laser abrasion or the like can be performed to form the optical path conversion mirrors. Alternatively, an optical path conversion member may be embedded in the optical waveguide in place of forming the optical path conversion mirror.

(3) Next, a solder resist layer is formed in organic optical waveguide non-formed parts.

The solder resist layer can be formed using the similar composition to the solder resist composition used to manufacture the multilayered printed circuit board according to the second group of the present invention or the like.

In addition, the thickness of the solder resist layer is desirably equal to that of the organic optical waveguide. By setting these thicknesses equal, it is possible to flatten the surface of the multilayered printed circuit board. In some cases, it is desirable that the both thicknesses are equal since the solder resist layer functions as the cladding part of the optical waveguide and can decrease the loss of optical transmission on the core part.

(4) Then, openings for mounting the substrate for mounting an IC chip and various surface mount-type electronic components are formed on the solder resist layer if necessary.

The openings for mounting the substrate for mounting an IC chip and the like can be formed by a method similar to that for forming the openings for via-holes, i.e., by performing exposure and development treatments or a laser treatment.

These openings may be formed on the solder resist layer on only one surface or each of the surfaces of the multilayered printed circuit board.

At the time of forming the solder resist layer, the solder resist layer having openings for mounting the substrate for mounting an IC chip and the like may be formed by manufacturing a resin film having openings formed at desired positions in advance and bonding it.

The diameter of the openings for mounting the substrate for mounting an IC chip is desirably 500 to 1000 μm. Further, the shapes of the openings are not limited to specific ones but may be columnar, elliptical columnar, quadrangular columnar, polygonal columnar or the like.

(5) The conductor circuit portions, which is exposed by the formation of the openings for mounting the substrate for mounting an IC chip and the like are coated with corrosion resistant metal such as nickel, palladium, gold, silver or platinum, if necessary, to form pads for surface mount. Among the corrosion resistant metallic materials, it is desirable to use nickel-gold, nickel-silver, nickel-palladium, nickel-palladium-gold and the like to form the coating layer.

The coating layer may be formed by plating, vapor deposition, electrodeposition or the like. Among them, plating is desirable from a viewpoint that the coating layer is excellent in evenness when being formed by plating.

(6) Then, if necessary, after filling the pads for surface mount with solder paste (e.g., Sn/Ag=96.5/3.5 or the like) through a mask having opening portions formed in portions corresponding to the pads for surface mount, reflow is performed to thereby form solder bumps. In addition, on the solder resist layer on the opposite side to the side on which the organic optical waveguides are formed, if necessary, pins may be arranged on the external substrate connection surface of the solder resist layer using conductive adhesive or the like or solder balls may be formed thereon to provide the PGA or the BGA. The type of the pins is not limited to a specific type but T-type pins are desirable. Examples of the material of the pins include Kovar, 42 alloy and the like.

Alternatively, after filling the pads with the solder paste, the substrate for mounting an IC chip and the surface mount-type electronic components may be placed thereon before performing reflow to thereby solder the substrate for mounting an IC chip and the surface mount-type electronic components to the multilayered printed circuit board. In this case, the order of mounting (soldering) the substrate for mounting an IC chip and the surface mount-type electronic components is not limited to a specific order but it is desirable to mount the member having many connection terminals later.

In this step, the substrate for mounting an IC chip and the surface mount-type electronic components can be mounted on the multilayered printed circuit board by connecting the BGA formed on the substrate for mounting an IC chip and the bumps formed on the surface mount-type electronic components to the pads for surface mount without forming the solder bumps, the PGA or the BGA on the multilayered printed circuit board.

Through these steps, it is possible to manufacture the multilayered printed circuit board according to the first aspect of the third group of the present invention.

A multilayered printed circuit board according to the second aspect of the third group of the present invention will now be described.

The multilayered printed circuit board according to the second aspect of the third group of the present invention comprises a substrate and, as serially built up on both faces thereof, a conductor circuit and an interlaminar insulating layer in an alternate fashion and in repetition, wherein an organic optical waveguide is formed entirely on the outermost interlaminar insulating layer at one side.

According to the second aspect of the third group of the present invention, since the conductor circuits and the organic optical waveguide are formed on the multilayered printed circuit board, it is possible to transmit both an optical signal and an electric signal. Further, since the organic optical waveguide is formed in the multilayered printed circuit board, it is possible to contribute to the miniaturization of an optical communication terminal device.

In the multilayered printed circuit board, the organic optical waveguide is formed entirely on the outermost interlaminar insulating layer on one surface of the substrate.

Accordingly, it is possible to transmit an optical signal through the organic optical waveguide.

In addition, the organic optical waveguide has an excellent adhesion to an interlaminar insulating layer, and the processing thereof can be facilitated.

The organic optical waveguide is an organic optical waveguide, for example, which is constituted by a core part and a cladding part. The core part is formed as an path for transmitting an optical signal in the multilayered printed circuit board and the cladding part is formed at the other portion. When the organic optical waveguide having the above-described configuration is formed, an optical signal is enclosed in the core part and transmitted. Therefore, by forming the core part at a desired position, it is possible to transmit the optical signal on a desired path. Besides, the cladding part can protect the conductor circuits and interlaminar insulating layers.

As a material for the organic optical waveguide is not limited to a specific one as long as the material has less absorbtion in a communication wavelength band. Specifically, examples of the material include the similar examples to those used for the multilayered printed circuit board according to the first aspect of the third group of the invention and the like.

Also in the multilayered printed circuit board according to the second aspect of the third group of the present invention, the organic optical waveguide may contain particles such as resin particles, inorganic particles, metal particles and the like.

In the multilayered printed circuit board, it is desirable that an optical waveguide for receiving light and an optical waveguide for emitting light are formed as the organic optical waveguide. In this case, it is desirable that the optical waveguide for receiving light and the optical waveguide for emitting light are made of the same material. This is because it is easy to adjust the thermal expansion coefficients of the optical waveguides and easy to form them.

Further, it is desirable that an optical path conversion mirror is formed on the organic optical waveguide. By forming the optical path conversion mirror, it is possible to change the angle of the optical path to a desired angle. It is noted that a member having the optical path conversion part may be arranged on the tip end portion of the optical waveguide (the tip end portion of the core part) in place of forming the optical path conversion mirror.

It is desirable to form openings for mounting the substrate for mounting an IC chip and those for mounting surface mount-type electronic components in the organic optical waveguide. It is particularly desirable to form BGA pad openings for mounting the substrate for mounting an IC chip.

When these openings are formed in the organic optical waveguide, it is possible to mount the substrate for mounting an IC chip and the surface mount-type electronic components on the surface of the multilayered printed circuit board. Specifically, it is possible to mount a substrate for mounting an IC chip such as BGA on which the light emitting element and the light receiving element as well as the IC chip are mounted on a side of the multilayered printed circuit board on which side the optical waveguide is formed.

The solder resist layer may be formed on a side of the multilayered printed circuit board, on which side the optical waveguide is not formed. In this solder resist layer, openings for mounting the surface mount-type electronic components and the like may be formed. When such openings are formed, pads for surface may be formed on the openings, if necessary, and then the surface mount-type electronic components may be mounted on the respective pads. In the openings, a PGA or a BGA can be provided, whereby it is possible to electrically connect the multilayered printed circuit board to an external substrate or the like.

Further, according to the second aspect of the third group of the present invention through solder bumps, when the external substrate (substrate for mounting an IC chip or the like) on which the optical elements such as the light emitting element and the light receiving element are mounted are connected to printed circuit of the multilayered printed circuit board on which side the organic optical waveguide is formed, it is possible to ensure arranging the multilayered printed circuit board and the external substrate at predetermined positions by the self-alignment function of the solders.

Therefore, as long as the position of the organic optical waveguide (core part) attached on the multilayered printed circuit board of the present invention and the position of the optical elements attached on the external substrate are accurate, it is possible to accurately transmit the optical signal between the organic optical waveguide (core part) and the optical elements.

By utilizing this self-alignment function, even when their positions are deviated before reflow at the time of connecting the external substrate to the multilayered printed circuit board through the solder bumps, the external substrate moves during the reflow and can be attached to an accurate position on the multilayered printed circuit board.

In addition, it is desirable that the openings for mounting the substrate for mounting an IC chip and the like are formed in the cladding part of the organic optical waveguide. This is because no optical signal transmission is hampered.

In the multilayered printed circuit board according to the second aspect of the third group of the present invention, it is desirable that the conductor circuits with the interlaminar insulating layers interposed therebetween are connected to one another by via-holes for the similar reason to that for the multilayered printed circuit board according to the first aspect of the third group of the present invention. Further, the conductor circuits are desirably formed by the additive method.

Also in the multilayered printed circuit board according to the second aspect of the third group of the present invention, the subtractive method or the build-up method may be used to form the conductor circuits. Further, the collective pressing or sequential pressing may be used to form the conductor circuits.

In the multilayered printed circuit board according to the second aspect of the third group of the present invention, it is desirable that a solder resist layer is formed on the outermost interlaminar insulating layer on the opposite side to the side on which the organic optical waveguides are formed. This is because: by forming the solder resist layer, the solder resist layer can protect the conductor circuits and the interlaminar insulating layers.

When the solder resist layer is formed, it is desirable to form openings for mounting surface mount-type electronic components and the like in the solder resist layer.

When the openings are formed in the solder resist layer, it is possible to mount various surface mount-type electronic components and the like on the solder resist layer side. Further, a PGA or a BGA can be arranged in the respective openings, whereby it is possible to electrically connect the multilayered printed circuit board to the external substrate or the like.

In addition, in case of connecting the external substrate to a side of the multilayered printed circuit board, on the side which this solder resist layer is formed, through solder bumps, it is possible to ensure arranging the multilayered printed circuit board and the external substrate at predetermined positions by the self-alignment function of the solders.

One embodiment of the multilayered printed circuit board having the above-described configuration will now be described with reference to the drawings.

Figure 15:
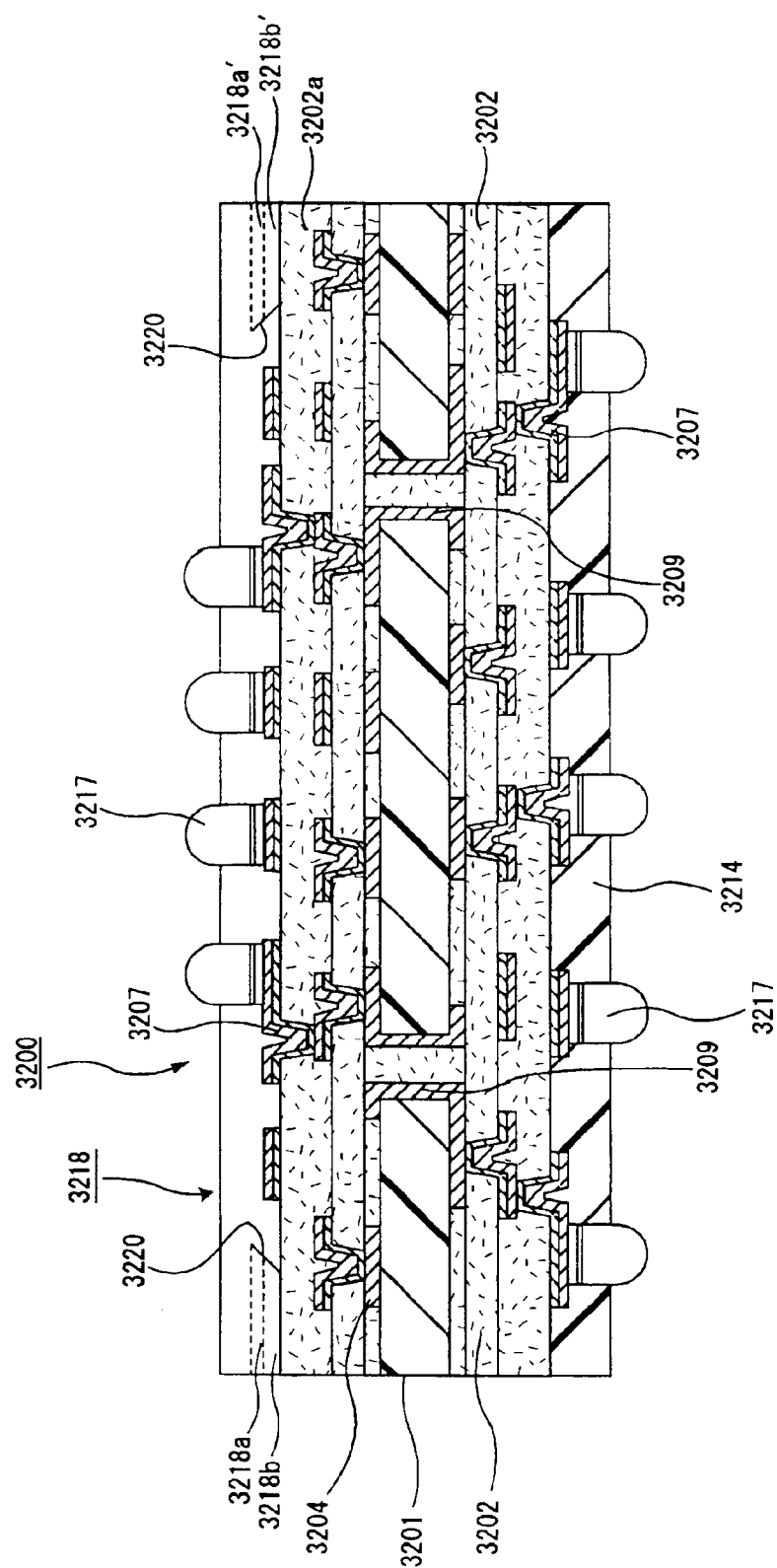
FIG. 15 is a cross-sectional view schematically showing one embodiment of a multilayered printed circuit board according to the second aspect of the third group of the present invention.

FIG. 15 is a cross-sectional view schematically showing one embodiment of the multilayered printed circuit board according to the second aspect of the third group of the present invention.

As shown in FIG. 15, regarding the multilayer printed circuit board 3200, conductor circuits 3204 and interlaminar insulating layers 3202 are built up on each surface of a substrate 3201, and the conductor circuits having the substrate 3201 interposed therebetween and those having the interlaminar insulating layers 3202 interposed therebetween are electrically connected to one another by plated-through holes 3209 and via-holes 3207, respectively.

Solder bumps 3217 are provided and an organic optical waveguide 3218 comprising core parts 3218a and 3218a' and cladding parts 3218b and 3218b' are formed on the outermost layer at one side. Optical path conversion mirrors 3220 are provided on a part of the organic optical waveguide 3218 (end portions of the core parts 3218a and 3218a').

On the organic optical waveguide 3218, the core part 3218a and the cladding part 3218b surrounding the core part 3218a serve as an optical waveguide for receiving light and the core part 3218a' and the cladding part 3218b' surrounding the core part 3218a' serve as an optical waveguide for emitting light. Of course, the former pair may serve as the optical waveguide for emitting light and the latter pair may serve as the optical waveguide for receiving light.

A solder resist layer 3214 including solder bumps 3217 is formed on the outermost layer of the multilayered printed circuit board 3200 on the opposite side to the side on which the organic optical waveguide 3218 is formed.

In the multilayered printed circuit board 3200 having the above-described configuration, an optical signal transmitted from the outside through an optical fiber (not shown) is introduced into the organic optical waveguide 3218 (core part 3218a) and transmitted to a light receiving element (not shown) or the like through the optical path conversion mirror 3220.

In addition, an optical signal outputted from a light emitting element (not shown) is introduced into the organic optical waveguide 3218 (core part 3218a') through the optical conversion mirror 3220 and transmitted as an optical signal to the outside through the optical fiber (not shown).

When the external substrate (not shown) such as the substrate for mounting an IC chip or the like is connected to the multilayered printed circuit board 3200 through the solder bumps 3217, it is possible to electrically connect the multilayered printed circuit board 3200 to the external substrate. When the optical elements are mounted on this external substrate, it is possible to transmit an optical signal and an electric signal between the multilayered printed circuit board 3200 and the external substrate.

The multilayered printed circuit board, having the above-described configuration, according to the second aspect of the third group of the present invention can also be used as a package substrate, a mother board, a daughter board or the like similarly to the multilayered printed circuit board according to the first aspect of the third group of the present invention.

A method for manufacturing the multilayered printed circuit board according to the second aspect of the third group of the present invention will now be described.

The method for manufacturing the multilayered printed circuit board according to the second aspect of the third group of the present invention differs from the method for manufacturing the multilayered printed circuit board according to the first aspect of the third group of the present invention in the formation method of the organic optical waveguide and in that the solder resist layer is not formed at least on one face of the circuit board.

Accordingly, in the description of the method for manufacturing the multilayered printed circuit board according to the second aspect of the third group of the present invention, the step of forming the organic optical waveguide will be described in detail while the other steps will be briefly described.

In the manufacture of the multilayered printed circuit board according to the second aspect of the third group of the present invention, first, a multilayered circuit board comprising conductor circuits and interlaminar insulating layers built up on both faces of a substrate is manufactured similarly to the step (1) of the method for manufacturing the multilayered printed circuit board according to the first aspect of the third group of the present invention.

(2) Next, an organic optical waveguide is formed entirely on the outermost interlaminar insulating layer at one side. In order to form the organic optical waveguides, the method using reactive ion etching, the exposure-development method, the mold formation method, the resist formation method, a combination thereof or the like can be used.

Specifically, the organic optical waveguide can be formed by using the method including the step of bonding the organic optical waveguide film, for example, the following steps (a) to (c).

(a) Liquid polymer which becomes an under-cladding part is applied onto a base material, a mold-releasing film or the like by spin coating or the like to form a film, and the resultant film is thermally cured. Thereafter, polymer which becomes a core layer is applied onto the under-cladding part to form a film, and the resultant film is thermally cured. Then, a resist is applied onto the surface of the core layer, a resist pattern is formed by photolithography, and the core layer is patterned into a core part by RIE (Reactive Ion Etching).

(b) Next, a film comprising the under-cladding part and the core part is bonded to a predetermined position of the outermost interlaminar insulating layer.

Further, it is desirable to form optical path conversion mirrors on the film comprising the under-cladding part and the core part.

The optical path conversion mirrors may be formed before attaching the film onto the interlaminar insulating layer or maybe formed after attaching it onto the interlaminar insulating layer. However, it is desirable to form the optical path conversion mirrors in advance except for a case where the organic optical waveguide is directly formed on the interlaminar insulating layer. This is because it is possible to facilitate working and to prevent the conductor circuits, interlaminar insulating layers and the other members constituting the multilayered printed circuit board from being damaged or broken during the working.

As a formation method of the optical path conversion mirrors, a method similar to that used for manufacturing the multilayered printed circuit board according to the first aspect of the third group of the present invention can be used.

Alternatively, optical path conversion members may be arranged in place of forming the optical path conversion mirrors.

(c) Polymer which becomes an over-cladding part is applied onto the entire surface of the interlaminar insulating layer to which the film comprising the under-cladding part and the core part is bonded, to form a film, and the resultant film is thermally cured, thereby obtaining an organic optical waveguide.

Alternatively, the formation of constituent elements of the organic optical waveguide up to the over-cladding part may be performed on the mold-releasing film or the like and this film-shaped optical waveguide may be then bonded onto the interlaminar insulating layer.

Instead of the method of bonding the film formed in advance, a method similar to the above-described method may be used. Namely, the under-cladding part and the core part are formed at predetermined positions on the interlaminar insulating layer and the over-cladding layer is then formed, thereby obtaining the organic optical waveguide.

In the step, if necessary, a solder resist layer is formed on the outermost interlaminar insulating layer on the opposite side to the side on which the organic optical waveguide is formed.

The solder resist layer can be formed similarly to the step (3) of the method for manufacturing the multilayered printed circuit board according to the first aspect of the third group of the present invention.

(3) Next, openings for mounting the substrate for mounting an IC chip and surface mount-type electronic components are formed in the organic optical path if necessary.

The openings for mounting the substrate for mounting an IC chip and the like can be formed by a laser treatment. As a laser used for this laser treatment, a laser similar to that used for forming the openings for via-holes can be used.

The diameter of the openings for mounting the substrate for mounting an IC chip and the like is desirably 500 to 1000 μm. Further, the shapes of the openings are not limited to specific ones but the openings may be columnar, elliptical columnar, quadrangular columnar, polygonal columnar or the like.

Further, at the time of forming the over-cladding part, the organic optical waveguide path including openings for mounting the substrate for mounting an IC chip and the like can be formed by manufacturing a resin film having openings formed at desired positions in advance and bonding it.

If the solder resist layer is formed in the above-described step (2), the openings for mounting the surface mount-type electronic components and the like may be formed similarly to the step (4) of the method for manufacturing the multilayered printed circuit board according to the first aspect of the third group of the present invention.

(4) Similarly to the steps (5) and (6) of the method for manufacturing the multilayered printed circuit board according to the first aspect of the third group of the present invention, if necessary, pads for surface mount and solder bumps are formed and a PGA or a BGA is arranged. Similarly to the case for manufacturing the multilayered printed circuit board according to the first aspect of the third group of the present invention, after filling the pads with the solder paste, the substrate for mounting an IC chip and the like may be placed thereon to thereby solder the substrate for mounting an IC chip and the like to the multilayered printed circuit board.

In this step, the substrate for mounting an IC chip and the surface mount-type electronic components can be mounted on the multilayered printed circuit board by connecting the BGA formed on the substrate for mounting an IC chip and the bumps formed on the surface mount-type electronic components to the pads for surface mount without forming the solder bumps, PGA or BGA.

Through these steps, it is possible to manufacture the multilayered printed circuit board according to the second aspect of the third group of the present invention.

A multilayered printed circuit board according to the fourth group of the present invention will now be described.

First, a multilayered printed circuit board according to the first aspect of the fourth group of the present invention will be described.

The multilayered printed circuit board according to the first aspect of the fourth group of the present invention comprises: a substrate and, as serially built up on both faces thereof, a conductor circuit and an interlaminar insulating layer in an alternate fashion and in repetition; and an optical waveguide formed at outer side of the above-mentioned substrate, wherein an elastic material layer is formed between the above-mentioned substrate and the above-mentioned optical waveguide.

According to the first aspect of the fourth group of the present invention, since the optical waveguide is formed at outer side of the substrate through the elastic material layer of the multilayered printed circuit board, it is possible to moderate stress applied to the substrate at the time of forming the optical waveguide, particularly at the time of forming the optical conversion mirror on the optical waveguide and prevent cracks and the like derived from the stress from occurring to the substrate. Accordingly, there is no possibility of deterioration of the reliability of the multilayered printed circuit board due to the cracks and the like occurring to the substrate.

In addition, when a film-shaped optical waveguide having the optical path conversion mirror formed thereon in advance is bonded at the time of forming the optical waveguide, the elastic material layer can moderate stress applied to the optical waveguide and prevent scratches, cracks and the like from occurring to the optical waveguide.

Since the conductor circuits and the organic optical waveguide are formed on the multilayered printed circuit board, it is possible to transmit both an optical signal and an electric signal. Further, since the optical waveguide is internalized in the multilayered printed circuit board, it is possible to contribute to the miniatuarization of an optical communication terminal device.

The multilayered printed circuit board according to the first aspect of the fourth group of the present invention comprises an optical waveguide formed at outer side of a substrate, wherein an elastic material layer is formed between the substrate and the optical waveguide.

The elastic material layer has an elastic modulus of desirably $2.5 \times 10^3$ MPa (250 kgf/mm$^2$) or less, more desirably 1.0 to $1.0 \times 10^3$ MPa (0.1 to 100 kgf/mm$^2$). When the elastic modulus exceeds $2.5 \times 10^3$ MPa, the stress applied to the substrate at the time of forming the optical waveguide, particularly at the time of forming the optical path conversion mirror on the optical waveguide, cannot be sufficiently moderated and the occurrence of cracks and the like to the substrate cannot be prevented. Besides, stress applied to the optical waveguide due to the difference in thermal expansion coefficient between the optical waveguide and the substrate or the interlaminar insulating layer cannot be sufficiently moderated, with the result that cracks may possibly occur to the optical waveguide.

Further, when the optical waveguide is formed by bonding a film-shaped optical guide, the stress applied to the optical waveguide cannot be sufficiently moderated and scratches, cracks and the like may possibly occur to the optical waveguide.

As a specific material for the elastic material layer, polyolefin resin and/or polyimide resin having an elastic modulus within the above-mentioned range is desirable.

A formation method of the elastic material layer will be described later in detail.

In the multilayered printed circuit board according to the first aspect of the fourth group of the present invention, the optical waveguide is formed on the elastic material layer.

Examples of the optical waveguide include an organic optical waveguide made of a polymer material or the like, an inorganic optical waveguide made of quartz glass, a compound semiconductor or the like, and the like. Among them, it is desirable to use the organic optical waveguide. This is because good adhesion between the optical waveguide and the interlaminar insulating layer is ensured and the optical waveguide can be easily formed and processed.

Examples of the polymer material include the similar examples to those described as the material for the organic optical waveguide constituting the multilayered printed circuit board according to the second group of the present invention.

The optical waveguide may contain not only the resin composition but also particles such as resin particles, inorganic particles and metal particles. Examples of the particles include the similar particles to those contained in the optical waveguide constituting the multilayered printed circuit board according to the second group of the present invention, and the like.

The resin particles, inorganic particles and metal particles may be used alone or in combination of two or more of them. The shape, diameter, mixing quantity of the particles are similar to those of the particles contained in the optical waveguide according to the second group of the present invention.

When the optical waveguide is constituted by a core part and a cladding part, the particles may be mixed in both the core part and the cladding part. Desirably, no particles are mixed in the core part and particles are mixed only in the cladding part covering the surrounding of the core part. The reason is the same as that described above in relation to the second group of the present invention.

When the particles are contained in the optical waveguide, it is possible to adjust the thermal expansion coefficient of the optical waveguide to those of the substrate, interlaminar insulating layers and the like that constitute the multilayered printed circuit board, making it more difficult to cause cracks, peeling and the like due to the difference in thermal expansion coefficient. In addition, in the optical waveguide containing the particles, thermal expansion coefficient in the direction of the surface of the optical waveguide on which the optical waveguide is brought into contact with the substrate or the like is approximately equal to thermal expansion coefficient in the direction orthogonal to the substrate or the like. Therefore, it is possible to almost prevent the balance between the $TM_0$ mode and $TE_0$ mode of the optical waveguide from being disturbed. Accordingly, it is possible to suppress optical signal transmission loss derived from these factors and ensure good optical signal transmission.

The shape of the optical waveguide is not limited to a specific shape but a sheet-shaped optical waveguide is desirable since it is easy to form.

The thickness of the core part of the optical waveguide is desirably 1 to 100 μm and the width thereof is desirably 1 to 100 μm. When the width is less than 1 μm, it is difficult to form the core part in some cases. When the width exceeds 100 μm, this may decrease the degree of freedom for the design of the conductor circuits and the like which constitute the multilayered printed circuit board in some cases.

The ratio of the above-mentioned thickness to width of the core part of the optical waveguide is desirably closer to 1:1. The plan shapes of the light receiving part of the light receiving element and the light emitting part of the light emitting element are normally circular. The ratio of the thickness to width is not limited to the specific one but it is sufficient that the ratio is normally about 1:2 to 2:1.

When the optical waveguide is a single-mode optical waveguide having a communication wavelength of 1.31 μm or 1.55 μm, the thickness and width of the core part of the optical waveguide are desirably 5 to 15 μm, more desirably about 10 μm. When the optical waveguide is a multi-mode optical waveguide having a communication wavelength of 0.85 μm, the thickness and width of the core part of the optical waveguide are desirably 20 to 80 μm, more desirably about 50 μm.

It is desirable that an optical waveguide for receiving light and an optical waveguide for emitting light are formed as the optical waveguide.

It is also desirable that the optical waveguide for receiving light and the optical waveguide for emitting light are made of the same material. This is because it is easy to adjust the thermal expansion coefficients of the optical waveguides and easy to form them.

Further, it is desirable that an optical path conversion mirror is formed on the optical waveguide as described above. This is because, by forming the optical path conversion mirror, it is possible to change the angle of the optical path to a desired angle.

The optical path conversion mirror can be formed by cutting one end of the optical waveguide. Alternatively, a member that includes an optical path conversion section may be arranged on the tip end portion of the optical waveguide in place of forming the optical path conversion mirror on the optical waveguide.

In the multilayered printed circuit board according to the first aspect of the fourth group of the present invention, the optical waveguide is formed on a part of the surface of the substrate. Therefore, it is desirable to form openings for optical paths for transmitting an optical signal between the optical waveguide and the external optical components (light receiving element, light emitting element, optical fiber and the like).

Specifically, it is desirable to form openings for optical paths penetrating the interlaminar insulating layers built up on one surface of the substrate. In addition, as will be described later, when the solder resist layer is formed on the outermost layer of the multilayered printed circuit board, it is desirable to form correlated openings for optical paths penetrating the solder resist layer and the interlaminar insulating layers at one side of the substrate.

The openings for optical paths may be filled with resin that does not hamper optical signal transmission, resin similar to that used for the optical waveguide or the like. By filling the openings for optical paths with the resin, it is possible to protect the optical waveguide formed on the substrate.

Further, in the multilayered printed circuit board, it is desirable that the conductor circuits with the interlaminar insulating layers interposed therebetween are connected to one another by via-holes.

By connecting the conductor circuits by via-holes, it is possible to arrange the conductor circuits with high density and improve the degree of freedom for the design of the conductor circuits.

Further, as shown in the following description of a method for manufacturing the multilayered printed circuit board, the conductor circuits are desirably formed by the additive method.

This is because the additive method is suitable for the formation of conductor circuits having fine wirings interval of 50 μm or less.

The additive method may be the full-additive method or the semi-additive method.

Alternatively, the subtractive method or the build-up method may be used to form the conductor circuits. Further, the collective pressing or sequential pressing may be used to form the conductor circuits.

It is further desirable that a solder resist layer is formed on the outermost layer of the multilayered printed circuit board, and openings for mounting the substrate for mounting an IC chip and openings for mounting various surface mount-type electronic components are formed in the solder resist layer.

When these openings are formed in the solder resist layer and pads for surface mount are formed if necessary, it is possible to form solder bumps and arrange a PGA and a BGA. It is thereby possible to electrically connect the multilayered printed circuit board to an external substrate or the like.

Further, the substrate for mounting an IC chip and the surface mount-type electronic components can be mounted on the multilayered printed circuit board by connecting the BGA formed on the substrate for mounting an IC chip and the bumps formed on the surface mount-type electronic components to the pads for surface mount without forming the solder bumps, PGA or BGA.

In the multilayered printed circuit board according to the first aspect of the fourth group of the present invention, when the external substrate (substrate for mounting an IC chip or the like) on which the optical elements such as the light emitting element and the light receiving element are mounted is connected on the side on which the optical waveguide is formed through solder bumps, it is possible to ensure arranging the multilayered printed circuit board and the external substrate at respective predetermined positions by the self-alignment function of the solders.

Therefore, as long as the attached position of the optical waveguide at the multilayered printed circuit board and the attached position of the optical elements are accurate, it is possible to accurately transmit the optical signal between the optical waveguide and the optical elements.

By utilizing this self-alignment function, even when their positions are deviated before reflow at the time of connecting the external substrate to the multilayered printed circuit board through the solder bumps, the external substrate moves during the reflow and can be attached to an accurate position on the multilayered printed circuit board.

The embodiment of the multilayered printed circuit board, having the above-described configuration, according to the first aspect of the fourth group of the present invention will now be described with reference to the drawings.

Figure 23:
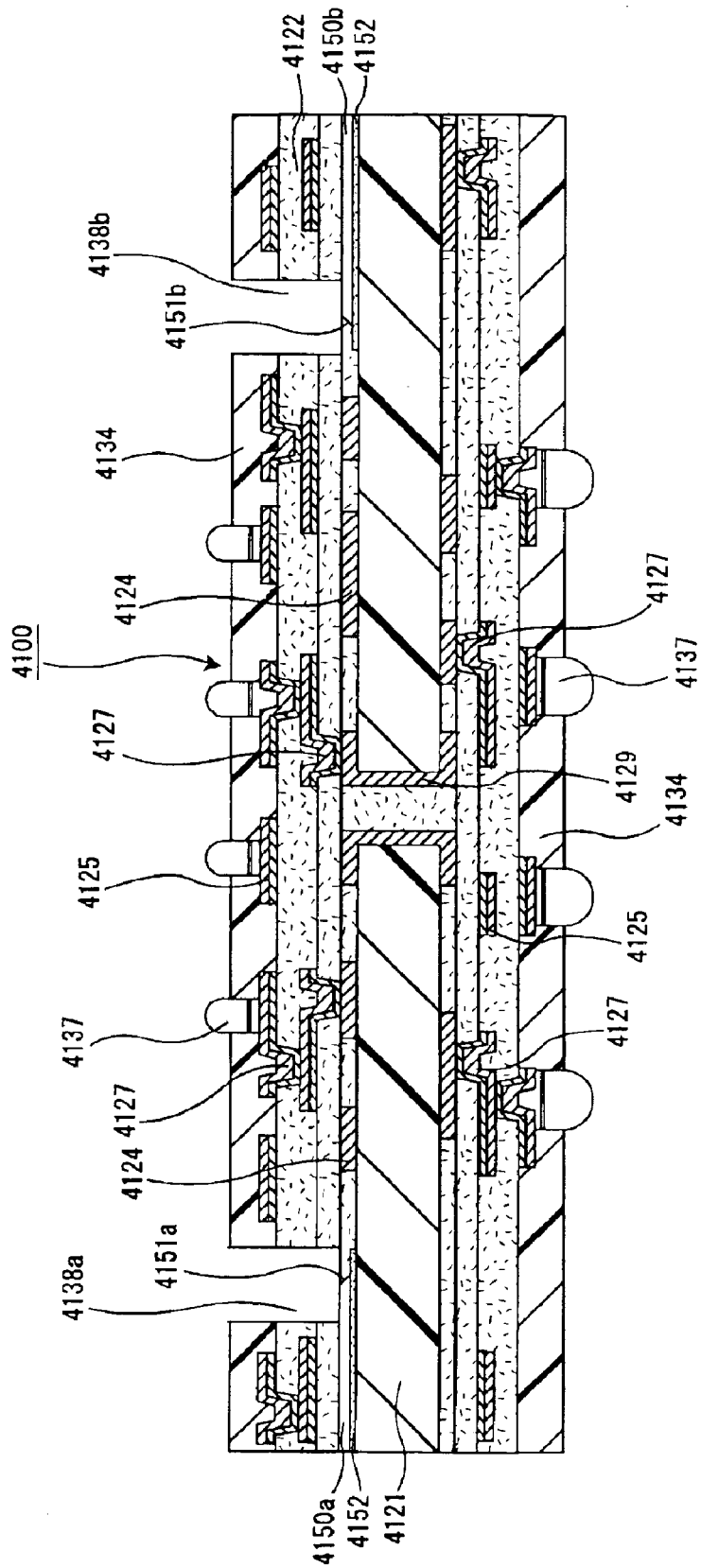
FIG. 23 is a cross-sectional view schematically showing one embodiment of a multilayered printed circuit board according to the first aspect of the fourth group of the present invention.

FIG. 23 is a cross-sectional view schematically showing one embodiment of the multilayered printed circuit board according to the first aspect of the fourth group of the present invention.

As shown in FIG. 23, in the multilayered printed circuit board 4100, conductor circuits 4124 and interlaminar insulating layers 4122 are built up on each surface of a substrate 4121, and the conductor circuits having the substrate 4121 interposed therebetween and the conductor circuits having the interlaminar insulating layers 4122 interposed therebetween are electrically connected to one another by plated-through holes 4129 and via-holes 4127, respectively, and a solder resist layer 4134 is formed on an outermost layer.

In addition, optical waveguides 4150 (4150a, 4150b) are formed through an elastic material layer 4152 over the surface of the substrate 4121 as well as the conductor circuit 4124 on the lowermost layer of the substrate. In portions on the tip ends of the optical waveguides 4150, in which optical path conversion mirrors 4151 (4151a, 4151b) are formed, openings 4138 (4138a, 4138b) for optical paths are formed perpendicularly to the substrate 4121. The openings 4138 for optical paths is formed of cavities.

It is noted that one of the optical waveguides 4150a and 4150b is an optical waveguide for receiving light and the other is an optical waveguide for emitting light.

In the multilayered printed circuit board 4100 having the above-described configuration, an optical signal transmitted from the outside through an optical fiber (not shown) is introduced into the optical waveguide 4150a and transmitted to a light receiving element (not shown) or the like through the optical path conversion mirror 4151a and the opening 4138a for optical path.

In addition, an optical signal outputted from a light emitting element (not shown) is introduced into the optical waveguide 4150b through the optical conversion mirror 4151b from the opening 4138b for optical path, and transmitted to the light receiving element of another substrate for mounting an IC chip to be converted into an electric signal or transmitted to the outside through the optical fiber (not shown).

When the external substrate such as the substrate for mounting an IC chip (not shown) is connected to the multilayered printed circuit board 4100 through the solder bumps 4137, it is possible to electrically connect the multilayered printed circuit board 4100 to the external substrate. When the optical elements are mounted on this external substrate, it is possible to transmit an optical signal and an electric signal between the multilayered printed circuit board 4100 and the external substrate.

The multilayered printed circuit board, having the above-described configuration, according to the first aspect of the fourth group of the present invention can be used as a package substrate, a mother board, a daughter board or the like by appropriately selecting whether: openings for mounting the substrate for mounting an IC chip and the surface mount-type electronic components are formed or not in the solder resist layer; or a BGA or a PGA is formed or not thereon.

In the multilayered printed circuit board including the optical waveguides having the above-described configuration, it is possible to moderate stress applied to the substrate at the time of forming the optical waveguides, particularly at the time of forming the optical conversion mirrors on the optical waveguides. When the optical waveguides are formed by bonding optical waveguides formed in a film shape in advance, it is possible to moderate stress applied to the optical waveguides during bonding.

A formation method of the optical waveguides and a formation method of an optical path conversion mirror on each optical waveguide will be described later in detail when a method for manufacturing the multilayered printed circuit board is described.

Next, a method for manufacturing the multilayered printed circuit board according to the first aspect of the fourth group of the present invention will now be described.

(1) Using an insulating substrate as a starting material, conductor circuits are formed on the insulating substrate.

Specifically, a method similar to that used in the step (1) of the method for manufacturing the multilayered printed circuit board according to the second group of the present invention or the like can be used.

(2) Next, the surfaces of the conductor circuits is subjected to a surface roughening treatment, if necessary.

The roughened surface formation treatment can be performed in a method similar to that used in the step (2) of the method for manufacturing the multilayered printed circuit board according to the second group of the present invention.

(3) An elastic material layer and optical waveguides are formed in conductor circuit non-formed parts on the substrate.

The elastic material layer can be formed using a method of bonding a film-shaped elastic material cut to have a desired size in advance, a method of applying a resin composition containing a resin material for the elastic material layer by a roll coater, a curtain coater or the like and then forming the elastic material layer only at a predetermined position by exposure and development treatments, or the other method. Alternatively, after applying the resin composition by the above-mentioned method, the elastic material layer may be formed at a predetermined position by an etching method, a resist formation method or the like.

Next, optical waveguides are formed on the elastic material layer. The optical waveguides can be formed by a method using reactive ion etching, an exposure-development method, a mold formation method, a resist formation method, a combination thereof or the like.

Specifically, for example, a resin composition for optical waveguide which becomes an under-cladding part is applied onto the elastic material layer by a spin coater or the like to form a film, and the resultant film is thermally cured. Thereafter, a resin composition for optical waveguide which becomes a core layer is applied onto the under-cladding part to form a film, and the resultant film is thermally cured. A resist is applied onto the surface of the core layer, a resist pattern is formed by photolithography, and the core layer is patterned into a core part by RIE (Reactive Ion Etching). Further, a resin composition for optical waveguide which becomes an over-cladding part is applied onto the under-cladding part (including the core part) to form a film, and the resultant film is thermally cured, whereby an optical waveguide can be formed.

Herein, the application of the resin compositions for optical waveguide and film formation may be performed by a method using a curtain coater or a roll coater, printing or the like.

Examples of the resin compositions for optical waveguides include a composition mixed with a curing agent, a reaction stabilizer, a solvent or the like, if necessary, besides the above-mentioned polymer material and particles.

The application of the resin compositions for optical waveguides may be performed once or plural number of times. Whether the application of the resin compositions for optical waveguides is to be performed once or plural number of times may be appropriately selected based on the thicknesses and the like of the cladding part and the core part.

Further, a method for bonding a film (a film-shaped optical waveguide) comprising resin compositions for optical waveguides and formed in advance may be used in place of the method for applying the uncured resin compositions and forming a film.

Specifically, the optical waveguide is formed by, for example, manufacturing a film-shaped optical waveguide on a base material, a mold-releasing film or the like in advance using resin compositions for optical waveguides and boding the optical waveguide onto the elastic material layer.

In this case, before bonding the film-shaped optical waveguide over the substrate (on the elastic material layer) the optical path conversion mirror may be formed in advance. Incidentally, The optical path conversion mirror can be formed by a method similar to that using a diamond saw or the like to be described later.

Whether the optical path conversion mirror is to be formed after forming the optical waveguide on the substrate or before bonding the film-shaped optical waveguide over the substrate may be appropriately selected based on the shape and the like of the optical path conversion mirror.

Specifically, in the multilayered printed circuit board shown in FIG. 23, the optical path conversion mirror 4151 (4151*a* or 4151*b*) provided on the optical waveguide 4150 (4150*a* or 4150*b*) is inclined such that the bottom surface of the optical waveguide 4150 is larger than the upper surface thereof. The optical path conversion mirror having such a shape can be easily formed by machining process using a diamond saw after forming the optical waveguide on the substrate (on the elastic material layer). Accordingly, optical path conversion mirror having such a shape may be formed after forming the optical waveguide on the substrate (on the elastic material layer).

However, in the multilayered printed circuit board according to the first aspect of the fourth group of the present invention, when the optical waveguide having the optical path conversion mirror is formed, the shape of the optical path conversion mirror is not limited to the shape shown in FIG. 23 but may be appropriately selected based on the structure and the like of the multilayered printed circuit board. Accordingly, like an optical waveguide 4150' (4150*a*' or 4150*b*') shown in FIG. 30, an optical path conversion mirror 4151' (4151*a*' or 4151*b*') may be formed such that the upper surface of the optical waveguide 4150' is larger than the bottom surface thereof.

Figure 30:
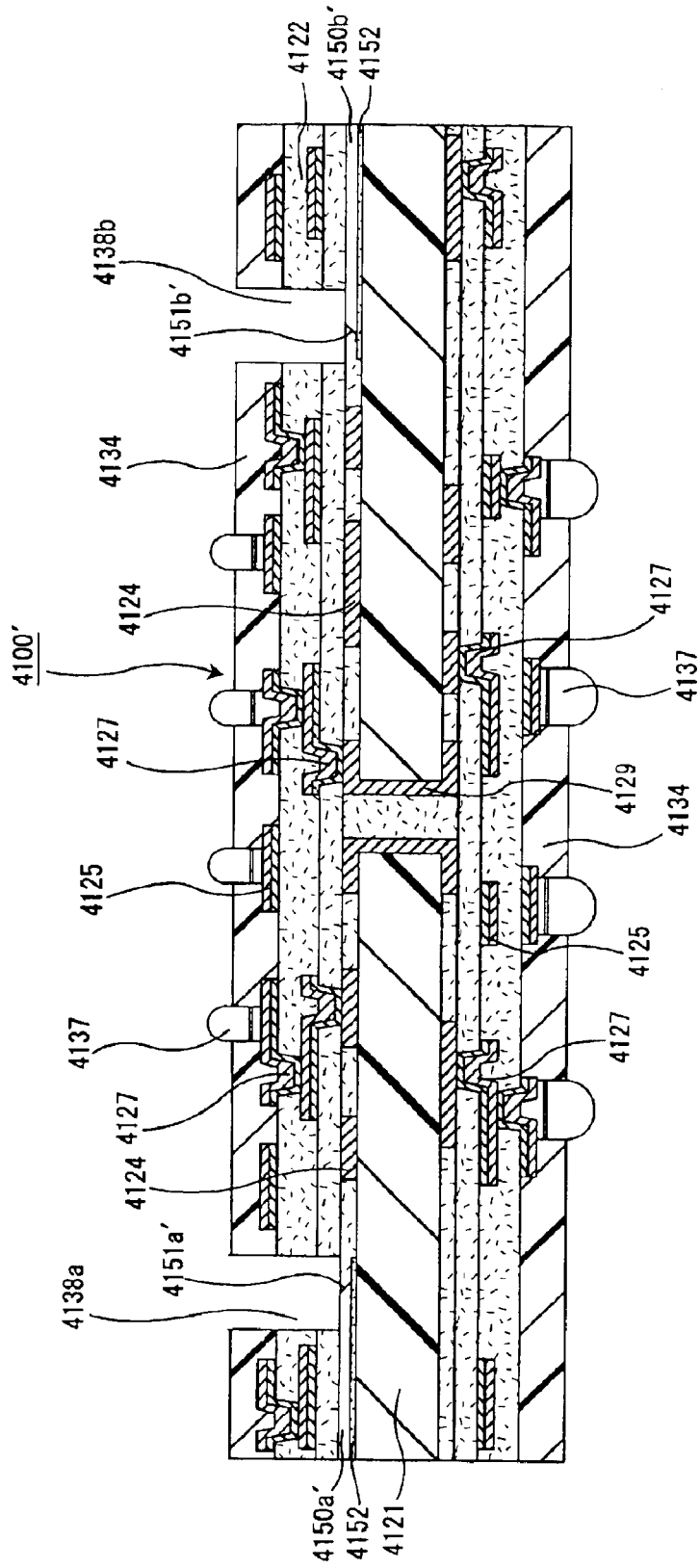
FIG. 30 is a cross-sectional view schematically showing another embodiment of the multilayered printed circuit board according to the first aspect of the fourth group of the present invention.

FIG. 30 is a cross-sectional view schematically showing another embodiment of the multilayered printed circuit board according to the first aspect of the fourth group of the present invention. The multilayered printed circuit board 4100 shown in FIG. 30 differs from the multilayered printed circuit board 4100 shown in FIG. 23 only in the shapes of the optical waveguides 4150' (those of the optical path conversion mirror 4151*a*', 4151*b*') and the other configuration is similar to that of the multilayered printed circuit board 4100.

As shown in FIG. 30, when the optical waveguides each having an optical path conversion mirror formed such that the upper surface of the optical path conversion mirror is larger than the bottom surface thereof are to be formed, it is difficult to form them after forming optical waveguides on the substrate (on the elastic material layer). Accordingly, the optical waveguide having such an optical path conversion mirror is formed by bonding a film-shaped optical waveguide with an optical path conversion mirror formed in advance over the substrate (on the elastic material layer).

In the manufacture of the multilayered printed circuit board according to the first aspect of the fourth group of the present invention, when the method of bonding the film-shaped optical waveguides over the substrate is used, the film-shaped optical waveguides are bonded onto the elastic material layer formed on the substrate. Therefore, it is possible to moderate stress applied onto the optical waveguides during bonding and prevent the occurrence of scratches, cracks and the like.

Further, when the optical waveguides are formed using the method of bonding a film onto the substrate, the elastic material layer and the optical waveguides may be formed using a method of bonding a film comprising two layers having the elastic material layer and the optical waveguides superposed in advance, by thermal bonding or the like. In this case, it is also possible to moderate stress applied to the optical waveguides.

It is noted that the formation step of the optical waveguide may be performed before forming the conductor circuits on the substrate.

When the optical path conversion mirror is to be formed on the optical waveguide, the optical path conversion mirror may be formed after forming the optical waveguide on the substrate (on the elastic material layer).

The method of forming the optical path conversion mirror is not limited to a specific method and a conventional well-known method can be used. Specifically, machining process using a diamond saw having a 90°-V-shaped tip end, a blade or a cutter or the like can be performed.

When the optical path conversion mirror is formed on the optical waveguide that is formed on the elastic material layer by the above-described method, it is possible to moderate stress applied to the substrate and, thereby, prevent cracks and the like from occurring to the substrate.

In some cases, an optical path conversion member may be formed in place of the optical path conversion mirror. In these cases, the elastic material layer can moderate the stress applied to the substrate when forming the optical path conversion member.

(4) Next, an uncured resin layer comprising thermosetting resin, photosensitive resin, resin obtained by acrylating a part of thermosetting resin, or a resin complex containing of these resins and thermoplastic resin is formed or a resin layer comprising thermoplastic resin is formed on the substrate on which the optical waveguides and the conductor circuits are formed.

As the method of forming the resin layer, a method similar to that used in the step (3) of the method for manufacturing the multilayered printed circuit board according to the second group of the present invention or the like can be used.

(5) Next, in case of forming interlaminar insulating layers using the thermosetting resin or resin complex as a material, openings for via-holes are formed as well as the uncured resin insulating layer is subjected to a curing treatment, thereby obtaining the interlaminar insulating layers. In this step, through holes may be formed if necessary.

The openings for via-hole and the through holes can be formed by a method similar to that used in the step (4) of the method for manufacturing the multilayered printed circuit board according to the second group of the present invention or the like can be used.

(6) Next, conductor circuits (including via-holes) are formed on the interlaminar insulating layers. Specifically, it is sufficient that a method similar to that used in the step (5) of the method for manufacturing the multilayered printed circuit board according to the second group of the present invention or the like is used to form the conductor circuits.

Accordingly, similarly to the method for manufacturing the multilayered printed circuit board according to the second group of the present invention, the conductor circuits may be formed by the additive method, the subtractive method or the build-up method. Further, collective pressing or sequential pressing may be used to form the conductor circuits.

(7) Then, when a cover plating layer is formed, the surface of the cover plating layer is subjected to a roughening treatment, if necessary, and the steps (4) to (6) are repeatedly performed if necessary, whereby interlaminar insulating layers and conductor circuits are formed on the both surfaces of the cover plating layer. In this step, plated-through holes may be formed or not formed.

(8) Next, an outermost solder resist layer is formed if necessary.

Specifically, a method similar to that used in the step (10) of the method for manufacturing the multilayered printed circuit board according to the second group of the present invention can be used to form the solder resist layer.

(9) Openings for mounting the substrate for mounting an IC chip and various surface mount-type electronic components are formed in the solder resist layer if necessary. Specifically, a method similar to that for forming the openings for via-holes, i.e., exposure and development treatment or a laser treatment can be used to form these openings. These openings may be formed only in the solder resist layer on one face or in the solder resist layer on both faces.

Further, when the solder resist layer is formed, the solder resist layer having openings for mounting the substrate for mounting an IC chip and the like may be formed by manufacturing a resin film having openings formed at desired positions in advance and bonding it.

The diameter of the openings for mounting the substrate for mounting an IC chip and the like is desirably 500 to 1000 μm.

(10) Next, the conductor circuit portions, which is exposed by the formation of the openings for mounting the substrate for mounting an IC chip and the like are coated with corrosion resistant metal such as nickel, palladium, gold, silver or platinum, if necessary, to form pads for surface mount. Among the corrosion resistant metallic materials, it is desirable to use nickel-gold, nickel-silver, nickel-palladium, nickel-palladium-gold and the like to form the coating layer.

The coating layer can be formed by plating, vapor deposition, electrodeposition or the like. Among them, plating is desirable from a viewpoint that the coating layer is excellent in evenness when being formed by plating.

(11) Next, openings for optical paths penetrating the solder resist layer and the interlaminar insulating layers in a row are formed on one surface of the substrate.

The openings for optical paths are formed by a laser treatment or the like.

As a laser used for the laser treatment, the similar laser to that used for forming the openings for via-holes can be used.

In this case, it is desirable to use a laser with a wavelength at which the optical waveguides do not exhibit absorbing property. If such a laser is used, there is a little probability that the surfaces of the optical waveguides are damaged when forming the openings for optical paths.

In addition, the positions for forming the openings for optical paths are not limited to specific ones as long as it is possible to transmit an optical signal from the optical waveguides and a signal to the optical waveguides. The positions may be appropriately selected based on the design of the conductor circuits and the like.

It is desirable that the diameter of the openings for optical paths is 100 to 500 μm. Further, the shapes of the openings are not limited to specific ones but the openings may be columnar, elliptical columnar, quadrangular columnar, polygonal columnar or the like.

As described above, the openings for optical paths may be formed after forming the solder resist layer. In some cases, after: forming the interlaminar insulating layers; and then the openings for optical paths are formed once and the solder resist layer is formed thereon, then, openings communicating with the openings for optical paths provided in the interlaminar insulating layers may be formed, at another time, as openings for optical paths. This is because it is sometimes difficult to form the openings for optical paths by performing a laser treatment at one time, depending on the thicknesses of the interlaminar insulating layers and solder resist layer. Further, when the openings are formed separately or twice, the openings formed in the solder resist layer may be formed by exposure and development treatments.

(12) Next, if necessary, after filling the pads for surface mount with solder paste (e.g., Sn/Ag=96.5/3.5) through a mask having opening portions formed in portions corresponding to the pads for surface mount, reflow is performed to thereby form solder bumps.

In addition, on the solder resist layer on the opposite side to the side on which the optical waveguides are formed, pins may be arranged on the external substrate connection surface using conductive adhesive or the like or solder balls may be formed thereon to provide a PGA or a BGA. The type of the pins is not limited to a specific type but T-type pins are desirable. Examples of the material of the pins include Kovar, 42 alloy and the like.

Alternatively, after filling the pads with the solder paste, the substrate for mounting an IC chip and the surface mount-type electronic components may be placed thereon before performing reflow to thereby solder the substrate for mounting an IC chip and the surface mount-type electronic components to the multilayered printed circuit board. In this case, the order of mounting (soldering) the substrate for mounting an IC chip and the surface mount-type electronic components is not limited to a specific order but it is desirable to mount the member having many connection terminals later.

Further, in this step, the solder bumps, PGA or BGA are not always formed. The substrate for mounting an IC chip and the surface mount-type electronic components can be mounted on the multilayered printed circuit board by connecting the BGA formed on the substrate for mounting an IC chip and the bumps formed on the surface mount-type electronic components to the above-mentioned pads for surface mount.

Through these steps, it is possible to manufacture the multilayered printed circuit board according to the first aspect of the fourth group of the present invention.

A multilayered printed circuit board according to the second aspect of the fourth group of the present invention will now be described.

The multilayered printed circuit board according to the second aspect of the fourth group of the present invention comprises: a substrate and, as serially built up on both faces there of, a conductor circuit and an interlaminar insulating layer in an alternate fashion and in repetition; and an optical waveguide formed at outer side of the outermost interlaminar insulating layer, wherein an elastic material layer is formed between the above-mentioned outermost interlaminar insulating layer and the above-mentioned optical waveguide.

According to the second aspect of the fourth group of the present invention, since the optical waveguide is formed at outer side of the outermost interlaminar insulating layer through the elastic material layer of the multilayered printed circuit board, it is possible to moderate stress applied to the interlaminar insulating layers at the time of forming the optical waveguide, particularly at the time of forming the optical conversion mirror on the optical waveguide, and prevent cracks and the like derived from the stress from occurring to the substrate. Therefore, there is no possibility of deterioration of the reliability of the multilayered printed circuit board due to the cracks and the like occurring to the interlaminar insulating layer.

In addition, if a film-shaped optical waveguide having the optical path conversion mirror formed thereon in advance is bonded at the time of forming the optical waveguide, the elastic material layer can moderate stress applied to the optical waveguide and prevent scratches, cracks and the like from occurring to the optical waveguide.

Since the conductor circuits and the optical waveguide are formed on the multilayered printed circuit board, it is possible to transmit both an optical signal and an electric signal. Further, since the optical waveguide is internalized in the multilayered printed circuit board, it is possible to contribute to the miniatuarization of an optical communication terminal device.

The multilayered printed circuit board according to the second aspect of the fourth group of the present invention comprises an optical waveguide formed on the outermost interlaminar insulating layer, wherein an elastic material layer is formed between the interlaminar insulating layer and the optical waveguide.

The elastic material layer has an elastic modulus of desirably $2.5 \times 10^3$ MPa or less, more desirably 1.0 to $1.0 \times 10^3$ MPa similarly to the elastic material layer of the multilayered printed circuit board according to the first aspect of the fourth group of the present invention. When the elastic modulus exceeds $2.5 \times 10^3$ MPa, the stress applied to the interlaminar insulating layer at the time of forming the optical waveguide cannot be sufficiently moderated and the occurrence of cracks and the like to the interlaminar insulating layer cannot be prevented. Besides, stress applied to the optical waveguide due to the difference in thermal expansion coefficient between the optical waveguide and the interlaminar insulating layer or the solder resist layer cannot be sufficiently moderated, with the result that cracks may possibly occur to the optical waveguide.

Further, when the optical waveguide is formed by bonding a film-shaped optical guide, the stress applied to the optical waveguide cannot be sufficiently moderated and scratches, cracks and the like may possibly occur to the optical waveguide.

As a specific material for the elastic material layer, polyolefin resin and/or polyimide resin having an elastic modulus within the above-mentioned range is desirable.

The multilayered printed circuit board according to the second aspect of the fourth group of the present invention differs from the multilayered printed circuit board according to the first aspect of the fourth group of the present invention in that the optical waveguide and the elastic material layer are formed on the outer most interlaminar insulating layer. However, the members that constitute the multilayered printed circuit board such as the optical waveguide and the interlaminar insulating layers as well as the elastic material layer and materials for these members are similar to the members and materials used in the multilayered printed circuit board according to the first aspect of the fourth group of the present invention.

Accordingly, the members that constitute the multilayered printed circuit board according to the second aspect of the fourth group of the present invention will not be described herein.

Next, the embodiment of the multilayered printed circuit board according to the second aspect of the fourth group of the present invention will be described with reference to the drawings.

Figure 24:
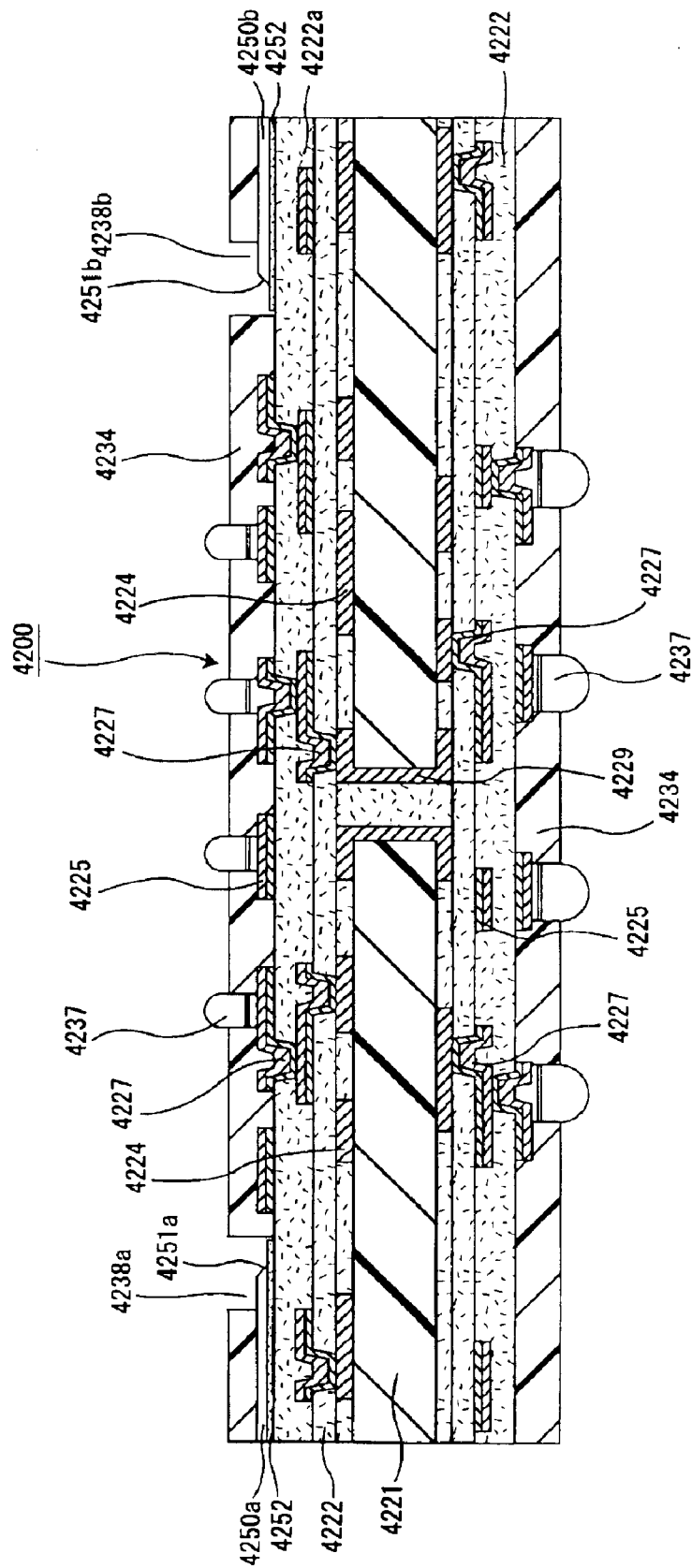
FIG. 24 is a cross-sectional view schematically showing one embodiment of a multilayered printed circuit board according to the second aspect of the fourth group of the present invention.

FIG. 24 is a cross-sectional view schematically showing one embodiment of the multilayered printed circuit board according to the second aspect of the fourth group of the present invention.

As shown in FIG. 24, in the multilayered printed circuit board 4200, conductor circuits 4224 and interlaminar insulating layers 4222 are built up on both face of a substrate 4221, the conductor circuits having the substrate 4221 interposed therebetween and the conductor circuits having the interlaminar insulating layers 4222 interposed therebetween are electrically connected to one another by plated-through holes 4229 and via-holes 4227, respectively, and a solder resist layer 4234 is formed on the outermost layer.

In addition, optical waveguides 4250 (4250*a*, 4250*b*) are formed through an elastic material layer 4252 over the outermost interlaminar insulating layer 4222*a*. In portions on the tip ends of the respective optical waveguides 4250 in which portions optical path conversion mirrors 4251 (4251*a*, 4251*b*) are formed, openings 4238 (4238*a*, 4238*b*) for optical paths are formed perpendicularly to the substrate 4221. The openings 4238 for optical paths are formed of cavities.

It is noted that one of the optical waveguides 4250*a* and 4250*b* is an optical waveguide for receiving light and the other is an optical waveguide for emitting light.

In the multilayered printed circuit board 4200 having the above-described configuration, an optical signal transmitted from the outside through an optical fiber (not shown) or the like is introduced into the optical waveguide 4250*a* and transmitted to a light receiving element (not shown) or the like through the optical path conversion mirror 4251*a* and the opening 4238*a* for optical paths.

In addition, an optical signal outputted from a light emitting element or the like (not shown) is introduced into the optical waveguide 4250*b* through the optical conversion mirror 4251*b* from the opening 4238*b* for optical paths, and transmitted to the light receiving element of another substrate for mounting an IC chip to be converted into an electric signal or transmitted to the outside through the optical fiber (not shown).

When the external substrate such as the substrate for mounting an IC chip (not shown) is connected to the multilayered printed circuit board 4200 through the solder bumps 4237, it is possible to electrically connect the multilayered printed circuit board 4200 to the external substrate. When the optical elements are mounted on this external substrate, it is possible to transmit an optical signal and an electric signal between the multilayered printed circuit board 4200 and the external substrate.

The multilayered printed circuit board, having the above-described configuration, according to the second aspect of the fourth group of the present invention can be used as a package substrate, a mother board, a daughter board or the like by appropriately selecting whether: openings for mounting the substrate for mounting an IC chip are formed or not in the solder resist layer; or a BGA or a PGA is provided or not thereon.

Also in the multilayered printed circuit board according to the second aspect of the fourth group of the present invention, when the optical path conversion mirror is formed on the optical path, the shape of the optical path conversion mirror is not limited to such a shape that the bottom surface of the optical waveguide is larger than the upper surface thereof as shown in FIG. 24 but may be such a shape that the upper surface thereof is larger than the bottom surface.

In the multilayered printed circuit board including the optical waveguides having the above-described configuration, it is possible to moderate stress applied to the interlaminar insulating layer at the time of forming the optical waveguides, particularly at the time of forming the optical conversion mirrors on the optical waveguides. When the optical waveguides are formed by bonding optical waveguides formed in a film shape in advance, it is possible to moderate stress applied to the optical waveguides during bonding process.

A method for manufacturing the multilayered printed circuit board according to the second aspect of the fourth group of the present invention will now be described.

As described above, the multilayered printed circuit board according to the second aspect of the fourth group of the present invention differs from the multilayered printed circuit board according to the first aspect of the fourth group of the present invention in the positions at which the optical waveguide and the elastic material layer are formed. Accordingly, the method for manufacturing the multilayered printed circuit board according to the second aspect of the fourth group of the present invention differs from the method for manufacturing the multilayered printed circuit board according to the first aspect of the fourth group of the present invention only in the steps of forming the elastic material layer and the optical waveguides and the other steps can be performed similarly to the method for manufacturing the multilayered printed circuit board according to the first aspect of the fourth group of the present invention.

The steps of manufacturing the elastic material layer and the optical waveguides will be mainly described herein and all the other manufacturing steps will be described briefly.

(1) First, an insulating substrate is used as a starting material, and a multilayered circuit board is formed similarly to the steps (1) to (7) of the method for manufacturing the multilayered printed circuit board according to the first aspect of the fourth group of the present invention except that the step (3) thereof, i.e., the step of forming the elastic material layer and the optical waveguides on the substrate is not performed.

(2) Then, an elastic material layer and optical waveguides are formed in conductor circuit non-formed parts on the outermost interlaminar insulating layer.

The elastic material layer can be formed using a method of bonding a film-shaped elastic material cut to have a desired size in advance, a method of applying a resin composition containing a resin material for the elastic material layer by a roll coater, a curtain coater or the like and then forming the elastic material layer only at a predetermined position by exposure and development treatments, or the other method. Alternatively, after applying the resin composition by the above-mentioned method, the elastic material layer may be formed at a predetermined position by an etching method, a resist formation method or the like.

Next, optical waveguides are formed on the elastic material layer. The optical waveguides can be formed by a method using reactive ion etching, an exposure-development method, a mold formation method, a resist formation method, a combination thereof or the like.

Specifically, for example, a resin composition for optical waveguide which becomes an under-cladding part is applied onto the elastic material layer by a spin coater or the like to form a film, and the resultant film is thermally cured. Thereafter, a resin composition for optical waveguide which becomes a core layer is applied onto the under-cladding part to form a film, and the resultant film is thermally cured. Next, a resist is applied onto the surface of the core layer, a resist pattern is formed by photolithography, and the core layer is patterned into a core part by RIE (Reactive Ion Etching) or the like. Further, a resin composition for optical waveguide which becomes an over-cladding part is applied onto the under-cladding part (including the core part) to form a film, and the resultant film is thermally cured, whereby an optical waveguide can be formed.

Herein, the application of the resin compositions for optical waveguides and film formation may be performed by a method using a curtain coater or a roll coater, printing or the like.

Examples of the resin compositions for optical waveguides include compositions similar to those used in the method for manufacturing the multilayered printed circuit board according to the first aspect of the fourth group of the present invention, and the like.

The application of the resin compositions for optical waveguides may be performed once or plural number of times. Whether the application of the resin compositions for optical waveguides is to be performed once or plural number of times may be appropriately selected based on the thicknesses and the like of the cladding part and the core part.

Further, a method of bonding a film (a film-shaped optical waveguide) comprising resin compositions for optical waveguides and formed in advance may be used in place of the method of applying the uncured resin compositions and forming a film.

Specifically, the optical waveguide is formed by, for example, manufacturing a film-shaped optical waveguide on a base material, a mold-releasing film or the like in advance using the resin compositions for optical waveguides and bonding the optical waveguide onto the elastic material layer.

In this case, before bonding the film-shaped optical waveguide over the substrate (on the elastic material layer) the optical path conversion mirror may be formed in advance. Whether the optical path conversion mirror is to be formed after forming the optical waveguide on the substrate or before bonding the film-shaped optical waveguide onto the substrate may be appropriately selected based on the shape and the like of the optical path conversion mirror. The optical path conversion mirror can be formed by a similar method to that using a diamond saw or the like to be described later.

The step of forming the optical waveguides may be performed before forming the conductor circuits on the interlaminar insulating layers.

Further, the elastic material layer and the optical waveguides may be formed by using a method of bonding a film comprising two layers having the elastic material layer and the optical waveguides superposed in advance, on the substrate by thermal bonding or the like.

In addition, when the optical path conversion mirror is to be formed on the optical waveguide, the mirror may be formed after forming the optical waveguide over the substrate (on the elastic material layer).

The method of forming the optical path conversion mirror is not limited to a specific method and a conventional well-known method can be used. Specifically, machining process using a diamond saw having a 90°-V-shaped tip end, a blade or a cutter or the like can be performed to form the optical path conversion mirror.

When the optical path conversion mirror is formed on each optical waveguide that is formed on the elastic material layer by the above-mentioned method, it is possible to moderate stress applied to the interlaminar insulating layer and, thereby, prevent cracks and the like from occurring to the interlaminar insulating layer.

In some cases, an optical path conversion member may be formed in place of the optical path conversion mirror. In these cases, the elastic material layer can moderate the stress applied to the substrate when forming the optical path conversion member.

(3) Next, a solder resist layer having openings for mounting the substrate for mounting an IC chip and the like is formed on the interlaminar insulating layer on which the optical waveguides are formed through the elastic material layer and pads for surface mount are formed similarly to the steps (8) to (10) of the method for manufacturing the multilayered printed circuit board according to the first aspect of the fourth group of the present invention.

The openings may be formed only in the solder resist layer on one face or in the solder resist layer on both faces.

(4) Next, openings for optical paths are formed in the solder resist layer on one side.

The openings for optical paths are formed by a laser treatment or the like.

As a laser used for the laser treatment, a laser similar to that used for forming the openings for via-holes, and the like can be used.

In this case, it is desirable to use a laser with a wavelength at which the optical waveguides do not exhibit absorbing property as the laser. This is because there is a little probability that the surfaces of the optical waveguides are damaged when forming the openings for optical paths.

In addition, the positions for forming the openings for optical paths are not limited to specific ones as long as it is possible to transmit an optical signal from the optical waveguides and a signal to the optical waveguides. The positions may be appropriately selected based on the design of the conductor circuits and the like.

It is desirable that the diameter of the openings for optical paths is 100 to 500 μm. Further, the shapes of the openings are not limited to specific ones but the openings may be columnar, elliptical columnar, quadrangular columnar, polygonal columnar or the like.

Further, the openings for optical paths formed on the multilayered printed circuit board according to the second aspect of the fourth group of the present invention are openings penetrating only the solder resist layer on one surface. Accordingly, in the manufacture of the multilayered printed circuit board according to the second aspect of the fourth group of the present invention, when the openings for optical paths are to be formed, the openings for optical paths may be formed by exposure and development treatments simultaneously with the formation of the openings for mounting the substrate for mounting an IC chip and the like by the exposure and development treatments in the above-described step (3) in place of the method using the laser treatment. This is because it is possible to decrease the number of steps and to decrease the probability of damaging the optical waveguides as compared with the method using the laser treatment.

(5) Next, solder bumps, a PGA or a BGA are formed similarly to the step (12) of the method for manufacturing the multilayered printed circuit board according to the first aspect of the fourth group of the present invention.

Further, also in this step of the method for manufacturing the multilayered printed circuit board according to the second aspect of the fourth group of the present invention, after filling the solder paste, the substrate for mounting an IC chip and the surface mount-type electronic components may be placed thereon before performing reflow to thereby solder the substrate for mounting an IC chip and the surface mount-type electronic components to the multilayered printed circuit board.

In this step, the solder bumps, the PGA or the BGA are not always formed. The substrate for mounting an IC chip and the surface mount-type electronic components can be mounted on the multilayered printed circuit board by connecting the BGA formed on the substrate for mounting an IC chip and the bumps formed on the surface mount-type electronic components to the pads for surface mount.

Through these steps, it is possible to manufacture the multilayered printed circuit board according to the second aspect of the fourth group of the present invention.

According to the multilayered printed circuit board according to the fourth group of the present invention, at the time of forming the optical waveguides, cracks and the like derived from the stress applied to the substrate or the outermost interlaminar insulating layer particularly at the time of forming the optical path conversion mirrors on the optical waveguides are less likely to occur, and the stress applied to the optical waveguides due to the difference in thermal expansion coefficient between the optical waveguides and the substrate or the interlaminar insulating layer is moderated. Therefore, it is possible to make it more difficult for cracks and the like derived from this stress to occur to the optical waveguides and when the film-shaped optical waveguides are bonded, it is possible to moderate the stress applied to the optical waveguides and prevent scratches and cracks derived from this stress from occurring to the optical waveguides.

So far, the multilayered printed circuit board comprising the optical waveguides formed on the substrate or the outermost interlaminar insulating layer through the elastic material layer has been described as the one which can attain above mentioned effect, however, even the multilayered printed circuit board comprising the optical waveguides formed at different positions from those of the optical waveguides of the above-described multilayered printed circuit board, i.e., in case that the optical waveguide is formed at positions between the interlaminar insulating layers or the like through the elastic material layer can attain the similar effects to those of the above-described multilayered printed circuit board.

A device for optical communication according to the fifth group of the present invention will now be described.

A device for optical communication according to the fifth group of the present invention comprises: a substrate for mounting an IC chip; and a multilayered printed circuit board, wherein: a light receiving element and a light emitting element are mounted on a side of the above-mentioned substrate for mounting an IC chip such that a light receiving part and a light emitting part are exposed, respectively, the above-mentioned side confronting the above-mentioned multilayered printed circuit board; an optical waveguide is formed at a face side of the above-mentioned multilayered printed circuit board, the above-mentioned face side confronting the above-mentioned substrate for mounting an IC chip; and the above-mentioned device for optical communication is constituted such that an optical signal can be transmitted through the above-mentioned optical waveguide, and the above-mentioned light receiving element or the above-mentioned light emitting element.

Since the device for optical communication according to the fifth group of the present invention comprises the substrate for mounting an IC chip on which the light receiving element and the light emitting element are mounted at predetermined positions and the multilayered printed circuit board on which the optical waveguide is formed at a predetermined position, the connection loss among the mounted optical components is low and excellent connection reliability as the device for optical communication is ensured.

Further, in the device for optical communication according to the fifth group of the present invention, when the substrate for mounting an IC chip and the multilayered printed circuit board are connected to each other through solder bumps, it is possible to further ensure arranging them at their predetermined positions by the self-alignment function of the solders.

By utilizing this self-alignment function, even when their positions are deviated before reflow at the time of connecting the substrate for mounting an IC chip onto the multilayered printed circuit board through the solder bumps, the substrate for mounting an IC chip moves during the reflow and can be attached to an accurate position on the multilayered printed circuit board.

Accordingly, it is possible to manufacture a device for optical communication having excellent connection reliability by connecting the substrate for mounting an IC chip onto the multilayered printed circuit board through the solder bumps as long as the position of the optical components such as the light receiving element, the light emitting element, the optical waveguide and the like attached to the substrate for mounting an IC chip and the multilayered printed circuit board are accurate, respectively.

The light receiving element and the light emitting element are mounted on a side of the substrate for mounting an IC chip, constituting the device for optical communication, the above-mentioned face confronting the multilayered printed circuit board so as to expose a light receiving part and a light emitting part, respectively.

Examples of the light receiving element and the light emitting element include the similar elements to those mounted on the substrate for mounting an IC chip according to the first aspect of the first group of the present invention and the like.

Further, it is desirable that solder bumps for transmitting an electric signal are formed on the substrate for mounting an IC chip. By forming the solder bumps, it is possible to transmit an electric signal between the substrate for mounting an IC chip and external electronic components.

In addition, in the multilayered printed circuit board that constitutes the device for optical communication, the optical waveguide is formed on a side of the board, which side confronting the substrate for mounting an IC chip.

It is therefore possible to transmit an optical signal through the optical waveguide.

Examples of a material for the optical waveguide include quartz glass, compound semiconductor, a polymer material and the like.

Among them, the polymer material is desirable since it is excellent in processability, excellent in adhesion to the interlaminar insulating layer of the multilayered printed circuit board and is obtained at low cost.

As the polymer material, a conventionally well-known polymer material can be used, and specific examples thereof include the similar polymer material to those used for the multilayered printed circuit board according to the second group of the present invention and the like.

The optical waveguide may contain particles such as resin particles, inorganic particles and metal particles similarly to the optical waveguide formed on the multilayered printed circuit board according to the second group of the present invention. By incorporating these particles in the optical waveguide, it is possible to adjust the thermal expansion coefficient of the organic optical waveguide to that of the interlaminar insulating layer, the solder resist layer or the like.

Examples of the particles contained in the organic optical waveguide include the similar particles to those contained in the optical waveguide according to the second group of the present invention and the like. In addition, the shape, particle diameter and mixing amount of the particles are similar to those of the particles contained in the optical waveguide according to the second group of the present invention and the like.

These resin particles, inorganic particles and metal particles may be used alone or in combination of two or more of them.

When the optical waveguide is constituted by a core part and a cladding part, the particles may be mixed in both the core part and the cladding part. Desirably, no particles are mixed in the core part and particles are mixed only in the cladding part covering the surrounding of the core part. The reason is the same as that described above in relation to the second group of the present invention.

The thickness of the core part of the optical waveguide is desirably 1 to 100 μm and the width thereof is desirably 1 to 100 μm. When the width is less than 1 μm, it is difficult to form the core part in some cases. When the width exceeds 100 μm, this may decrease the degree of freedom for the design of the conductor circuits and the like which constitute the multilayered printed circuit board in some cases.

The ratio of the above-mentioned thickness to width of the core part of the optical waveguide is desirably closer to 1:1. The plan shapes of the light receiving part of the light receiving element and the light emitting part of the light emitting element are normally circular. The ratio of the thickness to width is not limited to a specific one but may be normally about 1:2 to 2:1.

When the optical waveguide is a single-mode optical waveguide having a communication wavelength of 1.31 μm or 1.55 μm, the thickness and width of the core part of the optical waveguide are desirably 5 to 15 μm, more desirably about 10 μm. When the optical waveguide is a multi-mode optical waveguide having a communication wavelength of 0.85 μm, the thickness and width of the core part of the optical waveguide are desirably 20 to 80 μm, more desirably about 50 μm.

In the multilayered printed circuit board, the optical waveguide formed at a position confronting the light receiving element of the substrate for mounting an IC chip and the optical waveguide formed at a position confronting the light emitting element of the substrate for mounting an IC chip are desirably made of the same material.

Further, it is desirable that an optical path conversion mirror is formed at the optical waveguide. By forming the optical path conversion mirror, it is possible to change the angle of the optical path to a desired angle.

The optical path conversion mirror can be formed by cutting one end of the optical waveguide. Alternatively, a member that includes an optical path conversion part may be arranged on the tip end portion of the optical waveguide in place of forming the optical path conversion mirror on the optical waveguide.

It is also desirable that solder bumps for transmitting an electric signal are formed on the multilayered printed circuit board. By forming the solder bumps, it is possible to transmit an electric signal between the multilayered printed circuit board and external electronic components.

In the device for optical communication according to the fifth group of the present invention, the substrate for mounting an IC chip and the multilayered printed circuit board are formed such that the light receiving element and the light emitting element are confronting the optical waveguides and that an optical signal can be transmitted through one of the light receiving element or the light emitting element and the optical waveguides.

Specifically, by connecting the substrate for mounting an IC chip and the multilayered printed circuit board through the solder bumps, it is possible to arrange the light receiving element and the light emitting element at their predetermined positions at which the light receiving element and the light emitting element are confronting the optical waveguides. This is because the self-alignment function of the solders can be utilized.

The embodiment of the device for optical communication having the above-described configuration will now be described with reference to the drawings.

Figure 31:
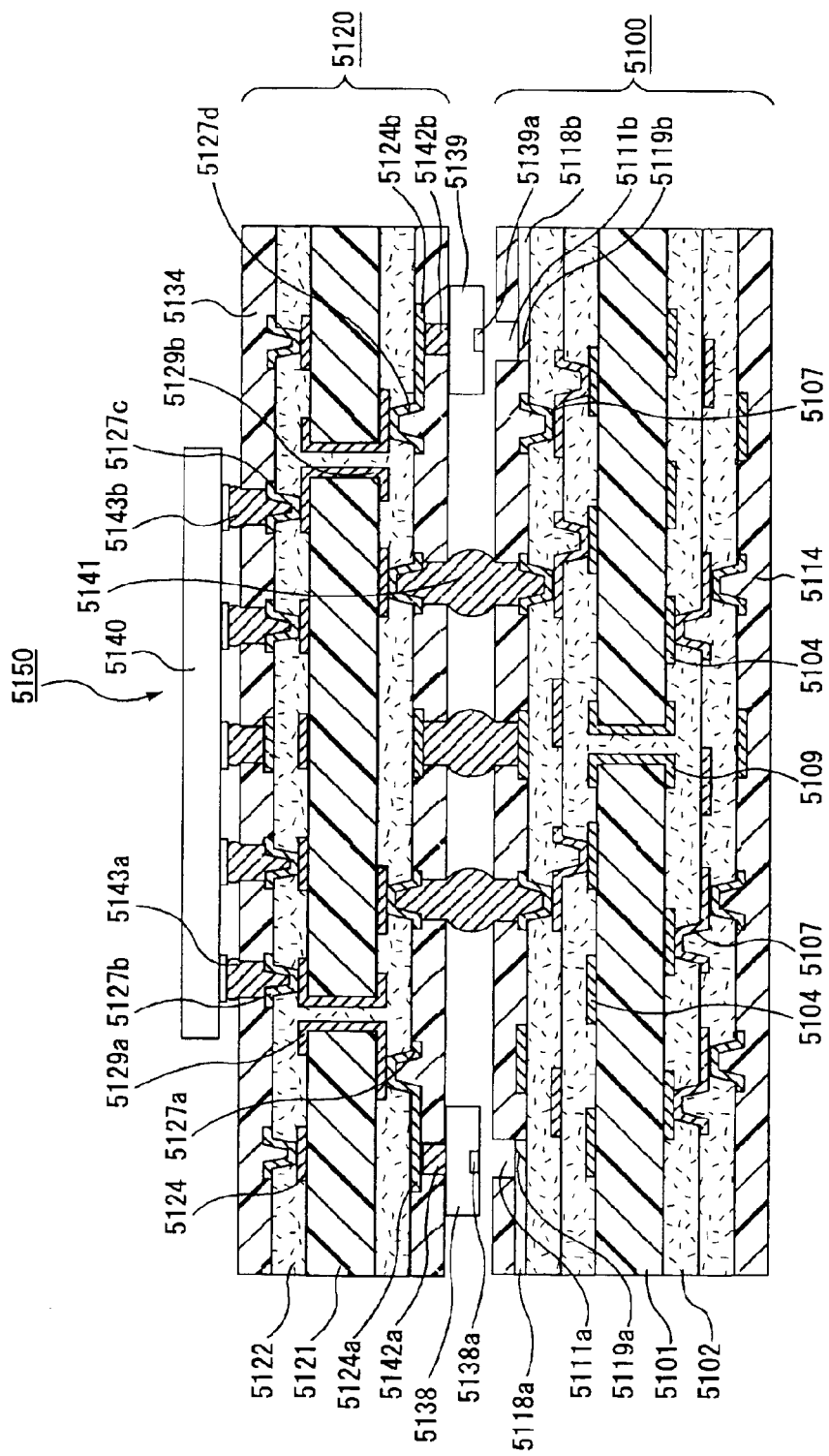
FIG. 31 is a cross-sectional view schematically showing one embodiment of a device for optical communication according to the fifth group of the present invention.

FIG. 31 is a cross-sectional view schematically showing one embodiment of the device for optical communication according to the fifth group of the present invention. It is noted that FIG. 31 shows the device for optical communication in a state in which an IC chip is mounted on the substrate.

As shown in FIG. 31, the device for optical communication 5150 constituted by: a substrate 5120 for mounting an IC chip on which an IC chip 5140 is mounted; and a multilayered printed circuit board 5100, with the substrate 5120 for mounting an IC chip electrically connected to the multilayered printed circuit board 5100 through solder connecting parts 5141.

In the substrate 5120 for mounting an IC chip, conductor circuits 5124 (5124a, 5124b) and interlaminar insulating layers 5122 are built up on each surface of a substrate 5121 and the conductor circuits having the substrate 5121 interposed therebetween and those having the interlaminar insulating layers 5122 interposed therebetween are electrically connected to one an other by plated-through holes 5129 (5129a, 5129b) and via-holes 5127 (5127a, 5127b, 5127c, 5127d), respectively.

In addition, a solder resist layer 5134 is formed on the outermost layer on each surface of the substrate 5121. A light receiving element 5138 and a light emitting element 5139 are mounted on the outermost layer confronting the multilayered printed circuit board 5100 such that a light receiving part 5138a and a light emitting part 5139a are exposed, respectively.

In the multilayered printed circuit board 5100, conductor circuits 5104 and interlaminar insulating layers 5102 are built up on each surface of a substrate 5101 and the conductor circuits having the substrate 5101 interposed therebetween and those having the interlaminar insulating layers 5102 interposed therebetween are electrically connected to one another by plated-through holes 5109 and via-holes 5107, respectively.

In addition, a solder resist layer 5114 which includes: openings 5111 for optical paths and solder bumps; and optical waveguides 118 (118a, 118b) having optical conversion mirrors 5119 (5119a, 5119b) provided immediately under the openings 5111 (5111a, 5111b) for optical paths are formed on the outermost layer on a side of the multilayered printed circuit board 5100, which side is confronting the substrate 5120 for mounting an IC chip.

In the device for optical communication 5150 having the above-described configuration, an optical signal transmitted from the outside through an optical fiber (not shown) is introduced into the optical waveguide 5118a, transmitted to the light receiving element 5138 (light receiving section 5138a) through the optical path conversion mirror 5119a and the opening 5111a for optical path, converted into an electric signal in the light receiving element 5138, and transmitted to the IC chip 5140 through a conductor layer 5142a—the conductor circuit 5124a—a via-hole 5127a—a plated-through hole 5129a—a via-holes 5127b—a solder connection part 5143a.

Further, an electric signal outputted from the IC chip 5140 is transmitted to the light receiving element 5139 through a solder connection part 5143b—a via-hole 5127c—a plated-through hole 5129b—a via-hole 5127d—the conductor circuit 5124b—a conductor layer 5142b, and converted into an optical signal by the light emitting element 5139, and this optical signal is introduced from the light emitting element

5139 (light emitting part 5139*a*) into the optical waveguide 5118*b* through the opening 5111*b* for optical path and the optical conversion mirror 5119*b*, and transmitted as an optical signal to the outside through the optical fiber (not shown).

In the device for optical communication according to the fifth group of the present invention, optical/electric signal conversion is performed in the substrate for mounting an IC chip, i.e., at a position near the IC chip. Therefore, an electric signal transmission distance is short and it is possible to deal with higher speed communication.

Further, after the electric signal outputted from the IC chip is converted into an optical signal as described above, the electric signal is transmitted to the outside through the optical fiber and, also, transmitted to the multilayered printed circuit board through the solder bumps and transmitted to the electric components such as the other IC chip mounted on the multilayered printed circuit board through the conductor circuits (including the via-holes and plated-through holes) of the multilayered printed circuit board.

Further, in the device for optical communication according to the fifth group of the present invention, the number of substrates for mounting an IC chip connected to the multilayered printed circuit board is not limited to one but may be two or more. In addition, the substrate for mounting an IC chip connected to the multilayeredprinted circuit board may be formed such that a plurality of substrates for mounting an IC chip are built up.

Next, a method for manufacturing the device for optical communication according to the fifth group of the present invention will be described.

The device for optical communication is manufactured by, for example, manufacturing the substrate for mounting an IC chip and the multilayered printed circuit board separately, arranging the substrate for mounting an IC chip and the multilayered printed circuit board such that the light receiving element and the light emitting element of the substrate for mounting an IC chip are confronting the conductor circuits of the multilayered printed circuit board, and connecting the solder bumps while adjusting the positions of the substrate for mounting an IC chip and the multilayered printed circuit board by reflow to thereby form the solder connection parts.

Accordingly, a method for manufacturing the substrate for mounting an IC chip and a method for manufacturing the multilayered printed circuit board separately, and then a method for connecting the substrate for mounting an IC chip and the multilayered printed circuit board will be described.

First, the method for manufacturing the substrate for mounting an IC chip will be described.

(1) First, the similar steps to the steps (1) to (8) of the method for manufacturing the substrate for mounting an IC chip according to the first aspect of the first group of the present invention and the like are performed, thereby forming a substrate having conductor circuits and interlaminar insulating layers repeatedly built up on both faces thereof. In the steps, plated-through holes are formed, based on necessity.

(2) Next, a solder resist layer is formed on each outermost layer of the substrate having the conductor circuits and the interlaminar insulating layers formed thereon if necessary.

The solder resist layer can be formed using a solder resist composition. As the solder resist composition, the similar solder resist composition to that used in the step (9) of the method for manufacturing the substrate for mounting an IC chip according to the first aspect of the first group of the present invention or the like can be used.

(3) Openings for forming solder bump and openings for mouting optical element are formed on the solder resist layer.

The openings for forming solder bump can be formed by the similar method to that for forming the openings for via-holes, i.e., using exposure and development treatments and a laser treatment.

Further, at the time of forming the solder resist layer, a resin film having openings formed at desired positions is produced in advance and bonded thereon, whereby the solder resist layer having the openings for forming solder bump and the openings for mouting optical element may be formed.

(4) Next, the conductor circuit portions, which is exposed by the formation of the openings for forming solder bump are coated with a corrosion resistant metal such as nickel, palladium, gold, silver or platinum, if necessary, to form solder pads. Among the corrosion resistant metallic materials, it is desirable to use nickel-gold, nickel-silver, nickel-palladium, nickel-palladium-gold and the like to form a coating layer.

The coating layer can be formed by plating, vapor deposition, electrodeposition or the like. Among them, plating is desirable from a viewpoint that the coating layer is excellent in evenness if being formed by plating. Furthermore, in this step, it is desirable to form a coating layer even on the conductor circuit portions, which is exposed by the formation of the openings for mouting optical element.

(5) After filling the solder pads with solder paste through a mask having opening portions formed in portions corresponding to the solder pads, reflow is performed to thereby form solder bumps.

(6) Optical elements (a light receiving element and a light emitting element) are mounted on the solder resist layer. The optical elements may be mounted through the solder (conductor layer) by filling the openings for mounting optical element with solder paste in the step (5) and attaching the optical elements during reflow.

Alternatively, the optical elements may be mounted on the solder resist layer using conductive adhesive or the like in place of the solder.

When one of these methods is used, the light receiving element and the light emitting element are mounted at the surface of the solder resist layer.

Alternatively, instead of the method for surface mounting the optical elements, openings may be formed so as to be able to house the optical elements at the time of forming the openings for mounting optical element in the step (3) and then the optical elements may be mounted by housing them in the openings through conductive adhesive. In this case, the light receiving element and the light emitting element are internalized in the solder resist layer.

Through these steps, it is possible to manufacture the substrate for mounting an IC chip that constitutes the device for optical communication according to the fifth group of the present invention.

Next, the method for manufacturing the multilayered printed circuit board will be described.

(1) First, the similar steps to the steps (1) to (8) of the method for manufacturing the substrate for mounting an IC chip according to the first aspect of the first group of the present invention and the like are performed, thereby forming a substrate having conductor circuits and interlaminar insulating layers repeatedly built up on both faces thereof. In the steps, plated-through holes are formed, based on demands.

(2) Next, optical waveguides are formed on conductor circuit non-formed parts on the interlaminar insulating layer, which is on the side confronting the substrate for mounting an IC chip.

The optical waveguides can be formed by the similar method to that used in the step (9) of the method for manufacturing the multilayered printed circuit board according to the second group of the present invention or the like.

Further, either an optical path conversion mirror or an optical path conversion member is formed on the optical waveguide.

(3) A solder resist layer is formed on the outermost layer of the substrate on which the optical waveguides are formed if necessary.

The solder resist layer can be formed using the a solder resist composition similar to that used when forming the solder resist layer of the substrate for mounting an IC chip.

(4) Next, openings for forming solder bump and openings for optical paths are formed on the solder resist layer on the side confronting the substrate for mounting an IC chip.

The openings for forming solder bump and the openings for optical paths can be formed by a method similar to the formation method of the openings for forming solder bump in the substrate for mounting an IC chip, i.e., by performing exposure and development method, a laser treatment or the like.

The openings for forming solder bump and the openings for optical paths may be formed simultaneously or separately.

Among these methods, it is desirable to select the method of: applying the resin composition containing photosensitive resin; and then performing exposure and development treatments to form the openings for mounting the substrate for mounting an IC chip and the like and the openings for optical paths for the following reason.

When the openings for optical paths are formed by the exposure and development treatments, there is no possibility of damaging the optical waveguides present under the openings for optical paths at the time of forming the openings.

Alternatively, the solder resist layer including the openings for forming solder bump and the openings for optical paths may be formed by manufacturing a resin film having openings formed at desired positions in advance and bonding the resin film at the time of forming the solder resist layer.

In addition, if necessary, openings for forming solder bump may be formed in the solder resist layer on the opposite side to the side confronting the substrate for mounting an IC chip.

This is because external connection terminals can be also formed on the solder resist layer on the opposite side to the side confronting the substrate for mounting an IC chip by performing post-steps.

(5) The conductor circuit portions, which is exposed by the formation of the openings for forming solder bump are coated with corrosion resistant metal such as nickel, palladium, gold, silver or platinum to form solder pads if necessary. Specifically, the solder pads may be formed by the similar method to the formation method of the solder bumps on the substrate for mounting an IC chip.

(6) After filling the solder pads with solder paste through a mask having opening portions formed in portions corresponding to the solder pads, reflow is performed to thereby form solder bumps. In addition, on the solder resist layer on the opposite side to the side confronting the substrate for mounting an IC chip, pins may be arranged on the external substrate connection surface or solder balls may be formed thereon to provide a PGA or a BGA.

Through these steps, it is possible to manufacture the multilayered printed circuit board that constitutes the device for optical communication according to the present invention.

Next, the method for manufacturing the device for optical communication using the substrate for mounting an IC chip and the multilayered printed circuit board manufactured by the above-described methods will be described.

First, solder connection portions are formed by the solder bumps of the substrate for mounting an IC chip and the solder bumps of the multilayered printed circuit board, and the both solder connection portions are electrically connected to each other.

Namely, the substrate for mounting an IC chip and the multilayered printed circuit board are arranged at respective predetermined positions in the respective predetermined direction so as to oppose to each other, and reflow is performed to electrically connect the substrate for mounting an IC chip to the multilayered printed circuit board.

In this step, the substrate for mounting an IC chip and the multilayered printed circuit board are connected to each other using their respective solder bumps. Therefore, even if they are slightly deviated from each other at the time of arranging them to be confronting each other, they can be arranged at their respective predetermined positions by the self-alignment effect of the solders during reflow.

Next, an IC chip is mounted on the substrate for mounting an IC chip and then the IC chip is sealed with resin if necessary, thereby obtaining the device for optical communication.

The IC chip can be mounted by a conventional well-known method.

Alternatively, the IC chip may be mounted before connecting the substrate for mounting an IC chip to the multilayered printed circuit board and then the substrate for mounting an IC chip on which the IC chip is mounted is connected to the multilayered printed circuit board, whereby the device for optical communication may be obtained.

A device for optical communication according to the sixth group of the present invention will now be described.

The device for optical communication according to the sixth group of the present invention comprises: a substrate for mounting an IC chip; and a multilayered printed circuit board, wherein the above-mentioned substrate for mounting an IC chip is constituted so as to comprise a conductor circuit, an interlaminar insulating layer, and a via-hole connecting the conductor circuits with the above-mentioned interlaminar insulating layers interposed therebetween to each other, and a light receiving element and a light emitting element are mounted on the above-mentioned substrate for mounting an IC chip.

Since the device for optical communication according to the sixth group of the present invention comprises the substrate for mounting an IC chip on which the light receiving element and the light emitting element are mounted at predetermined positions, respectively, and the multilayered printed circuit board on which the optical waveguide is formed at a predetermined position, the connection loss among the mounted optical components is low and excellent connection reliability as the device for optical communication is ensured.

Particularly, when the light receiving element and the light emitting element are mounted on the surface of the substrate for mounting an IC chip, the light receiving element and the light emitting element may be mounted after forming conductor circuits, interlaminar insulating layers and via-holes for connecting the conductor circuits with the interlaminar insulating layers interposed therebetween. Therefore, after the light receiving element and the light emitting element are mounted, heat and stress generated at the time of forming the conductor circuits and the interlaminar insulating layers are not applied to the light receiving element and the light emitting element. Accordingly, no positional deviation due to the heat and stress occurs, making it possible to ensure mounting the light receiving element and the light emitting element at their respective desired positions.

Furthermore, when the optical elements such as the light receiving element and the light emitting element are mounted on the surface of the substrate for mounting an IC chip, the optical elements are desirably flip-chip type components. When the optical elements are flip-chip type components, the positional deviation of the optical components such as the light receiving element and the light emitting element and the like is less likely to occur and repair of those is easy.

In the device for optical communication according to the sixth group of the present invention, when the substrate for mounting an IC chip is connected to the multilayered printed circuit board through solder bumps, it is possible to further ensure arranging them at their respective predetermined positions by the self-alignment function of the solders.

By utilizing this self-alignment function, even when their positions are deviated before reflow at the time of connecting the substrate for mounting an IC chip onto the multilayered printed circuit board through the solder bumps, the substrate for mounting an IC chip moves during the reflow and can be attached to an accurate position on the multilayered printed circuit board.

Accordingly, it is possible to manufacture a device for optical communication having excellent connection reliability by connecting the substrate for mounting an IC chip onto the multilayered printed circuit board through the solder bumps as long as the optical components such as the light receiving element, the light emitting element, the optical waveguide and the like are attached to their respective accurate positions of the substrate for mounting an IC chip and such optical components like the optical waveguides are attached to their respective accurate positions of the multilayered printed circuit board.

In addition, even when the substrate for mounting an IC chip is connected to the multilayered printed circuit board through a BGA or a PGA, the similar advantages can be attained.

The light receiving element and the light emitting element are mounted on the substrate for mounting an IC chip that constitutes the device for optical communication.

The mounting positions of the light receiving element and the light emitting element are not limited to specific ones. However, as described above, it is desirable to mount them on the surface of the substrate for mounting an IC chip.

In that case, the light receiving element and the light emitting element may be mounted on the substrate for mounting an IC chip in such a manner that:they are on the side confronting the multilayered printed circuit board; they are on the opposite side to the side confronting the multilayered printed circuit board; or one of the light receiving element or the light emitting element on the side confronting the multilayered printed circuit board, and the other element on the opposite side to the side confronting the multilayered printed circuit board.

When the light receiving element and the light emitting element are mounted at the substrate for mounting an IC chip on the opposite side to the side confronting the multilayered printed circuit board, the light receiving element, the light emitting element and the IC chip are normally mounted on the same surface of the substrate for mounting an IC chip.

By thus appropriately selecting the mounting positions of the light receiving element and the light emitting element according to the design of the device for optical communication, it is possible to further improve the degree of freedom for the design of the device for optical communication, thus positional deviation of the light receiving element and the light emitting element relative to the optical waveguide formed on the multilayered printed circuit board is less likely to occur, and consequently optical signal connection reliability is further improved.

Furthermore, by determining the mounting positions of the light receiving element and the light emitting element according to the design of the device for optical communication, stress is less likely to occur to the substrate for mounting an IC chip. Specifically, it is possible to suppress the occurrence of the stress derived from the difference in thermal expansion coefficient among the light receiving element and the light emitting element, the substrate, the interlaminar insulating layers, the conductor circuits and the like that constitute the substrate for mounting an IC chip, the IC chip, by appropriately selecting their respective mounting or formation positions. It is also possible to ensure the strength of the substrate for mounting an IC chip.

Further, when: the light receiving element and the light emitting element are mounted on the opposite face side of the substrate for mounting an IC chip to the face side confronting the multilayered printed circuit board; and when one of the light receiving element and the light emitting element is mounted on the face side thereof, the above-mentioned face side confronting the multilayered printed circuit board and the other element is mounted on the opposite face side thereof to the face side confronting the multilayered printed circuit board, it is desirable to form an optical path for transmitting an optical signal penetrating the substrate for mounting an IC chip.

This is because an optical signal can be transmitted to the optical waveguide formed on the multilayered printed circuit board through this optical path for transmitting an optical signal.

In addition, by appropriately determining the mounting positions of the light receiving element and the light emitting element and whether or not to form the optical path for transmitting an optical signal, it is possible to select the mounting positions of the light receiving element and the light emitting element more freely. As a result, free space increases in designing the substrate for mounting an IC chip, thus making it possible to attain high density wiring and the like.

The free space means an area in which the conductor circuits are formed and electronic components such as a capacitor are mounted.

Example of the light receiving element and the light emitting element includes the similar light receiving element and light emitting element to those mounted on the substrate for mounting an IC chip that constitutes the device for optical communication according to the fifth group of the present invention.

Further, although the light receiving element and the light emitting element may be wire-bonding type elements, they are desirably flip-chip type elements.

When the light receiving element and the light emitting element are flip-chip type element, the positional deviation of those is less likely to be caused due to the self-alignment function during mounting and also repair of those is easy when being mounted at the surface of the substrate for mounting an IC chip.

When the optical path for transmitting an optical signal is formed on the substrate for mounting an IC chip, the interior of the optical path for transmitting an optical signal may be a cavity. However, a conductor layer may be formed on the wall surface of the optical path for transmitting an optical signal and a resin layer for optical path may be formed in the optical path. Each of the conductor layer and the resin layer for optical path maybe formed on a part of the optical path for transmitting an optical signal.

When the conductor layer is formed on the wall surface of the optical path for transmitting an optical signal, the conductor layer is desirably made of metal having glossiness. Specific examples of the metal having glossiness include Ni, Au, Ag and the like.

When the resin layer for optical path is formed in the optical path for transmitting an optical signal, a material for the resin layer for optical path is not limited to a specific one but it is desirable that the material has a transmissivity of 70 (%/mm) or more for the light at communication wavelength.

The transmissivity of the resin layer for optical path for the light at communication wavelength means the transmissivity for the light at communication wavelength per 1 mm-length. Specifically, when the intensity of light with intensity of $I_1$, which is incident on the resin layer for optical path, is emitted from the resin layer after passing through the resin layer by 1 mm, with the intensity of $I_2$, the transmissivity is calculated by the following expression (1).

$$\text{Transmissivity (\%/mm)} = (I_2/I_1) \times 100 \tag{1}$$

Further, it is desirable that the substrate for mounting an IC chip is formed such that the conductor circuits and the interlaminar insulating layers are serially built up on each or one face of the substrate. Specifically, the conductor circuits and the interlaminar insulating layers are formed on each or one face of the substrate comprising an impregnated resin substrate as a core material or the like, by the build-up method. It is also desirable that via-holes for connecting the conductor circuits with the interlaminar insulating layers interposed therebetween are formed.

By thus constituting the substrate for mounting IC chip, when the light receiving element, the light emitting element and the IC chip are mounted thereon, warp and stress is less likely to be caused to the substrate for mounting an IC chip, and the positional deviation of the light receiving element, the light emitting element and the like deriving from the warp and stress is less likely to be caused.

Furthermore, by forming the conductor circuits, the interlaminar insulating layers and the via-holes by the build-up method, it is possible to make wirings of the substrate for mounting an IC chip finer and thereby make the density of the substrate for mounting an IC chip higher.

Moreover, it is possible to ensure electrically connecting the light receiving element and the light emitting element to the IC chip.

It is further desirable that solder bumps for transmitting an electric signal are formed on the substrate for mounting an IC chip. By forming the solder bumps, it is possible to transmit an electric signal between the substrate for mounting an IC chip and external electronic components.

Further, the optical waveguide is formed on the multilayered printed circuit board that constitutes the device for optical communication and an optical signal can be transmitted through this optical waveguide.

In addition, it is desirable to form an optical path for transmitting an optical signal for transmitting an optical signal between the light receiving element and the light emitting element, and the optical waveguide on the multilayered printed circuit board.

This is because an optical signal can be transmitted between: the optical waveguide; and the light receiving and emitting elements formed on the substrate for mounting an IC chip through this optical path for transmitting an optical signal.

In addition, by forming the optical path for transmitting an optical signal on the multilayered printed circuit board based on nessecity, it is possible to further improve the degree of freedom for the design of the multilayered printed circuit board, thereby increasing the density of the multilayered printed circuit board and, therefore, the density of the device for optical communication. This is because it is possible to decrease a dead space in the multilayered printed circuit board by freely selecting the formation position of the optical waveguide according to the design of the multilayered printed circuit board.

The dead space means an area in which the formation of the conductor circuits or the mounting of electronic components such as a capacitor is obstructed. Normally, the optical waveguide is formed so as to across the entire of or a part of the substrate or interlaminar insulating layer, so that the formation of the conductor circuits or the like are obstructed in an area in the vicinity of the optical waveguide.

Examples of the optical waveguide include the similar waveguide to that formed on the multilayered printed circuit board that constitutes the device for optical communication according to the fifth group of the present invention.

In the multilayered printed circuit board, it is desirable that the optical waveguide formed at a position confronting the light receiving element of the substrate for mounting an IC chip and the optical waveguide formed at a position confronting the light emitting element of the substrate for mounting an IC chip are made of the same material.

It is also desirable that the optical path conversion mirror is formed on each of the optical waveguides. By forming the optical path conversion mirror, it is possible to change the angle of the optical path to a desired angle. In addition, an optical path conversion member may be formed in place of the optical path conversion mirror.

The optical path conversion mirror can be formed by cutting one end of the optical waveguide.

It is also desirable that solder bumps for transmitting an electric signal are formed on the multilayered printed circuit board. By forming the solder bumps, it is possible to transmit an electric signal between the multilayered printed circuit board and external electronic components.

Specifically, by connecting the substrate for mounting an IC chip and the multilayered printed circuit board through the solder bumps, it is possible to arrange the light receiving element, the light emitting element and the optical waveguides at their respective predetermined positions at which the light receiving element and the light emitting element are confronting the optical waveguides. This is because the self-alignment function of the solders can be utilized. Even when the substrate for mounting an IC chip is connected to the multilayered printed circuit board through a PGA or a BGA, similar effects can be attained.

As described above, the device for optical communication according to the present invention is constituted so as to be able to transmit an optical signal between the light receiving element and the light emitting element mounted on the substrate for mounting an IC chip and the optical waveguide formed on the multilayered printed circuit board. In addition, the optical path for transmitting an optical signal is formed on the substrate for mounting an IC chip and/or the multilayered printed circuit board if necessary.

Further, according to the device for optical communication, having the above-described configuration, according to the sixth group of the present invention, it is possible to hinder the occurrence of the positional deviation of the light receiving element and the light emitting element mounted on the substrate for mounting an IC chip and the optical waveguide formed on the multilayered printed circuit board. Therefore, the device for optical communication is excellent in optical signal connection reliability.

The embodiment of the device for optical communication having the above-described configuration will now be described with reference to the drawings.

Figure 42:
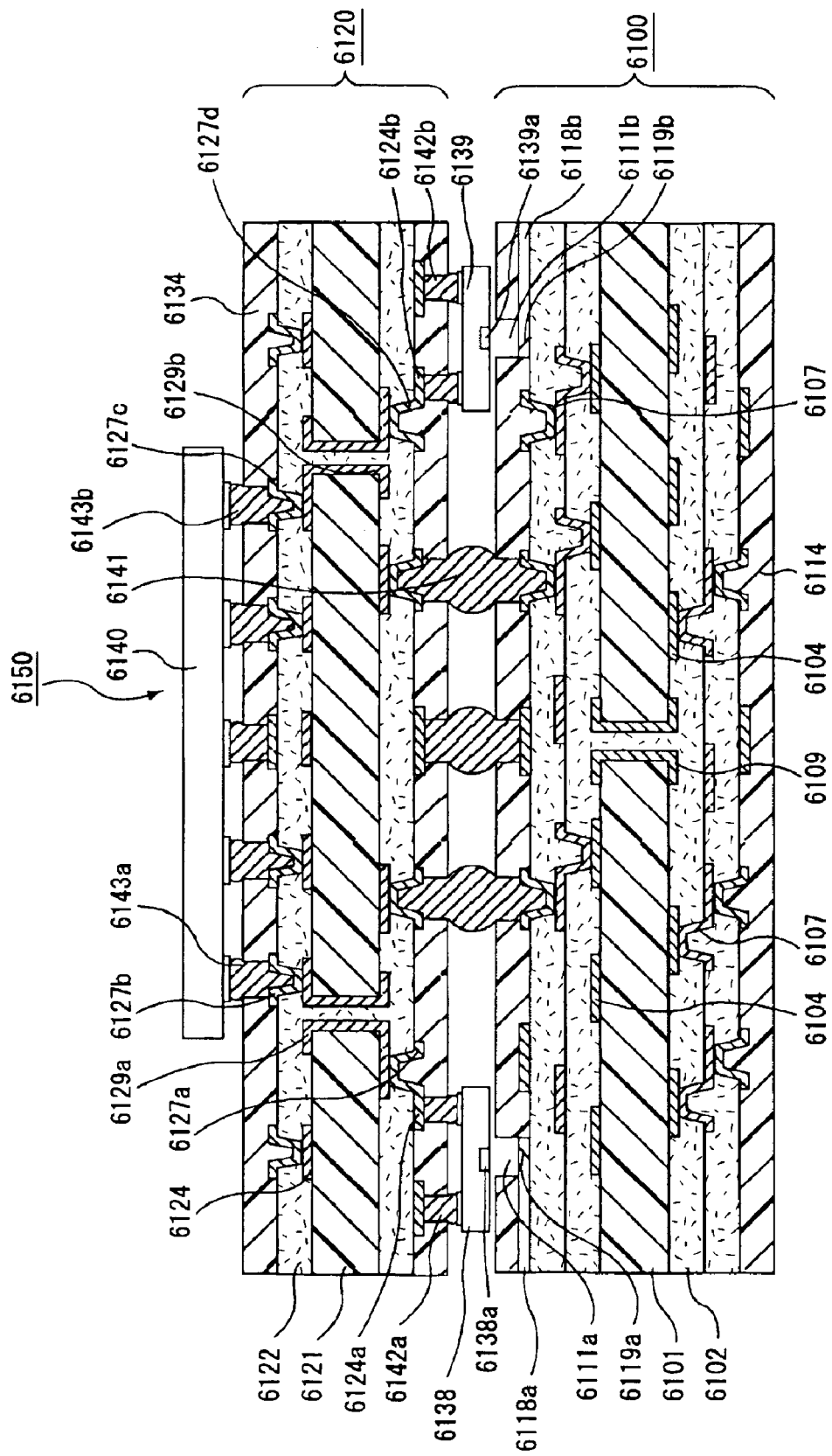
FIG. 42 is a cross-sectional view schematically showing one embodiment of a device for optical communication according to the sixth group of the present invention.

FIG. 42 is a cross-sectional view schematically showing one embodiment of the device for optical communication according to the sixth group of the present invention. It is noted that FIG. 42 shows the device for optical communication in a state in which an IC chip is mounted on the substrate.

As shown in FIG. 42, the device for optical communication 6150 according to the sixth group of the present invention comprises a substrate 6120 for mounting an IC chip on which an IC chip 6140 is mounted and a multilayered printed circuit board 6100, with the substrate 6120 for mounting an IC chip electrically connected to the multilayered printed circuit board 6100 through solder bumps 6141.

In substrate 6120 for mounting an IC chip, conductor circuits 6124 (6124a, 6124b) and interlaminar insulating layers 6122 are built up on each surface of a substrate 6121, and the conductor circuits having the substrate 6121 interposed therebetween and those having the interlaminar insulating layers 6122 interposed therebetween are electrically connected to one another by plated-through holes 6129 (6129a, 6129b) and via-holes 6127 (6127a, 6127b, 6127c, 6127d), respectively.

In addition, a solder resist layer 6134 with solder bumps is formed on the outermost layer of the substrate 6120 for mounting an IC chip. A light receiving element 6138 and a light emitting element 6139 are mounted on the outermost layer confronting the multilayered printed circuit board 6100 such that a light receiving part 6138a and a light emitting part 6139a are exposed, respectively.

In the multilayered printed circuit board, conductor circuits 6104 and interlaminar insulating layers 6102 are built up on each surface of a substrate 6101, and the conductor circuits having the substrate 6101 interposed therebetween and those having the interlaminar insulating layers 6102 interposed therebetween are electrically connected to one another by plated-through holes 6109 and via-holes 6107, respectively.

In addition, a solder resist layer 6114 which includes openings 6111 for optical paths and solder bumps and optical waveguides 6118 (6118a, 6118b) having optical conversion mirrors 6119 (6119a, 6119b) provided immediately under the openings 6111 (6111a, 6111b) for optical paths are formed on the outermost layer on a side of the multilayered printed circuit board 6100, which side confronting the substrate 6120 for mounting an IC chip.

In the device for optical communication 6150 having the above-described configuration, an optical signal transmitted from the outside through an optical fiber (not shown) is introduced into the optical waveguide 6118a, transmitted to the light receiving element 6138 (light receiving section 6138a) through the optical path conversion mirror 6119a and the opening for optical path 6111a, converted into an electric signal in the light receiving element 6138, and transmitted to an IC chip 6140 through a conductor layer 6142a—the conductor circuit 6124a—a via-hole 6127a—a plated-through hole 6129a—a via-holes 6127b—a solder connection part 6143a.

Further, an electric signal outputted from the IC chip 6140 is transmitted to the light emmiting element 6139 through a solder connection part 6143b—a via-hole 6127c—a plated-through hole 6129b—a via-hole 6127d—the conductor circuit 6124b—a conductor layer 6142b, and converted into an optical signal by the light emitting element 6139, and this optical signal is introduced from the light emitting element 6139 (light emitting part 6139a) into the optical waveguide 6118b through the opening 6111b for optical path and the optical conversion mirror 6119b and transmitted as an optical signal to the outside through the optical fiber (not shown).

In the device for optical communication according to the sixth group of the present invention, optical/electric signal conversion is performed in the substrate for mounting an IC chip, i.e., at a position near the IC chip. Therefore, an electric signal transmission distance is short and it is possible to deal with higher speed communication.

Further, after the electric signal outputted from the IC chip is converted into an optical signal, the electric signal is transmitted not only to the outside through the optical fiber as described above but also to the multilayered printed circuit board through the solder bumps and transmitted to the electric components such as the other IC chip mounted on the multilayered printed circuit board through the conductor circuits (including the via-holes and plated-through holes) of the multilayered printed circuit board.

In case of the device for optical communication 6150 according to the sixth group of the present invention shown in FIG. 42, the light receiving element and the light emitting element are mounted at the surface of the substrate for mounting an IC chip on the side confronting the multilayered printed circuit board.

The embodiment of the device for optical communication according to the sixth group of the present invention is not limited to that shown in FIG. 42 but may be an embodiment as shown in each of FIGS. 43 to 47.

FIGS. 43 to 47 are cross-sectional views schematically showing another embodiments of the device for optical communication according to the sixth group of the present invention. It is noted that each of FIGS. 43 to 47 shows the device for optical communication in a state where an IC chip is mounted.

Since the configurations of the devices for optical communication shown in FIGS. 43 to 47, respectively, are basically, approximately equal to that of the device for optical communication shown in FIG. 42, only different constituent elements from those of the device for optical communication 6150 shown in FIG. 42 will be described herein.

Figure 43:
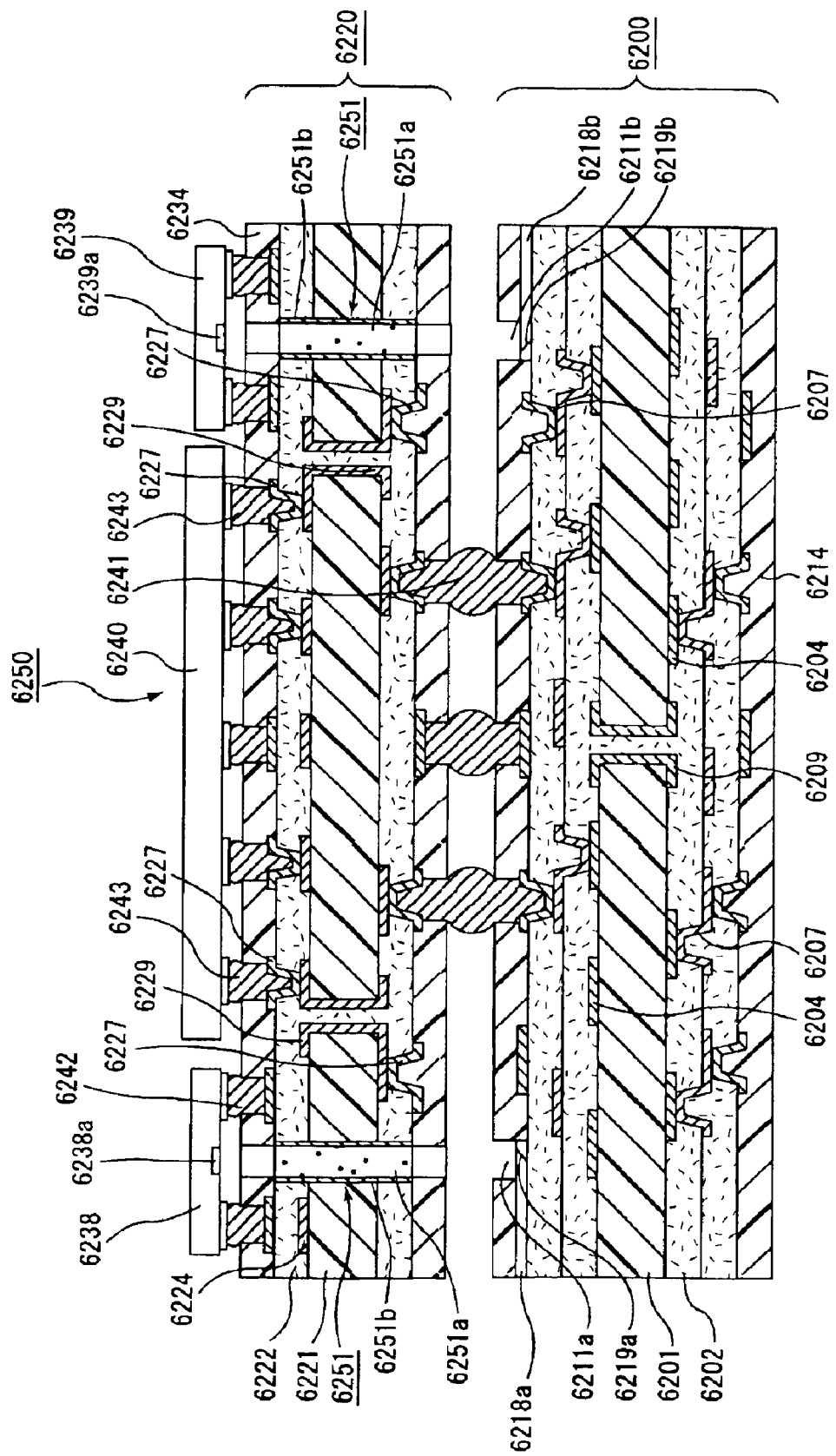
FIG. 43 is a cross-sectional view schematically showing one embodiment of another device for optical communication according to the sixth group of the present invention.

In a device for optical communication 6250 shown in FIG. 43, an optical path 6251 for transmitting an optical signal penetrating a substrate for mounting an IC chip 6220 is formed in the substrate for mounting an IC chip 6220. A conductor layer 6251b is formed on a part of the wall surface of this optical path 6251 for transmitting an optical signal and a part of this optical path 6251 for transmitting an optical signal is filled with a resin 6251a for optical path. In addition, the substrate for mounting an IC chip 6220 is formed such that a light receiving element 6238 and a light emitting element 6239 are mounted at the surface of the substrate 6220 on the side on which an IC chip 6240 is mounted and that an optical signal can be transmitted between the light receiving element 6238 or light emitting element 6239 and optical waveguides 6219 (6219*a*, 6219*b*) through the optical path 6251 for transmitting an optical signal.

In this device for optical communication 6250, the light receiving element 6238 and the light emitting element 6239 are formed on the same surface of the substrate for mounting an IC chip 6220 as the surface on which the IC chip 6240 is mounted, so that an optical signal can be transmitted between the light receiving element 6238 or the light emitting element 6239, and the optical waveguides 6219 through the optical path 6251 for transmitting an optical signal.

Figure 44:
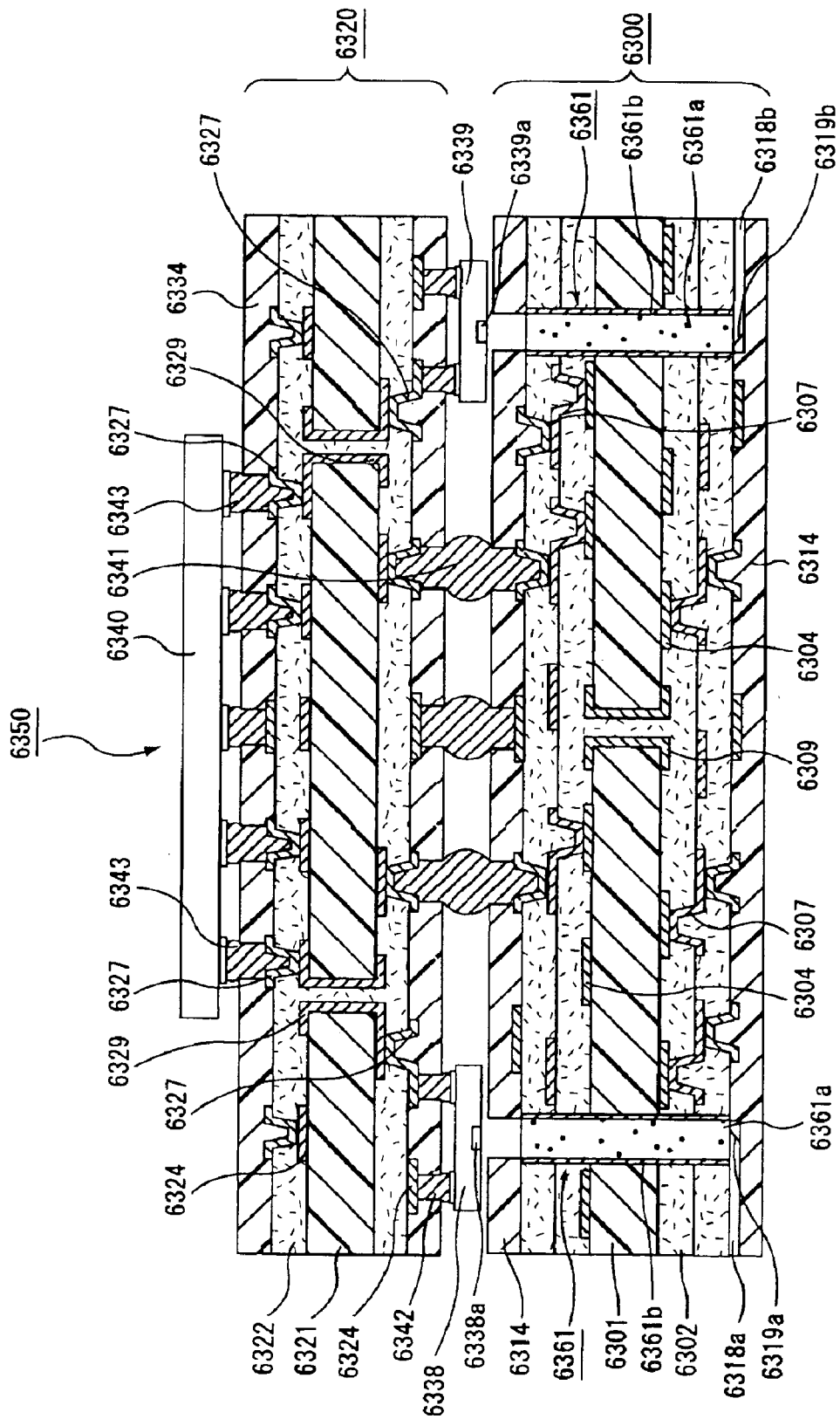
FIG. 44 is a cross-sectional view schematically showing one embodiment of another device for optical communication according to the sixth group of the present invention.

In a device for optical communication 6350 shown in FIG. 44, an optical path 6361 for transmitting an optical signal penetrating a substrate 6301, interlaminar insulating layers 6302 and a solder resist layer 6314 in a row is formed in a multilayered printed circuit board 6300, so that an optical signal can be transmitted between optical waveguides 6319 (6319*a*, 6319*b*) and a light receiving element 6338 and a light emitting element 6339 through the optical path 6361 for transmitting an optical signal. A conductor layer 6361*b* is formed on a part of the wall surface of this optical path 6361 for transmitting an optical signal and a part of this optical path 6361 for transmitting an optical signal is filled with a resin 6361*a* for optical path.

On the multilayered printed circuit board 6300, the formation positions of the optical waveguides 6319 differ from those on the multilayered printed circuit board 6100 shown in FIG. 42. The optical waveguides 6319 are formed on the outermost interlaminar insulating layer 6302 on the opposite side to the substrate for mounting an IC chip 6320 with the substrate 6301 interposed therebetween.

In this device for optical communication 6350, an optical signal can be transmitted between the light receiving element 6338 and the light emitting element 6339, and the optical waveguides 6319 through the optical path 6361 for transmitting an optical signal penetrating the substrate 6301, the interlaminar insulating layer 6302 and the solder resist layer 6314 formed at the multilayered printed circuit board 6300.

Figure 45:
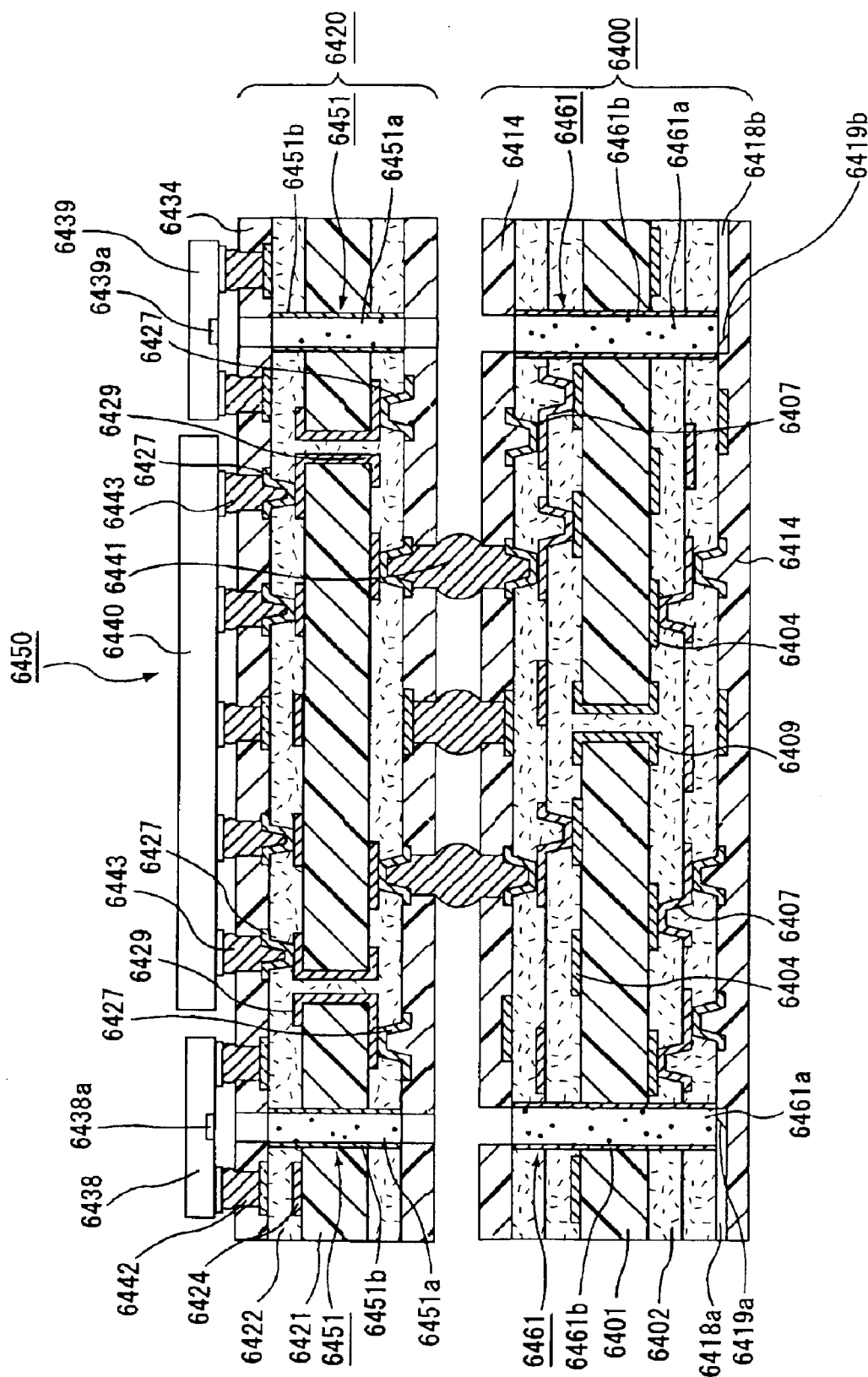
FIG. 45 is a cross-sectional view schematically showing one embodiment of another device for optical communication according to the sixth group of the present invention.

In a device for optical communication 6450 shown in FIG. 45, an optical path 6451 for transmitting an optical signal penetrating a substrate for mounting an IC chip 6420 is formed, a conductor layer 6451*b* is formed on a part of the wall surface of this optical path 6451 for transmitting an optical signal, and is filled with resin for optical path 6451*a*. The substrate for mounting an IC chip 6420 is equal in configuration to the substrate for mounting an IC chip 6220 shown in FIG. 43.

In addition, an optical path 6461 for transmitting an optical signal penetrating a substrate 6401, interlaminar insulating layers 6402 and a solder resist layer 6414 in a row is formed in a multilayered printed circuit board 6400, so that an optical signal can be transmitted between optical waveguides 6419 and a light receiving element 6438 and a light emitting element 6439 through the optical path 6461 for transmitting an optical signal. The multilayered printed circuit board 6400 is equal in configuration to the multilayered printed circuit board 6300 shown in FIG. 44.

In the device for optical communication 6450, an optical signal can be transmitted between the light receiving element 6438 or light emitting element 6439 and the optical waveguides 6419 through the optical path 6451 for transmitting an optical signal formed on and penetrating the substrate for mounting an IC chip 6420 and the optical path 6461 for transmitting an optical signal formed on the multilayered printed circuit board 6400 and penetrating the substrate 6401, the interlaminar insulating layers 6402 and the solder resist layer 6414.

Figure 46:
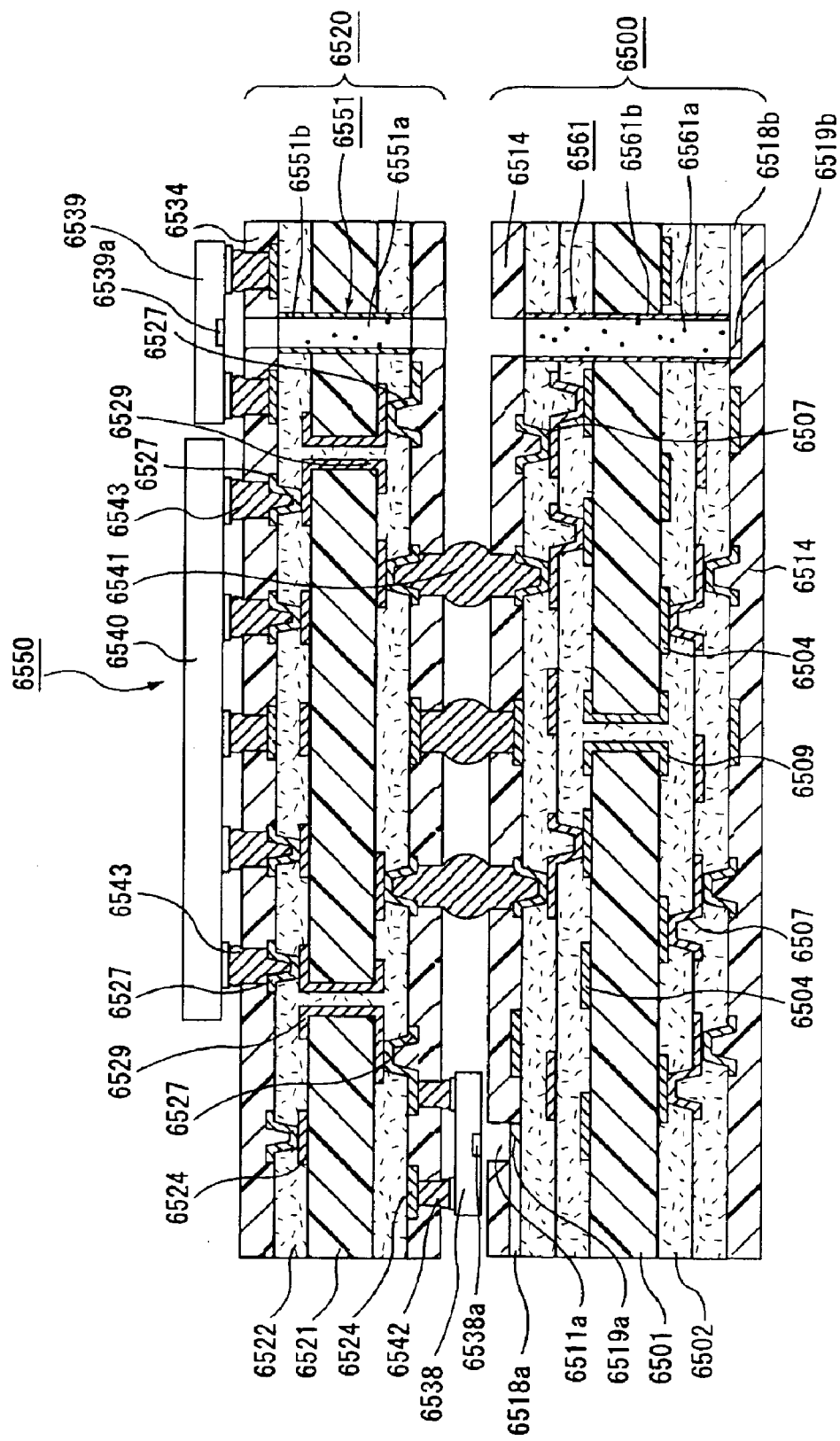
FIG. 46 is a cross-sectional view schematically showing one embodiment of another device for optical communication according to the sixth group of the present invention.

Further, in a device for optical communication 6550 shown in FIG. 46, a light receiving element 6538 is mounted on the face side of a substrate 6520 for mounting an IC chip, on the face side confronting a multilayered printed circuit board 6500, whereas a light emitting element 6539 is mounted on the opposite face side of the substrate 6520 for mounting an IC chip to the face side confronting the multilayered printed circuit board 6500.

In addition, an optical path 6551 for transmitting an optical signal penetrating the substrate 6520 for mounting an IC chip is formed in the substrate 6520 for mounting an IC chip such that the light emitting element 6539 can transmit an optical signal to optical waveguides formed on the multilayered printed circuit board 6500. A conductor layer 6551*b* is formed on a part of the wall surface of the optical path 6551 for transmitting an optical signal, and a part of the interior of the optical path 6551 for transmitting an optical signal is formed with a resin 6551*a* for optical path.

Further, optical waveguides are formed on the multilayered printed circuit board 6500. The optical waveguide 6518*a* for transmitting an optical signal between the optical waveguide 6518*a* and the light receiving element 6538 is formed on an outermost interlaminar insulating layer 6502 closer to the substrate 6520 for mounting an IC chip across the substrate 6501. The optical waveguide 6518*b* for transmitting an optical signal between the optical waveguide 6518*b* and the light emitting element 6539 is formed on an outermost interlaminar insulating layer 6502 opposite to the substrate 6520 for mounting an IC chip across the substrate 6501. In addition, an optical path 6561 for transmitting an optical signal for transmitting an optical signal between the light emitting element 6539 and the optical waveguide 6518*b* is formed on the multilayered printed circuit board 6500. The optical path 6561 for transmitting an optical signal is formed to penetrate the substrate 6501, the interlaminar insulating layers 6502 and the solder resist layer 6514, a conductor layer 6561*b* is formed on a part of the wall surface of the optical path 6561 for transmitting an optical signal, and a resin layer 6561*a* for optical path is formed on a part of the interior of the optical path 6561 for transmitting an optical signal.

In this device for optical communication 6550, an optical signal can be transmitted between the light emitting element 6539 and the optical waveguide 6519*b* through the optical path 6551 for transmitting an optical signal formed on and penetrating the substrate 6520 for mounting an IC chip and the optical path 6561 for transmitting an optical signal formed on the multilayered printed circuit board 6500 and penetrating the substrate 6501, the interlaminar insulating layers 6502 and the solder resist layer 6514.

It is noted that an optical signal can be transmitted between the light receiving element 6538 and the optical waveguide 6519*a* through an opening 6511*a* for optical path formed at the solder resist layer of the multilayered printed circuit board 6500.

Figure 47:
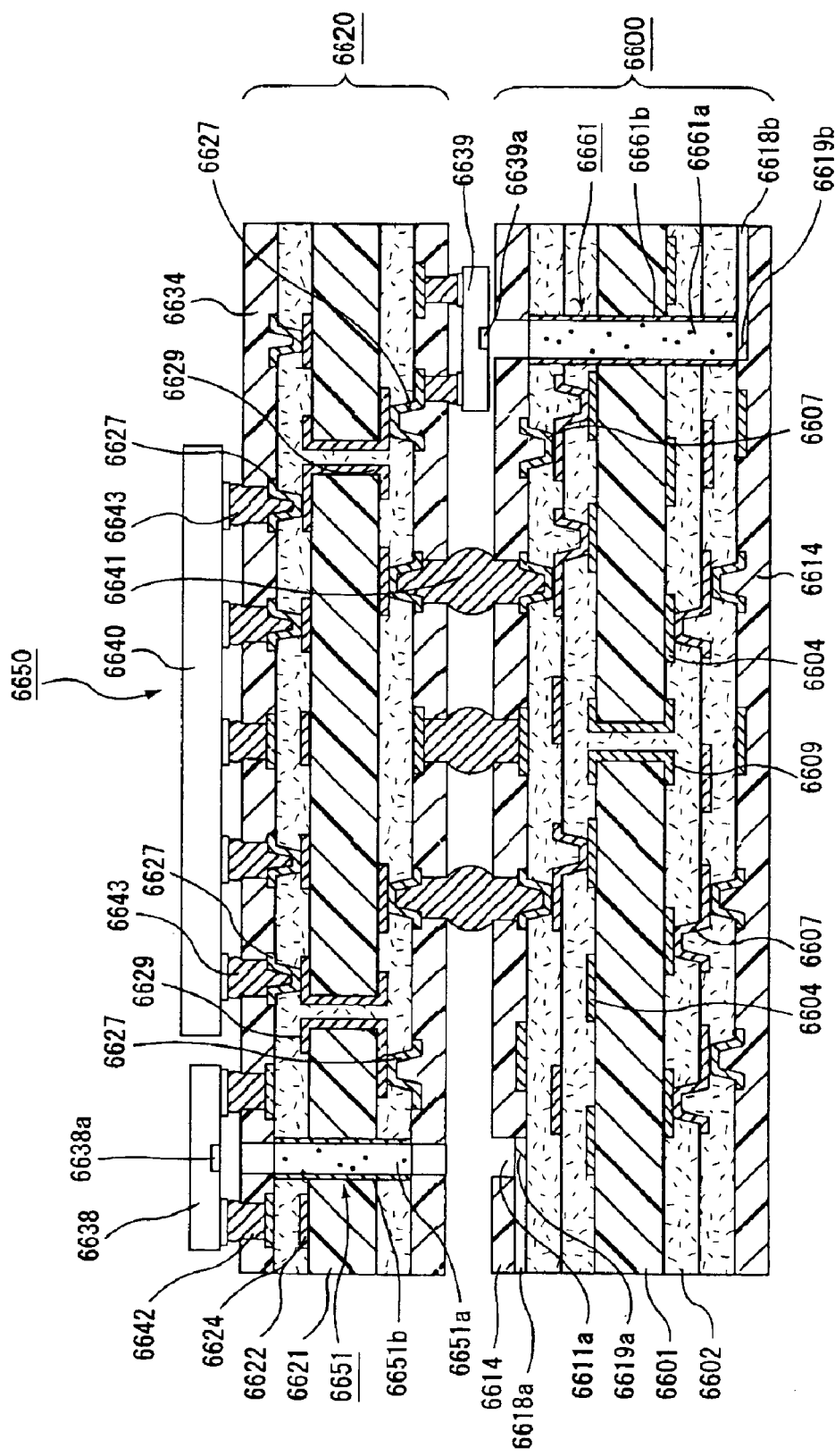
FIG. 47 is a cross-sectional view schematically showing one embodiment of another device for optical communication according to the sixth group of the present invention.

In a device 6650 for optical communication shown in FIG. 47, a light receiving element 6638 is mounted on the opposite face side of a substrate 6620 for mounting an IC chip to the face side confronting a multilayered printed circuit board 6600, and a light emitting element 6639 is mounted on the face side of the substrate 6620 for mounting an IC chip, on the face side confronting the multilayered printed circuit board 6600.

In addition, an optical path 6651 for transmitting an optical signal penetrating the substrate 6620 for mounting an IC chip is formed such that an optical signal can be transmitted between the light receiving element 6638 and an optical waveguide 6618a formed on the multilayered printed circuit board 6600. A conductor layer 6551a is formed on a part of the wall surface of this optical path 6651 for transmitting an optical signal and a resin layer for optical path is formed on a part of the interior thereof.

Further, optical waveguides 6619 are formed on the multilayered printed circuit board 6600. The optical waveguide 6618a for transmitting an optical signal between the optical waveguide 6618a and the light receiving element 6638 is formed on an outermost interlaminar insulating layer, which is closer to the substrate 6620 for mounting an IC chip across the substrate 6601. The optical waveguide 6618b for transmitting an optical signal between the optical waveguide 6618b and the light emitting element 6639 is formed on an outermost interlaminar insulating layer at opposite side to the substrate 6620 for mounting an IC chip across the substrate 6601. In addition, an optical path 6651 for transmitting an optical signal for transmitting an optical signal between the light emitting element 6639 and the optical waveguide 6618b is formed on the multilayered printed circuit board 6600. The optical path 6661 for transmitting an optical signal is formed to penetrate the substrate 6601, the interlaminar insulating layers 6602 and the solder resist layer 6614, a conductor layer 6661b is formed on a part of the wall surface of the optical path 6661 for transmitting an optical signal, and a resin layer 6661a for optical path is formed on a part of the interior of the optical path 6661 for transmitting an optical signal.

In this device 6650 for optical communication, an optical signal can be transmitted between the light emitting element 6639 and the optical waveguide 6619b through the optical path 6661 for transmitting an optical signal formed on the multilayered printed circuit board 6600 and penetrating the substrate 6601, the interlaminar insulating layers 6602 and the solder resist layer 6614.

An optical signal can be also transmitted between the light receiving element 6638 and the optical waveguide 6619a through the optical path 6651 for transmitting an optical signal formed in and penetrating the substrate 6620 for mounting an IC chip.

While the conductor layer is formed on the wall surface of each of the optical paths for transmitting an optical signal formed on the devices for optical communication shown in FIGS. 42 to 47 and the resin layer for optical path is formed on the interior thereof, the conductor layer and the resin layer for optical path may be formed if necessary.

As described above, the embodiments of the device for optical communication according to the sixth group of the present invention are not limited to those shown in FIGS. 42 to 47. Any embodiments in which the mounting positions of the light receiving element and the light emitting element, the formation positions of the optical waveguides and whether or not to form the optical path for transmitting an optical signal are appropriately selected to be combined may be included in the sixth group of the present invention.

Moreover, such an IC chip mounted on the device for optical communication according to the present invention may be mounted thereon by wire bonding or flip-chip connection. It is desirable to mount the IC chip by flip-chip connection.

Further, in the device for optical communication according to the sixth group of the present invention, the number of substrates for mounting an IC chip connected to the multilayered printed circuit board is not limited to one but may be two or more. In addition, the substrate for mounting an IC chip connected to the multilayered printed circuit may be those in which a plurality of substrates for mounting an IC chip are built up.

Next, a method for manufacturing the optical device according to the sixth group of the present invention will be described.

The device for optical communication can be manufactured by manufacturing the substrate for mounting an IC chip and the multilayered printed circuit board separately, arranging the substrate for mounting an IC chip and the multilayered printed circuit board such that the light receiving element and the light emitting element of the substrate for mounting an IC chip are confronting the conductor circuits of the multilayered printed circuit board, and connecting the solder bumps of these while adjusting the positions of the substrate for mounting an IC chip and the multilayered printed circuit board by reflow to thereby form the solder connection parts.

Therefore, a method for manufacturing the substrate for mounting an IC chip and a method for manufacturing the multilayered printed circuit board will be separately described and, then, a method for connecting the substrate for mounting an IC chip and the multilayered printed circuit board will be described.

First, the method for manufacturing the substrate for mounting an IC chip will be described.

As described above, it is desirable to form the substrate for mounting an IC chip using the build-up method, so that the substrate for mounting an IC chip formed by the build-up method will be mainly described herein.

(1) Similarly to the step (1) of the method for manufacturing the substrate for mounting an IC chip according to the first aspect of the first group of the present invention, using an insulating substrate as a starting material, conductor circuits are formed on the insulating substrate.

In this step, through holes for plated-through holes and a through hole for forming an optical path for transmitting an optical signal (referred to as "through hole for optical path" hereinafter) may be formed if necessary.

Further, a conductor layer may be formed on the wall surface of the through hole for optical path if necessary.

The conductor layer is desirably formed using metal having glossiness. Specifically, Ni, Au, Ag or the like is desirably used to form the conductor layer.

Furthermore, the through hole for optical path may be filled with a resin composition for forming a resin layer for optical path. The filling of the resin composition may be performed after forming the interlaminar insulating layer having an opening communicating with the through hole for optical path in a later step.

(2) Next, the surfaces of the conductor circuits is subjected to a surface roughening treatment if necessary.

The surface roughening treatment can be performed in the similar method to that used in the step (2) of the method for manufacturing the substrate for mounting an IC chip according to the first aspect of the first group of the present invention.

(3) Either an uncured resin layer comprising thermosetting resin, photosensitive resin, resin obtained by acrylating a part of thermosetting resin, or a resin complex containing these resins and thermoplastic resin is formed or a resin layer comprising thermoplastic resin is formed on a substrate on which the conductor circuits are formed.

Specifically, the resin layer can be formed in the similar method to that used in the step (3) of the method for manufacturing the substrate for mounting an IC chip according to the first aspect of the first group of the present invention.

(4) Next, in case of forming an interlaminar insulating layer using the thermosetting resin or resin complex as a material, openings for via-holes are formed as well as the uncured resin insulating layer is subjected to a curing treatment and, thereby obtaining the interlaminar insulating layer. In this step, the through holes (those for forming plated-through holes and those for forming the optical paths for transmitting an optical signal) may be formed if necessary.

The openings for via-holes are desirably formed by a laser treatment. In addition, when the photosensitive resin is used as the material of the interlaminar insulating layer, the interlaminar insulating layer may be formed by exposure and development treatments.

When the interlaminar insulating layer using the thermoplastic resin as a material therefor is formed, openings for via-holes are formed in the resin layer comprising the thermoplastic resin to obtain the interlaminar insulating layer. In this case, the openings for via-holes can be formed by a laser treatment.

When the through holes are to be formed in this step, they may be formed by drilling, a laser treatment or the like.

When the through hole for optical path is formed in the step (1) above, it is desirable to form the openings for via-holes and the opening for optical path communicating with the through hole for optical path. This opening for optical path becomes a part of the optical path for transmitting an optical signal through a later step.

As a laser used for the laser treatment, a laser similar to that used in the step (4) of the method for manufacturing the substrate for mounting an IC chip according to the first aspect of the first group of the present invention.

(5) Next, a conductor circuit is formed on the surface of the interlaminar insulating layer including inner walls of the openings for via-holes.

In order to form the conductor circuit, a thin film conductor layer is first formed on the surface of the interlaminar insulating layer.

The thin film conductor layer can be formed by electroless plating, sputtering or the like.

Examples of the materials of the thin film conductor layer include copper, nickel, tin, zinc, cobalt, thallium, lead and the like.

Among these materials, the thin film conductor layer comprising copper or copper and nickel is desirable because of its or their excellent electric characteristics, economic advantage and the like.

Further, in the case of forming the thin film conductor layer by electroless plating, the thickness of the thin film conductor layer is desirably 0.3 to 2.0 μm, more desirably 0.6 to 1.2 μm. Further, in the case of forming the thin film conductor layer by sputtering, the thickness thereof is desirably 0.1 to 1.0 μm.

Alternatively, if necessary, the roughened surface may be formed on the surface of the interlaminar insulating layer before the thin film conductor layer is formed. When the roughened surface is formed, it is possible to improve the adhesion between the interlaminar insulating layer and the thin film conductor layer. When the interlaminar insulating layer is formed using the resin composition for forming the roughened surface, in particular, it is desirable to form the roughened surface using an acid, an oxidizing agent or the like.

Furthermore, when through holes for forming plated-through hole are formed in the above-described step of (4), the thin film conductor layer may be also formed on the wall surfaces of the through holes at the time of forming the thin film conductor layer on the interlaminar insulating layer, to thereby obtain plated-through holes. Further, when the through hole for optical path is formed in the above-described step (4), the conductor layer may be also formed in the wall surface of the through hole for optical path. In this case, it is desirable to form a conductor layer made of the above-described metal having glossiness.

(6) Next, a plating resist is formed to the substrate on the surface of which the thin film conductor layer is formed.

The plating resist can be formed by bonding a photosensitive dry film, closely arranging a photomask comprising a glass substrate or the like drawing a plating resist pattern, and performing exposure and development treatments.

(7) Thereafter, electroplating is performed using the thin film conductor layer as a plating lead to thereby form an electroplating layer in the plating resist non-formed part. The electroplating is desirably copper plating.

Further, the thickness of the electroplating layer is desirably 5 to 20 μm.

Thereafter, the plating resist and the thin film conductor layer under the plating resist are removed, whereby conductor circuits (including via-holes) can be formed.

It is sufficient that the removal of the plating resist is performed using an aqueous alkaline solution and the removal of the thin film conductor layer is performed using an etching solution containing a solution mixture of a sulfuric acid and peroxide, sodium persulfate, ammonium persulfate, ferric chloride, cupric chloride or the like.

Further, after forming the conductor circuits, the catalyst on the interlaminar insulating layers may be removed by an acid or an oxidizing agent if necessary. This is because: when the catalyst is removed, it is possible to prevent the deterioration of electric characteristics of the insulating layers.

Alternatively, the conductor circuits may be formed by a formation method of an electroplating layer on the entire surface of the thin film conductor layer and then performing an etching treatment in place of the method (steps (6) and (7)) for forming the electroplating layer after forming this plating resist.

Further, when the plated-through holes are formed in the above-described steps (4) and (5), the plated-through holes may be filled with a resin filler.

Furthermore, when the plated-through holes are filled with the resin filler, a cover plating layer which covers the surface layer portion of the resin filler layer by performing electroless plating may be formed if necessary.

When the through hole for optical path is formed in the above-described step (4), the through hole may be filled with the resin composition for forming the resin layer for optical path separately in this step.

(8) When the cover plating layer is formed, the surface of the cover plating layer is subjected to a roughening treatment, if necessary, and the steps (3) to (7) are repeatedly performed if necessary, whereby interlaminar insulating layers and conductor circuits are formed on the both surfaces of the cover plating layer. In this step, plated-through holes may be formed or not formed. In addition, the through hole for optical path may be formed in this step, depending on the situation.

(9) Next, solder resist layers are formed on the respective outermost layers of the substrate on which the conductor circuits and the interlaminar insulating layers are formed, based on necessity.

The solder resist layer can be formed in a similar method to that used in the step (9) of the method for manufacturing the substrate for mounting an IC chip according to the first aspect of the first group of the present invention or the like.

(10) Then, openings for forming solder bump and openings for mounting optical element are formed in each solder resist layer.

The openings for forming solder bump and the openings for mounting optical element can be formed by a method similar to that for forming the openings for via-holes, i.e., using exposure and development treatments or a laser treatment.

Further, at the time of forming the solder resist layers, a resin film having openings formed at desired positions is produced and bonded thereon, whereby the solder resist layers having the openings for forming solder bump and the openings for mounting optical element may be formed. When the through hole for optical path is formed in the above-described step, an opening communicating with this through hole for optical path is formed in the solder resist layer. This opening also becomes a part of the optical path for transmitting an optical signal.

Depending on the situation, after forming the conductor circuits, the interlaminar insulating layers and the solder resist layers on the substrate, a through hole for optical path penetrating them may be formed at one time.

(11) Next, the conductor circuit portions, which is exposed by the formation of the openings for forming solder bump are coated with a corrosion resistant metal such as nickel, tin, palladium, gold, silver or platinum to form solder pads if necessary. Among the corrosion resistant metallic materials, it is desirable to use nickel-gold, nickel-silver, nickel-palladium, nickel-palladium-gold and the like to form a coating layer.

The coating layer may be formed by plating, vapor deposition, electrodeposition or the like. Among them, plating is desirable from a viewpoint that the coating layer is excellent in evenness when being formed by plating.

Furthermore, in this step, it is desirable to form a coating layer even on the conductor circuit portions, which is exposed by the formation of the openings for mounting optical element.

(12) After filling the solder pads with solder paste through a mask having opening portions formed in portions corresponding to the solder pads, reflow is performed to thereby form solder bumps.

(13) Furthermore, optical elements (a light receiving element and a light emitting element) are mounted on the solder resist layer. The optical elements may be mounted, for example, through the solder (conductor layer) by filling the openings for mounting optical element with solder paste in the above-described step (12) and attaching the optical elements during reflow.

Alternatively, the optical elements may be mounted on the solder resist layer using conductive adhesive or the like in place of the solder.

When one of these methods is used, the light receiving element and the light emitting element are mounted at the surface of the solder resist layer.

In addition, when the optical path for transmitting an optical signal penetrating the substrate for mounting an IC chip is formed, it is desirable to mount the light receiving element and the light emitting element on the surface of the solder resist layer. The reason is already described above.

Furthermore, the optical elements (light receiving element and light emitting element) mounted in this step are desirably flip-chip type components.

Alternatively, instead of the method for surface mounting the optical elements, openings may be formed so as to be able to house the optical elements at the time of forming the openings for mounting optical element in the above-described step (10) and then the optical elements may be mounted by housing them in the openings through conductive adhesive. In this case, the light receiving element and the light emitting element are internalized in the solder resist layer.

Through these steps, it is possible to manufacture the substrate for mounting an IC chip that constitutes the device for optical communication according to the sixth group of the present invention.

Next, the method for manufacturing the multilayered printed circuit board will be described.

(1) First, similar steps to the steps (1) to (8) of the method for manufacturing the substrate for mounting an IC chip are performed, thereby forming a substrate having conductor circuits and interlaminar insulating layers repeatedly built up on both faces thereof. In the steps, plated-through holes are formed, based on necessity.

In this step, similarly to the step of the method for manufacturing the substrate for mounting an IC chip, a through hole for optical path for forming an optical path for transmitting an optical signal is formed if necessary. Whether the through hole for optical path is to be formed or not may be appropriately determined based on the design of the multilayered printed circuit board such as the formation positions of the optical waveguides.

Furthermore, when the through hole for optical path is formed, a conductor circuit made of metal having glossiness or the like may be formed on the wall surface of the through hole for optical path. In addition, the through hole for optical path may be filled with a resin composition for forming a resin layer for optical path.

(2) Next, optical waveguides are formed on conductor circuit non-formed parts on the interlaminar insulating layer on the side confronting the substrate for mounting an IC chip.

The optical waveguides can be formed in a method similar to that used in the step (2) of the method for manufacturing the multilayered printed circuit board that constitutes the device for optical communication according to the fifth group of the present invention or the like.

When the optical path penetrating the substrate and the interlaminar insulating layers is formed in the above-described step (1), the optical waveguides are formed on the interlaminar insulating layer on the opposite side to the substrate for mounting an IC chip across the substrate.

The positions at which the optical waveguides are formed are not limited to those on the outermost interlaminar insulating layer but may be the positions between the interlaminar insulating layers.

(3) Then, a solder resist layer is formed on the outermost layer of the substrate on which the optical waveguides are formed if necessary.

The solder resist layer can be formed using a solder resist composition similar to that used when forming the solder resist layer of the substrate for mounting an IC chip.

(4) Next, openings for forming solder bump and openings for optical path are formed on the solder resist layer on the side confronting the substrate for mounting an IC chip.

The openings for forming solder bump and openings for optical paths can be formed by a method similar to that for forming the openings for forming solder bump in the substrate for mounting an IC chip, i.e., by performing exposure and development method, a laser treatment or the like.

The openings for forming solder bump and the openings for optical paths may be formed simultaneously or separately.

When the optical path penetrating the substrate and the interlaminar insulating layers is formed in the above-described steps (1) to (3), an opening for optical path communicating with this opening is formed in the solder resist layer. By forming the opening for optical path communicating with this opening, this opening for optical path becomes a part of the optical path for transmitting an optical signal.

After forming the solder resist layer, the optical path penetrating the substrate, the interlaminar insulating layers and the solder resist layers may be formed at one time.

Among these methods, it is desirable to select the method of: applying the resin composition containing photosensitive resin; and then performing exposure and development treatments to form the openings for mounting the substrate for mounting an IC chip and the like and the openings for optical paths for the following reason.

When the openings for optical paths are formed by the exposure and development treatments, there is no possibility of damaging the optical waveguides present under the openings for optical paths at the time of forming the openings.

Alternatively, the solder resist layer including the openings for forming solder bump and the openings for optical paths may be formed by manufacturing a resin film having openings formed at desired positions in advance and bonding the resin film at the time of forming the solder resist layer.

In addition, openings for forming solder bump may be formed if necessary in the solder resist layer on the opposite side to the side confronting the substrate for mounting an IC chip.

This is because external connection terminals can be also formed on the solder resist layer on the opposite side to the side confronting the substrate for mounting an IC chip by executing post-steps.

(5) The conductor circuit portions, which is exposed by the formation of the substrate for mounting an IC chip mounting openings and the like are coated with corrosion resistant metal such as nickel, tin, palladium, gold, silver or platinum to form solder pads if necessary. Specifically, the solder pads may be formed by the similar method to the formation method of the solder pads on the substrate for mounting an IC chip.

(6) After filling the solder pads with solder paste through a mask having opening portions formed in portions corresponding to the solder pads, reflow is performed to thereby form solder bumps. Alternatively, a PGA or a BGA may be formed in some cases.

In addition, on the solder resist layer on the opposite side to the side confronting the substrate for mounting an IC chip, pins may be arranged on the external substrate connection surface or solder balls may be formed thereon to provide the PGA or the BGA.

Through these steps, it is possible to manufacture the multilayered printed circuit board that constitutes the device for optical communication according to the sixth group of the present invention.

Next, the method for manufacturing the device for optical communication using the substrate for mounting an IC chip and the multilayered printed circuit board manufactured by the above-described methods will be described.

First, solder connection parts are formed by the solder bumps of the substrate for mounting an IC chip and solder connection parts are formed by the solder bumps of the multilayered printed circuit board, and the both solder connection parts are electrically connected to each other.

Specifically, the substrate for mounting an IC chip and the multilayered printed circuit board are arranged at respective predetermined positions in the predetermined directions so as to be confronting each other, reflow is performed to connect the substrate for mounting an IC chip to the multilayered printed circuit board.

In this step, the substrate for mounting an IC chip and the multilayered printed circuit board are connected to each other using their respective solder bumps. Therefore, even when they are slightly deviated from each other at the time of arranging them to be confronting each other, they can be arranged at respective predetermined positions by the self-alignment effect of the solders during reflow.

Next, an IC chip is mounted on the substrate for mounting an IC chip and then the IC chip is sealed with resin if necessary, thereby obtaining the device for optical communication.

The IC chip can be mounted by a conventional well-known method. As described above, the IC chip is desirably such a type as to be able to be mounted by flip-chip connection.

Alternatively, the IC chip may be mounted before connecting the substrate for mounting an IC chip to the multilayered printed circuit board and then the substrate for mounting an IC chip on which the IC chip is mounted is connected to the multilayered printed circuit board, whereby the device for optical communication may be obtained.

BEST MODE FOR CARRYING OUT THE INVENTION

The embodiments according to the first to sixth groups of the present invention will be described hereinafter in more detail. It is noted that the embodiments according to the first to sixth groups of the present invention are not limited to the following examples.

It is also noted that the thermal expansion coefficient of resin was measured at 50 to 70° C. and the characteristics (particle content, refractive index, transmissivity) of the resin were those after the resin was cured unless specified otherwise.

EXAMPLE 1

A. Production of Resin Film for Interlaminar Insulating Layer 30 parts by weight of bisphenol A-type epoxy resin (epoxy equivalent: 469, Epicoat 1001 made by Yuka Shell Epoxy Co., Ltd.), 40 parts by weight of cresol-novolac type epoxy resin (epoxy equivalent: 215, Epiclon N-673 made by Dainippon Ink and Chemicals, Inc.), and 30 parts by weight of triazine structure containing phenol-novolac resin (phenol hydroxyl group equivalent: 120, Phenolite KA-7052 made by Dainippon Ink and Chemicals, Inc.) were dissolved while being heated in 20 parts by weight of ethyl diglycol acetate and 20 parts by weight of solvent naphtha under stirring condition, followed by the addition of 15 parts by weight of epoxy-terminated polybutadiene rubber (Denalex R-45EPT made by Nagase Kasei Corp.) and 1.5 parts by weight of a pulverized product of 2-phenyl-4,5-bis(hydroxymethyl) imidazole, 2 parts by weight of a finely pulverized silica, and 0.5 parts by weight of a silicon based defoaming agent to prepare an epoxy resin composition.

After the obtained epoxy resin composition was applied to a 38 μm-thick PET film so as to adjust the thickness after drying to be 50 μm by a roll coater, the resulting film was dried at 80 to 120° C. for 10 minutes to produce a resin film for an interlaminar insulating layer.

B. Preparation of Resin Composition for through Hole Filler

A container was loaded with 100 parts by weight of bisphenol F-type epoxy monomer (molecular weight: 310, YL 983 U made by Yuka Shell Epoxy Co., Ltd.), 170 parts by weight of a $SiO_2$ spherical particle coated with a silane coupling agent and having an average particle diameter of 1.6 μm and a diameter of the maximum particle of 15 μm or less (CRS 1101-CE, made by Adtec Co., Ltd.), and 1.5 parts by weight of a leveling agent (Perenol S4, made by San Nopco Ltd.) and they were stirred and mixed to prepare a resin filler with a viscosity of 45 to 49 Pa·s at 23±1° C. As a curing agent, 6.5 parts by weight of an imidazole curing agent (2E4MZ-CN, made by Shikoku Corp.) was employed.

C. Manufacture of Substrate for Mounting an IC Chip (1) A copper-clad laminate plate having an insulating substrate 1021 which is made of a 0.8 mm-thick glass epoxy resin or BT (Bismaleimide-Triazine) resin with a 18 μm-thick copper foil 1028 laminated on both sides of the substrate 1021 was used as a starting material (see FIG. 4(*a*)). First, the copper-clad laminate plate was drilled to bore holes and then, electroless plating treatment was performed and pattern etching was performed to form conductor circuits 1024 and plated-through holes 1029 on both faces of the substrate 1021.

Figure 4:
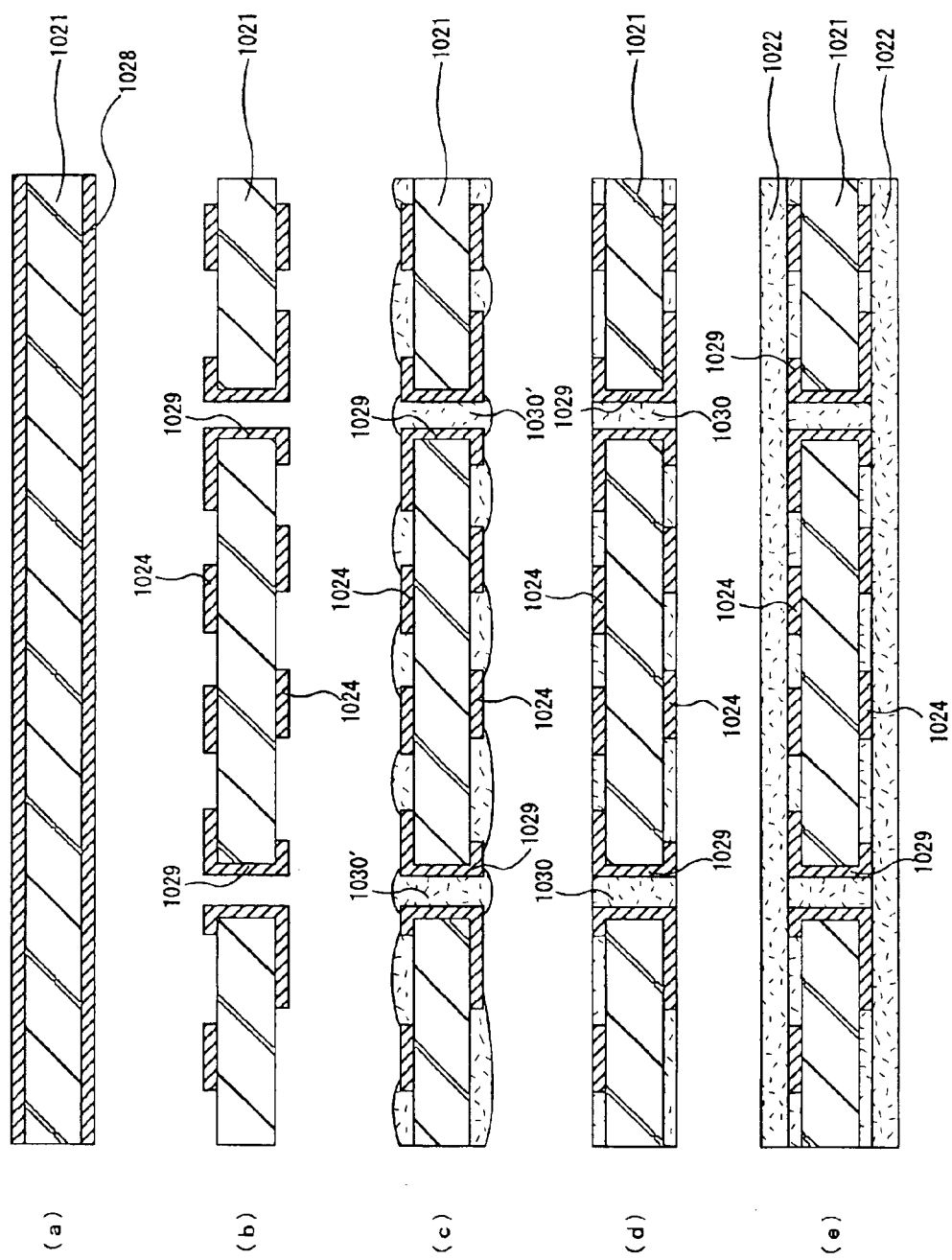
FIG. 4 is a cross-sectional view schematically showing part of the steps of manufacturing the substrate for mounting an IC chip according-to the first aspect of the first group of the present invention.

(2) The substrate in which the plated-through holes 1029 and the conductor circuits 1024 were formed was washed with water and dried, then subjected to blackening treatment using an aqueous solution containing NaOH (10 g/l), $NaClO_2$ (40 g/l), $Na_3PO_4$ (6 g/l) as a blackening bath (oxidizing bath) and reducing treatment using an aqueous solution containing NaOH (10 g/l) and $NaBH_4$ (6 g/l) as a reducing bath to form roughened surfaces (not shown) on the entire surfaces of the conductor circuits 1024 including the plated-through holes 1029 (see FIG. 4(*b*)).

(3) After the resin filler described in the process B was prepared, the layer of the resin filler 1030' was formed inside the plated-through holes 1029, at the conductor circuit non-formed parts on one surface of the substrate 1021 and the peripheral portions of the conductor circuits 1024 within 24 hours of the preparation by the following method.

That is, first, the resin filler was pushed in the plated-through holes using a squeegee and then dried under the conditions of 100° C. for 20 minutes. Next, a mask drawing openings corresponding to the conductor circuit non-formed parts was put on the substrate and the layer of the resin filler 1030' was formed in the conductor circuit non-formed parts, which was a concave portions, using a squeegee and then dried under the conditions of 100° C. for 20 minutes (see FIG. 4(*c*)).

(4) One surface of the substrate for which the above-described treatment (3) was finished was ground by a belt sander grinder using #600 belt grinding-paper (made by Sankyo Rikagaku Co., Ltd.) so as not to leave the resin filler 1030' on the surface of the conductor circuits 1024 and the land surface of the plated-through holes 1029 and then, buffing was performed to remove the scratches by the above-mentioned belt sander grinding. A series of such grinding steps were performed for the other surface of the substrate in the same manner.

Next, heating treatment at 100° C. for 1 hour, 120° C. for 3 hours, 150° C. for 1 hour and 180° C. for 7 hours was performed to form a resin filler layer 1030.

In such a manner, the surface layer part of the resin filler layer 1030 formed in the plated-through holes 1029 and the conductor circuit non-formed parts and the surface of the conductor circuits 1024 were made flat to obtain an insulating substrate (see FIG. 4(*d*)) wherein: the resin filler layer 1030 and the side surfaces of the conductor circuits 1024 were firmly stuck to each other through the roughened surfaces (not shown); and also the inner wall surfaces of the through holes 1029 and the resin filler 1030 were firmly stuck to each other through the roughened surfaces. By this step, the surface of the resin filler layer 1030 was flush with the surfaces of the conductor circuits 1024.

(5) After the above-mentioned substrate was washed with water and degreased with an acid, soft etching was performed and then, etching solution was sprayed on both faces of the substrate to etch the surfaces of the conductor circuits 1024 and the land surfaces and inner wall of the plated-through holes 1029 to form the roughened surfaces (not shown) on the entire surfaces of the conductor circuits 1024. As the etching solution, etching solution (Mec Etch bond, made by Mec Co., Ltd.) containing 10 parts by weight of an imidazole copper(II) complex and 7 parts by weight of glycolic acid, and 5 parts by weight of potassium chloride was used.

(6) Next, a resin film for interlaminar insulating layer with a slightly larger in size than the substrate produced by the above-described process A was put on the substrate, temporarily pressure-bonded under the conditions of 0.4 MPa pressure, 80° C. temperature, and 10-second pressure bonding period and cut and, after that, laminated by the following method using a vacuum laminator apparatus and successively subjected to thermosetting treatment to form interlaminar insulating layers 1022 (see FIG. 4(*e*)).

That is, the resin film for interlaminar insulating layer was actually laminated on the substrate by pressure bonding under the conditions of degree of vacuum: 65 Pa, pressure: 0.4 MPa, temperature: 80° C., and pressure bonding period: 60-second, and further subjected to thermosetting at 170° C. for 30 minutes.

Figure 5:
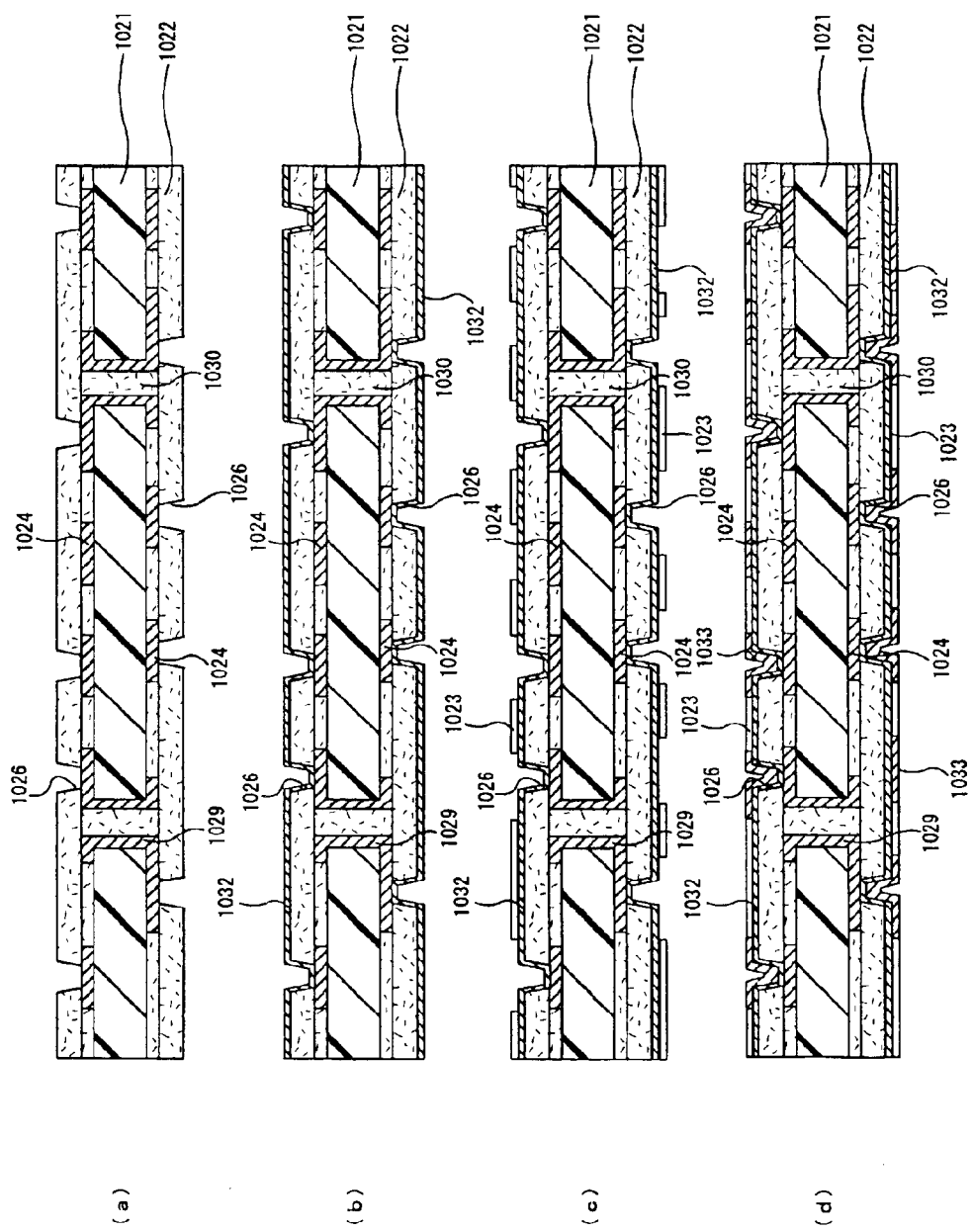
FIG. 5 is a cross-sectional view schematically showing part of the steps of manufacturing the substrate for mounting an IC chip according to the first aspect of the first group of the present invention.

(7) Next, openings 1026 for via-holes with 80 μm diameter were formed on the interlaminar insulating layers 1022 by a $CO_2$ gas laser of 10.4 μm wavelength through a 1.2 mm-thick mask having through holes in conditions of the beam diameter of 4.0 mm, the top hat mode, the pulse width of 8.0 μs, 1.0 mm-diameter of the through holes of the mask, and one shot (see FIG. 5(*a*)).

(8) The substrate in which the openings 1026 for via-holes were formed was immersed in a solution containing 60 g/l of permanganic acid at 80° C. for 10 minutes to dissolve and remove the epoxy resin particles existing on the surfaces of the interlaminar insulating layers 1022 and, consequently, to form the roughened surfaces (not shown) on the interlaminar insulating layers 1022 including the inner walls of the openings 1026 for via-holes.

(9) Next, the substrate subjected to the above-described treatment was immersed in a neutralizer (made by Shipley Co.) and washed with water.

Further, a palladium catalyst was supplied to the surface of the substrate subjected to the surface roughening treatment (the roughening depth: 3 μm), so that catalyst core was adhered to the surfaces of the underlayer interlaminar insulating layers 1022 (including the inner wall surfaces of the openings 1026 for via-holes) (not shown). Specifically, the above-mentioned substrate was immersed in a catalyst solution containing palladium chloride ($PdCl_2$) and stannous chloride ($SnCl_2$), and palladium metal was precipitated, thereby supplying the catalyst.

(10) Next, the substrate was immersed in an electroless copper plating aqueous solution having the following composition to form thin film conductor layers (electroless copper plating film) 1032 with a thickness of 0.6 to 3.0 μm on the entire surfaces of the interlaminar insulating layers 1022 (including the inner wall surfaces of the openings 1026 for via-holes) and the wall surfaces of the through holes 1029 (see FIG. 5(b)).

| [Electroless plating aqueous solution] | |
|---|---|
| NiSO$_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
30° C. Liquid Temperature for 40 Minutes

(11) Next, a commercially available photosensitive dry film was stuck to the substrate on which the thin film conductor layers (electroless copper plating films) 1032 were formed and a mask was put thereon and exposure with a dose of 100 mJ/cm$^2$ and development with an aqueous 0.8% sodium carbonate solution were performed to form a plating resist 1023 having a thickness of 20 μm (see FIG. 5(c)).

(12) Next, the substrate was washed with water at 50° C. to be degreased and washed with water at 25° C. and further washed with sulfuric acid and, after that, the substrate was subjected to electroplating under the following conditions to form electroplating copper films 1033 having a thickness of 20 μm on the plating resist 1023 non-formed parts (see FIG. 5(d)).

| [Electroplating solution] | |
|---|---|
| Sulfuric acid | 2.24 mol/l |
| Copper sulfate | 0.26 mol/l |
| Additive | 19.5 ml/l |

(Cupracid HL, Made by Atotech Japan Co., Ltd.)

| [Electroplating conditions] | |
|---|---|
| Current density | 1 A/dm$^2$ |
| Time | 65 minutes |
| Temperature | 22 ± 2° C. |

Figure 6:
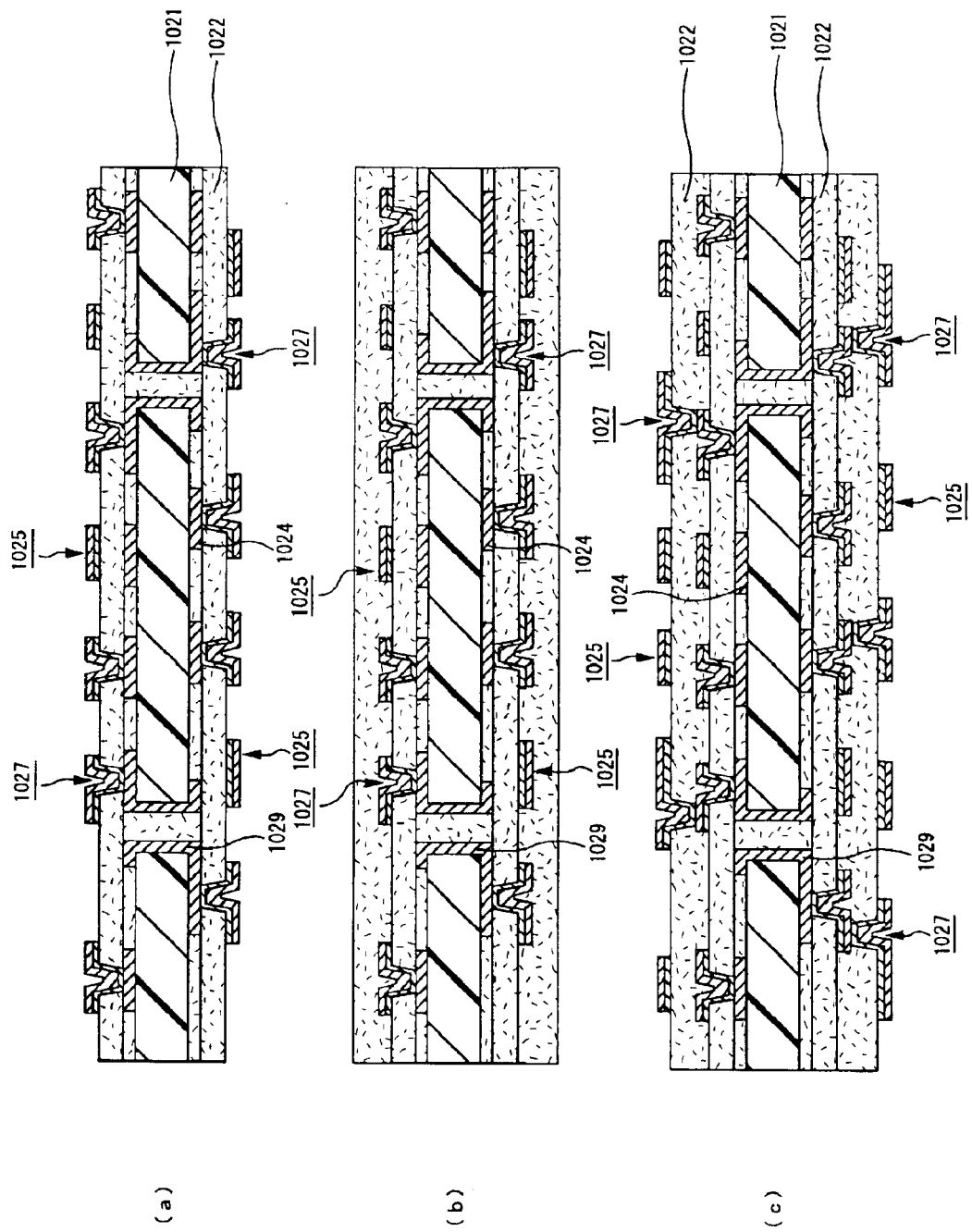
FIG. 6 is a cross-sectional view schematically showing part of the steps of manufacturing the substrate for mounting an IC chip according to the first aspect of the first group of the present invention.

(13) After peeling off and removing the plating resists 1023 with 5% NaOH, the thin film conductor layer sunder the plating resists 1023 are etched, dissolved and removed with a solution mixture of sulfuric acid and hydrogen peroxide, thus forming conductor circuits 1025 (including via-holes 1027) each comprising the thin film conductor layer (electroless copper plating film) 1032 and the electroplating copper film 1033 and having a thickness of 18 μm (FIG. 6(a)).

(14) The steps (5) to (13) were repeated to build up interlaminar insulating layers and conductor layers on further upper layers (see FIGS. 6(b) and 6(c)). Further, using a method similar to that used in the step (5), a roughened surface is formed on the conductor circuit on the outermost layer.

(15) Next, a container was loaded with: 46.67 parts by weight of an oligomer provided with a photosensitivity (molecular weight: 4000) obtained by acrylating 50% of an epoxy group of cresol-novolac type epoxy resin (made by Nippon Kayaku Co., Ltd.), dissolved in diethylene glycol dimethyl ether (DMDG) to be 60% by weight concentration; 15.0 parts by weight of bisphenol A-type epoxy resin (trade name: Epicoat 1001 made by Yuka Shell Epoxy Co., Ltd.) dissolved in methyl ethyl ketone to be 80% by weight concentration; 1.6 parts by weight of imidazole curing agent (tradename: 2E4MZ-CN, made by Shikoku Corp.) ; 4.5 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE6A, made by Kyoei Chemical Co., Ltd.); and 0.71 parts by weight of the dispersion type defoaming agent (S-65, made by San Nopco Ltd.), and they were stirred and mixed to prepare the mixed composition. Then, to the mixed composition, 2.0 parts by weight of benzophenone (made by Kanto Kagaku Corp.) as a photoinitiator and 0.2 parts by weight of Michler's ketone (made by Kanto Kagaku Corp.) as a photosensitizer were added to the mixed composition to obtain a solder resist composition adjusted to have a viscosity of 2.5 Pa·s at 25° C.

The viscosity measurement was performed using a rotor No. 4 in the case of 60 min$^{-1}$ (rpm) and a rotor No. 3 in the case of 4.6 min$^{-1}$ (rpm) using a B-type viscometer (DVL-B type, made by Tokyo Keiki Co., Ltd.).

(16) Next, the above-mentioned solder resist composition was applied by 30 μm thickness to the both faces of the substrate on which the interlaminar insulating layers 1022 and the conductor circuits 1025 (including via-holes 1027) were formed and then, dried under conditions of 70° C. for 20 minutes and 70° C. for 30 minutes, so that the layer of the solder resist composition was formed.

(17) A 5 mm-thick photomask drawing a pattern of the openings for forming solder bump was firmly stuck to the solder resist layers on the side which the IC chip was mounted, followed by the exposure to UV rays of 1000 mJ/cm$^2$ dose and development with the DMTG solution to form openings having 200 μm diameter.

A 5 mm-thick photomask drawing patterns of the openings for forming solder bump and the openings for mounting optical element, was firmly stuck to each solder resist composition layer on the side which the optical elements were mounted, followed by exposure and development under the above-mentioned conditions, thereby forming openings having a diameter of 200 μm and openings having a diameter of 180 μm.

Figure 7:
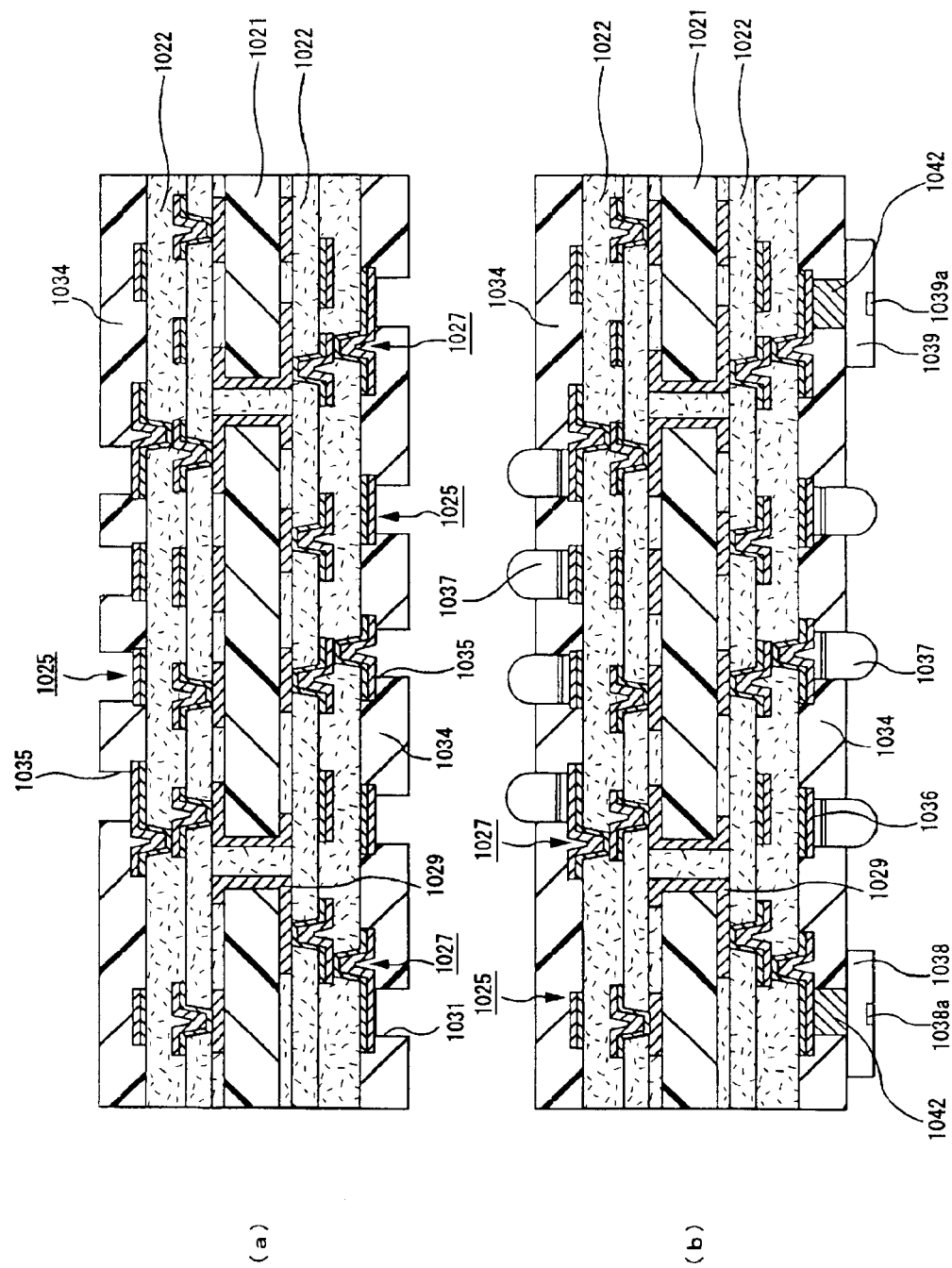
FIG. 7 is a cross-sectional view schematically showing part of the steps of manufacturing the substrate for mounting an IC chip according to the first aspect of the first group of the present invention.

Further, heat treatments were performed at 80°C. for 1 hour, 100° C. for 1 hour, 120° C. for 1 hour and 150° C. for 3 hours, respectively, to cure the solder resist composition layers, thus forming a solder resist layer having openings for forming solder bump 1035 and a thickness of 20 μm and a solder resist layer 1034 having openings 1035 for forming solder bump, openings 1031 for mounting optical element and a thickness of 20 μm (see FIG. 7(a)). As the solder resist composition, a commercially available solder resist composition can be also used.

(18) Next, the substrate on which the solder resist layers 1034 were formed was immersed in an electroless nickel plating solution having pH 4.5 and containing nickel chloride (2.3×10$^{-1}$ mol/l), sodium hypophosphite (2.8×10$^{-1}$ mol/l), and sodium citrate (1.6×10$^{-1}$ mol/l) for 20 minutes to form 5 μm-thick nickel plating layers in the openings 1035 for forming solder bump and openings 1031 for mounting optical element, respectively. Further, the obtained substrate was immersed in an electroless gold plating solution containing potassium gold cyanide ($7.6\times10^{-3}$ mol/l), ammonium chloride ($1.9\times10^{-1}$ mol/l), sodium citrate ($1.2\times10^{-1}$ mol/l), and sodium hypophosphite ($1.7\times10^{-1}$ mol/l) under the conditions of 80° C. for 7.5 minutes to form a 0.03 μm-thick gold plating layer on each nickel plating layer, thus obtaining solder pads 1036.

(19) Thereafter, solder paste was printed in the openings 1035 for forming solder bump and the openings 1031 for mounting optical element formed in the solder resist layers 1034; and a light receiving element 1038 and a light emitting element 1039 were attached to the solder paste printed on the respective openings 1031 for mounting optical element while positioning properly the light receiving part 1038a of the light receiving element 1038 and the light emitting part 1039a of the light emitting element 1039, then reflow was performed at 200° C., to thereby mount the light receiving element 1037 and the light emitting element 1039, followed by formation of solder bumps 1038 on the respective openings for forming solder bump 1035, thus obtaining a substrate for mounting an IC chip. As the light receiving element 1038, an optical element made of InGaAs was used. As the light emitting element 1039, an optical element made of InGaAsP was used (see FIG. 7(*b*)).

Through these steps, the substrate for mounting an IC chip on which the light receiving element and the light emitting element were mounted so as to expose the light receiving part and the light emitting part on one surface thereof, respectively, was manufactured in this example.

EXAMPLE 2

(1) First, a substrate having interlaminar insulating layers and conductor circuits built up on each surface of the substrate was manufactured in the similar manners as those in the steps (1) to (14) of Example 1.

(2) Next, solder resist composition layers were formed in the similar manners to those in the steps (15) and (16) of Example 1.

(3) A 5 mm-thick photomask drawing a pattern of openings for forming solder bump was firmly stuck to the solder resist composition layers on the side which the IC chip was mounted, followed by the exposure to UV rays of 1000 mJ/cm² dose and development with the DMTG solution to form openings having 200 μm diameter.

A photomask drawing patterns of the openings for forming solder bump and openings for housing optical elements was firmly stuck to each solder resist composition layer on the side which the optical elements were mounted, followed by exposure and development under the above-mentioned conditions, thereby forming openings for forming solder bump (diameter: 200 μm) and openings for housing optical elements.

Further, the solder resist composition layers were cured under similar conditions to those in the step (17) of Example 1, thereby forming a solder resist layer having openings for forming solder bump and a thickness of 20 μm and a solder resist layer 1034 having openings for forming solder bump, openings for housing optical elements and a thickness of 20 μm.

(4) Next, coating layers (solder pads) were formed on the openings for forming solder bump and the openings for housing optical elements in a similar manner as that in the step (18) of Example 1.

(5) Thereafter, solder paste with a quantity necessary to form solder bumps was printed in the openings for forming solder bump and the openings for housing optical elements formed in the solder resist layers. A light receiving element and a light emitting element were housed in the openings for housing optical elements and then reflow was performed at 200° C., to thereby mount the light receiving element and the light emitting element, followed by formation of solder bumps, thus obtaining a substrate for mounting an IC chip. As the light receiving element and the light emitting elements, similar optical elements as those used in Example 1 were used.

Through these steps, the substrate for mounting an IC chip (see FIG. 2) having the light receiving element and the light emitting element housed therein so as to expose the light receiving part and the light emitting part on one face side of the substrate, respectively, was manufactured in this example.

EXAMPLE 3

(1) First, a substrate having interlaminar insulating layers and conductor circuits built up on each surface of the substrate was manufactured in the same manners as those in the steps (1) to (14) of Example 1.

(2) Next, a light receiving element and a light emitting element were attached to their respective predetermined positions of the conductor circuit on the outermost layer through conductive adhesive. The same light receiving element and light emitting element as those used in Example 1 were used.

(3) A solder resist composition was prepared in the same manner as that in the step (15) of Example 1.

Further, after bonding a resist to the light receiving portion of the light receiving element and the light emitting portion of the light emitting element attached to the conductor circuit in the step (2) above, the solder resist composition was applied and drying treatments were conducted at 70° for 20 minutes and at 70° for 30 minutes, respectively, there by forming solder resist composition layers. The thicknesses of the light receiving element and the light emitting element were 300 μm.

(4) A 5 mm-thick photomask drawing a solder bump formation opening pattern thereon was closely stuck to the solder resist composition layer on the IC chip mounting side, followed by the exposure and development under the same conditions as those in (17) of Example 1, to thereby form openings for forming solder bump having 200 μm diameter. Likewise, openings for forming solder bump were formed in the solder resist composition layer on the optical component mounting side.

The resist attached to the light receiving portion and the light emitting portion in the step (17) was removed, and the solder resist composition layers were cured under the same conditions as those in the step (17) of Example 1, thereby forming the solder resist layer including the openings for forming solder bump and optical path openings formed in portions corresponding to the light receiving portion and the light emitting portion and in which the optical components were completely buried. The thickness of the solder resist layer on the IC chip mounting side was 450 μm and that of the solder resist layer on the optical component mounting side was 450 μm.

(5) Next, coating layers (solder pads) were formed on the openings for forming solder bump in the same manner as that in the step (18) of Example 1.

(6) Then, solder paste with a quantity necessary to form solder bumps was printed in the openings for forming solder bump and then reflow was performed at 250° C., to thereby form the solder bumps and obtain the substrate for mounting an IC chip.

Through these steps, the substrate for mounting an IC chip in one face side of which the light receiving element and the light emitting element were embedded and the optical paths connecting the light receiving part of the light receiving element and the light emitting part of the light emitting element to an optical signal were secured, was manufactured in this example.

For each of the substrates for mounting an IC chip obtained in Examples 1 to 3, the end face of an optical fiber was arranged at a position confronting the light receiving part of the light receiving element, a detector was attached to a position confronting the light emitting part of the light emitting element, an optical signal was tarnsmitted through the optical fiber, the IC chip was allowed to perform arithmetic operation and then the optical signal was detected by the detector. As a result, a desired optical signal was able to be detected.

COMPARATIVE EXAMPLE 1

A. Manufacture of Substrate for Mounting an IC Chip

A substrate 7120 for mounting an IC chip (see FIG. 48) was manufactured in manners similars to those in the steps in process C of Example 1 except that the openings for housing optical elements were not formed and the optical elements (light receiving element and light emitting element) were not mounted.

Herein, a substrate for mounting an IC chip was manufactured using a substantially similar method to that for manufacturing the substrate for mounting an IC chip in process C of Example 1 except that the size thereof was changed based on nessecity.

B. Manufacture of Optical Element-Mounting Substrate

A multilayered printed circuit board on which solder resist layers having openings for forming solder bump and openings for mounting optical element were formed was manufactured in manners similar to those in the steps (1) to (18) (except for (14)) of process C of Example 1. It is noted that the openings for forming solder bump were formed only on one solder resist layer and the openings for mounting optical element were formed only on the other solder resist layer.

Figure 48:
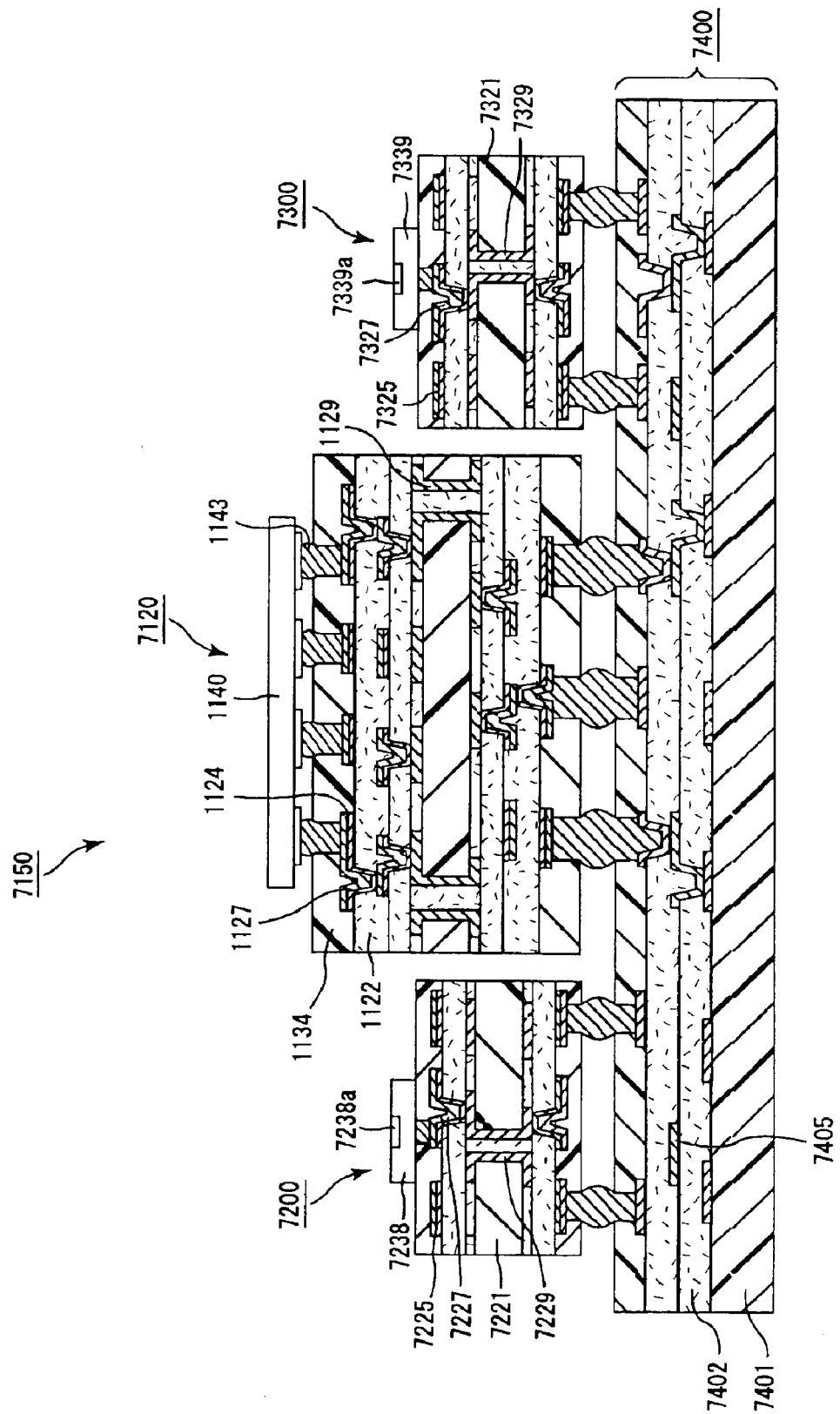
FIG. 48 is a cross-sectional view schematically showing a substrate for mounting an IC chip and the like manufactured in Comparative Example 1.

Next, optical elements were mounted and solder bumps were formed in a manner similar to that in the step (19) of Example 1. Herein, only one of the light receiving element made of InGaAs or the light emitting element made of In GaAsP was mounted. A substrate 7200 on which a light receiving element 7238 was mounted and a substrate 7300 on which a light emitting element 7339 was mounted were manufactured separately (see FIG. 48). In FIG. 48, reference symbol 7238a denotes a light receiving surface, 7339a denotes a light emitting surface, 7221 and 7321 denote substrates, 7225 and 7325 denote conductor circuits, 7227 and 7327 denote via-holes and 7229 and 7329 denote plated-through holes.

Herein, the optical element-mounting substrate was manufactured using a substantially similar method to that for manufacturing the substrate for mounting an IC chip, except that the size thereof was changed based on necessity.

Next, a printed circuit board 7400 on which conductor circuits 7405 and interlaminar insulating layers 7402 were built up was prepared on one surface of the substrate 7401. The substrate for mounting an IC chip manufactured through the steps described in process A and the optical element-mounting substrate manufactured through the steps described in process B were mounted on this printed circuit board 7400. It is noted that an IC chip was mounted on the substrate for mounting an IC chip in advance.

Thereafter, the end face of an optical fiber was arranged at a position confronting the light receiving part of the light receiving element, a detector was attached to a position confronting the light emitting part of the light emitting element, an optical signal was transmitted through the optical fiber, the IC chip was allowed to perform arithmetic operation and then the optical signal was detected by the detector. As a result, signal error was partially detected. The reason is considered as follows. Since the distance between the optical component and the IC chip became larger than that for the substrate for mounting an IC chip on which the optical components were mounted in Example 1, signal error due to cross-talk noise occurred.

EXAMPLE 4

A. Production of Resin Film for Interlaminar Insulating Layer 30 parts by weight of bisphenol A-type epoxy resin (epoxy equivalent: 469, Epicoat 1001, made by Yuka Shell Epoxy Co., Ltd.), 40 parts by weight of cresol-novolac type epoxy resin (epoxy equivalent: 215, Epiclon N-673 made by Dainippon Ink and Chemicals, Inc.), and 30 parts by weight of triazine structure containing phenol-novolac resin (phenol hydroxyl group equivalent: 120, Phenolite KA-7052 made by Dainippon Ink and Chemicals, Inc.) were dissolved while being heated in 20 parts by weight of ethyl diglycol acetate and 20 parts by weight of solvent naphtha under stirring condition, followed by the addition of 15 parts by weight of epoxy-terminated polybutadiene rubber (Denalex R-45EPT, made by Nagase Chemicals Ltd.) and 1.5 parts by weight of a pulverized product of 2-phenyl-4,5-bis(hydroxymethyl) imidazole, 2 parts by weight of a finely pulverized silica, and 0.5 parts by weight of a silicon based defoaming agent to prepare an epoxy resin composition.

After the obtained epoxy resin composition was applied to a 38 μm-thick PET film so as to adjust the thickness after drying to be 50 μm by a roll coater, the resulting film was dried at 80 to 120° C. for 10 minutes to produce a resin film for an interlaminar insulating layer.

B. Preparation of Resin Composition for through Hole Filler

A container was loaded with 100 parts by weight of bisphenol F epoxy monomer (YL 983 U made by Yuka Shell Epoxy Co.; molecular weight of 310), 170 parts by weight of a $SiO_2$ spherical particle coated with a silane coupling agent and having an average particle diameter of 1.6 μm and a diameter of the maximum particle of 15 μm or less (made by ADTEC Co., Ltd.: CRS 1101-CE), and 1.5 parts by weight of a leveling agent (Perenol S4 made by Sannopuko KK) and they were stirred and mixed to prepare a resin filler with a viscosity of 45 to 49 Pa·s at 23±1° C. As a curing agent, 6.5 parts by weight of an imidazole curing agent (made by Shikoku Chemicals Corp.: 2E4MZ-CN) was employed.

C. Manufacture of Maultilayered Printed Circuit Board (1) A Copper-clad laminate plate comprising an insulating substrate 2001 which is made of a 0.8 mm-thick glass epoxy resin or BT (Bismaleimide-Triazine) resin with a 18 μm-thick copper foil 2008 laminated on both sides of the substrate 2001 was used as a starting material (see FIG.

9(a)). First, the copper-clad laminate plate was drilled to bore holes and then, electroless plating treatment was performed and pattern etching was performed to form conductor circuits 2004 and plated-through holes 2009 on both faces of the substrate 2001.

Figure 9:
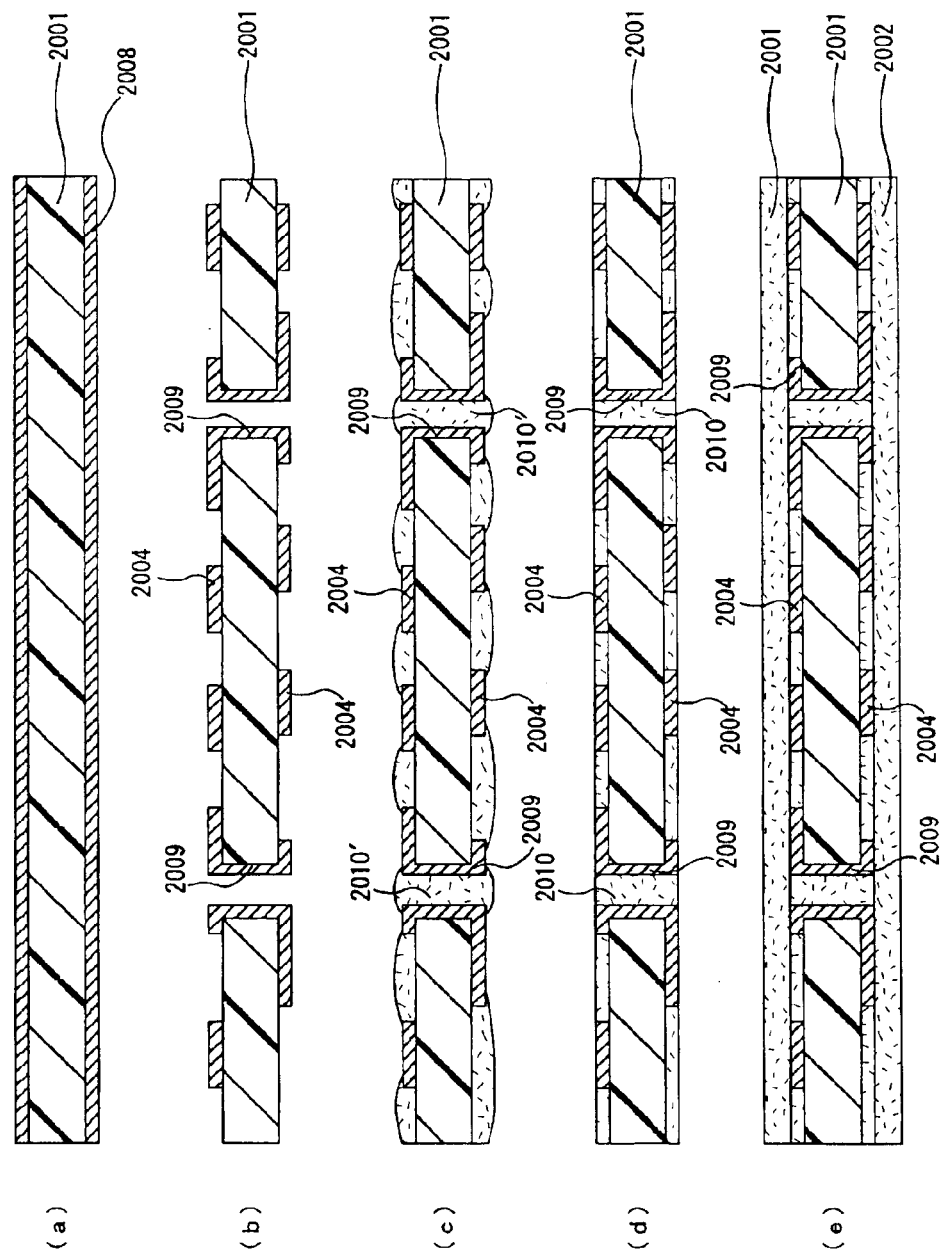
FIG. 9 is a cross-sectional view schematically showing part of the steps of manufacturing the multilayered printed circuit board according to the second group of the present invention.

(2) The substrate in which the plated-through hole 2009 and the conductor circuits 2004 were formed was washed with water and degreased with an acid, soft etching was performed and then, etching solution was sprayed on both faces of the substrate and fed by a transport roller, thereby forming roughened surfaces (not shown) on the surfaces of the conductor circuits 2004 including the plated-through holes 2009 there for (see FIG. 9(b)). As the etching solution, etching solution (made by Mec Co., Ltd., Mec Etch Bond) containing 10 parts by weight of an imidazole copper (II) complex and 7 parts by weight of glycolic acid, and 5 parts by weight of potassium chloride was used.

(3) After the resin filler described in process B was prepared, the layer 2010' of the resin filler was formed inside the plated-through holes 2009, the conductor circuit non-formed parts on one surface of the substrate 2001 and the peripheral portions of the conductor circuits 2004 by the following method within 24 hours after the preparation.

That is, first, the resin filler was pushed in the plated-through holes using a squeegee and then dried under the conditions of 100° C. for 20 minutes. Next, a mask drawing openings corresponding to the conductor circuit non-formed parts was put on the substrate and the layer 2010' of the resin filler was formed in the conductor circuit non-formed parts, which were concave portions, using the squeegee and then dried under the conditions of 100° C. for 20 minutes. Likewise, the layer 2010' of the resin filler was formed in the conductor circuit non-formed parts and the peripheral portions of the conductor circuits on the other surface of the substrate (see FIG. 9(c)).

(4) One surface of the substrate for which the above-mentioned treatment (3) was finished was ground by a belt sander grinder using #600 belt grinding-paper (made by Sankyo Rikagaku Co., Ltd.) so as not to leave the resin filler 2010' on the surfaces of the conductor circuits 2004 and the land surfaces of the plated-through holes 2009 and then, buffing was performed to remove the scratches by the above-mentioned belt sander grinding. A series of such grinding steps were performed for the other surface of the substrate in a similar manner.

Next, heating treatments at 100° C. for 1 hour, 120° C. for 3 hours, 150° C. for 1 hour and 180° C. for 7 hours were performed to form a resin filler layer 2010.

In such a manner, the surface layer part of the resin filler layer 2010 formed in the plated-through holes 2009 and the conductor circuit non-formed parts and the surfaces of the conductor circuits 2004 were made flat to obtain an insulating substrate (see FIG. 9(d)) wherein: the resin filler 2010 and the side surfaces of the conductor circuits 2004 were firmly stuck to each other through the roughened surfaces; and also the inner wall surfaces of the plated-through holes 2009 and the resin filler 2010 were firmly stuck to each other through the roughened surfaces. By this step, the surface of the resin filler layer 2010 was flush with the surfaces of the conductor circuits 2004.

(5) After the above-mentioned substrate was washed with water and degreased with an acid, soft etching was performed and then, etching solution was sprayed on both faces of the substrate to etch the surfaces of the conductor circuits 2004 and the land surfaces and inner walls of the plated-through holes 2009 to form the roughened surfaces (not shown) on the entire surfaces of the conductor circuits 2004. As the etching solution, etching solution (made by Mec Co., Ltd., Mec Etch Bond) containing 10 parts by weight of an imidazole copper (II) complex and 7 parts by weight of glycolic acid, and 5 parts by weight of potassium chloride was used.

(6) Next, a resin film for an interlaminar insulating layer with a slightly larger size than the substrate produced by process A was put on each surface of the substrate, temporarily pressure-bonded under the conditions of 0.4 MPa pressure, 80° C. temperature, and 10-second pressure bonding period and cut and after that, laminated by the following method using a vacuum laminator apparatus and successively subjected to thermosetting treatment to form interlaminar insulating layers 2002 (see FIG. 9(e)).

That is, the resin film for an interlaminar insulating layer was actually laminated on the substrate by pressure bonding under the conditions of 65 Pa degree of vacuum, 0.4 MPa pressure, 80° C. temperature, and 60-second pressure bonding period and further subjected to thermosetting at 170° C. for 30 minutes.

(7) Next, openings 2006 for via-holes with 80 μm diameter were formed in the interlaminar insulating layers 2002 by a $CO_2$ gas laser of 10.4 μm wavelength through a 1.2 mm-thick mask having through holes in conditions of the beam diameter of 4.0 mm, the top hat mode, the pulse width of 8.0 μs, 1.0 mm-diameter of the through holes of the mask, and one shot (see FIG. 10(a)).

(8) The surfaces of the interlaminar insulating layers 2002 were roughened by performing plasma treatment using SV-4540 made by ULVAC, Inc. The plasma treatment was performed with argon gas used as inert gas under the conditions of power of 200 W, gas pressure of 0.6 Pa and a temperature of 70° C. for 2 minutes.

Next, using the same apparatus, after the gas inside the apparatus was exchanged, sputtering was performed using SV-4540 with Ni set as a target under the conditions of an atmospheric pressure of 0.6 Pa, a temperature of 80° C., a power of 200 W, a period of 5 minutes, thereby forming a metal layer made of Ni on each interlaminar insulating layer 2002. The thickness of Ni layer was 0.1 μm.

(9) Next, the substrate on which the Ni layers were formed was immersed in an electroless copper plating aqueous solution having the following composition to form electroless copper plating film with a thickness of 0.6 to 3.0 μm on the surface of each Ni layer (see FIG. 10(b)). In FIG. 10(b), the Ni layers and thin film conductor layers 2012 each comprising the Ni layer and the electroless copper plating layer.

| [Electroless plating solution] | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]

30° C. Liquid Temperature for 40 Minutes

Figure 10:
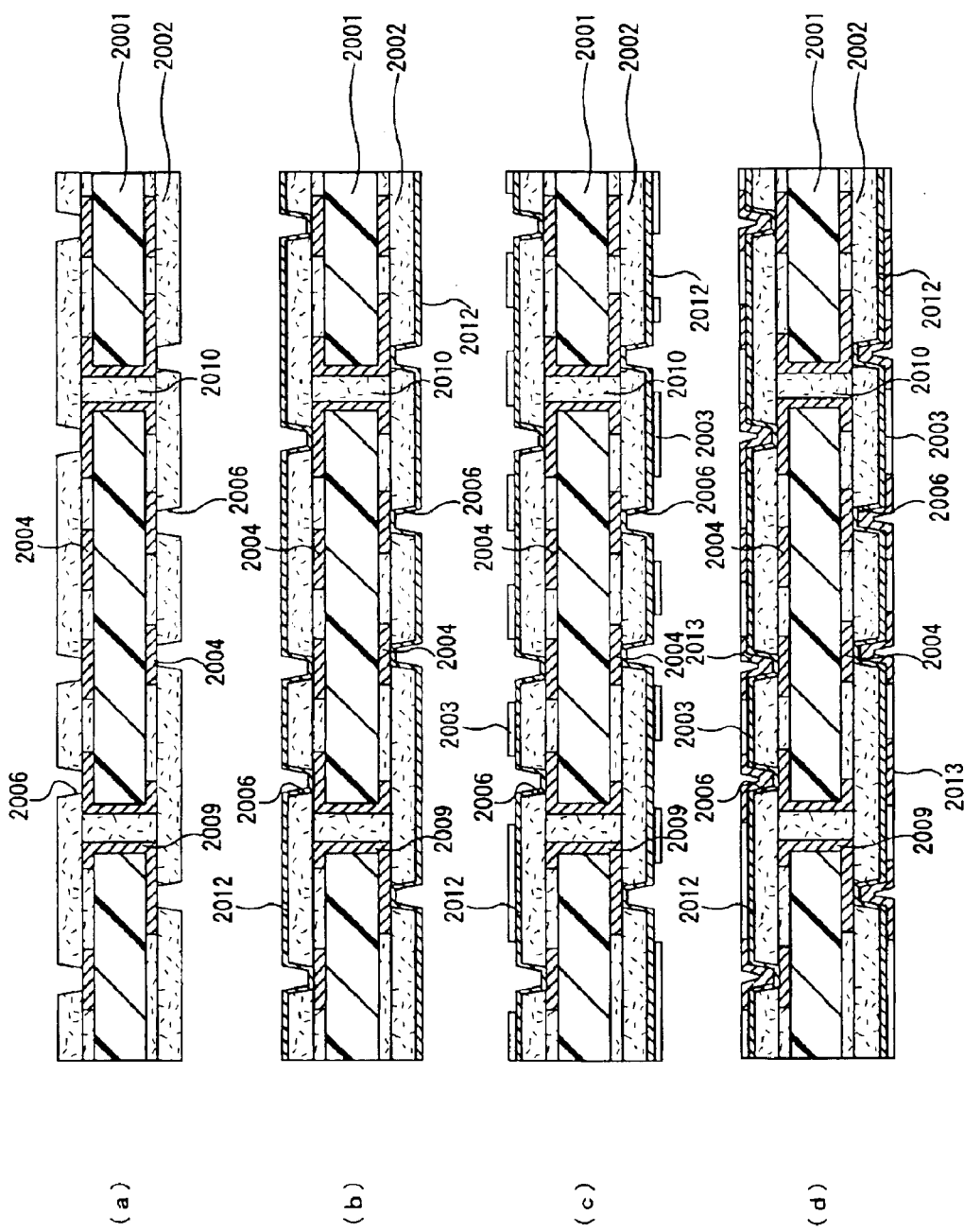
FIG. 10 is a cross-sectional view schematically showing part of the steps of manufacturing the multilayered printed circuit board according to the second group of the present invention.

(10) Next, a commercially available photosensitive dry film was stuck to the substrate on which the electroless copper plating films 2012 were formed, a mask was put thereon, and exposure with a dose of 100 μmJ/cm² and development with an aqueous 0.8% sodium carbonate solution were performed to form a plating resist 2003 having a thickness of 20 μm (see FIG. 10(*c*)).

(11) Next, the substrate was washed with water at 50° C. to be degreased, washed with water at 25° C. and further washed with sulfuric acid. The substrate was then subjected to electroplating under the following conditions to form electroplating copper films 2013 having a thickness of 20 μm in portions in which the plating resist 2003 was not formed (see FIG. 10(*d*)).

| [Electroplating solution] | |
|---|---|
| Sulfuric acid | 2.24 mol/l |
| Copper sulfate | 0.26 mol/l |
| Additive | 19.5 ml/l |

(Cupracid GL Made by Atotech Japan Co., Ltd.)

| [Electroplating conditions] | |
|---|---|
| Current density | 1 A/dm² |
| Time | 65 minutes |
| Temperature | 22 ± 2° C. |

Figure 11:
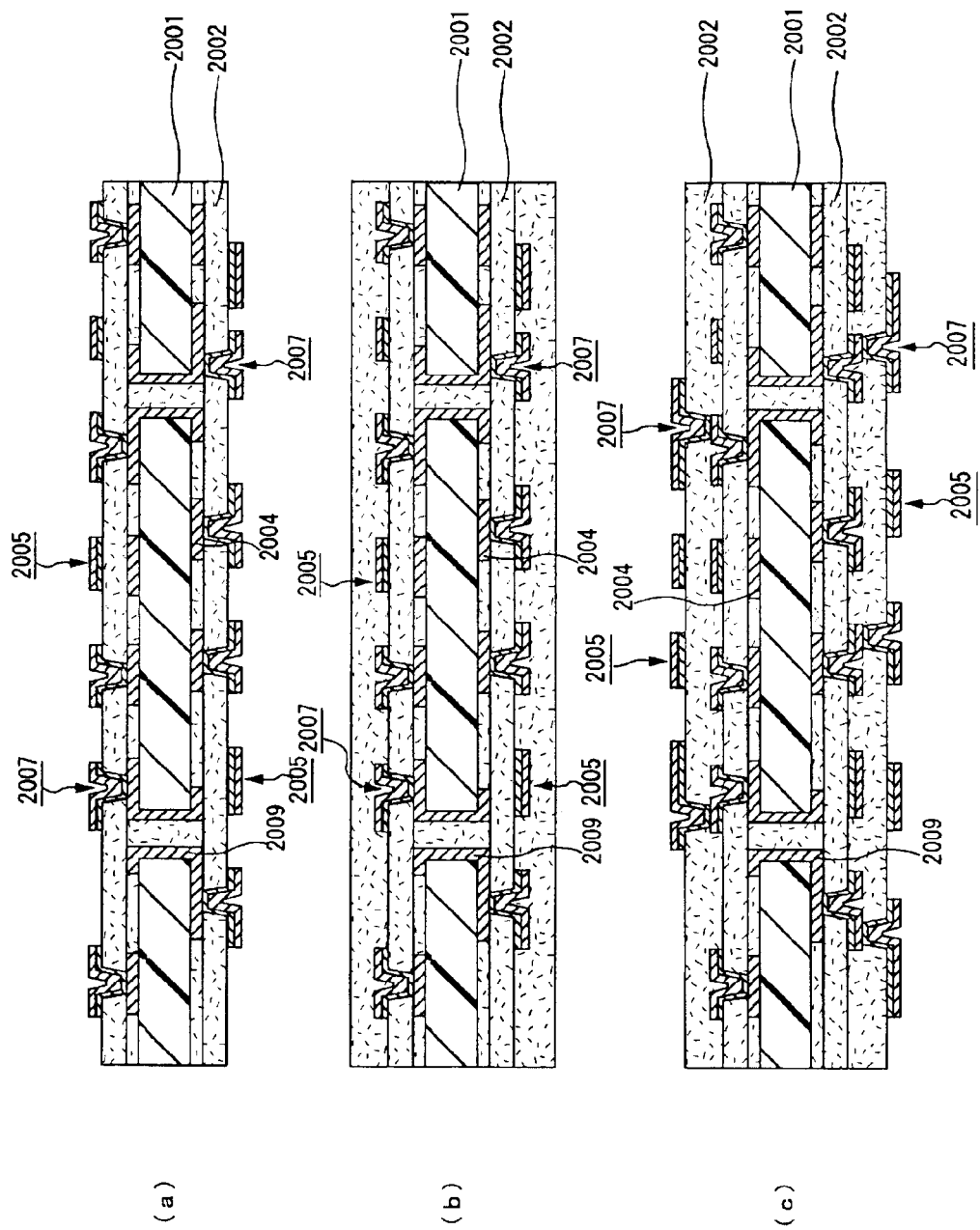
FIG. 11 is a cross-sectional view schematically showing part of the steps of manufacturing the multilayered printed circuit board according to the second group of the present invention.

(12) After peeling off the plating resists 2003 with 5% NaOH, the electroless plating film under the plating resists 2003 were etched, dissolved and removed with a solution mixture of sulfuric acid and hydrogen peroxide, thus forming conductor circuits 2005 (including via-holes 2007) each comprising the electroless copper plating film 2012 and the electroplating copper film 2013 and having a thickness of 18 μm (see FIG. 11(*a*)).

(13) The steps (5) to (12) were repeated to build up interlaminar insulating layers and conductor layers on further upper layers (see FIGS. 11(*b*) to 11(*c*)). Further, using a similar method to that used in the step (5), a roughened surface was formed on the conductor circuit on the outermost layer.

Figure 12:
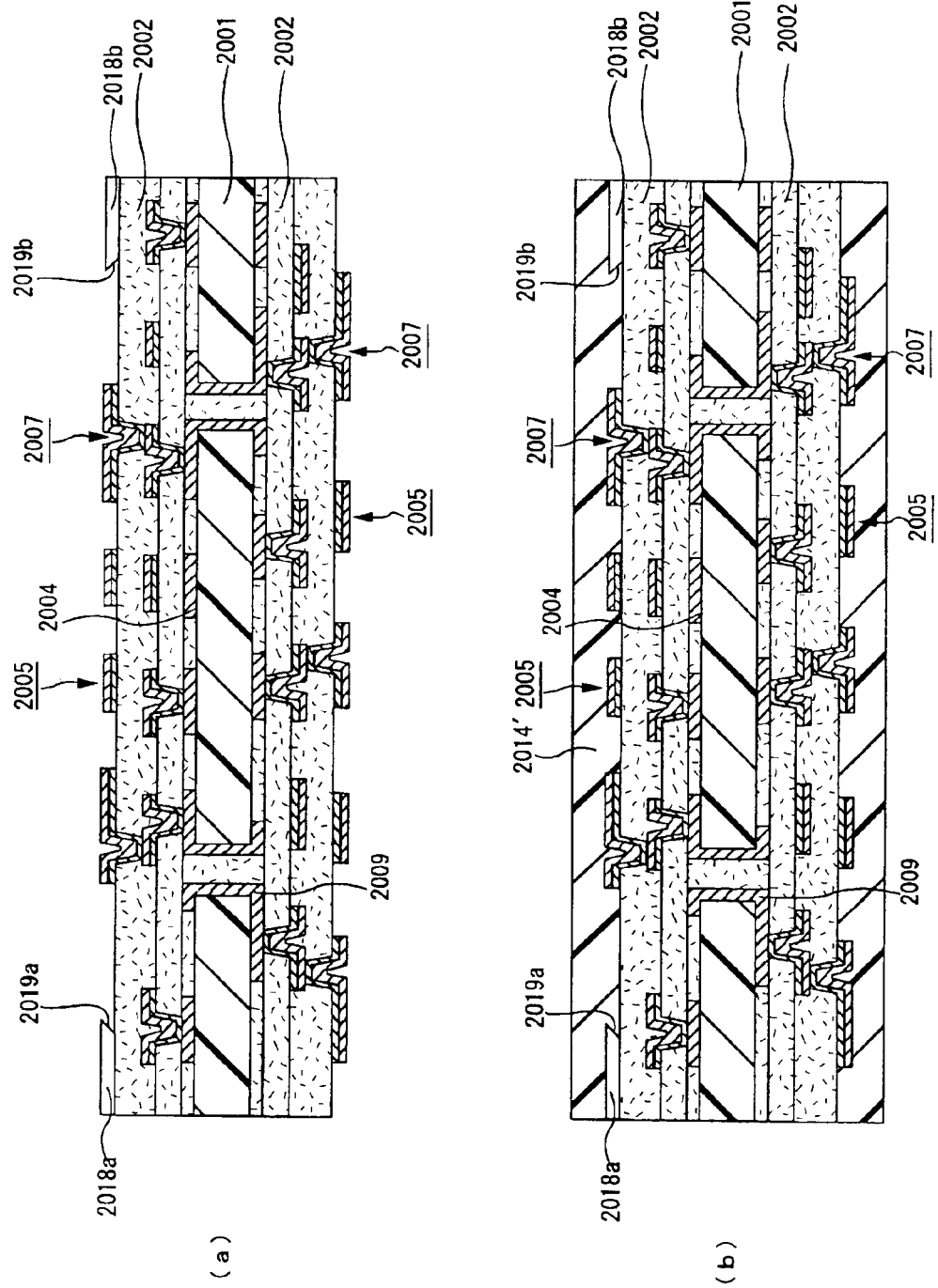
FIG. 12 is a cross-sectional view schematically showing part of the steps of manufacturing the multilayered printed circuit board according to the second group of the present invention.

(14) Optical waveguides 2018*a* and 2018*b* having optical path conversion mirrors 2019*a* and 2019*b* were formed at predetermined positions on the surface of the outermost interlaminar insulating layer 2002, respectively, using the following method (see FIG. 12(*a*)).

Namely, film-shaped optical waveguides (made by STEAG microParts GmbH., width: 25 μm and thickness: 25 μm) comprising PMMA and having 45°-optical path conversion mirrors formed in advance, respectively, by using a diamond saw having a 90°-V-shaped tip end, were bonded such that the side surfaces on the other ends of the optical waveguides on the optical path conversion mirror non-formed side were aligned to the side surfaces of the interlaminar insulating layers.

The bonding of the optical waveguides was performed by: applying adhesive comprising thermosetting resin onto the bonding surfaces of the optical waveguides with the interlaminar insulating layers by a thickness of 10 μm; bonding it thereon with pressure; and then curing the adhesive at 60° for 1 hour.

In this example, the curing treatment was performed under the conditions at 60° C. and 1 hour. In some cases, step curing may be performed. This is because stress tends to occur less frequently to the optical waveguides during bonding by conducting the step curing.

(15) Next, a container was loaded with: 46.67 parts by weight of an oligomer provided with a photosensitivity (molecular weight: 4000) obtained by acrylating 50% of an epoxy group of cresol-novolac type epoxy resin (made by Nippon Kayaku Co., Ltd.), dissolved in diethylene glycol dimethyl ether (DMDG) to be 60% by weight concentration; 15.0 parts by weight of bisphenol A-type epoxy resin (trade name: Epicoat 1001, made by Yuka Shell Epoxy Co., Ltd.) dissolved in methyl ethyl ketone to be 80% by weight concentration; 1.6 parts by weight of imidazole curing agent (trade name: 2E4MZ-CN, made by Shikoku Corp.) ; 3.0 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE6A, made by Kyoei Chemical Co., Ltd.); and 0.71 parts by weight of the dispersion type defoaming agent (S-65, made by San Nopco Ltd.), and they were stirred and mixed to prepare the mixed composition. Then, to the mixed composition, 2.0 parts by weight of benzophenone (made by Kanto Kagaku Corp.) as a photoinitiator and 0.2 parts by weight of Michler's ketone (made by Kanto Kagaku Corp.) as a photosensitizer were added to the mixed composition to obtain a solder resist composition adjusted to have a viscosity of 2.0 Pa·s at 25° C.

The viscosity measurement was performed using a rotor No. 4 in the case of 60 min$^{-1}$ (rpm) and a rotor No. 3 in the case of 4.6 min$^{-1}$ (rpm) using a B-type viscometer (DVL-B type, made by Tokyo Keiki Co., Ltd.).

(16) Next, the above-mentioned solder resist composition was applied onto both faces of the substrate on which the optical waveguides 2018*a* and 2018*b* were formed and dried under the conditions of 70° C. for 20 minutes and 70° C. for 30 minutes, thereby forming layers 2014' of the solder resist composition (see FIG. 12(*b*)).

(17) A 5 mm-thick photomask drawing a pattern of openings for mounting the substrate for mounting IC chip and those for optical paths, was firmly stuck to the solder resist composition layer 2014' on the side on which the optical waveguides were formed, followed by the exposure to UV rays of 1000 mJ/cm² dose and development with the DMTG solution to form openings for mounting the substrate for mounting an IC chip and openings for optical paths having an opening diameter of 400 μm. Further, heat treatments were performed at 80° C. for 1 hour, 100° C. for 1 hour, 120° C. for 1 hour and 150° C. for 3 hours, respectively, to cure the solder resist composition layers, thus forming a solder resist layer 2014 having openings 2015 for mounting the substrate for mounting an IC chip and openings 2019*a* and 2019*b* for optical paths. The openings for mounting the substrate for mounting an IC chip were set to have a pitch of 1.27 mm and a diameter of 600 μm.

Figure 13:
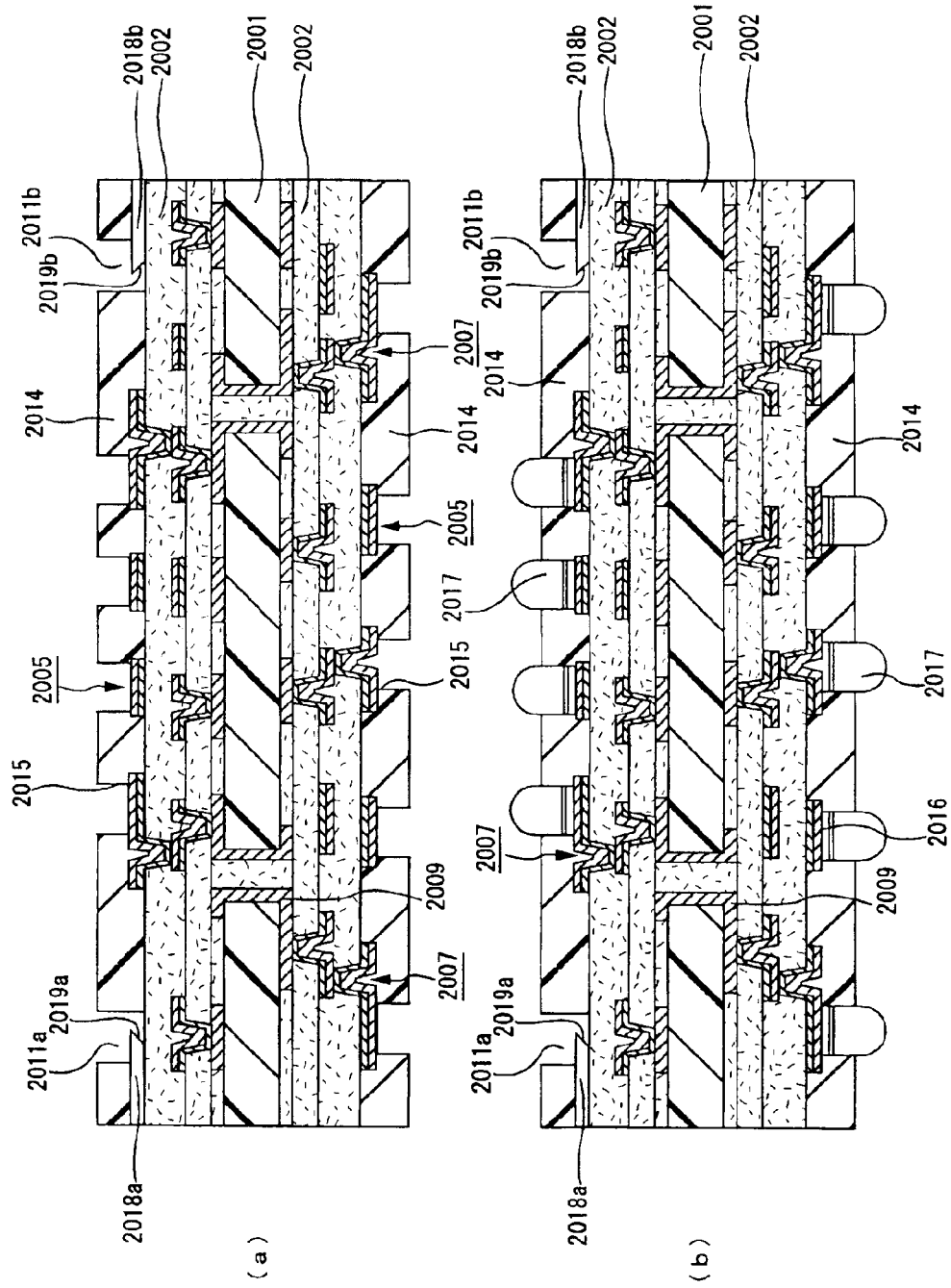
FIG. 13 is a cross-sectional view schematically showing part of the steps of manufacturing the multilayered printed circuit board according to the second group of the present invention.

Further, a 5 mm-thick photomask drawing a pattern of openings for mounting surface mount-type electronic components was firmly stuck to the solder resist composition layer 2014' on the side on which the optical waveguides were not formed, followed by exposure and development to be cured under the above-mentioned conditions, thereby forming a solder resist layer 2014 having openings 2015 for mounting surface mount-type electronic components (see FIG. 13(*a*)). As the solder resist composition, a commercially available solder resist composition can be also used.

(18) Next, the substrate on which the solder resist layers 2014 were formed was immersed in an electroless nickel plating solution having pH 4.5 and containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form 5 μm-thick nickel plating layers in the openings 2015 for mounting the substrate for mounting an IC chip and the surface mount-type electronic components, respectively. Further, the obtained substrate was immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) under the conditions of 80° C. for 7.5 minutes to form a 0.03 μm-thick gold plating layer on each nickel plating layer, thus obtaining pads 2016 for surface mount.

(19) Solder paste (Sn/Ag=96.5/3.5) was printed in the openings 2015 for mounting the substrate for mounting an IC chip formed in the solder resist layer 2014 and then reflow was performed at 250° C., to thereby obtain a multilayered printed circuit board (see FIG. 13(*b*)).

EXAMPLE 5

A multilayered printed circuit board was manufactured in similar manners to those of Example 4 except that film-shaped organic optical waveguides (width: 50 μm, thickness: 50 μm) comprising polyimide fluoride and having 45°-optical path conversion mirrors formed in advance, by using a diamond saw having a 90°-V-shaped tip end, in the step (14) of Example 4.

EXAMPLE 6

A multilayered printed circuit board was manufactured in similar manners to those of Example 4 except that film-shaped organic optical waveguides (width: 50 μm, thickness: 50 μm) comprising epoxy resin and having 45°-optical path conversion mirrors formed in advance, by using a diamond saw having a 90°-V-shaped tip end, in the step (14) of Example 4.

The multilayered printed circuit boards obtained in Examples 4 to 6 were evaluated based on the following evaluation method by performing (1) observation of shape of optical waveguide, (2) optical signal detection and (3) continuity test.

Evaluation Method (1) Observation of Shape of Optical Waveguide

For the multilayered printed circuit boards in Examples 4 to 6, these boards were cut by a cutter so as to cross the organic optical waveguides and the cross sections of the organic optical waveguides were observed.

(2) Optical Signal Detection

A substrate for mounting an IC chip on which a light receiving element and a light emitting element were mounted was connected to s side of each of the multilayered printed circuit boards in Examples 4 to 6, on which side the organic optical waveguides were formed, such that the light receiving element and the light emitting element were arranged at positions confronting the openings for optical paths, respectively.

Next, an optical fiber was attached to the exposed surface of the optical waveguide confronting the light emitting element, at the side surface of each multilayered printed circuit board and a detector was attached to the exposed surface of the optical waveguide confronting the light receiving element, at the side surface of each multilayered printed circuit board. Thereafter, an optical signal was transmitted through the optical fiber to the multilayered printed circuit board, the IC chip was allowed to perform arithmetic operation and then the detector detected the optical signal.

(3) Continuity Test

Similarly to the optical signal detection, the substrate for mounting an IC chip was connected to multilayered printed circuit board and a continuity test was then performed. A continuity state was evaluated based on the result displayed on a monitor.

The result of the evaluation of each of the multilayered printed circuit boards in Examples 4 to 6 demonstrated that two kinds of optical waveguides, i.e., the optical waveguide for receiving light and the optical waveguide for emitting light were formed at predetermined positions, respectively.

In addition, in each of the multilayered printed circuit boards in Examples 4 to 6, when the substrate for mounting an IC chip was connected to the multilayered printed circuit board and an optical signal was transmitted thereto, it was possible to detect a desired optical signal, and each of the multilayered printed circuit boards manufactured in Examples 4 to 6 had sufficiently high optical signal transmission ability.

Moreover, the continuity test when the substrate for mounting an IC chip was connected thereto demonstrated that no electric signal continuity problem occurred to each of the multilayered printed circuit boards in Examples 4 to 6 and that an electric signal as well as an optical signal was able to be transmitted.

Additionally, the transmission loss of each optical waveguide with 850 nm-wavelength light was measured to be 0.3 dB/cm.

EXAMPLE 7

A multilayered printed circuit board was manufactured similarly to Example 4 except for using optical waveguides produced by the following method in the step (4) of Process C of Example 4.

That is, ①acrylic resin (refractive index: 1.52, transmissivity: 94%/mm, thermal expansion coefficient: 72 ppm) was prepared as resin for forming core part and acrylic resin (refractive index: 1.51, transmissivity: 93%/mm, thermal expansion coefficient of 70 ppm) was prepared as resin for forming the cladding part. The resin for forming core part and resin for forming the cladding part were prepared to have a viscosity of 1000 cps (mPa·s). The viscosity was adjusted using ethyl lactate.

②Next, using a spin coater, resin for forming the cladding part was applied at 1000 pm/10 sec, and then pre-bake at 80° C. for 10 minutes, exposure with 2000 mJ and post-bake at 150° C. for 1 hour were performed, thereby forming an under-cladding part.

③ The resin for forming core part was applied onto the under-cladding part at 1200 pm/10 sec using the spin coater, and then pre-bake at 80° C. for 10 minutes, exposure with 1000 mJ, dip phenomenon using 1% TMH for 2 minutes and post-bake at 150° C. for 1 hour were performed, thereby forming a core part.

④ Further, resin for forming the cladding part was applied onto the under-cladding part and the core part at 1000 pm/10 sec using the spin coater, and then pre-bake at 80° C. for 10 minutes, exposure with 2000 mJ and post-bake at 150° C. for 1 hour were performed, thereby forming a core part and producing an optical waveguide. The optical waveguide thus formed was such that the cross-sectional size of the core part was 50×50 μm and the film thicknesses of the over-cladding part and under-cladding part were 50 μm.

⑤ Dicing was performed using a 90°-#3000 blade to form a 45°-optical path conversion part. A mirror was not formed by metallic deposition or the like. In addition, the transmission loss of the 45° optical waveguide thus formed was 1.2 dB.

EXAMPLES 8 to 15

A multilayered printed circuit board was manufactured similarly to Example 7 except that the optical waveguide was formed using, a resin for forming the cladding part composition to which pulverized silica particles having a particle distribution of 0.1 to 0.8 μm were added so as to have mixing quantities shown in Table 1 below, as resin for forming the cladding part used in Example 7.

TABLE 1

|  | Content of pulverized silica (% by weight) | transmissivity (%/mm) | Thermal expansion coefficient (ppm) |
|---|---|---|---|
| Example 8 | 8 | 84 | 61 |
| Example 9 | 10 | 82 | 58 |
| Example 10 | 15 | 84 | 53 |
| Example 11 | 25 | 81 | 46 |
| Example 12 | 50 | 82 | 41 |
| Example 13 | 60 | 79 | 37 |
| Example 14 | 70 | 75 | 34 |
| Example 15 | 80 | 77 | 29 |

For the multilayered printed circuit boards thus obtained in Examples 7 to 15, the formation ability of the cladding part at the time of forming each optical waveguide and the presence or absence of cracks on the optical waveguide after a liquid-phase temperature cycle test were evaluated. The evaluation results are shown in Table 2.

The formation ability of the cladding part was evaluated based on whether a cladding part having a predetermined thickness was able to be formed.

In addition, the liquid-phase cycle test was performed under similar conditions to those in Example 7. The presence or absence of cracks on the optical waveguide was determined by cutting the multilayered printed circuit board to cross the optical waveguide and observing the cross section of the multilayered printed circuit board.

TABLE 2

|  | Formation ability of cladding | Liquid-phase temperature cycle | | |
|---|---|---|---|---|
|  |  | 250 cycles | 500 cycles | 1000 cycles |
| Example 7 | ○ | ○ | ○ | Δ |
| Example 8 | ○ | ○ | ○ | Δ |
| Example 9 | ○ | ○ | ○ | Δ |
| Example 10 | ○ | ○ | ○ | ○ |
| Example 11 | ○ | ○ | ○ | ○ |
| Example 12 | ○ | ○ | ○ | ○ |
| Example 13 | ○ | ○ | ○ | ○ |
| Example 14 | ○ | ○ | ○ | ○ |
| Example 15 | Δ | ○ | ○ | ○ |

Evaluation Standard of Formation Ability of Cladding Part

○ When forming 10 pieces of optical waveguides, cladding parts were able to be formed to have designed film thicknesses for all the optical waveguides.

Δ When forming 10 pieces of optical waveguides, film thicknesses of cladding parts were partially deviated from designed film thicknesses.

× When forming 10 pieces of optical waveguides, cladding parts having designed film thicknesses were not able to be formed for any of the optical waveguides.

Evaluation Standard of Liquid-Phase Temperature Cycle Test

○ No crack was observed.

Δ Some cracks occurred but optical signal was able to be transmitted through optical waveguide.

× Cracks occurred and optical signal was not able to be transmitted through optical waveguide.

The transmission loss of each optical waveguide was measured by the following method.

The losses of the optical waveguide having lengths of 60 mm, 50 mm, 40 mm and 20 mm were measured, and transmission losses thereof were measured by a cut-back method using minimum square method.

In addition, for the specific transmission loss of each optical waveguide was as follows. The transmission loss of the optical waveguide Example 7) having the core part and cladding part both containing no particles was 0.22 dB/cm, that of the optical waveguide Example 11) with only the core part containing 25% by weight of particles was 0.24 dB/cm and hardly changed even when particles were added to the cladding part.

In Examples 7 to 15, pulverized silica particles were added to the cladding parts constituting the respective optical waveguides. Similar experiments were performed by using titania particles or alumina particles instead of the pulverized silica particles. Regarding the results, although the thermal expansion coefficient slightly different, similar results were obtained for the formation ability of the cladding part and the liquid-phase temperature cycle test.

The optical waveguides formed in Examples 7 to 15 were multi-mode optical waveguides. Even when multilayered printed circuit boards were manufactured similarly to Examples 7 to 15 by using single-mode optical waveguides in stead of the multi-mode optical waveguides, a predetermined optical signal was able to be transmitted for all the optical waveguides.

The single-mode optical waveguide was formed as follows. Siloxane based resin (refractive index: 1.50, transmissivity: 93%/mm, thermal expansion coefficient: 115 ppm) was prepared as resin for forming core part and siloxane based resin (refractive index: 1.48, transmissivity: 93%/mm, thermal expansion coefficient: 141 ppm) was prepared as resin for forming the cladding part. In addition, particles were added to be a predetermined mixing quantity to resin for forming the cladding part if necessary. Using these resins, a single-mode optical waveguide having the cross-sectional size of the core part of 10×10 μm and the film thicknesses of the over-cladding part and the under-cladding part of 10 μm was obtained by a similar method to that in Example 7.

Further, among the optical waveguides formed by the above method, the single-mode optical waveguide having particles mixed to the cladding part had a transmission loss of 0.43 dB/cm for signal light having a wavelength of 1.33 μm and a transmission loss of 0.84 dB/cm for signal light having a wavelength of 1.55 μm, and the single-mode optical waveguide having 50% by weight of particles mixed to the cladding part had a transmission loss of 0.41 dB/cm for signal light having a wavelength of 1.33 μm and a transmission loss of 0.82 dB/cm for signal light having a wavelength of 1.55 μm. The transmission loss was measured by the cut-back method.

The cladding part having no particles mixed had a thermal expansion coefficient of 141 ppm, and the cladding part having particles mixed by 50% by weight had a thermal expansion coefficient of 48 ppm. The optical waveguides were evaluated by conducting the liquid-phase temperature cycle test for the multilayered printed circuit boards using these single-mode optical waveguides. The evaluation results were the same as those for Examples 7 to 15.

EXAMPLE 16

A. Production of Resin Film for Interlaminar Insulating Layer 30 parts by weight of bisphenol A-type epoxy resin (epoxy equivalent: 469, Epicoat 1001 made by Yuka Shell Epoxy Co., Ltd.), 40 parts by weight of cresol-novolac type epoxy resin (epoxy equivalent: 215, Epiclon N-673 made by Dainippon Ink and Chemicals, Inc.), and 30 parts by weight of phenol triazine structure containing novolac resin (phenol hydroxyl group equivalent: 120, Phenolite KA-7052 made by Dainippon Ink and Chemicals, Inc.) were dissolved while being heated in 20 parts by weight of ethyl diglycol acetate and 20 parts by weight of solvent naphtha under stirring condition, followed by the addition of 15 parts by weight of epoxy-terminated polybutadiene rubber (Denalex R-45EPT, made by Nagase Chemicals Ltd.) and 1.5 parts by weight of a pulverized product of 2-phenyl-4,5-bis(hydroxymethyl) imidazole, 2 parts by weight of a finely pulverized silica, and 0.5 parts by weight of a silicon based defoaming agent to prepare an epoxy resin composition.

After the obtained epoxy resin composition was applied to a 38 μm-thick PET film so as to adjust the thickness after drying to be 50 μm by a roll coater, the resulting film was dried at 80 to 120° C. for 10 minutes to produce a resin film for an interlaminar insulating layer.

B. Preparation of Resin Composition for through Hole Filler

A container was loaded with 100 parts by weight of bisphenol F-type epoxy monomer (YL983U, made by Yuka Shell Epoxy Co., Ltd., molecular weight: 310), 170 parts by weight of a $SiO_2$ spherical particle coated with a silane coupling agent and having an average particle diameter of 1.6 μm and a diameter of the maximum particle of 15 μm or less (CRS 1101-CE, made by Adtec Co., Ltd.), and 1.5 parts by weight of a leveling agent (Perenol S4 made by San Nopco Ltd.) and they were stirred and mixed to prepare a resin filler with a viscosity of 45 to 49 Pa·s at 23±1° C. As a curing agent, 6.5 parts by weight of an imidazole curing agent (2E4MZ-CN, made by Shikoku Corp.) was employed.

C. Manufacture of Multilayered Printed Circuit Board (1) A copper-clad laminate plate comprising an insulating substrate 3001 which is made of a 0.8 mm-thick glass epoxy resin or BT (Bismaleimide-Triazine) resin with a 18 μm-thick copper foil 3008 laminated on both sides of the insulating substrate 3001 was used as a starting material (see FIG. 16(a)). First, the copper-clad laminate plate was drilled to bore holes and then, electroless plating treatment was performed and pattern etching was performed to form conductor circuits 3004 and plated-through holes 3009 on both faces of the substrate 3001.

(2) The substrate in which the plated-through hole 3009 and the conductor circuits 3004 were formed was washed with water and degreased with an acid, soft etching was performed and then, etching solution was sprayed on both faces of the substrate and fed by a transport roller, thereby forming roughened surfaces (not shown) on the surfaces of the conductor circuits 3004 including the plated-through holes 3009 there for (see FIG. 16(b)) As the etching solution, etching solution (Mec Etch Bond, made by Mec Co., Ltd.) containing 10 parts by weight of an imidazole copper (II) complex and 7 parts by weight of glycolic acid, and 5 parts by weight of potassium chloride was used.

(3) After the resin filler described in process B was prepared, the layer of the resin filler 3010' was formed inside the plated-through holes 3009, the conductor circuit non-formed parts on one surface of the substrate 3001 and the peripheral portions of the conductor circuits 3004 by the following method within 24 hours after the preparation.

That is, first, the resin filler was pushed in the plated-through holes using a squeegee and then dried under the conditions of 100° C. for 20 minutes. Next, a mask drawing openings corresponding to the conductor circuit non-formed parts was put on the substrate and the layer of the resin filler 3010' was formed in the conductor circuit non-formed parts, which were concave portions, using the squeegee and then dried under the conditions of 100° C. for 20 minutes. Likewise, the layer of the resin filler 3010' was formed in the conductor circuit non-formed parts and the peripheral portions of the conductor circuits 3004 on the other surface of the substrate 3001 (see FIG. 16(c)).

(4) One surface of the substrate for which Process (3) was finished was ground by a belt sander grinder using #600 belt grinding-paper (made by Sankyo Rikagaku Co., Ltd.) so as not to leave the resin filler on the surfaces of the conductor circuits 3004 and the land surfaces of the plated-through holes 3009 and then, buffing was performed to remove the scratches by the above-mentioned belt sander grinding. A series of such grinding steps were performed for the other surface of the substrate in a similar manner.

Next, heating treatments at 100° C. for 1 hour, 120° C. for 3 hours, and 150° C. for 1 hour were performed to form a resin filler layer 3010.

In such a manner, the surface layer part of the resin filler layer 3010 formed in the plated-through holes 3009 and the conductor circuit non-formed parts and the surfaces of the conductor circuits 3004 were made flat to obtain an insulating substrate (see FIG. 16(d))wherein: the resin filler 3010 and the side surfaces of the conductor circuits 3004 were firmly stuck to each other through the roughened surfaces; and also the inner wall surfaces of the plated-through holes 3009 and the resin filler 3010 were firmly stuck to each other through the roughened surfaces. By this step, the surface of the resin filler layer 3010 was flush with the surfaces of the conductor circuits 3004.

(5) After the above-mentioned substrate was washed with water and degreased with an acid, soft etching was performed and then, etching solution was sprayed on both faces of the substrate to etch the surfaces of the conductor circuits 3004 and the land surface sand inner walls of the plated-through holes 3009 to form the roughened surfaces on the entire surfaces of the conductor circuits 3004. As the etching solution, etching solution (Mec Etch Bond, made by Mec Co., Ltd.) containing 10 parts by weight of an imidazole copper (II) complex, 7 parts by weight of glycolic acid, and 5 parts by weight of potassium chloride was used.

Figure 16:
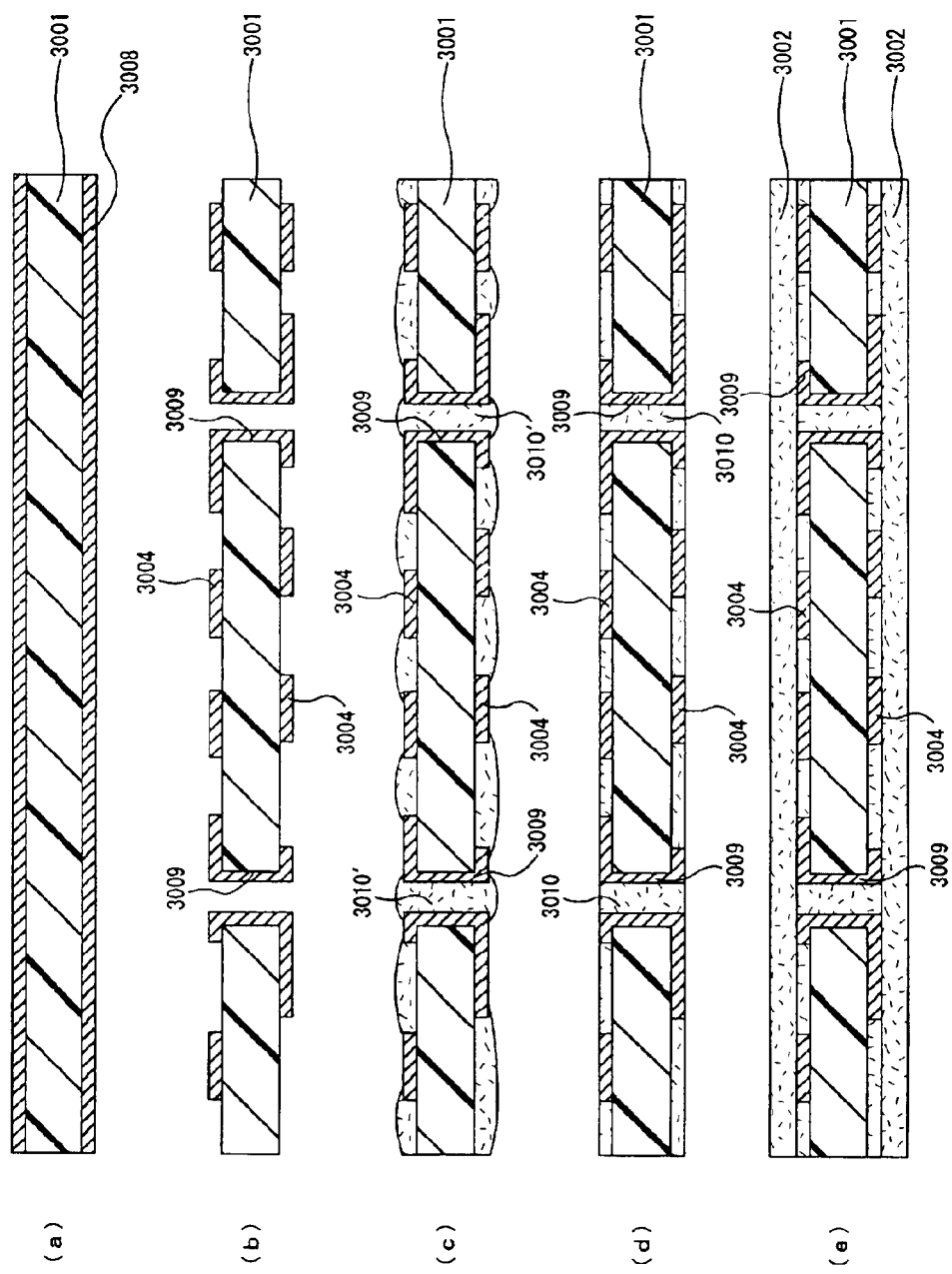
FIG. 16 is a cross-sectional view schematically showing part of the steps of manufacturing the multilayered printed circuit board according to the first aspect of the third group of the present invention.

(6) Next, a resin film for an interlaminar insulating layer with a slightly larger size than the substrate produced by process A was put on each surface of the substrate, temporarily pressure-bonded under the conditions of 0.4 MPa pressure, 80° C. temperature, and 10-second pressure bonding period and cut and after that, laminated by the following method using a vacuum laminator apparatus and successively subjected to thermosetting treatment to form interlaminar insulating layers 3002 (see FIG. 16 (e)). That is, the resin film for an interlaminar insulating layer was actually laminated on the substrate by pressure bonding under the conditions of 65 Pa degree of vacuum, 0.4 MPa pressure, 80° C. temperature, and 60-second pressure bonding period and further subjected to thermosetting at 170° C. for 30 minutes.

(7) Next, openings 3006 for via-holes with 80 μm diameter were formed in the interlaminar insulating layers 3002 by a $CO_2$ gas laser of 10.4 μm wavelength through a 1.2 mm-thick mask having through holes in conditions of the beam diameter of 4.0 mm, the top hat mode, the pulse width of 8.0 μs, 1.0 mm-diameter of the through holes of the mask, and one shot (see FIG. 17(a)).

(8) The surfaces of the interlaminar insulating layers 3002 were roughened by performing plasma treatment using SV-4540 made by ULVAC, Inc. The plasma treatment was performed with argon gas used as inert gas under the conditions of power of 200 W, gas pressure of 0.6 Pa and a temperature of 70° C. for 2 minutes.

Next, using the same apparatus, after the gas inside the apparatus was exchanged, sputtering was performed using SV-4540 with Ni set as a target under the conditions of an atmospheric pressure of 0.6 Pa, a temperature of 80° C., a power of 200 W, a period of 5 minutes, thereby forming a metal layer comprising Ni on each interlaminar insulating layer 3002. The thickness of Ni layer was 0.1 μm.

(9) Next, the substrate on which the Ni layers were formed was immersed in an electroless copper plating aqueous solution having the following composition to form electroless copper plating film with a thickness of 0.6 to 3.0 μm on the surface of each Ni layer (see FIG. 17(b)). In FIG. 17(b), thin film conductor layers 3012 each comprising the Ni layer and the electroless copper plating layer are shown.

| [Electroless plating solution] | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
30° C. Liquid Temperature for 40 Minutes

(10) Next, a commercially available photosensitive dry film was stuck to the substrate on which the electroless copper plating films 3012 were formed, a mask was put thereon, and exposure with a dose of 100 mJ/cm² and development with an aqueous 0.8% sodium carbonate solution were performed to form a plating resist 3003 having a thickness of 20 μm (see FIG. 17(c)).

(11) Next, the substrate was washed with water at 50° C. to be degreased, washed with water at 25° C. and further washed with sulfuric acid. The substrate was then subjected to electroplating under the following conditions to form electroplating copper films 3013 having a thickness of 20 μm in portions in which the plating resist 3003 was not formed (see FIG. 17(d)).

| [Electroplating solution] | |
|---|---|
| Sulfuric acid | 2.24 mol/l |
| Copper sulfate | 0.26 mol/l |
| Additive | 19.5 ml/l |

(Cupracid GL, Made by Atotech-Japan)

| [Electroplating conditions] | |
|---|---|
| Current density | 1 A/dm² |
| Time | 65 minutes |
| Temperature | 22 ± 2° C. |

(12) After peeling off the plating resists 3003 with 5% NaOH, the electroless plating film under the plating resists 3003 were etched, dissolved and removed with a solution mixture of sulfuric acid and hydrogen peroxide, thus forming conductor circuits 3005 (including via-holes 3007) each comprising the electroless copper plating film 3012 and the electroplating copper film 3013 and having a thickness of 18 μm (see FIG. 18(a)).

(13) The steps (5) to (12) were repeated to build up interlaminar insulating layers and conductor layers on further upper layers (see FIGS. 18(b) to 18(c)). Further, using a similar method to that used in the step (5), a roughened surface (not shown) was formed on the conductor circuit 3005 (including via-holes 7) on the outermost layer, whereby a multilayered printed circuit borad was obtained.

Figure 19:
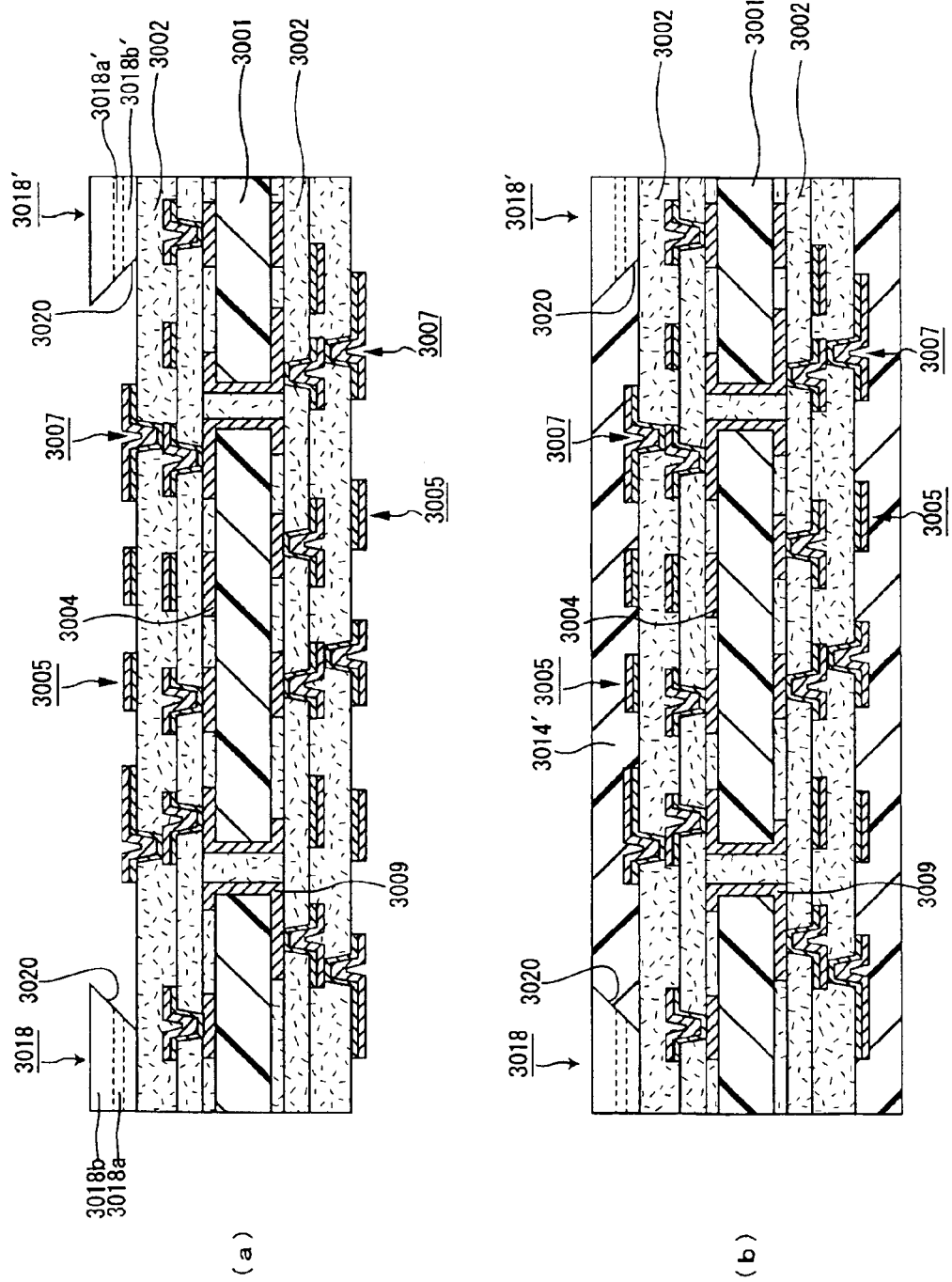
FIG. 19 is a cross-sectional view schematically showing part of the steps of manufacturing the multilayered printed circuit board according to the first aspect of the third group of the present invention.

(14) Organic optical waveguides 3018 and 3018' having optical path conversion mirrors 3020 were formed at predetermined positions on the surface of the outermost interlaminar insulating layer 3002, respectively, using the following method (see FIG. 19(a)). The organic optical waveguides 3018 and 3018' are formed of core parts 3018a, 3018a' and cladding parts 3018b, 3018b', respectively.

Namely, film-shaped organic optical waveguides (made by STEAG microParts GmbH., width: 25 μm, thickness: 25 μm) comprising PMMA and having 45°-optical path conversion mirrors formed on one end in advance, respectively, by using a diamond saw having a 90°-V-shaped tip end, were bonded such that the side surfaces of the optical waveguides on the other ends thereof on the optical path conversion mirror non formed side were aligned to the side surfaces of the interlaminar insulating layers.

The bonding of the organic optical waveguides was performed by: applying adhesive comprising thermosetting resin onto the bonding surfaces of the organic optical waveguides with the interlaminar insulating layers; bonding it with pressure thereon; and then curing the adhesive at 60° C. for 1 hour.

In this example, the curing treatment was performed under the conditions at 60° C. for 1 hour. In some cases, step curing may be performed. This is because stress tends to occur less frequently to the optical waveguides during bonding by performing the step curing.

(15) Next, a container was loaded with: 46.67 parts by weight of an oligomer provided with a photosensitivity (molecular weight: 4000) obtained by acrylating 50% of an epoxy group of cresol-novolac type epoxy resin (made by Nippon Kayaku Co., Ltd.), dissolved in diethylene glycol dimethyl ether (DMDG) to be 60% by weight concentration; 15.0 parts by weight of bisphenol A-type epoxy resin (trade name: Epicoat 1001 made by Yuka Shell Epoxy Co., Ltd.) dissolved in methyl ethyl ketone to be 80% by weight concentration; 1.6 parts by weight of imidazole curing agent (trade name: 2E4MZ-CN made by Shikoku Corp.); 3.0 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE6A, made by Kyoei Chemical Co., Ltd.); and 0.71 parts by weight of the dispersion type defoaming agent (made by San Nopco Ltd., S-65), and they were stirred and mixed to prepare the mixed composition. Then, to the mixed composition, 2.0 parts by weight of benzophenone (made by Kanto Kagaku Corp.) as a photoinitiator and 0.2 parts by weight of Michler's ketone (made by Kanto Kagaku Corp.) as a photosensitizer were added to the mixed composition to obtain a solder resist composition adjusted to have a viscosity of 2.0 Pa·s at 25° C.

The viscosity measurement was performed using a rotor No. 4 in the case of 60 rpm ($min^{-1}$) and a rotor No. 3 in the case of 4.6 rpm ($min^{-1}$) using a B-type viscometer (DVL-B type, made by Tokyo Keiki Co., Ltd.).

(16) Next, the above-mentioned solder resist composition was applied onto organic optical waveguide non-formed portions on the interlaminar insulating layer on the side on which the organic optical waveguides 3018a and 3018b were formed and onto the entire surfaces of the interlaminar insulating layer on the opposite side, and dried under the conditions of 70° C. for 20 minutes and 70° C. for 30 minutes, thereby forming layers 3014' of the solder resist composition (see FIG. 19(b)).

(17) Openings for mounting the substrate for mounting an IC chip were formed in the solder resist composition layer 3014' on the side on which the organic optical waveguides were formed by laser treatment.

Further, a 5 mm-thick photomask drawing a pattern of openings for mounting surface mount-type electronic components, was firmly stuck to the solder resist composition layer 3014' on the side on which the organic optical waveguides were not formed, followed by the exposure to UV rays of 1000 mJ/cm² dose and development with the DMTG solution to form openings for mounting the surface mount-type electronic components having optional shape and size. Further, heat treatments were performed at 100° C. for 1 hour, 120° C. for 1 hour, and 150° C. for 3 hours, respectively, to cure the solder resist composition layers, thus forming solder resist layers 3014 having openings for mounting the substrate for mounting an IC chip, the surface mount-type electronic components and the like on the both faces of the substrate, respectively (see FIG. 20(a)). As the solder resist composition, a commercially available solder resist composition can be also used.

(18) Next, the substrate on which the solder resist layers 2014 were formed was immersed in an electroless nickel plating solution having pH 4.5 and containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form 5 μm-thick nickel plating layers in the openings for mounting the substrate for mounting an IC chip and the surface mount-type electronic components, respectively. Further, the obtained substrate was immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) under the conditions of 80° C. for 7.5 minutes to form a 0.03 μm-thick gold plating layer on each nickel plating layer, thus obtaining pads 3016 for surface mount.

Figure 20:
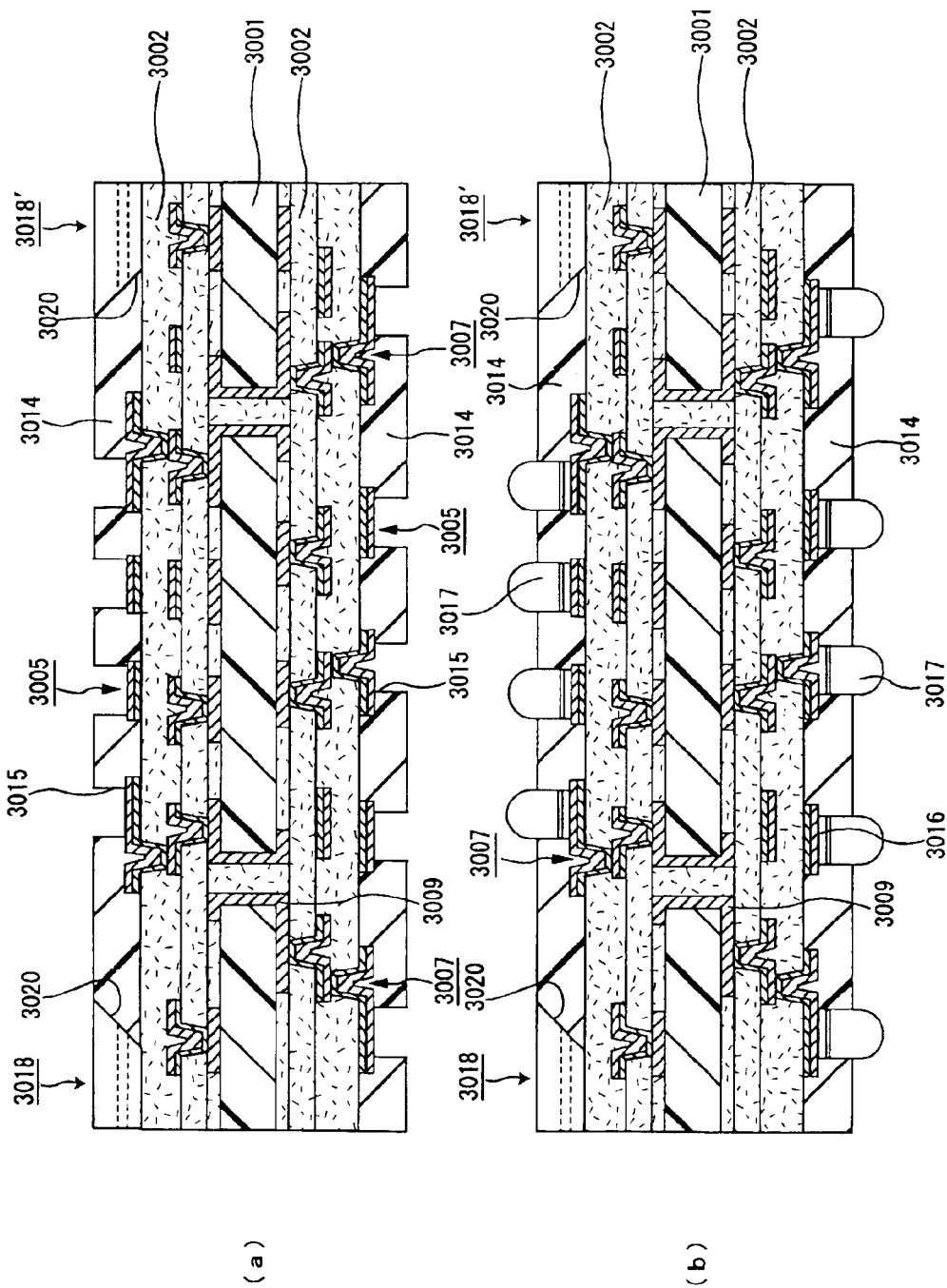
FIG. 20 is a cross-sectional view schematically showing part of the steps of manufacturing the multilayered printed circuit board according to the first aspect of the third group of the present invention.

(19) Solder paste (Sn/Ag=96.5/3.5) was printed in the openings 3015 for mounting the substrate for mounting an IC chip formed in the solder resist layer 3014 and then reflow was performed at 250° C., to thereby obtain a multilayered printed circuit board (see FIG. 20(b)).

EXAMPLE 17

A multilayered printed circuit board was manufactured in similar manners to those of Example 16 except that film-shaped organic optical waveguides (width: 50 μm, thickness: 50 μm) comprising polyimide fluoride and having 45°-optical path conversion mirrors formed in advance, respectively, by using a diamond saw having a 90°-V-shaped tip end in the step (14) of Example 16.

EXAMPLE 18

A multilayered printed circuit board was manufactured in similar manners to those of Example 16 except that film-shaped organic optical waveguides (width: 50 μm, thickness: 50 μm) comprising epoxy resin and having 45°-optical path conversion mirrors formed in advance, respectively, by using a diamond saw having a 90°-V-shaped tip end in the step (14) of Example 16.

EXAMPLE 19

Figure 17:
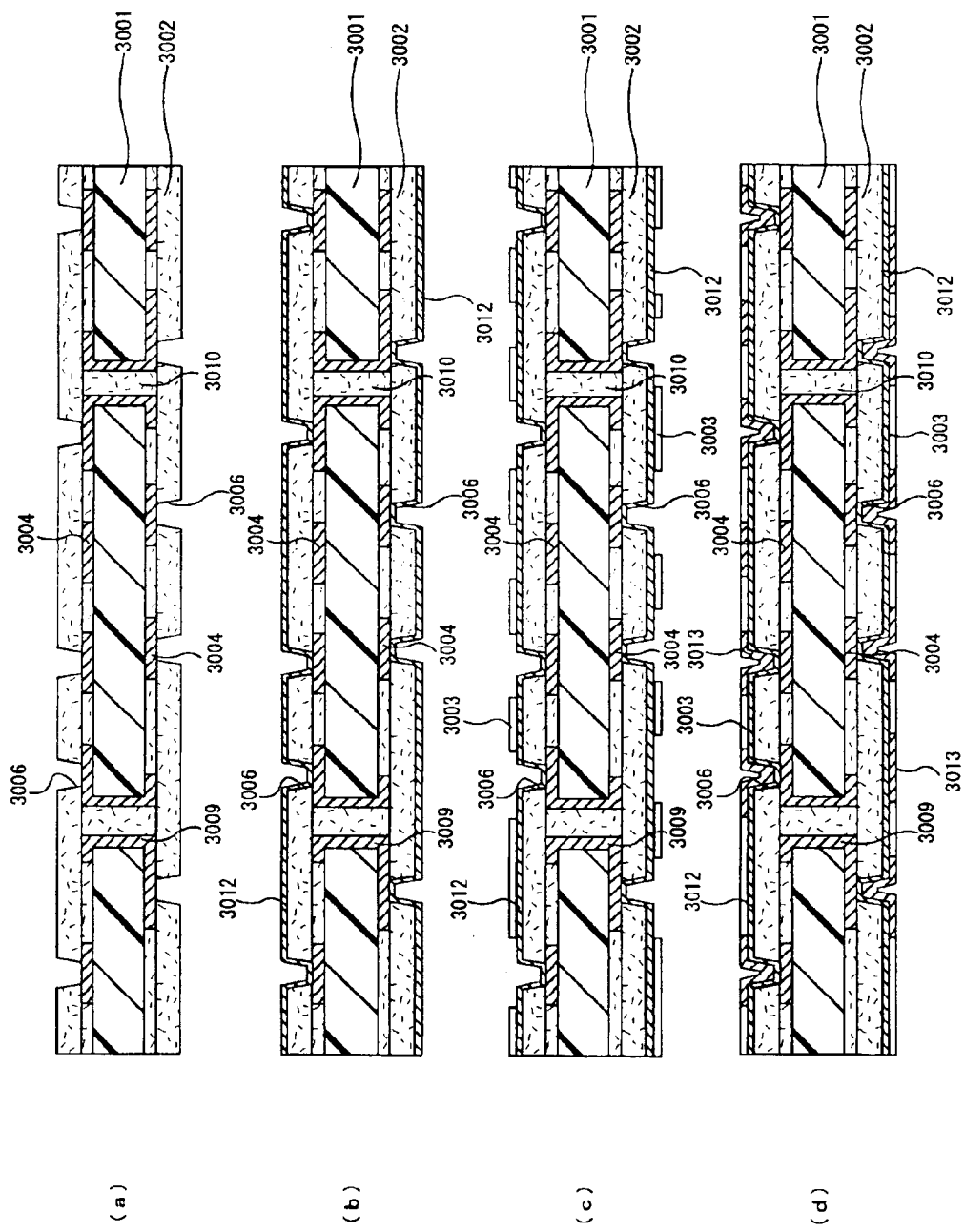
FIG. 17 is a cross-sectional view schematically showing part of the steps of manufacturing the multilayered printed circuit board according to the first aspect of the third group of the present invention.
Figure 18:
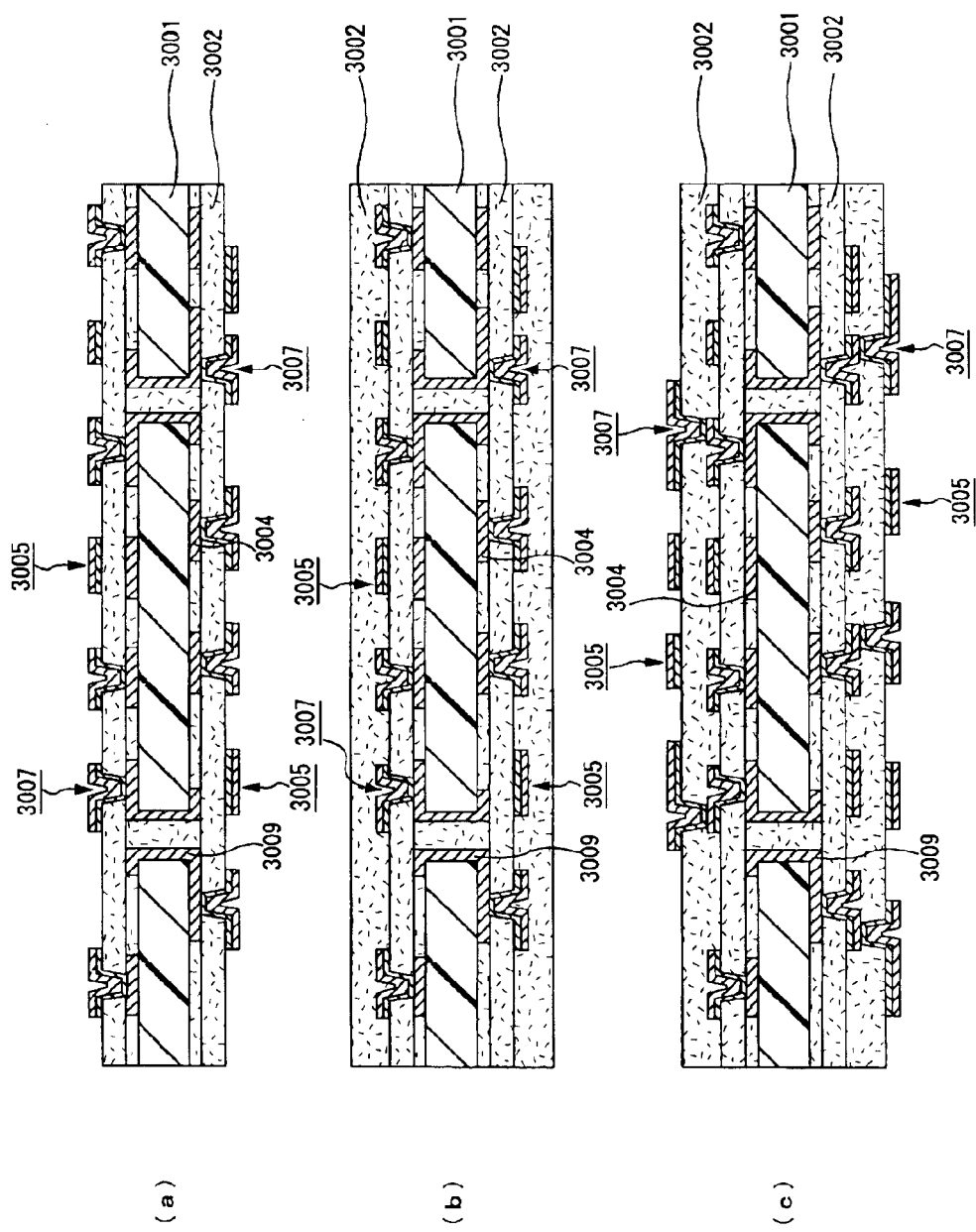
FIG. 18 is a cross-sectional view schematically showing part of the steps of manufacturing the multilayered printed circuit board according to the first aspect of the third group of the present invention.

(1) A multilayered printed circuit board was manufactured in similar manners to those in the steps (1) to (13) of Example 16 (see FIGS. 16 to 18).

(2) Next, a film which is comprising under-cladding parts 3038b, 3038b' and core parts 3038a, 3038a' was formed at a predetermined position on the surface of the outermost interlaminar insulating layer 3002 using the following method. 45°-optical path conversion mirrors were formed on one end of this film by using a diamond saw having a 90°-V-shaped tip end. Next, the film on which the optical path conversion mirrors were formed bonded such that the side surfaces of the film on the other end thereof on the optical path conversion mirror non-formed side were aligned to the side surfaces of the interlaminar insulating layers 3002 (see FIG. 21(a)).

The bonding of the organic optical waveguide is performed by: applying adhesive comprising thermosetting resin onto an adhesion surface of the organic optical waveguide to the interlaminar insulating layer; and then after bonding it thereon with pressure, curing the resultant at 60° C. for 1 hour.

(Formation Method of Film)

PMMA for forming under-cladding part was applied onto a mold-releasing film by spin coating to form a film, and the film was thermally cured. PMMA for forming core part was applied onto an under-cladding part to form a film, and the film was thermally cured. A resist was applied onto the surface of a core part, a resist pattern was formed by photolithography, and the film was patterned into the shape of the core part by reactive ion etching, thereby forming a film formed of the under-cladding part and the core part.

The thickness of the film was 10 μm.

(3) Next, PMMA for forming over-cladding part was applied onto the entire surface of the interlaminar insulating layer 3002 (including on the film) on the side on which the film was bonded in the above-described step (2), and the PMMA was thermally cured, thereby forming an organic optical waveguide 3038 entirely on the interlaminar insulating layer 3002.

Figure 21:
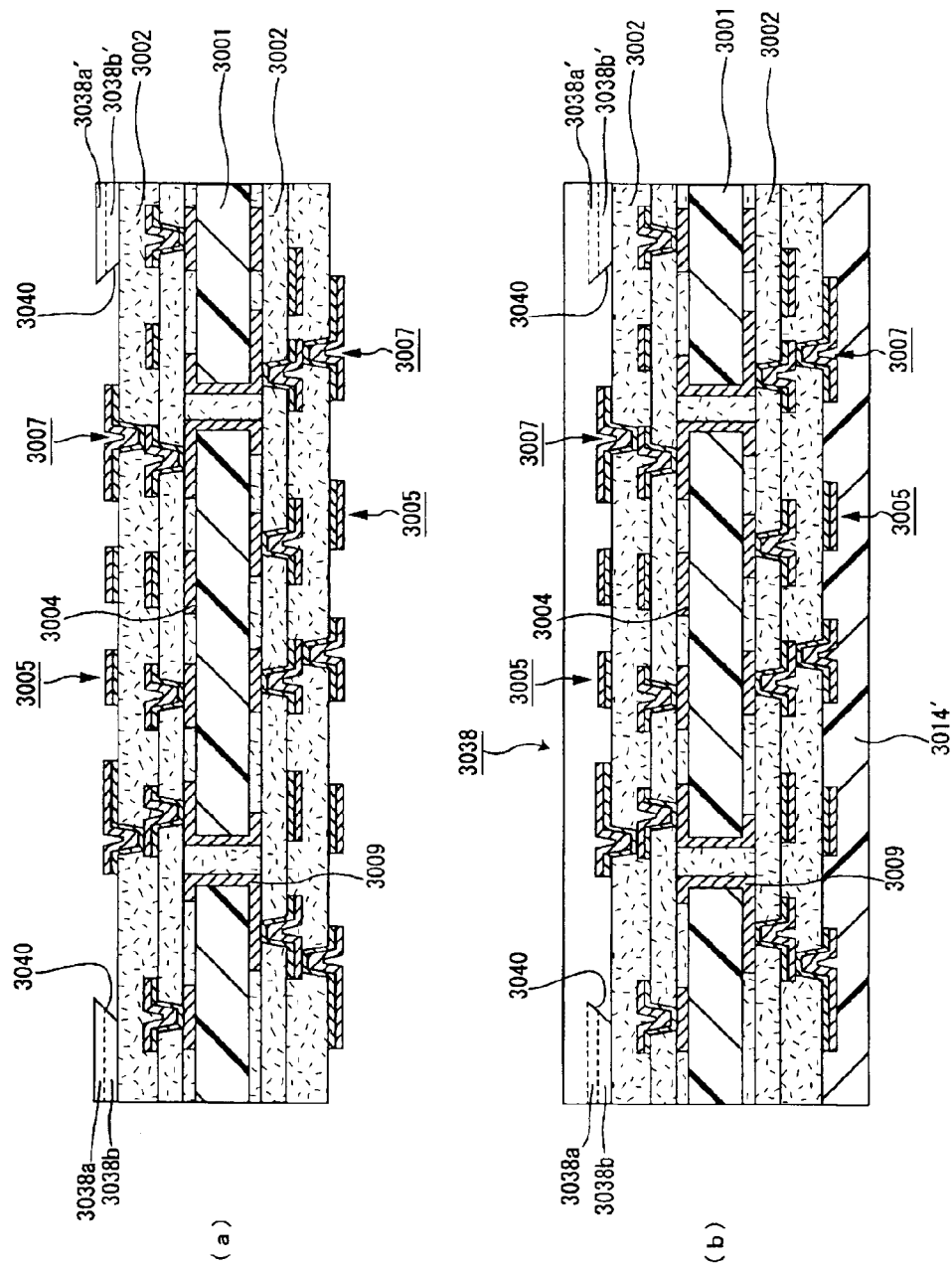
FIG. 21 is a cross-sectional view schematically showing part of the steps of manufacturing the multilayered printed circuit board according to the first aspect of the third group of the present invention.

In addition, a solder resist composition prepared in a similar manner to that in the step (15) of Example 16 was applied onto the interlaminar insulating layer 3002 on the opposite side to the side on which the organic optical waveguide was formed, in a similar manner to that in the step (16) of Example 16 and dried, thereby forming a solder resist composition layer 3014' (see FIG. 21(b)).

(4) Next, openings for mounting the substrate for mounting an IC chip were formed in an organic optical waveguide 3028 by laser treatment. The openings had a pitch of 1.27 mm and a diameter of 600 μm.

Figure 22:
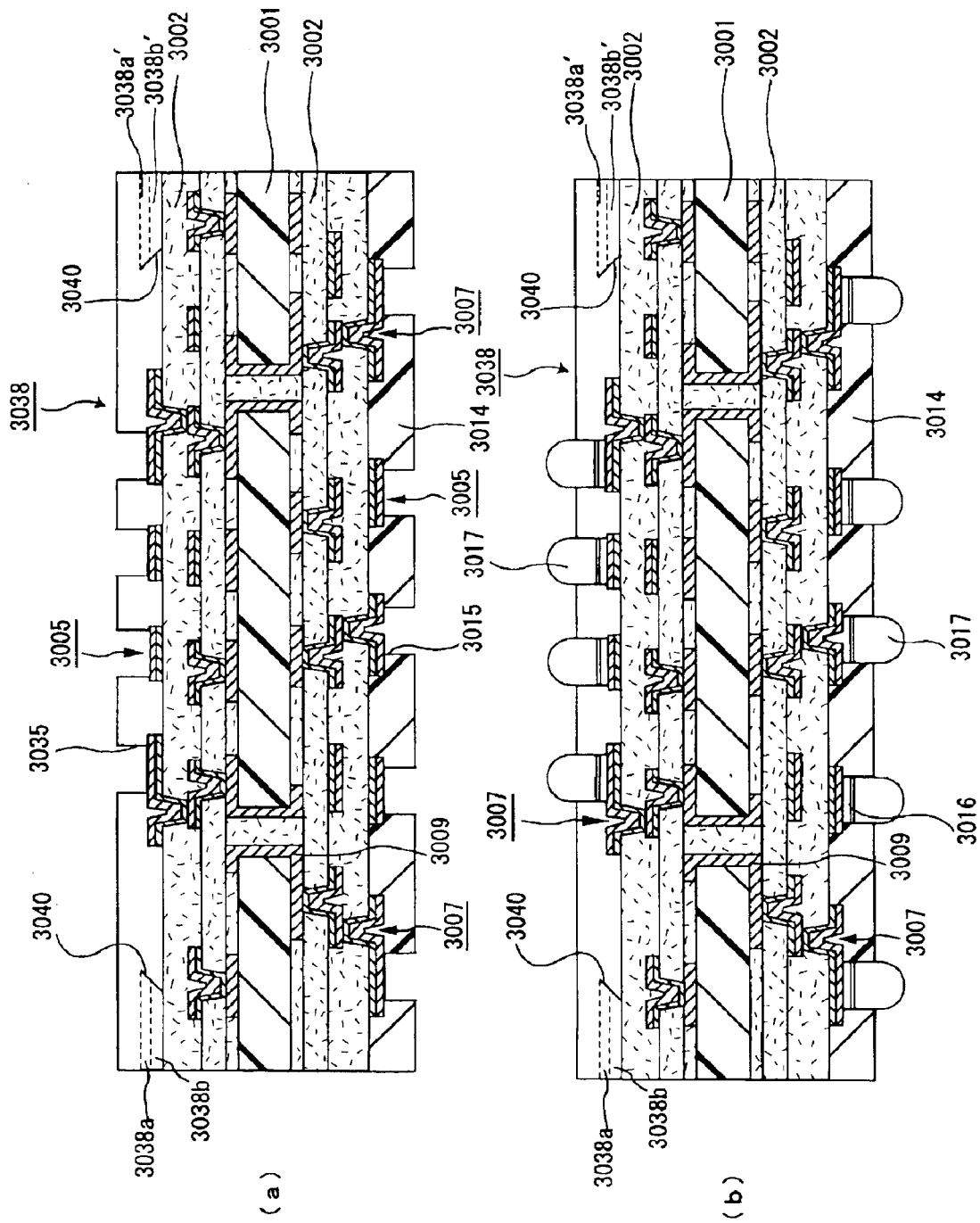
FIG. 22 is a cross-sectional view schematically showing part of the steps of manufacturing the multilayered printed circuit board according to the first aspect of the third group of the present invention.

Further, openings 3015 for mounting surface mount-type electronic components were formed in the solder resist composition layer 3014' in a similar manner to that in the step (17) of Example 7, thus obtaining a solder resist layer 3014 (see FIG. 22(*a*)).

(5) Similarly to the steps (18) and (19) of Example 7, a multilayered printed circuit board was obtained (see FIG. 22(*b*))

EXAMPLE 20

A multilayered printed circuit board was manufactured similarly to Example 19 except that a film was formed using polyimide fluoride for forming under-cladding part and polyimide fluoride for forming core part instead of PMMA for forming the under-cladding part and PMMA for forming the core part, respectively in the step (2) of Example 19, and that an organic optical waveguide was formed using polyimide fluoride for forming over-cladding part instead of PMMA for forming the over-cladding part in the step (3) thereof.

EXAMPLE 21

A multilayered printed circuit board was manufactured similarly to Example 19 except that a film was formed using epoxy resin for forming under-cladding part and epoxy resin for forming core part instead of PMMA for forming the under-cladding part and PMMA for forming the core part, respectively in the step (2) of Example 19, and that an organic optical waveguide was formed using epoxy resin for forming over-cladding part instead of PMMA for forming the over-cladding part in the step (3) thereof.

EXAMPLE 22

A multilayered printed circuit board was manufactured similarly to Example 19 except that a film was formed using epoxy resin for forming under-cladding part instead of PMMA for forming the under-cladding part in the step (2) of Example 19, and that an organic optical waveguide was formed using epoxy resin for forming over-cladding part instead of PMMA for forming the over-cladding part in the step (3) thereof.

The multilayered printed circuit boards obtained in Examples 16 to 22 were evaluated based on the following evaluation method by performing (1) observation of shape of optical waveguide, (2) optical signal detection and (3) continuity test.

Evaluation Method (1) Observation of shape of organic optical waveguide
The multilayered printed circuit boards in Examples 16 to 22 were cut by a cutter so as to cross the organic optical waveguides and the cross sections of the organic optical waveguides were observed.

(2) Optical Signal Detection

A substrate for mounting an IC chip on which a light receiving element and a light emitting element were mounted was connected to a side of each of the obtained multilayered printed circuit boards, on which side the organic optical waveguides were formed, in Examples 16 to 22 such that the light receiving element and the light emitting element were arranged at positions confronting the organic optical waveguides (core parts), respectively.

Next, an optical fiber was attached to the exposed surface of the optical waveguide confronting the light emitting element, at the side surface of each multilayered printed circuit board and a detector was attached to the exposed surface of the optical waveguide confronting the light receiving element, at the side surface of each multilayered printed circuit board. Thereafter, an optical signal was transmitted through the optical fiber to the multilayered printed circuit board, the IC chip was allowed to perform arithmetic operation and then the detector detected the optical signal.

(3) Continuity Test

Similarly to the optical signal detection, the substrate for mounting an IC chip was connected to each multilayered printed circuit board and a continuity test was then performed. A continuity state was evaluated based on the result displayed on a monitor.

The result of the evaluation of each of the multilayered printed circuit boards in Examples 16 to 22 demonstrated that two kinds of optical waveguides, i.e., the optical waveguide for receiving light and the optical waveguide for emitting light were formed at predetermined positions, respectively.

Moreover, the continuity test when the substrate for mounting an IC chip was connected thereto demonstrated that no electric signal continuity problem occurred to each of the multilayered printed circuit boards in Examples 16 to 22 and that an electric signal as well as an optical signal was able to be transmitted.

Additionally, the transmission loss of each optical waveguide with 850 nm-wavelength light was measured to be 0.3 dB/cm.

EXAMPLES 23 to 31

A multilayered printed circuit board was manufactured similarly to Example 16 except that optical waveguides containing pulverized silica particles having a content shown in Table 3 and a particle distribution of 0.1 to 0.8 μm was used in the step (14) of process C of Example 16.

In Examples 23 to 31, optical waveguides were formed in similar manners to those of Examples 7 to 15, respectively.

TABLE 3

| | Content of pulverized silica (% by weight) | transmissivity (%/mm) | Thermal expansion coefficient (ppm) |
|---|---|---|---|
| Example 23 | 0 | 93 | 70 |
| Example 24 | 8 | 84 | 61 |
| Example 25 | 10 | 82 | 58 |
| Example 26 | 15 | 84 | 53 |
| Example 27 | 25 | 81 | 46 |
| Example 28 | 50 | 82 | 41 |
| Example 29 | 60 | 79 | 37 |
| Example 30 | 70 | 75 | 34 |
| Example 31 | 80 | 77 | 29 |

For the multilayered printed circuit boards thus obtained in Examples 23 to 31, the presence or absence of cracks on the optical waveguide after a liquid-phase temperature cycle test were evaluated. The evaluation results are shown in Table 4.

The evaluation was performed based on the similar evaluation method and evaluation standard as those of Example 7.

TABLE 4

| | Liquid-phase temperature cycle | | |
|---|---|---|---|
| | 250 cycles | 500 cycles | 1000 cycles |
| Example 23 | ◯ | ◯ | Δ |
| Example 24 | ◯ | ◯ | Δ |
| Example 25 | ◯ | ◯ | Δ |
| Example 26 | ◯ | ◯ | ◯ |
| Example 27 | ◯ | ◯ | ◯ |
| Example 28 | ◯ | ◯ | ◯ |
| Example 29 | ◯ | ◯ | ◯ |
| Example 30 | ◯ | ◯ | ◯ |
| Example 31 | ◯ | ◯ | ◯ |

In Examples 23 to 31, pulverized silica particles were added to the cladding parts constituting the respective optical waveguides. Similar experiments were performed by using titania particles or alumina particles instead of the pulverized silica particles. Regarding the results, although the thermal expansion coefficient slightly different, similar results were obtained for the liquid-phase temperature cycle test.

The optical waveguides formed in Examples 32 to 31 were multi-mode waveguides. Even when multilayered printed circuit boards were manufactured similarly to Examples 32 to 31 by using single-mode optical waveguides instead of the multi-mode optical waveguides, a predetermined optical signal was able to be transmitted for all the optical waveguides.

The single-mode optical waveguide was formed as follows. Siloxane based resin (refractive index: 1.50, transmissivity: 93%/mm, thermal expansion coefficient: 115 ppm) was prepared as resin for forming core part and siloxane based resin (refractive index: 1.48, transmissivity: 93%/mm, thermal expansion coefficient: 141 ppm) was prepared as resin for forming the cladding part. In addition, particles were added to be a predetermined mixing quantity to resin for forming the cladding part if necessary. Using these resins, a single-mode optical waveguide having the cross-sectional size of the core part of 10×10 μm and the film thicknesses of the over-cladding part and the under-cladding part of 10 μm was obtained by a similar method as that in Example 7.

Further, among the optical waveguides formed by the above method, the single-mode optical waveguide having no particles mixed to the cladding part had a transmission loss of 0.43 dB/cm for signal light having a wavelength of 1.33 μm and a transmission loss of 0.84 dB/cm for signal light having a wavelength of 1.55 μm, and the single-mode optical waveguide having 50% by weight of particles mixed to the cladding part had a transmission loss of 0.41 dB/cm for signal light having a wavelength of 1.33 μm and a transmission loss of 0.82 dB/cm for signal light having a wavelength of 1.55 μm. The transmission loss was measured by the cut-back method.

The cladding part having no particles mixed had a thermal expansion coefficient of 141 ppm, and the cladding part having particles mixed by 50% by weight had a thermal expansion coefficient of 48 ppm. The optical waveguides were evaluated by performing the liquid-phase temperature cycle test for the multilayered printed circuit boards using these single-mode optical waveguides. The evaluation results were the same as those for Examples 23 to 31.

EXAMPLES 32 to 40

A multilayered printed circuit board was manufactured similarly to Example 19 except that optical waveguides containing pulverized silica particles having a content shown in Table 5 and a particle distribution of 0.1 to 0.8 μm was used in the steps (2) and (3) of Example 19.

Namely, in the step (2) of Example 19, a film comprising core parts and cladding parts and having 45°-optical path conversion parts formed thereon was formed using the following method, and the film was bonded onto the interlaminar insulating layer in a similar manner to that used in the step (2) of Example 19.

(Formation Method of Film)

First, a film having a core part cross-sectional size of 50×50 μm, an under-cladding part thickness of 50 μm and comprising core parts and cladding parts by performing similar steps to steps ① to ③ for forming the optical waveguides in Examples 17 to 25. This film was subjected to dicing using a 90°-#3000 blade to form a 45°-optical path conversion part, thus obtaining the film on which the 45°-optical path conversion part was formed.

Further, in the step (3) of Example 19, a similar resin composition to that for forming the under-cladding part was applied using a spin coater at 1000 pm/10 sec, and then pre-bake at 80° C. for 10 minutes, exposure with 2000 mJ and post-bake at 150° C. for 1 hour were performed, thereby forming an optical waveguide on the entire surface of the interlaminar insulating layer on which the film was bonded.

TABLE 5

| | Content of pulverized silica (% by weight) | transmissivity (%/mm) | Thermal expansion coefficient (ppm) |
|---|---|---|---|
| Example 32 | 0 | 93 | 70 |
| Example 33 | 8 | 84 | 61 |
| Example 34 | 10 | 82 | 58 |
| Example 35 | 15 | 84 | 53 |
| Example 36 | 25 | 81 | 46 |
| Example 37 | 50 | 82 | 41 |
| Example 38 | 60 | 79 | 37 |
| Example 39 | 70 | 75 | 34 |
| Example 40 | 80 | 77 | 29 |

For the multilayered printed circuit boards thus obtained in Examples 32 to 40, the formation ability of the cladding part and the presence or absence of cracks on the optical waveguide after a liquid-phase temperature cycle test were evaluated. The evaluation results are shown in Table 6.

The evaluation of the formation ability of the cladding part was performed based on whether a cladding part having a predetermined thickness was able to be formed.

In addition, the liquid-phase cycle test was performed under similar conditions to those for Example 7, and the presence or absence of cracks on the optical waveguide was determined by cutting each multilayered printed circuit board with a cutter to cross the core part and the cladding part of the optical waveguide and observing the cross section thereof.

TABLE 6

| | Formation ability of cladding | Liquid-phase temperature cycle | | |
|---|---|---|---|---|
| | | 250 cycles | 500 cycles | 1000 cycles |
| Example 32 | ◯ | ◯ | ◯ | Δ |
| Example 33 | ◯ | ◯ | ◯ | Δ |
| Example 34 | ◯ | ◯ | ◯ | Δ |

TABLE 6-continued

| | Formation ability of cladding | Liquid-phase temperature cycle | | |
|---|---|---|---|---|
| | | 250 cycles | 500 cycles | 1000 cycles |
| Example 35 | ◯ | ◯ | ◯ | ◯ |
| Example 36 | ◯ | ◯ | ◯ | ◯ |
| Example 37 | ◯ | ◯ | ◯ | ◯ |
| Example 38 | ◯ | ◯ | ◯ | ◯ |
| Example 39 | ◯ | ◯ | ◯ | ◯ |
| Example 40 | Δ | ◯ | ◯ | ◯ |

In Examples 32 to 40, pulverized silica particles were added to the cladding parts constituting the respective optical waveguides. Similar experiments were performed by using titania particles or alumina particles instead of the pulverized silica particles. Regarding the results, although the thermal expansion coefficient slightly different, similar results were obtained for the liquid-phase temperature cycle test.

The optical waveguides formed in Examples 32 to 40 were multi-mode waveguides. Even when multilayered printed circuit boards were manufactured similarly to Examples 32 to 40 by using single-mode optical waveguides instead of the multi-mode optical waveguides, a predetermined optical signal was able to be transmitted for all the optical waveguides.

The single-mode optical waveguide was formed as follows. Siloxane based resin (refractive index: 1.50, transmissivity: 93%/mm, thermal expansion coefficient: 115 ppm) was prepared as resin for forming core part and siloxane based resin (refractive index: 1.48, transmissivity: 93%/mm, thermal expansion coefficient: 141 ppm) was prepared as resin for forming the cladding part. In addition, particles were added to be a predetermined mixing quantity to resin for forming the cladding part if necessary. Using these resins, a single-mode optical waveguide having the cross-sectional size of the core part of 10×10 μm and the film thicknesses of the over-cladding part and the under-cladding part of 10 μm was obtained by a similar method to that in Example 7.

Further, regarding the optical waveguides formed by the above method, the single-mode optical waveguide having particles mixed to the cladding part had a transmission loss of 0.43 dB/cm for signal light having a wavelength of 1.33 μm and a transmission loss of 0.84 dB/cm for signal light having a wavelength of 1.55 μm, and the single-mode optical waveguide having 50% by weight of particles mixed to the cladding part had a transmission loss of 0.41 dB/cm for signal light having a wavelength of 1.33 μm and a transmission loss of 0.82 dB/cm for signal light having a wavelength of 1.55 μm. The transmission loss was measured by the cut-back method.

The cladding part having no particles mixed had a thermal expansion coefficient of 141 ppm, and the cladding part having particles mixed by 50% by weight had a thermal expansion coefficient of 48 ppm. The optical waveguides were evaluated by performing the liquid-phase temperature cycle test for the multilayered printed circuit boards using these single-mode optical waveguides. The evaluation results were similar to those for Examples 32 to 40.

EXAMPLE 41

A. Production of Resin Film for Interlaminar Insulating Layer 30 parts by weight of bisphenol A-type epoxy resin (epoxy equivalent: 469, Epicoat 1001, made by Yuka Shell Epoxy Co., Ltd.), 40 parts by weight of cresol-novolac type epoxy resin (epoxy equivalent: 215, Epiclon N-673 made by Dainippon Ink and Chemicals, Inc.), and 30 parts by weight of triazine structure containing phenol-novolac resin (phenol hydroxyl group equivalent: 120, Phenolite KA-7052, made by Dainippon Ink and Chemicals, Inc.) were dissolved while being heated in 20 parts by weight of ethyl diglycol acetate and 20 parts by weight of solvent naphtha under stirring condition, followed by the addition of 15 parts by weight of epoxy-terminated polybutadiene rubber (Denalex R-45EPT, made by Nagase Chemicals Ltd.) and 1.5 parts by weight of a pulverized product of 2-phenyl-4,5-bis(hydroxymethyl) imidazole, 2 parts by weight of a finely pulverized silica, and 0.5 parts by weight of a silicon based defoaming agent to prepare an epoxy resin composition.

After the obtained epoxy resin composition was applied to a 38 μm-thick PET film so as to adjust the thickness after drying to be 50 μm by a roll coater, the resulting film was dried at 80 to 120° C. for 10 minutes to produce a resin film for an interlaminar insulating layer.

B. Preparation of Resin Composition for through Hole Filler

A container was loaded with 100 parts by weight of bisphenol F-type epoxy monomer (YL983U, made by Yuka Shell Epoxy Co., Ltd., molecular weight: 310), 170 parts by weight of a $SiO_2$ spherical particle coated with a silane coupling agent and having an average particle diameter of 1.6 μm and a diameter of the maximum particle of 15 μm or less (CRS 1101-CE, made by Adtec Co., Ltd.), and 1.5 parts by weight of a leveling agent (Perenol S4, made by San Nopco Ltd.) and they were stirred and mixed to prepare a resin filler with a viscosity of 45 to 49 Pa·s at 23±1° C. As a curing agent, 6.5 parts by weight of an imidazole curing agent (2E4MZ-CN, made by Shikoku Corp.) was employed.

C. Manufacture of Multilayered Printed Circuit Board (1) A copper-clad laminate plate comprising an insulating substrate 4021 which is made of a 0.8 mm-thick glass epoxy resin or BT (Bismaleimide-Triazine) resin with a 18 μm-thick copper foil 4028 laminated on both sides of the substrate 2001 was used as a starting material (see FIG. 25(a)). First, the copper-clad laminate plate was drilled to bore holes and then, electroless plating treatment was performed and pattern etching was performed to form conductor circuits 4024 and plated-through holes 4029 on both faces of the substrate 4021.

(2) The substrate in which the plated-through hole 4029 and the conductor circuits 4024 were formed was washed with water and degreased with an acid, soft etching was performed and then, etching solution was sprayed on both faces of the substrate and fed by a transport roller, thereby forming roughened surfaces (not shown) on the surfaces of the conductor circuits 4024 including the plated-through holes 4029. As the etching solution, etching solution (Mec Etch Bond, made by Mec Co., Ltd.) containing 10 parts by weight of an imidazole copper (II) complex, 7 parts by weight of glycolic acid, and 5 parts by weight of potassium chloride was used.

(3) A dry film comprising polyolefin based resin and cut to have a desired size in advance was laminated on a predetermined position (conductor circuit non-formed part)

on the substrate, thereby forming an elastic material layer 4052 having an elastic modulus of 10 MPa and a thickness of 25 μm.

(4) Next, film-shaped organic optical waveguides (made by STEAG microparts GmbH., width: 25 μm, thickness: 25 μm) 4050 comprising PMMA were bonded onto the elastic material layer 4052 formed in the step (3) such that the side surfaces of the optical waveguides on one ends thereof were aligned to the side surfaces of the substrate 4021. The bonding of the organic optical waveguides was performed by: applying adhesive comprising thermosetting resin onto the surfaces of the organic optical waveguides on the substrate side; then after bonding it thereon with pressure; curing the adhesive at 60° C. for 1 hour.

In this example, the curing treatment was performed under the conditions at 60° C. for 1 hour. In some cases, step curing may be performed. This is because stress tends to occur less frequently to the optical waveguides during bonding by performing the step curing.

Figure 25:
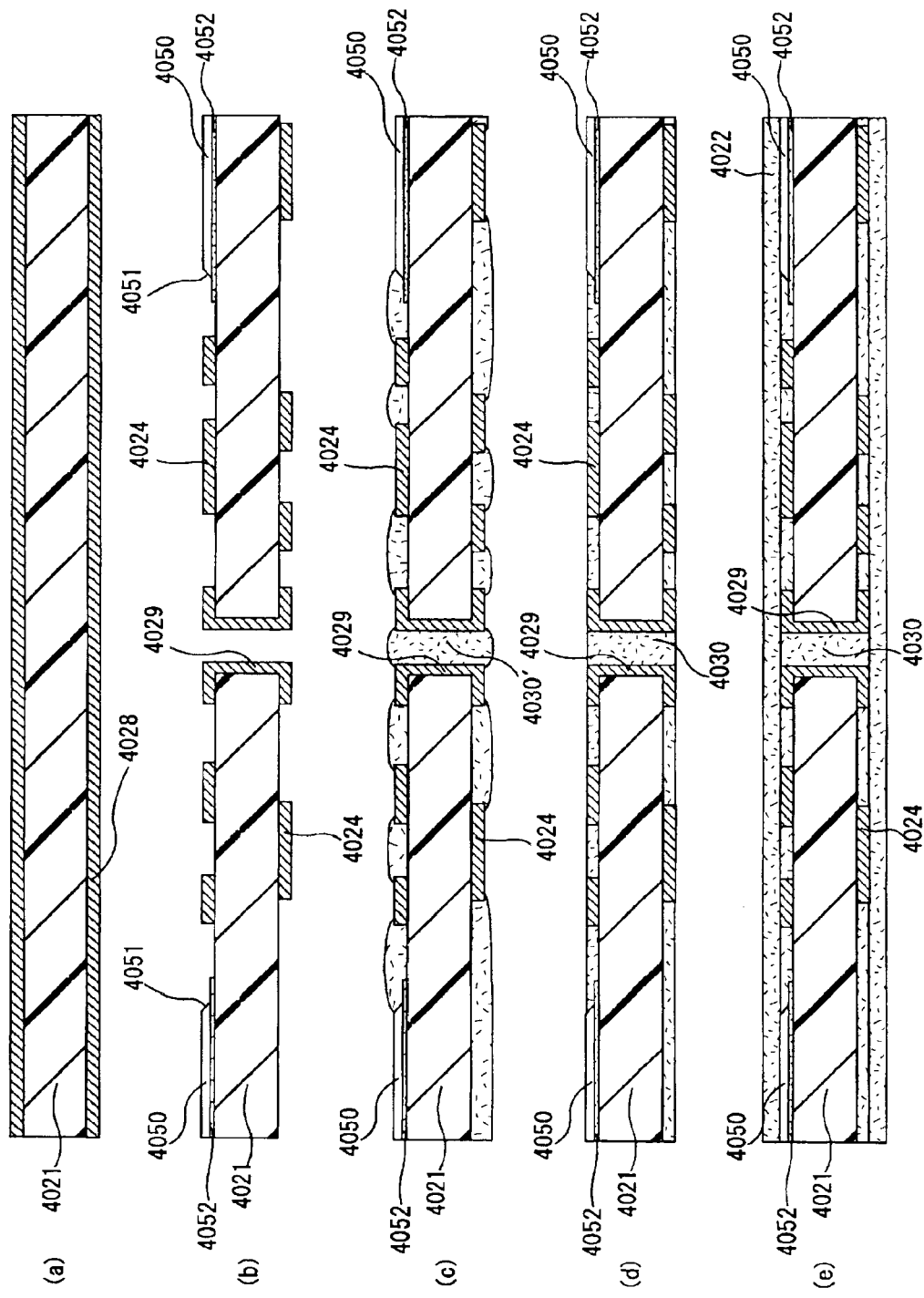
FIGS. 25(a) to 25(e) are cross-sectional views schematically showing part of the steps of manufacturing the multilayered printed circuit board according to the first aspect of the fourth group of the present invention.

Further, using a diamond saw having a 90°-V-shaped tip end, a 45°-optical path conversion mirror 4051 was formed on one end of each optical waveguide 4050 (see FIG. 25(*b*)).

(5) After the resin filler described in process B was prepared, the layer of the resin filler 4030' was formed inside the plated-through holes 4029, the conductor circuit non-formed parts and optical waveguide non formed portions on one surface of the substrate 4021 and the peripheral portions of the conductor circuits 4024 by the following method within 24 hours after the preparation.

That is, first, the resin filler was pushed in the plated-through holes using a squeegee and then dried under the conditions of 100° C. for 20 minutes. Next, a mask drawing openings corresponding to the conductor circuit non-formed parts (including optical waveguide non-formed portions) was put on the substrate and the layer of the resin filler 4030' was formed in the conductor circuit non-formed parts, which were concave portions, using the squeegee and then dried under the conditions of 100° C. for 20 minutes. Likewise, the layer of the resin filler 4030' was formed in the conductor circuit non-formed parts (including optical waveguide non-formed portions) and the peripheral portions of the conductor circuits on the other surface of the substrate.

(6) One surface of the substrate for which process (5) was finished was ground by a belt sander grinder using #600 belt grinding-paper (made by Sankyo Rikagaku Co., Ltd.) so as not to leave the resin filler 4030' on the surfaces of the conductor circuits 4024 and the land surfaces of the plated-through holes 4029 and then, buffing was performed to remove the scratches by the above-mentioned belt sander grinding. A series of such grinding steps were performed for the other surface of the substrate in a similar manner.

Next, heating treatments at 100° C. for 1 hour, 120° C. for 3 hours, 150° C. for 1 hour, and 180° C. for 7 hours, respectively, were performed to form a resin filler layer 4030.

In such a manner, the surface layer part of the resin filler layer 4030 formed in the plated-through holes 4029 and the conductor circuit non-formed parts and the surfaces of the conductor circuits 4024 were made flat to obtain an insulating substrate (see FIG. 25(*d*)) wherein: the resin filler 4030 and the side surfaces of the conductor circuits 4024 were firmly stuck to each other through the roughened surfaces; and also the inner wall surfaces of the plated-through holes 4029 and the resin filler 4030 were firmly stuck to each other through the roughened surfaces. By this step, the surface of the resin filler layer 4030 was flush with the surfaces of the conductor circuits 4024.

(7) After the above-mentioned substrate was washed with water and degreased with an acid, soft etching was performed and then, etching solution was sprayed on both faces of the substrate to etch the surfaces of the conductor circuits 4024 and the land surfaces and inner walls of the plated-through holes 4029 to form the roughened surfaces on the entire surfaces of the conductor circuits 4024. As the etching solution, etching solution (Mec Etch Bond, made by Mec Co., Ltd.) containing 10 parts by weight of an imidazole copper (II) complex, 7 parts by weight of glycolic acid, and 5 parts by weight of potassium chloride was used.

(8) Next, a resin film for an interlaminar insulating layer with a slightly larger size than the substrate produced by process A was put on each surface of the substrate, temporarily pressure-bonded under the conditions of 0.4 MPa pressure, 80° C. temperature, and 10-second pressure bonding period and cut and after that, laminated by the following method using a vacuum laminator apparatus and successively subjected to thermosetting treatment to form interlaminar insulating layers 4022 (see FIG. 25(*e*)).

That is, the resin film for the interlaminar insulating layer was actually laminated on the substrate by pressure bonding under the conditions of 65 Pa degree of vacuum, 0.4 MPa pressure, 80° C. temperature, and 60-second pressure bonding period and further subjected to thermosetting at 170° C. for 30 minutes.

Figure 26:
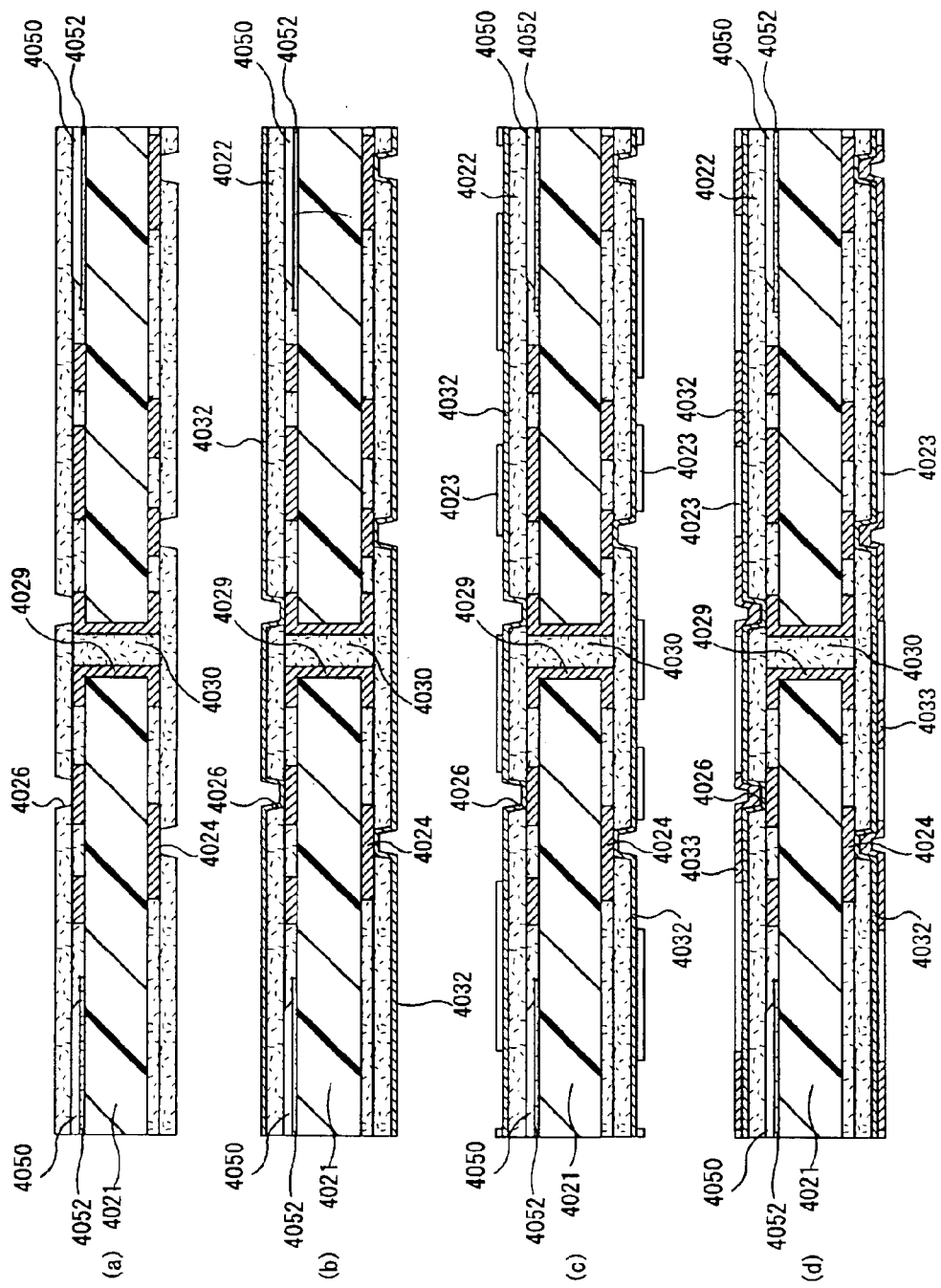
FIGS. 26(a) to 26(d) are cross-sectional views schematically showing part of the steps of manufacturing the multilayered printed circuit board according to the first aspect of the fourth group of the present invention.

(9) Next, openings 4026 for via-holes with 80 μm diameter were formed in the interlaminar insulating layers 4022 by a $CO_2$ gas laser of 10.4 μm wavelength through a 1.2 mm-thick mask having through holes on the interlaminar insulating layer 4022 in conditions of the beam diameter of 4.0 mm, the top hat mode, the pulse width of 8.0 μs, 1.0 mm-diameter of the through holes of the mask, and one shot (see FIG. 26(*a*)).

(10) The substrate in which the openings 4026 for via-holes were formed was immersed in a solution containing 60 g/l of permanganic acid at 80° C. for 10 minutes to dissolve and remove the epoxy resin particles existing on the surfaces of the interlaminar insulating layers 4022 and consequently, to form the roughened surfaces (not shown) on the interlaminar insulating layers 4022 including the inner walls of the openings 4026 for via-holes.

Next, the substrate subjected to the above-mentioned treatment was immersed in a neutralizer (made by Shipley Co.) and washed with water.

Further, a palladium catalyst was supplied to the surface of the substrate subjected to the surface roughening treatment (the roughening depth: 3 μm), so that catalyst core adhered to the surfaces of the interlaminar insulating layers 4022 (including the inner wall surfaces of the openings 4026 for via-holes) (not shown). Namely, the catalyst was attached by immersing the substrate in a catalytic solution containing palladium chloride ($PdCl_2$) and stannous chloride ($SnCl_2$) and precipitating palladium metal.

(11) Next, the substrate was immersed in an electroless copper plating aqueous solution having the following composition to form a thin film conductor layer (electroless copper plating film) 4032 with a thickness of 0.6 to 3.0 μm on the surface of each interlaminar insulating layer 4022 (including the inner wall surfaces of the openings 4026 for via-holes) (see FIG. 26(*b*)).

| [Electroless plating solution] | |
|---|---|
| NiSO$_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
35° C. Liquid Temperature for 40 Minutes

(12) Next, a commercially available photosensitive dry film was stuck to the substrate on which the electroless copper plating films 4032 were formed, a mask was put thereon, and exposure with a dose of 100 mJ/cm² and development with an aqueous 0.8% sodium carbonate solution were performed to form a plating resist 4023 having a thickness of 20 μm (see FIG. 26(*c*)).

(13) Next, the substrate was washed with water at 50° C. to be degreased, washed with water at 25° C. and further and then washed with sulfuric acid. The substrate was then subjected to electroplating under the following conditions to form electroplating copper films 4033 having a thickness of 20 μm in portions in which the plating resist 4023 was not formed (see FIG. 26(*d*)).

| [Electroplating solution] | |
|---|---|
| Sulfuric acid | 2.24 mol/l |
| Copper sulfate | 0.26 mol/l |
| Additive | 19.5 ml/l |

(Cupracid GL, Made by Atotech Japan Co., Ltd.)

| [Electroplating conditions] | |
|---|---|
| Current density | 1 A/dm² |
| Time | 65 minutes |
| Temperature | 22 ± 2° C. |

Figure 27:
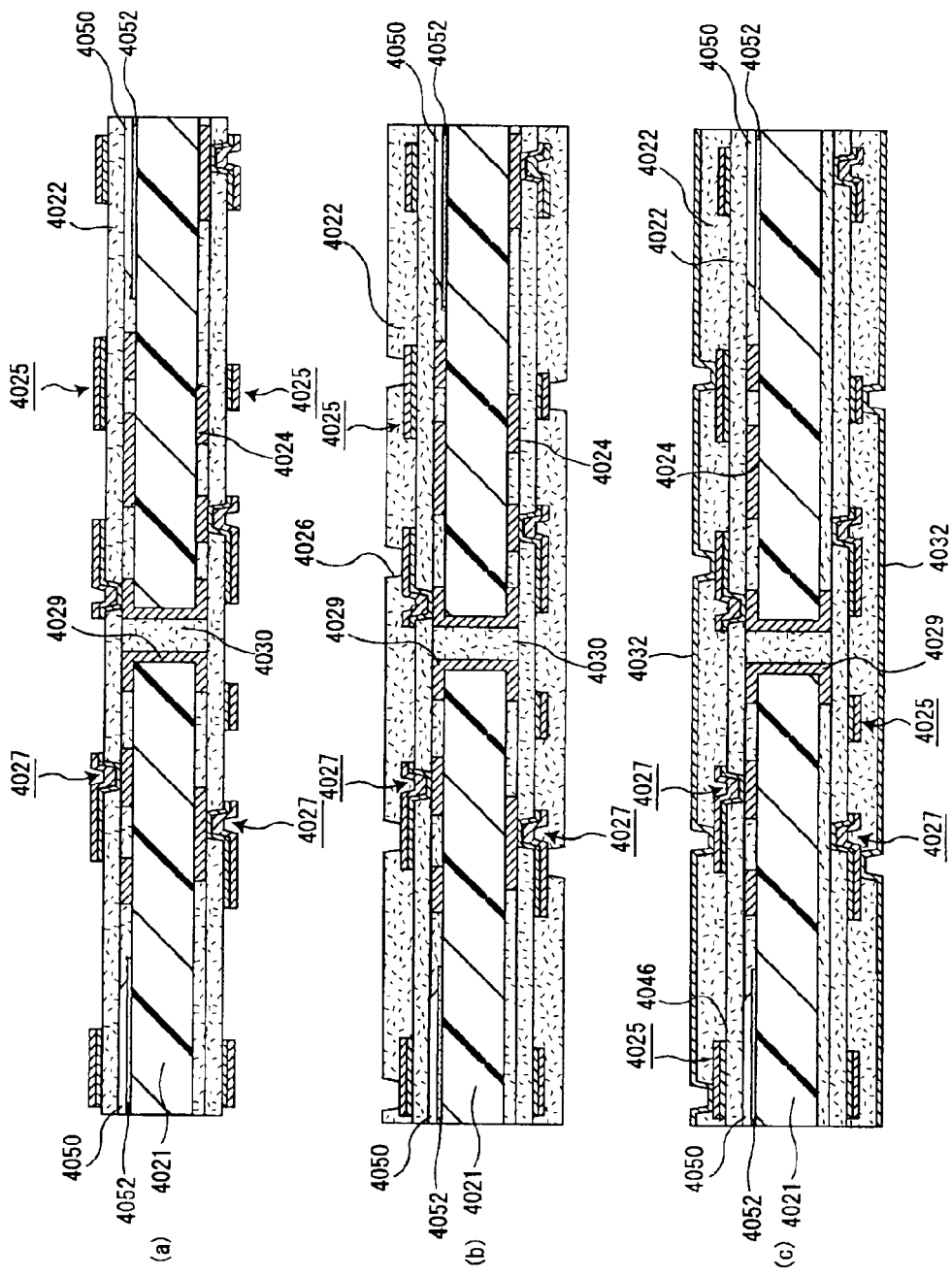
FIGS. 27(a) to 27(c) are cross-sectional views schematically showing part of the steps of manufacturing the multilayered printed circuit board according to the first aspect of the fourth group of the present invention.
Figure 28:
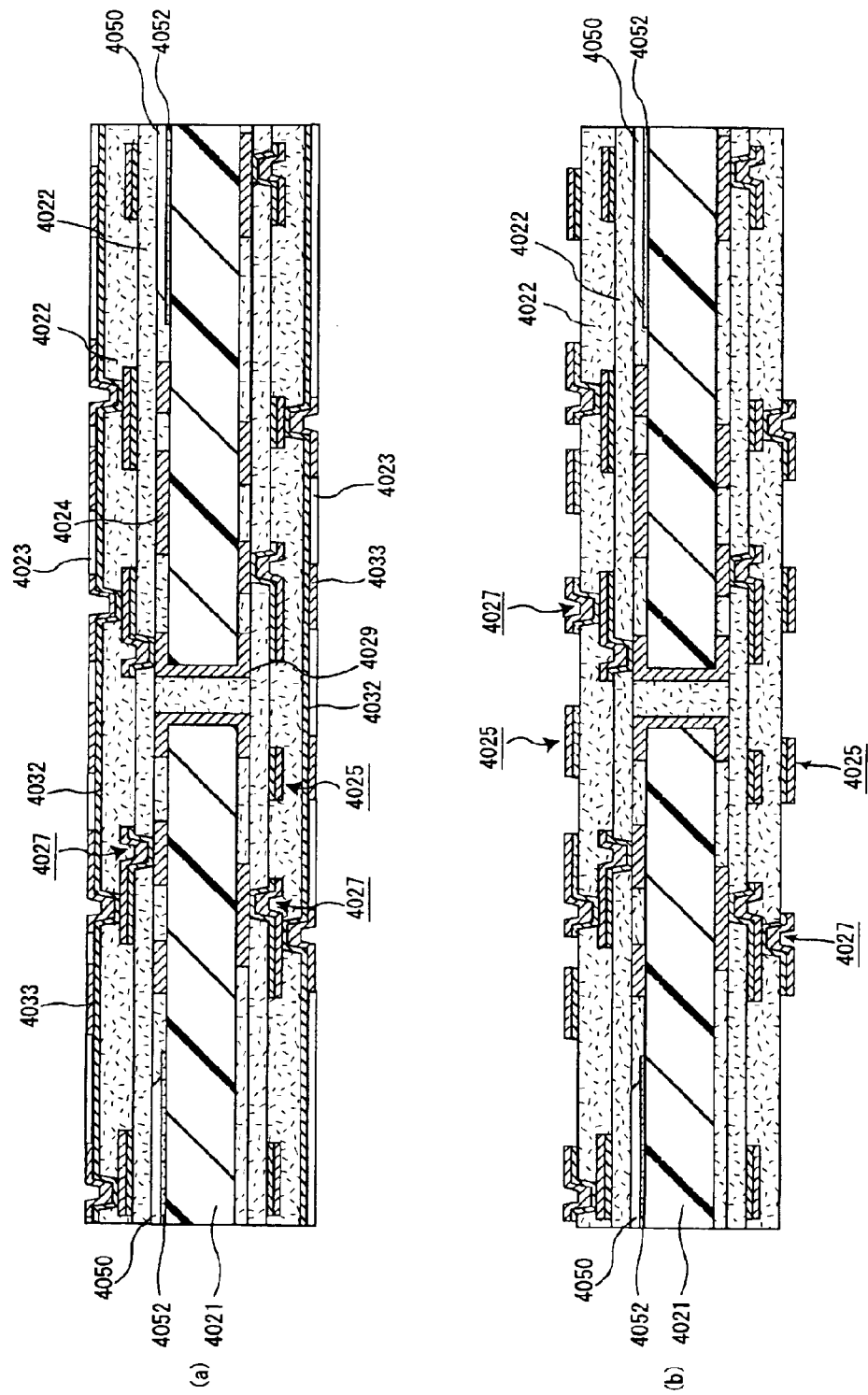
FIGS. 28(a) and 28(b) are cross-sectional views schematically showing part of the steps of manufacturing the multilayered printed circuit board according to the first aspect of the fourth group of the present invention.

(14) After peeling off the plating resists 4023 with 5% NaOH, the thin film conductor layers under the plating resists 4023 were etched, dissolved and removed with a solution mixture of sulfuric acid and hydrogen peroxide, thus forming conductor circuits 4025 (including via-holes 4027) each comprising the electroless copper plating film 4032 and the electroplating copper film 4033 and having a thickness of 18 μm (see FIG. 27(*a*)).

(15) The steps (7) to (14) were repeated to build up interlaminar insulating layers and conductor layers on further upper layers (see FIGS. 27(*b*) to 28(*b*)). Further, using a similar method to that used in the step (7), a roughened surface (not shown) was formed on the conductor circuit 4025 (including the via-holes 4027) on the outermost layer, thereby obtaining a multilayred printed curcuit board.

(16) Next, a container was loaded with: 46.67 parts by weight of an oligomer provided with a photosensitivity (molecular weight: 4000) obtained by acrylating 50% of an epoxy group of cresol-novolac type epoxy resin (made by Nippon Kayaku Co., Ltd.), dissolved in diethylene glycol dimethyl ether (DMDG) to be 60% by weight concentration; 15.0 parts by weight of bisphenol A-type epoxy resin (trade name: Epicoat 1001, made by Yuka Shell Epoxy Co., Ltd.) dissolved in methyl ethyl ketone to be 80% by weight concentration; 1.6 parts by weight of imidazole curing agent (tradename: 2E4MZ-CN, made by Shikoku Corp.); 3.0 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE6A, made by Kyoei Chemical Co., Ltd.); and 0.71 parts by weight of the dispersion type defoaming agent (S-65, made by San Nopco Ltd.), and they were stirred and mixed to prepare the mixed composition. Then, to the mixed composition, 2.0 parts by weight of benzophenone (made by Kanto Kagaku Corp.) as a photoinitiator and 0.2 parts by weight of Michler's ketone (made by Kanto Kagaku Corp.) as a photosensitizer were added to the mixed composition to obtain a solder resist composition adjusted to have a viscosity of 2.0 Pa·s at 25° C.

The viscosity measurement was performed using a rotor No. 4 in the case of 60 min$^{-1}$ (rpm) and a rotor No. 3 in the case of 4.6 min$^{-1}$ (rpm) using a B-type viscometer (DVL-B type, made by Tokyo Keiki Co., Ltd.).

(17) Next, the above-mentioned solder resist composition was applied to both faces of the multilayered printed circuit board and dried under the conditions of 70° C. for 20 minutes and 70° C. for 30 minutes, thereby forming layers of the solder resist composition.

(18) A 5 mm-thick photomask drawing a pattern of openings for mounting the substrate for mounting IC chip and those for mounting the other surface mount-type electronic components of optional shapes, was firmly stuck to the solder resist composition layer on the side on which the optical waveguides were formed, followed by the exposure to UV rays of 1000 mJ/cm² dose and development with the DMTG solution to form openings having an opening diameter of 600 μm.

Further, heat treatments were performed at 100° C. for 1 hour, 120° C. for 1 hour, and 150° C. for 3 hours, respectively, to cure the solder resist composition layers, thus forming a solder resist layer 4034 having openings 4039 for mounting the substrate for mounting an IC chip and the like.

(19) Next, the substrate on which the solder resist layers 4034 were formed was immersed in an electroless nickel plating solution having pH 4.5 and containing nickel chloride ($2.3\times10^{-1}$ mol/l), sodium hypophosphite ($2.8\times10^{-1}$ mol/l), and sodium citrate ($1.6\times10^{-1}$ mol/l) for 20 minutes to form 5 μm-thick nickel plating layers in the openings 4039, respectively. Further, the obtained substrate was immersed in an electroless gold plating solution containing potassium gold cyanide ($7.6\times10^{-3}$ mol/l), ammonium chloride ($1.9\times10^{-1}$ mol/l), sodium citrate ($1.2\times10^{-1}$ mol/l), and sodium hypophosphite ($1.7\times10^{-1}$ mol/l) under the conditions of 80° C. for 7.5 minutes to form a 0.03 μm-thick gold plating layer on each nickel plating layer, thus obtaining surface mount pads 4036 (see FIG. 29(*a*)).

Figure 29:
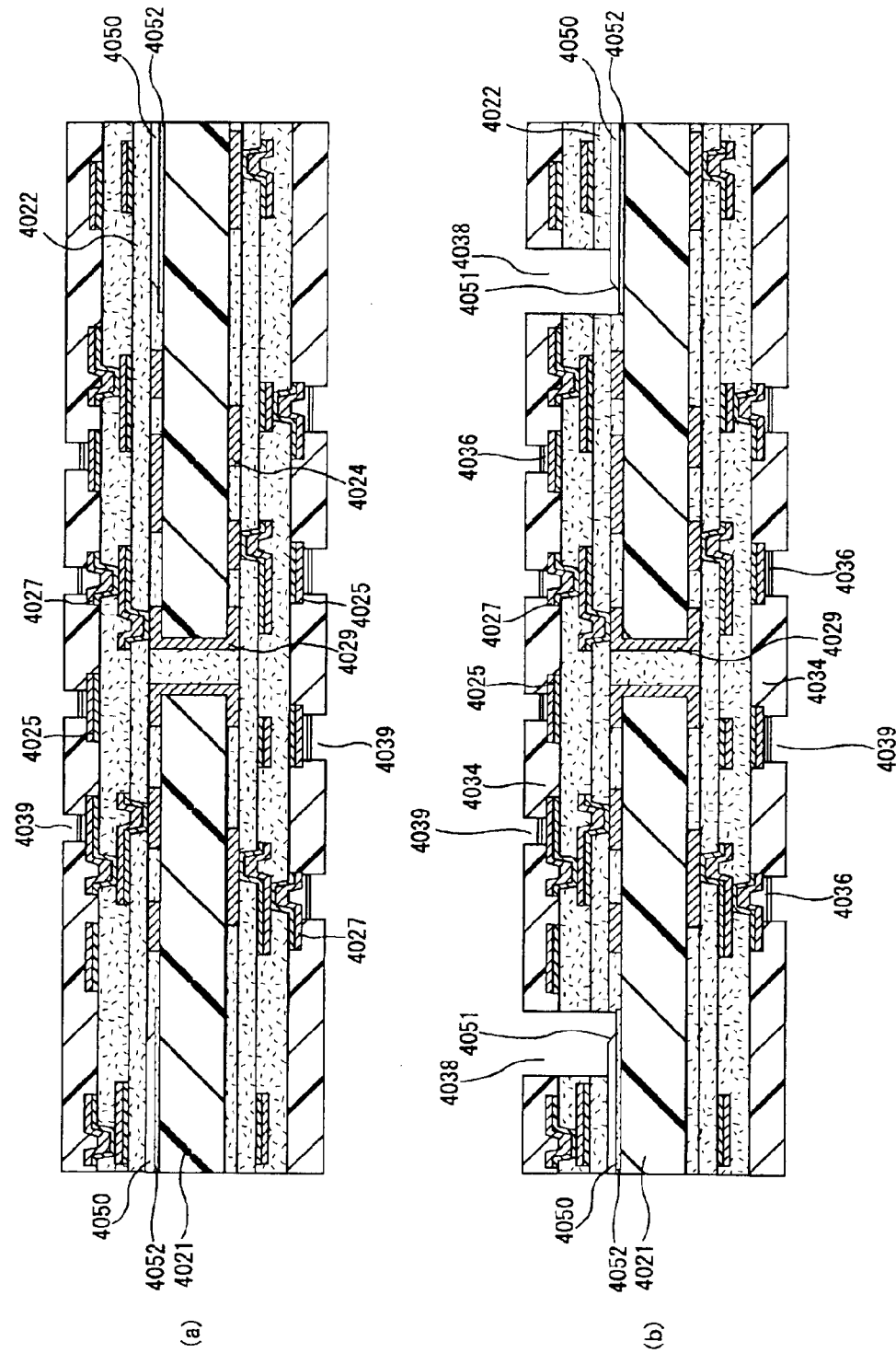
FIGS. 29(a) and 29(b) are cross-sectional views schematically showing part of the steps of manufacturing the multilayered printed circuit board according to the first aspect of the fourth group of the present invention.

(20) A mask having through holes formed at a position confronting the optical waveguide 4050 was put on one side of the substrate (side on which optical waveguide was formed) on which the solder resist layer was formed, openings having a diameter of 400 μm were formed to penetrate the solder resist layer 4034 and the interlaminar insulating layers 4022 on one surface of the substrate using carbon dioxide gas lazer, and a desmear treatment was performed to the wall surfaces of the openings, there by obtaining openings 4038 for optical paths (see FIG. 29(*b*)).

(21) Next, solder paste (Sn/Ag=96.5/3.5) was printed in the openings 4039 formed in the solder resist layers 4034 and then reflow was performed at 250° C., thereby forming solder bumps on the openings 4039 and obtaining a multilayered printed circuit board (see FIG. 243).

EXAMPLE 42

A multilayered printed circuit board was manufactured similarly to Example 41 except that the 45°-optical path conversion mirror was formed on one end of each film-shaped organic optical waveguide (made by STEAG micro Parts GmbH., width: 25 µm, thickness: 25 µm) comprising PMMA by using a diamond saw having a 90°-V-shaped tip end first, and then the optical waveguide on which this optical path conversion mirror was formed was bonded under similar conditions to those in the step (4) of Example 41 such that the side surface of the optical waveguide on one end was aligned to the side surface of the substrate in the step (4) of Example 41. The optical waveguide was bonded in a direction such that the upper surface thereof was larger than the bottom surface thereof (see FIG. 30).

EXAMPLE 43

(1) A multilayered printed circuit board was obtained similarly to the steps (1) to (15) of Example 14 except that the steps (3) and (4) thereof were not performed.

(2) Next, a film comprising polyimide resin, cut to have a desired size in advance was bonded to a predetermined position (conductor circuit non-formed parts) on the outermost interlaminar insulating layer, thereby forming an elastic material layer having an elastic modulus of $2.45 \times 10^3$ MPa and a thickness of 50 µm.

(3) Film-shaped organic optical waveguides (made by STEAG microParts GmbH., width: 50 µm, thickness: 50 µm) comprising PMMA were bonded onto the elastic material layer formed in the step (2) such that the side surfaces of the optical waveguides on one ends thereof were aligned to the side surfaces of the substrate. The bonding of the organic optical waveguides was performed under similar conditions to those in the step (4) of Example 41.

Further, a 45°-optical path conversion mirror was formed on one end of each organic optical waveguide by using a diamond saw having a 90°-V-shaped tip end.

(4) Next, the solder resist composition was prepared similarly to the step (16) of Example 41 and applied to the both faces of the multilayered printed circuit board under similar conditions to those in the step (17) of Example 41, there by forming solder resist composition layers.

(5) A 5 mm-thick photomask drawing a pattern of openings for mounting the substrate for mounting IC chip and those for optical paths, was firmly stuck to the solder resist composition layer on one surface of the substrate, followed by the exposure to UV rays of 1000 mJ/cm² dose and development with the DMTG solution to form openings for mounting the substrate for mounting an IC chip and openings for optical paths having an opening diameter of 400 µm. The openings for mounting the substrate for mounting an IC chip were set to have a diameter of 600 µm and a pitch of 1.27 mm.

In addition, a mask drawing only a pattern of openings for mounting various surface mount-type electronic components was used on the other surface of the substrate, followed by exposure and development treatments under similar conditions, thereby forming openings.

Further, heat treatments were performed at 80° C. for 1 hour, 100° C. for 1 hour, 120° C. for 1 hour and 150° C. for 3 hours, respectively, to cure the solder resist composition layers, thus forming a solder resist layers having openings for mounting the substrate for mounting an IC chip and the like and openings for optical paths.

(6) Surface mount pads 4036 were formed similarly to the step (19) of Example 41 and solder bumps were formed similarly to the step (21) of Example 41, thereby obtaining a multilayered printed circuit board (see FIG. 24).

EXAMPLE 44

A multilayered printed circuit board was manufactured similarly to Example 43 except that the 45°-optical path conversion mirror was formed on one end of each film-shaped organic optical waveguide (made by STEAG micro Parts GmbH., width: 50 µm, thickness: 50 µm) comprising PMMA by using a diamond saw having a 90°-V-shaped tip end first, and then the optical waveguide on which this optical path conversion mirror was formed was bonded under similar conditions to those in the step (4) of Example 41 such that the side surface of the optical waveguide on one end was aligned to the side surface of the substrate in the step (3) of Example 43. The optical waveguide was bonded in a direction such that the upper surface thereof was larger than the bottom surface thereof.

COMPARATIVE EXAMPLE 2

A multilayered printed circuit board was manufactured similarly to Example 41 except that the step (4) of Example 41, i.e., the step of forming the elastic material layer was not performed.

COMPARATIVE EXAMPLE 3

A multilayered printed circuit board was manufactured similarly to Example 43 except that the step (2) of Example 43, i.e., the step of forming the elastic material layer was not performed.

The multilayered printed circuit boards obtained in Examples 41 to 44 and Comparative Examples 2 and 3 were evaluated according to the following evaluation method by performing (1) observation of shapes of optical waveguide, and substrate or interlaminar insulating layer thereunder (2) optical signal detection and (3) continuity test.

Evaluation Method (1) Observation of Shapes

The obtained multilayered printed circuit boards were cut by a cutter so as to cross the organic optical waveguides, and the cross sections of the organic optical waveguides were observed.

(2) Optical Signal Detection

A substrate for mounting an IC chip on which a light receiving element and a light emitting element were mounted was connected to a side of each of the obtained multilayered printed circuit boards, on which side the organic optical waveguides were formed, through the solder bumps such that the light receiving element and the light emitting element were arranged at positions confronting the openings for optical path, respectively.

Next, an optical fiber was attached to the exposed surface of the optical waveguide confronting the light emitting element, at the side surface of each multilayered printed circuit board, and a detector was attached to the exposed surface of the optical waveguide confronting the light receiving element, at the side surface of each multilayered printed circuit board. Thereafter, an optical signal was transmitted through the optical fiber to the multilayered printed circuit board, the IC chip was allowed to perform arithmetic operation and then the detector detected the optical signal.

(3) Continuity Test

Similarly to the optical signal detection, the substrate for mounting an IC chip was connected to each multilayered printed circuit board and a continuity test was then performed. A continuity state was evaluated based on the result displayed on a monitor.

The result of the evaluation of the multilayered printed circuit board in Example 41 demonstrated that two kinds of optical waveguides, i.e., the optical waveguide for receiving light and the optical waveguide for emitting light were formed at predetermined positions, respectively. In addition, in the multilayered printed circuit board in Example 43, two kinds of optical waveguides, i.e., the optical waveguide for receiving light and the optical waveguide for emitting light were formed at predetermined positions, respectively, there were no cracks in the optical waveguide and the interlaminar insulating layer existing under the optical waveguide. Further, also in the multilayeredprinted circuit boards in Examples 42 and 44, there were no cracks in the optical waveguide.

Moreover, it was demonstrated that the multilayered printed circuit boards manufactured in Examples 41 to 44 each had sufficient optical signal transmission function.

Further, in the multilayered printed circuit boards in Examples 41 to 44, the continuity test when the substrate for mounting an IC chip was connected thereto through the solder bumps demonstrated that no electric signal continuity problem occurred to each of the multilayered printed circuit boards and that an electric signal as well as an optical signal was able to be transmitted.

On the contrary, in the multilayered printed circuit boards in Comparative Examples 2 and 3, two kinds of optical waveguides, i.e., the optical waveguide for receiving light and the optical waveguide for emitting light were formed at predetermined positions, respectively, however, cracks were occurred on part of the substrate or interlaminar insulating layer existing under the optical waveguide.

Moreover, in the multilayered printed circuit boards in Comparative Examples 2 and 3, when the substrate for mounting an IC chip was connected thereto, so as to transmit an optical signal, a predetermined optical signal can be detected. However, as compared with the multilayered printed circuit board of an embodiment, on which elastic material layer is formed, such as Example 41 or 43, signal error tended to easily occur.

In the continuity test, there were no problems particularly.

EXAMPLES 45 to 53

A multilayered printed circuit board was manufactured similarly to Example 41 except that optical waveguides containing pulverized silica particles having a content shown in Table 7 and a particle distribution of 0.1 to 0.8 µm was used in the step 14 of process C in Example 41.

In Examples 45 to 53, optical waveguides were formed in similar manners to those of Examples 7 to 15, respectively.

TABLE 7

|  | Content of pulverized silica (% by weight) | transmissivity (%/mm) | Thermal expansion coefficient (ppm) |
|---|---|---|---|
| Example 45 | 0 | 93 | 70 |
| Example 46 | 8 | 84 | 61 |
| Example 47 | 10 | 82 | 58 |
| Example 48 | 15 | 84 | 53 |
| Example 49 | 25 | 81 | 46 |
| Example 50 | 50 | 82 | 41 |
| Example 51 | 60 | 79 | 37 |
| Example 52 | 70 | 75 | 34 |
| Example 53 | 80 | 77 | 29 |

For the multilayered printed circuit boards thus obtained in Examples 45 to 53, the presence or absence of cracks on the optical waveguide after a liquid-phase temperature cycle test were evaluated. The evaluation results were shown in Table 8.

The evaluation was performed based on a similar evaluation method and a similar evaluation standard to those of Example 7.

TABLE 8

|  | Liquid-phase temperature cycle | | |
|---|---|---|---|
|  | 250 cycles | 500 cycles | 1000 cycles |
| Example 45 | ○ | ○ | Δ |
| Example 46 | ○ | ○ | Δ |
| Example 47 | ○ | ○ | Δ |
| Example 48 | ○ | ○ | ○ |
| Example 49 | ○ | ○ | ○ |
| Example 50 | ○ | ○ | ○ |
| Example 51 | ○ | ○ | ○ |
| Example 52 | ○ | ○ | ○ |
| Example 53 | ○ | ○ | ○ |

In Examples 45 to 53, pulverized silica particles were added to the cladding parts constituting the respective optical waveguides. Similar experiments were performed by using titania particles or alumina particles instead of the pulverized silica particles. Regarding the results, although the thermal expansion coefficient slightly different, similar results were obtained for the liquid-phase temperature cycle test.

The optical waveguides formed in Examples 45 to 53 were multi-mode waveguides. Even when multilayered printed circuit boards were manufactured similarly to Examples 45 to 53 by using single-mode optical waveguides instead of the multi-mode optical waveguides, a predetermined optical signal was able to be transmitted for all the optical waveguides.

The single-mode optical waveguide was formed as follows. Siloxane based resin (refractive index: 1.50, transmissivity: 93%/mm, thermal expansion coefficient: 115 ppm) was prepared as resin for forming core part and siloxane based resin (refractive index: 1.48, transmissivity: 93%/mm, thermal expansion coefficient: 141 ppm) was prepared as resin for forming the cladding part. In addition, particles were added to be a predetermined mixing amount to resin for forming the cladding part if necessary. Using these resins, a single-mode optical waveguide having the cross-sectional size of the core part of 10×10 µm and the film thicknesses of the over-cladding part and the under-cladding part of 10 µm was obtained by a similar method to that in Example 7.

Further, among the optical waveguides formed by the above method, the single-mode optical waveguide having no particles mixed to the cladding part had a transmission loss of 0.43 dB/cm for signal light having a wavelength of 1.33 µm and a transmission loss of 0.84 dB/cm for signal light having a wavelength of 1.55 µm, and the single-mode optical waveguide having 50% by weight of particles mixed to the cladding part had a transmission loss of 0.41 dB/cm for signal light having a wavelength of 1.33 µm and a transmission loss of 0.82 dB/cm for signal light having a wavelength of 1.55 µm. The transmission loss was measured by the cut-back method.

The cladding part having no particles mixed had a thermal expansion coefficient of 141 ppm, and the cladding part having particles mixed by 50% by weight had a thermal expansion coefficient of 48 ppm. The optical waveguides were evaluated by performing the liquid-phase temperature cycle test for the multilayered printed circuit boards using these single-mode optical waveguides. The evaluation results were similar to those for Examples 45 to 53.

EXAMPLE 54

A. Production of Substrate for Mounting an IC Chip

A-1. Production of Resin Film for Interlaminar Insulating Layer 30 parts by weight of bisphenol A-type epoxy resin (epoxy equivalent: 469, Epicoat 1001, made by Yuka Shell Epoxy Co., Ltd.), 40 parts by weight of cresol-novolak type epoxy resin (epoxy equivalent: 215, Epiclon N-673, made by Dainippon Ink and Chemicals, Inc.), and 30 parts by weight of triazine structure containing phenol-novolak resin (phenol hydroxyl group equivalent: 120, Phenolite KA-7052, made by Dainippon Ink and Chemicals, Inc.) were dissolved while being heated in 20 parts by weight of ethyl diglycol acetate and 20 parts by weight of solvent naphtha under stirring condition, followed by the addition of 15 parts by weight of epoxy-terminated polybutadiene rubber (Denalex R-45EPT, made by Nagase Chemicals Ltd.) and 1.5 parts by weight of a pulverized product of 2-phenyl-4,5-bis(hydroxymethyl)imidazole, 2 parts by weight of a finely pulverized silica, and 0.5 parts by weight of a silicon based defoaming agent to prepare an epoxy resin composition.

After the obtained epoxy resin composition was applied to a 38 µm-thick PET film so as to adjust the thickness after drying to be 50 µm by a roll coater, the resulting film was dried at 80 to 120° C. for 10 minutes to produce a resin film for an interlaminar insulating layer.

A-2. Preparation of Resin Composition for through Hole Filler

A container was loaded with 100 parts by weight of bisphenol F-type epoxy monomer (YL983U, made by Yuka Shell Epoxy Co., Ltd., molecular weight: 310), 170 parts by weight of a SiO2 spherical particle coated with a silane coupling agent and having an average particle diameter of 1.6 µm and a diameter of the maximum particle of 15 µm or less (CRS 1101-CE, made by Adtec Co., Ltd.), and 1.5 parts by weight of a leveling agent (Perenol S4, made by San Nopco Ltd.) and they were stirred and mixed to prepare a resin filler with a viscosity of 45 to 49 Pa·s at 23±1° C. As a curing agent, 6.5 parts by weight of an imidazole curing agent (2E4MZ-CN, made by Shikoku Corp.) was employed.

A-3. Manufacture of Substrate for Mounting an IC Chip (1) A copper-clad laminate plate comprising an insulating substrate 21 which is made of a 0.8 mm-thick glass epoxy resin or BT (Bismaleimide-Triazine) resin with a 18 µm-thick copper foil 28 laminated on both sides of the substrate 21 was used as a starting material (see FIG. 32(a)). First, the copper-clad laminate plate was drilled to bore holes and then, electroless plating treatment was performed and pattern etching was performed to form conductor circuits 24 and plated-through holes 29 on both faces of the substrate 21.

Figure 32:
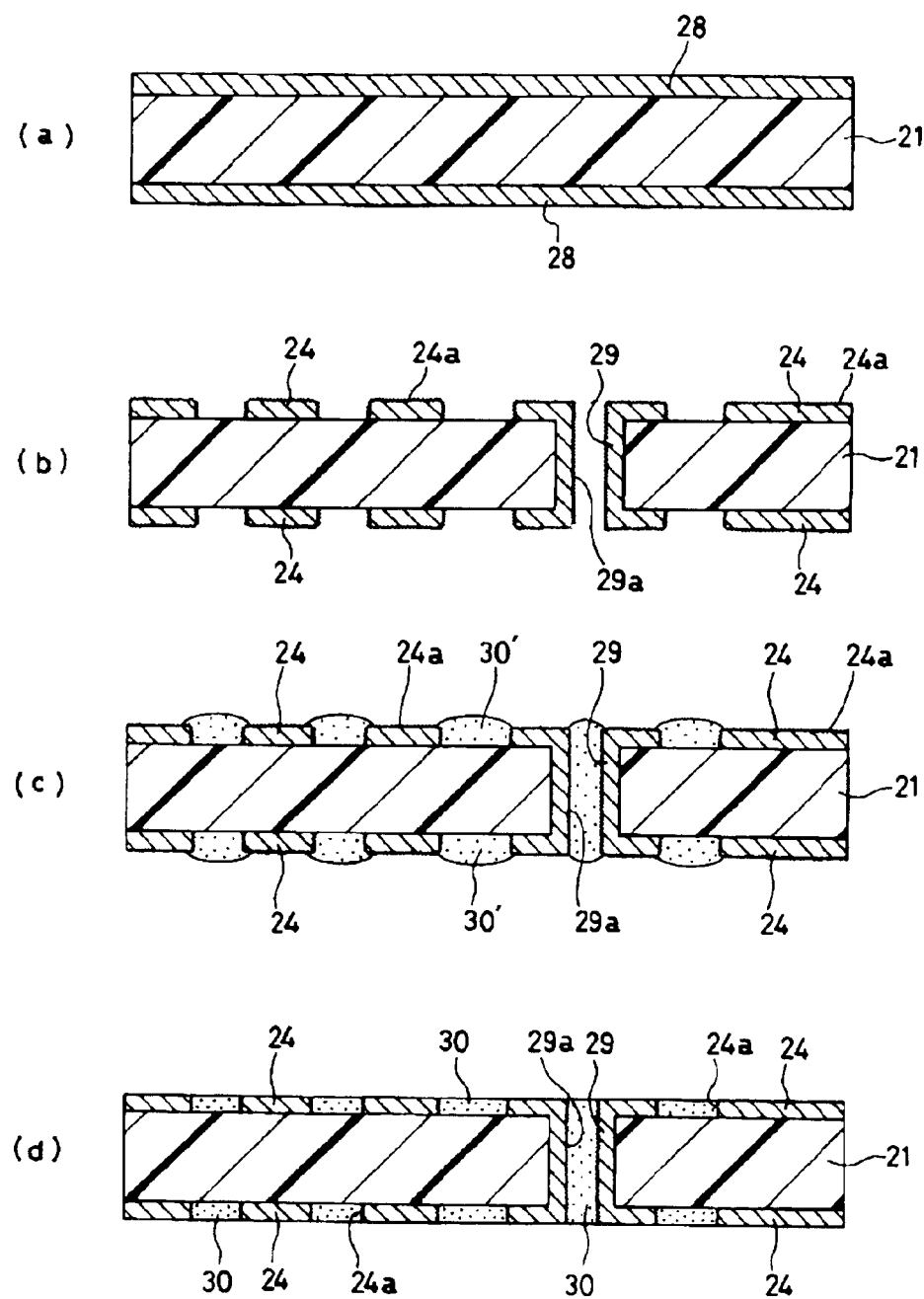
FIG. 32 is a cross-sectional view schematically showing part of the steps of manufacturing a substrate for mounting an IC chip that constitutes the device for optical communication according to the fifth group of the present invention.

(2) The substrate in which the plated-through hole 29 and the conductor circuits 24 were formed was washed with water and dried, then subjected to blackening treatment using an aqueous solution containing NaOH (10 g/l), NaClO$_2$ (40 g/l), Na$_3$PO$_4$ (6 g/l) as a blackening bath (oxidizing bath) and reducing treatment using an aqueous solution containing NaOH (10 g/l) and NaBH$_4$ (6 g/l) as a reducing bath to form roughened surfaces 24a and 29a on the surfaces of the conductor circuits 24 including the plated-through holes 29 (see FIG. 32(b)).

(3) After the resin filler described in A-2 was prepared, the layer 30' of the resin filler was formed inside the plated-through holes 29, the conductor circuit non-formed parts and the peripheral portions of the conductor circuits 24 on one surface of the substrate 21 by the following method within 24 hours after the preparation.

That is, first, the resin filler was pushed in the plated-through holes using a squeegee and then dried under the conditions of 100° C. for 20 minutes. Next, a mask having openings corresponding to the conductor circuit non-formed parts was put on the substrate and the layer 30' of the resin filler was formed in the conductor circuit non-formed parts, which were concave portions, using the squeegee and then dried under the conditions of 100° C. for 20 minutes (see FIG. 32(c)).

(4) One surface of the substrate for which the above-mentioned treatment (3) was finished was ground by a belt sander grinder using #600 belt grinding-paper (made by Sankyo Rikagaku Co., Ltd.) so as not to leave the resin filler on the surfaces of the conductor circuits 24 and the land surfaces of the plated-through holes 29 and then, buffing was performed to remove the scratches by the above-mentioned belt sander grinding. A series of such grinding steps were performed for the other surface of the substrate in a similar manner.

Next, heating treatments at 100° C. for 1 hour, 120° C. for 3 hours, 150° C. for 1 hour, and 180° C. for 7 hours were performed, respectively, to form a resin filler layer 30.

In such a manner, the surface layer part of the resin filler layer 30 formed in the plated-through holes 29 and the conductor circuit non-formed parts and the surfaces of the conductor circuits 24 were made flat to obtain an insulating substrate (see FIG. 32(d))wherein: the resin filler 30 and the side surfaces 24a of the conductor circuits 24 were firmly stuck to each other through the roughened surfaces; and also the inner wall surfaces 29a of the plated-through holes 29 and the resin filler 30 were firmly stuck to each other through the roughened surfaces. By this step, the surface of the resin filler layer 30 was flush with the surfaces of the conductor circuits 24.

Figure 33:
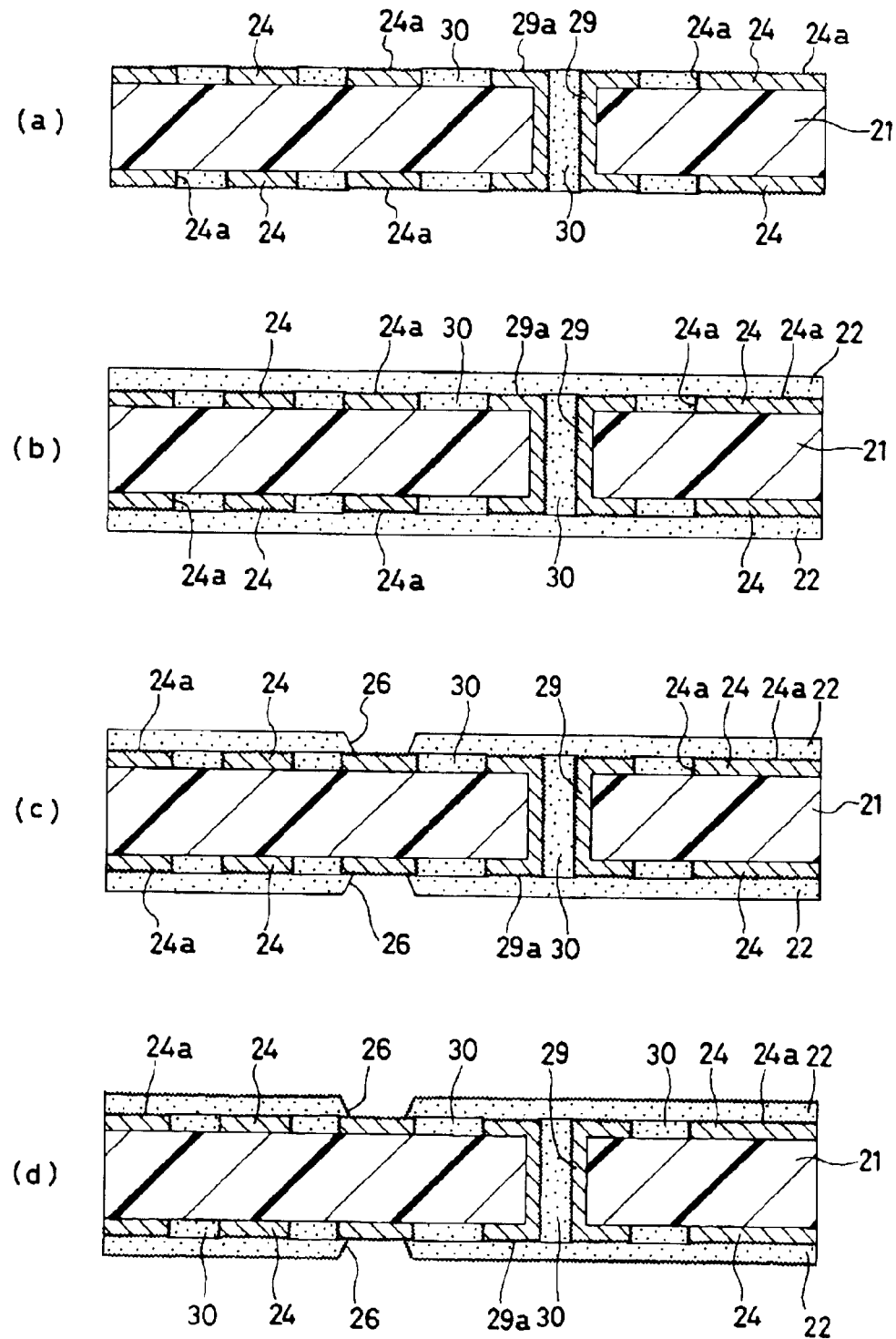
FIG. 33 is a cross-sectional view schematically showing part of the steps of manufacturing the substrate for mounting an IC chip that constitutes the device for optical communication according to the fifth group of the present invention.

(5) After the above-mentioned substrate was washed with water and degreased with an acid, soft etching was performed and then, etching solution was sprayed on both faces of the substrate to etch the surfaces of the conductor circuits 24 and the land surfaces and inner walls of the plated-through holes 29 to form the roughened surfaces 24a and 29a on the entire surfaces of the conductor circuits 24 (see FIG. 33(a)). As the etching solution, etching solution (Mec Etch Bond, made by Mec Co., Ltd.) containing 10 parts by weight of an imidazole copper (II) complex, 7 parts by weight of glycolic acid, and 5 parts by weight of potassium chloride was used.

(6) Next, a resin film for the interlaminar insulating layer with a slightly larger size than the substrate produced by the above-mentioned process A-1 was put on each surface of the substrate, temporarily pressure-bonded under the conditions of 0.4 MPa pressure, 80° C. temperature, and 10-second pressure bonding period and cut and after that, laminated by the following method using a vacuum laminator apparatus and successively subjected to thermosetting treatment to form interlaminar insulating layers 22 (see FIG. 33(b)).

That is, the resin film for the interlaminar insulating layer was actually laminated on the substrate by pressure bonding under the conditions of 65 Pa degree of vacuum, 0.4 MPa pressure, 80° C. temperature, and 60-second pressure bonding period and further subjected to thermosetting at 170° C. for 30 minutes.

(7) Next, openings 26 for via-holes with 80 μm diameter were formed in the interlaminar insulating layers 22 by a CO2 gas laser of 10.4 μm wavelength through a 1.2 mm-thick mask having through holes in conditions of the beam diameter of 4.0 mm, the top hat mode, the pulse width of 8.0 μs, 1.0 mm-diameter of the through holes of the mask, and one shot. (see FIG. 33(c)).

(8) The substrate in which the openings 26 for via-holes were formed was immersed in a solution containing 60 g/l of permanganic acid at 80° C. for 10 minutes to dissolve and remove the epoxy resin particles existing on the surfaces of the interlaminar insulating layers 22 and consequently, to form the roughened surfaces on the interlaminar insulating layers 22 including the inner walls of the openings 26 for via-holes (see FIG. 33(d)).

(9) Next, the substrate subjected to the above-mentioned treatment was immersed in a neutralizer (made by Shipley Co.) and washed with water.

Further, a palladium catalyst was supplied to the surface of the substrate subjected to the surface roughening treatment (the roughening depth: 3 μm), so that catalyst core adhered to the surfaces of the interlaminar insulating layers 22 (including the inner wall surfaces of the openings 26 for via-holes) (not shown). Namely, the catalyst was attached by immersing the substrate in a catalytic solution containing palladium chloride ($PdCl_2$) and stannous chloride ($SnCl_2$) and precipitating palladium metal.

Figure 34:
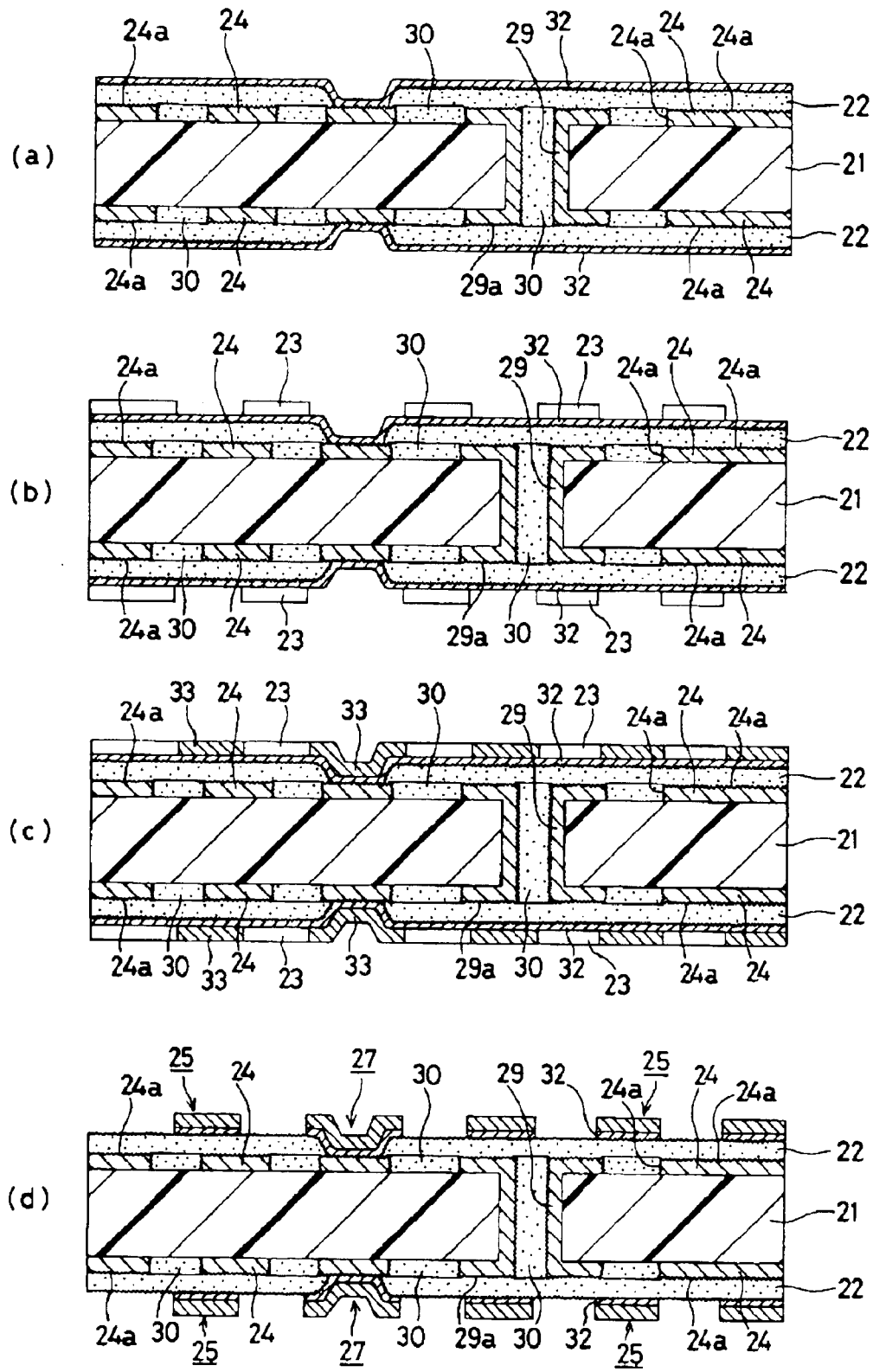
FIG. 34 is a partly cross-sectional view schematically showing part of the steps of manufacturing the substrate for mounting an IC chip that constitutes the device for optical communication according to the fifth group of the present invention.

(10) Next, the substrate was immersed in an electroless copper plating aqueous solution having the following composition to form electroless copper plating film 32 with a thickness of 0.6 to 3.0 μm on the surfaces of the interlaminar insulating layers 22 (including the inner wall surfaces of the openings 26 for via-holes) and the wall surfaces of the through holes 29 (see FIG. 34(a)).

| [Electroless plating solution] | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]

30° C. Liquid Temperature for 40 Minutes

(11) Next, a commercially available photosensitive dry film was stuck to the substrate on which the electroless copper plating films 32 were formed and a mask was put thereon and exposure with a dose of 100 mJ/$cm^2$ and development with an aqueous 0.8% sodium carbonate solution were performed to form a plating resist 23 having a thickness of 20 μm (see FIG. 34(b)).

(12) Next, the substrate was washed with water at 50° C. to be degreased and washed with water at 25° C. and further washed with sulfuric acid and after that the substrate was subjected to electroplating under the following conditions to form electroplating copper films 33 having a thickness of 20 μm in portions in which the plating resist 23 was not formed (see FIG. 34(c)).

| [Electroplating solution] | |
|---|---|
| Sulfuric acid | 2.24 mol/l |
| Copper sulfate | 0.26 mol/l |
| Additive | 19.5 ml/l |

(Cupracid GL, Made by Atotech Japan Co., Ltd.)

| [Electroplating conditions] | |
|---|---|
| Current density | 1 A/$dm^2$ |
| Time | 65 minutes |
| Temperature | 22 ± 2° C. |

(13) After peeling off the plating resists 23 with 5% NaOH, the electroless plating films under the plating resists 23 were etched, dissolved and removed with a solution mixture of sulfuric acid and hydrogen peroxide, thus forming conductor circuits 25 (including via-holes 27) each comprising the electroless copper plating film 32 and the electroplating copper film 33 and having a thickness of 18 μm (FIG. 34(d)).

Further, using a similar etching solution (Mec Etch Bond) as that used in the step (5), roughened surfaces were formed on the surfaces of the conductor circuits 25 (including the via-holes 27).

(14) Next, a container was loaded with: 46.67 parts by weight of an oligomer provided with a photosensitivity (molecular weight: 4000) obtained by acrylating 50% of an epoxy group of cresol-novolak type epoxy resin (made by Nippon Kayaku Co., Ltd.), dissolved in diethylene glycol dimethyl ether (DMDG) to be 60% by weight concentration; 15.0 parts by weight of bisphenol A-type epoxy resin (trade name: Epicoat 1001, made by Yuka Shell Epoxy Co., Ltd.) dissolved in methyl ethyl ketone to be 80% by weight concentration; 1.6 parts by weight of imidazole curing agent (trade name: 2E4MZ-CN, made by Shikoku Corp.); 4.5 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE6A, made by Kyoei Chemical Co., Ltd.); and 0.71 parts by weight of the dispersion type defoaming agent (S-65, made by San Nopco Ltd.), and they were stirred and mixed to prepare the mixed composition. Then, to the mixed composition, 2.0 parts by weight of benzophenone (made by Kanto Kagaku Corp.) as a photoinitiator and 0.2 parts by weight of Michler's ketone (made by Kanto Kagaku Corp.) as a photosensitizer were added to the mixed composition to obtain a solder resist composition adjusted to have a viscosity of 2.0 Pa·s at 25° C.

The viscosity measurement was performed using a rotor No. 4 in the case of 60 $min^{-1}$ (rpm) and a rotor No. 3 in the case of 4.6 $min^{-1}$ (rpm) using a B-type viscometer (DVL-B type, made by Tokyo Keiki Co., Ltd.).

Figure 35:
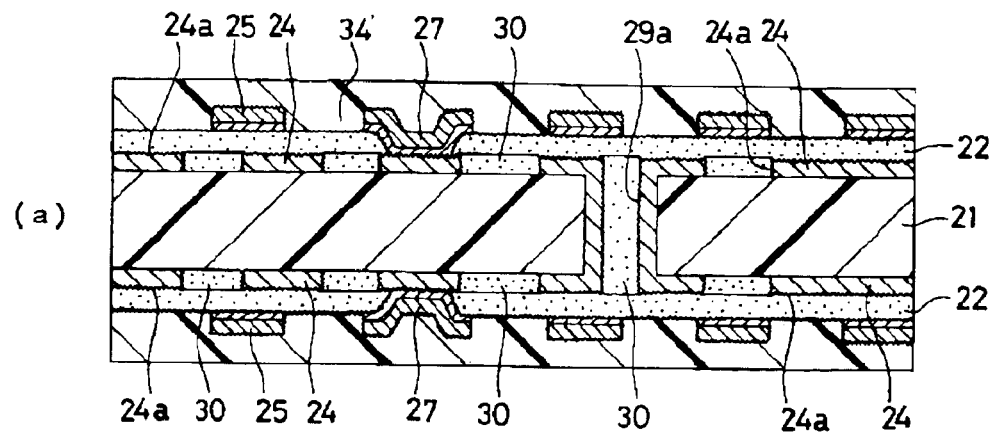
FIG. 35 is a partly cross-sectional view schematically showing part of the steps of manufacturing the substrate for mounting an IC chip that constitutes the device for optical communication according to the fifth group of the present invention.
Figure 35:
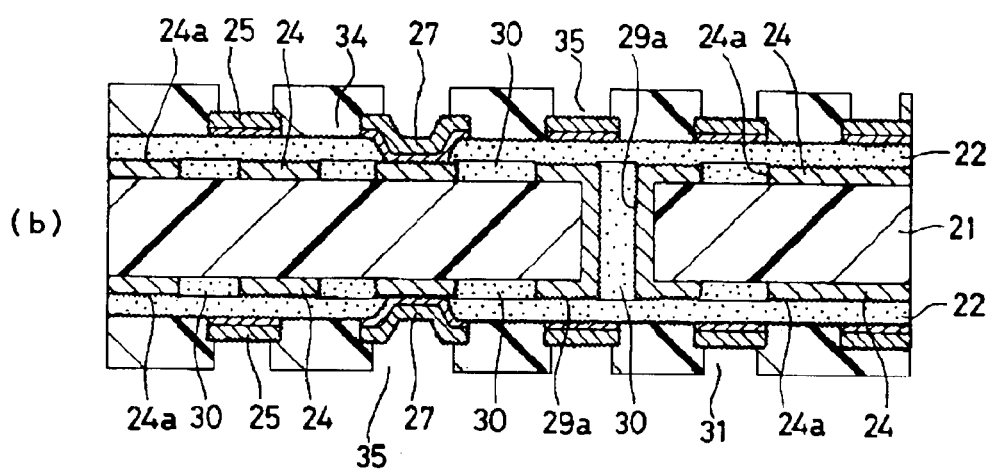
Figure 35:
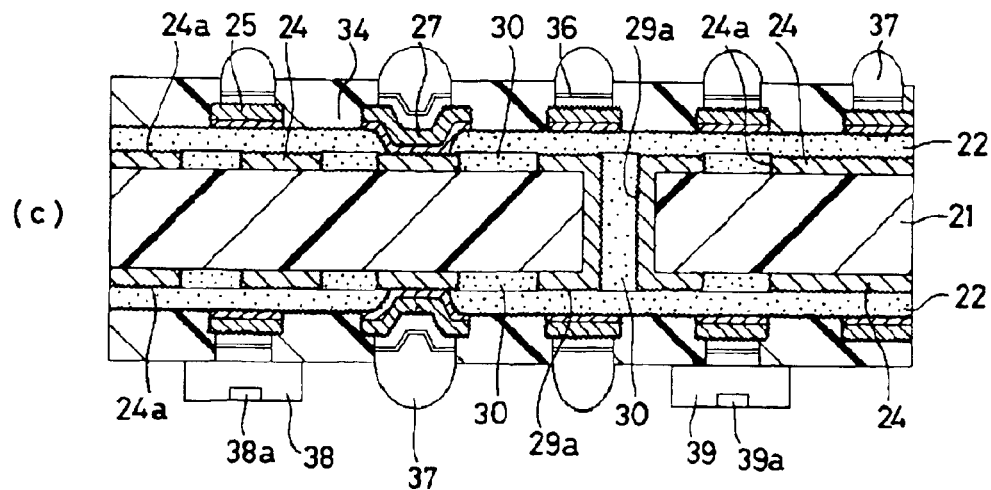

(15) The above-mentioned solder resist composition was applied by 30 μm thickness to both faces of the substrate on which the interlaminar insulating layers 22 and the conductor circuits 25 (including the via-holes 27) were formed, and dried under conditions of 70° C. for 20 minutes and 70° C. for 30 minutes, thereby forming the layer 34' of the solder resist composition (see FIG. 35(*a*)).

(16) A 5 mm-thick photomask drawing a pattern of openings for forming solder bump and openings for optical elements (a light receiving element and a light emitting element), was firmly stuck to the solder resist composition layer, followed by the exposure to UV rays of 1000 $mJ/cm^2$ dose and development with the DMTG solution to form openings having 200 μm diameter.

Further, heat treatments were performed at 80° C. for 1 hour, 100° C. for 1 hour, and 120° C. for 1 hours, respectively, to cure the solder resist composition layers, thus forming a solder resist layer 34 having openings for forming solder bump 35, openings 31 for optical elements and a thickness of 20 μm (see FIG. 35(*b*)). As the solder resist composition, a commercially available solder resist composition can be also used.

(17) Next, the substrate on which the solder resist layers 34 were formed was immersed in an electroless nickel plating solution having pH 4.5 and containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form 5 μm-thick nickel plating layers in the openings for forming solder bump 35 and the openings 31 for optical elements, respectively. Further, the obtained substrate was immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) under the conditions of 80° C. for 7.5 minutes to form a 0.03 μm-thick gold plating layer on each nickel plating layer, thus obtaining solder pads 36.

(18) Solder paste was printed in the openings for forming solder bump 35 and the openings 31 for optical elements formed in the solder resist layer 34; and a light receiving element 38 and a light emitting element 39 were attached to the solder paste printed on the respective openings 31 for optical elements while positioning properly the light receiving part 38*a* of the light receiving element 38 and the light emitting part 39*a* of the light emitting element 39, then reflow was performed at 200° C., to thereby mount the light receiving element 38 and the light emitting element 39, followed by formation of solder bumps 37 on the respective openings for forming solder bump 35, thus obtaining a substrate for mounting an IC chip.

As the light receiving element 38, an optical element made of InGaAs was used. As the light emitting element 39, an optical element made of InGaAsP was used (see FIG. 35(*c*)).

B. Production of Multilayered Printed Circuit Board

B-1. Production of Resin Film for Interlaminar Insulating Layer

A resin film for an interlaminar insulating layer was produced using a similar method to that used in process A-1.

B-2. Preparation of Resin Composition for through Hole Filler

A resin composition for a through hole filler was produced using a similar method to that used in process A-2.

B-3. Manufacture of Multilayered Printed Circuit Board (1) A copper-clad laminate plate comprising an insulating substrate 1 which is made of a 0.6 mm-thick glass epoxy resin or BT (Bismaleimide-Triazine) resin with a 18 μm-thick copper foil 8 laminated on both sides of the substrate 1 was used as a starting material (see FIG. 36(*a*)). First, the copper-clad laminate plate was drilled to bore holes and then, electroless plating treatment was performed and pattern etching was performed to form conductor circuits 4 and plated-through holes 9 on both faces of the substrate 1.

Figure 36:
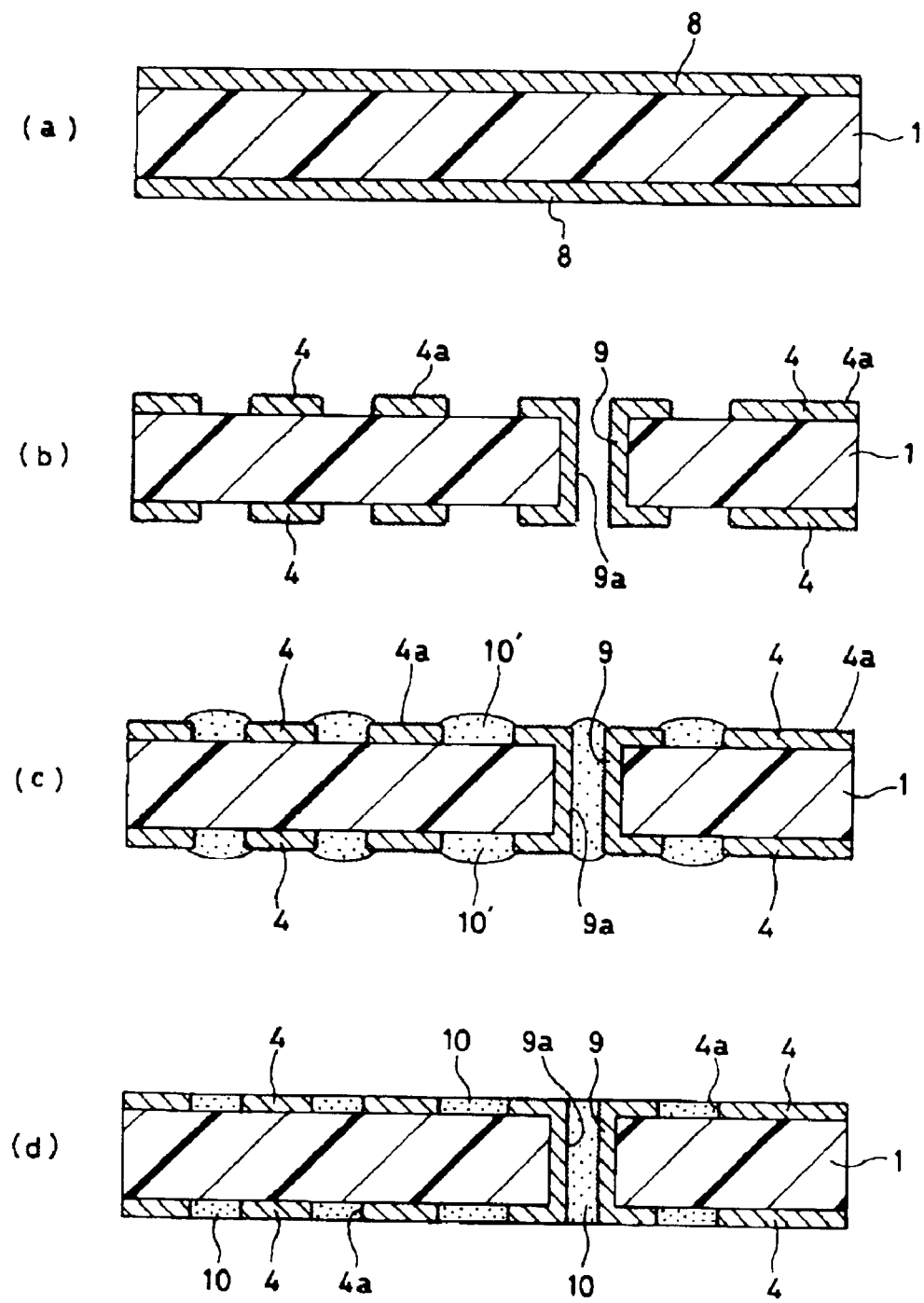
FIG. 36 is a partly cross-sectional view schematically showing part of the steps of manufacturing a multilayered printed circuit board that constitutes the device for optical communication according to the fifth group of the present invention.

(2) The substrate in which the plated-through hole 9 and the conductor circuits 4 were formed was washed with water and degreased with an acid, and etching solution (Mec Etch Bond, made by Mec Co., Ltd.) was sprayed on the substrate, thereby forming roughened surfaces 4*a* and 9*a* on the surfaces of the conductor circuits 4 including the plated-through holes 9 (see FIG. 36(*b*)).

(3) After the resin filler described in process B-2 was prepared, the layer of the resin filler 10' was formed inside the plated-through holes 9, the conductor circuit non-formed parts on one surface of the substrate 1 and the peripheral portions of the conductor circuits 4 by the following method within 24 hours after the preparation.

That is, first, the resin filler was pushed in the plated-through holes using a squeegee and then dried under the conditions of 100° C. for 20 minutes. Next, a mask having openings corresponding to the conductor circuit non-formed parts was put on the substrate and the layer of the resin filler 10' was formed in the conductor circuit non-formed parts, which were concave portions, using the squeegee and then dried under the conditions of 100° C. for 20 minutes. Likewise, the layer of the resin filler 10' was formed in the conductor circuit non-formed parts and the peripheral portions of the conductor circuits on the other surface of the substrate (see FIG. 36(*c*)).

(4) One surface of the substrate for which the above-mentioned treatment (3) was finished was ground by a belt sander grinder using #600 belt grinding-paper (made by Sankyo Rikagaku Co., Ltd.) so as not to leave the resin filler 10' on the surfaces of the conductor circuits 4 and the land surfaces of the plated-through holes 9 and then, buffing was performed to remove the scratches by the above-mentioned belt sander grinding. A series of such grinding steps were performed for the other surface of the substrate in a similar manner.

Next, heating treatments at 100° C. for 1 hour, 120° C. for 3 hours, 150° C. for 1 hour, and 180° C. for 7 hours were performed, respectively, to form a resin filler layer 10.

In such a manner, the surface layer part of the resin filler layer 10 formed in the plated-through holes 9 and the conductor circuit non-formed parts and the surfaces of the conductor circuits 4 were made flat to obtain an insulating substrate (see FIG. 36(*d*)) wherein: the resin filler 10 and the side surfaces 4*a* of the conductor circuits 4 were firmly stuck to each other through the roughened surfaces; and also the inner wall surfaces 9*a* of the plated-through holes 9 and the resin filler 10 were firmly stuck to each other through roughened surfaces. By this step, the surface of the resin filler layer 10 was flush with the surfaces of the conductor circuits 4.

Figure 37:
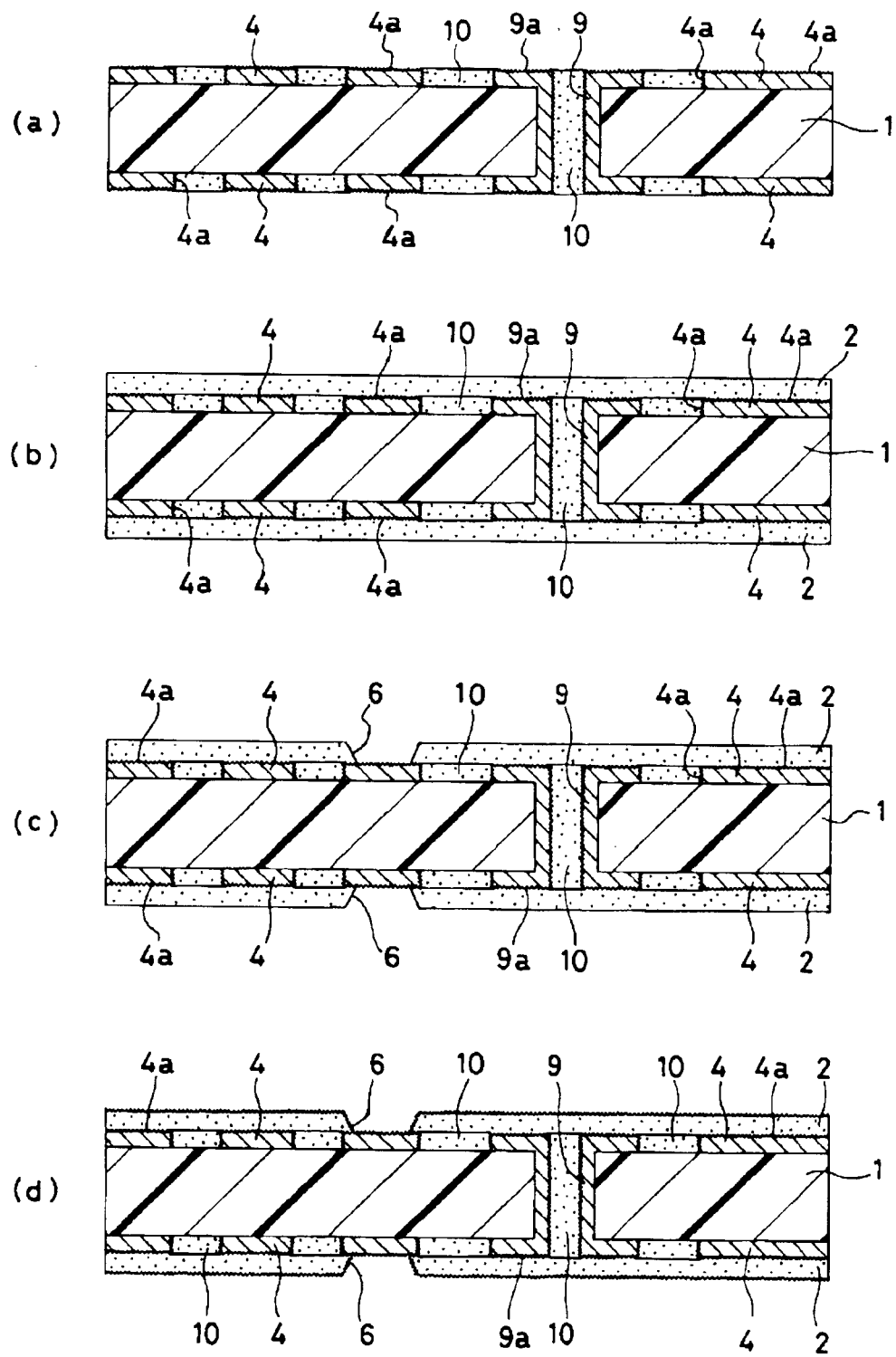
FIG. 37 is a partly cross-sectional view schematically showing part of the steps of manufacturing the multilayered printed circuit board that constitutes the device for optical communication according to the fifth group of the present invention.

(5) After the above-mentioned substrate was washed with water and degreased with an acid, soft etching was performed and then, etching solution was sprayed on both faces of the substrate to etch the surfaces of the conductor circuits 4 and the land surfaces and inner walls of the plated-through holes 9 to form the roughened surfaces 4a and 9a on the entire surfaces of the conductor circuits 4 (see FIG. 37(a)). As the etching solution, etching solution, Mec Etch Bond made by Mec Co., Ltd. was used.

(6) Next, a resin film for the interlaminar insulating layer with a slightly larger size than the substrate produced by process B-1 was put on each surface of the substrate, temporarily pressure-bonded under the conditions of 0.4 MPa pressure, 80° C. temperature, and 10-second pressure bonding period and cut and after that, laminated by the following method using a vacuum laminator apparatus and successively subjected to thermosetting treatment to form interlaminar insulating layers 2 (see FIG. 37(b)). That is, the resin film for the interlaminar insulating layer was actually laminated on the substrate by pressure bonding under the conditions of 65 Pa degree of vacuum, 0.4 MPa pressure, 80° C. temperature, and 60-second pressure bonding period and further subjected to thermosetting at 170° C. for 30 minutes.

(7) Next, openings 6 for via-holes with 80 μm diameter were formed in the interlaminar insulating layers 2 by a CO2 gas laser of 10.4 μm wavelength through a 1.2 mm-thick mask having through holes in conditions of the beam diameter of 4.0 mm, the top hat mode, the pulse width of 8.0 μs, 1.0 mm-diameter of the through holes of the mask, and one shot (see FIG. 37(c)).

(8) The surfaces of the interlaminar insulating layers 2 were roughened by performing plasma treatment using SV-4540 made by ULVAC, Inc. (see FIG. 37(d)). The plasma treatment was performed with argon gas used as inert gas under the conditions of power of 200 W, gas pressure of 0.6 Pa and a temperature of 70° C. for 2 minutes.

Next, using the same apparatus, after the gas inside the apparatus was exchanged, sputtering was performed with Ni set as a target under the conditions of an atmospheric pressure of 0.6 Pa, a temperature of 80° C., a power of 200 W, a period of 5 minutes, thereby forming a metal layer made of Ni on each interlaminar insulating layer 2. The thickness of Ni layer was 0.1 μm.

Figure 38:
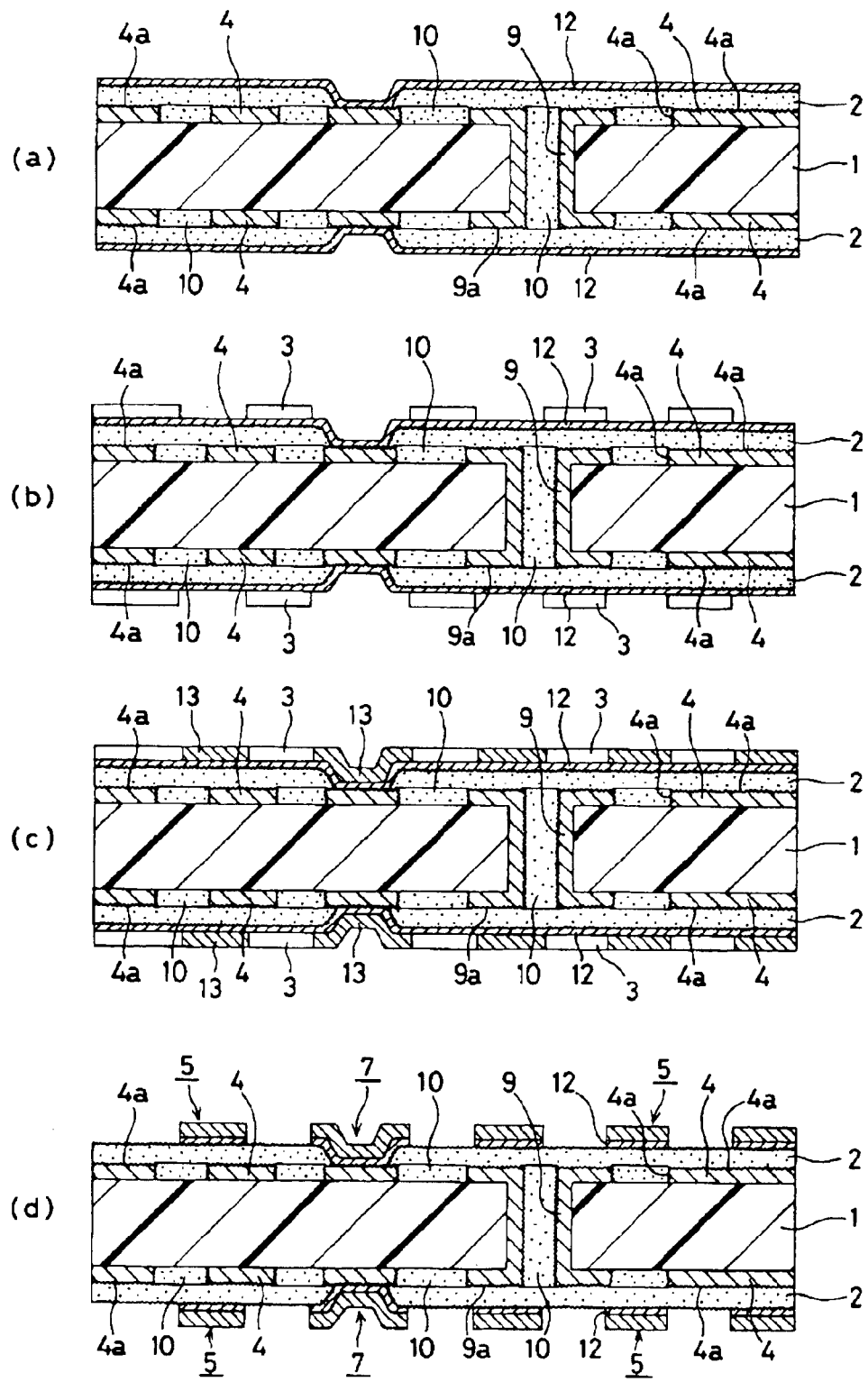
FIG. 38 is a partly cross-sectional view schematically showing part of the steps of manufacturing the multilayered printed circuit board that constitutes the device for optical communication according to the fifth group of the present invention.
Figure 39:
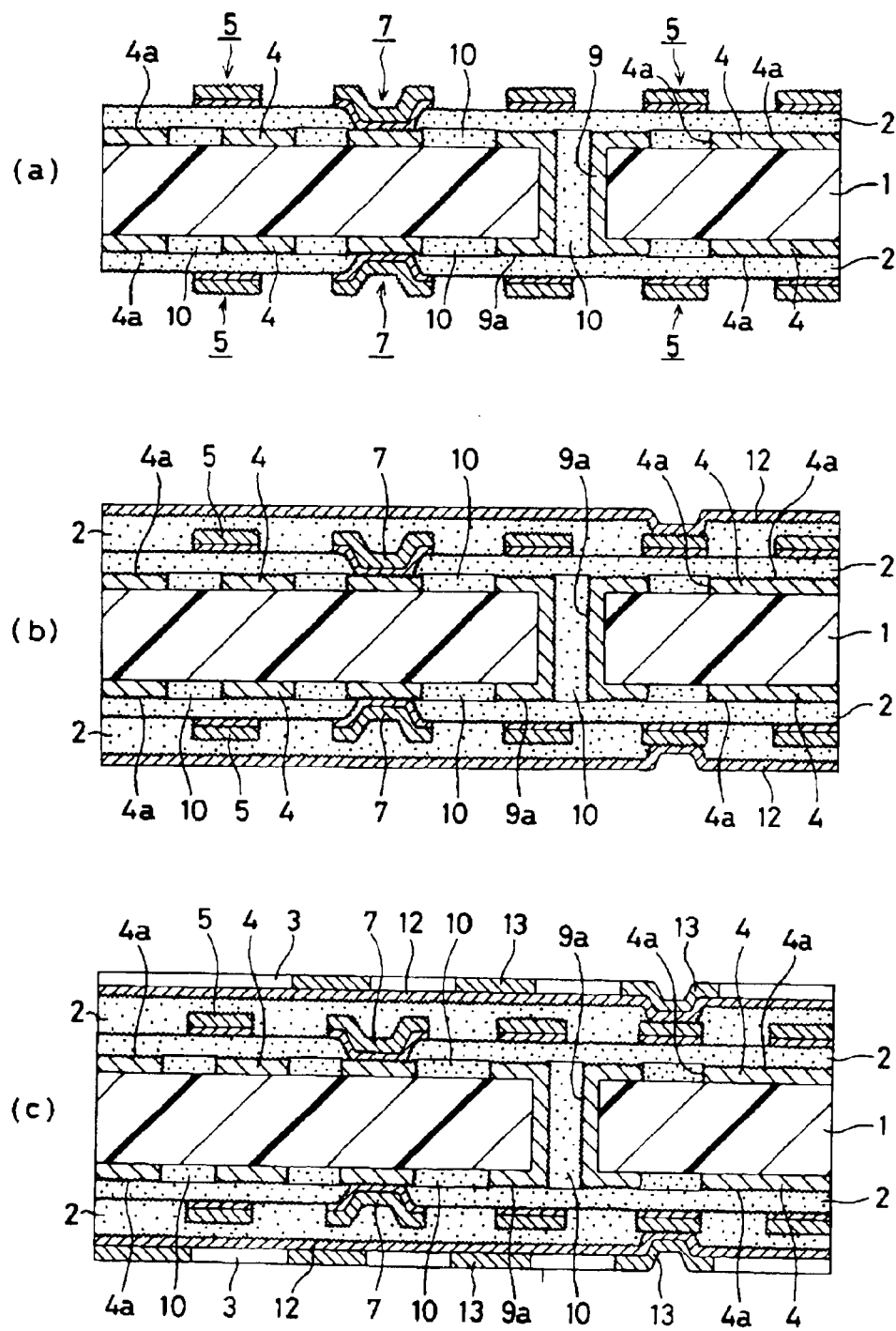
FIG. 39 is a partly cross-sectional view schematically showing part of the steps of manufacturing the multilayered printed circuit board that constitutes the device for optical communication according to the fifth group of the present invention.
Figure 40:
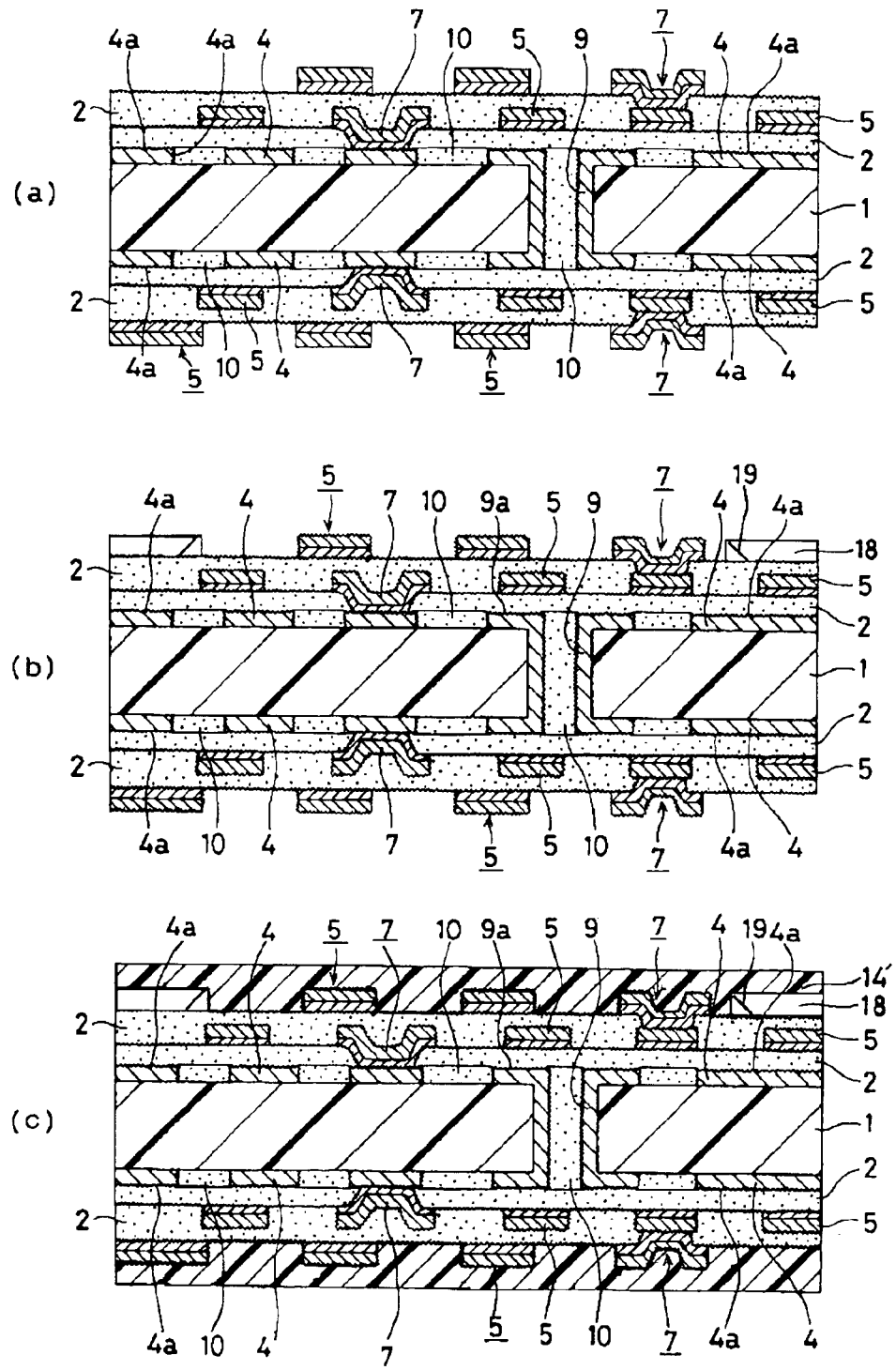
FIG. 40 is a partly cross-sectional view schematically showing part of the steps of manufacturing the multilayered printed circuit board that constitutes the device for optical communication according to the fifth group of the present invention.

(9) The substrate on which the Ni layers were formed was immersed in an electroless copper plating aqueous solution having the following composition to form electroless copper plating film with a thickness of 0.6 to 3.0 μm on the surface of each Ni layer (see FIG. 38(a)). In FIG. 38, the layer comprising the Ni layers and the electroless copper plating layer is denoted as thin film conductor layers 12.

| [Electroless plating solution] | |
| --- | --- |
| NiSO$_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 100 mg/l |
| Polyethylene glycol (PEG) | 0.10 g/l |

[Electroless Plating Condition]
30° C. Liquid Temperature for 40 Minutes

(10) Next, a commercially available photosensitive dry film was stuck to the substrate on which the thin film conductor layers 12 were formed, a mask was put thereon, and exposure with a dose of 100 mJ/cm$^2$ and development with an aqueous 0.8% sodium carbonate solution were performed to form a plating resist 3 having a thickness of 20 μm (see FIG. 38(b)).

(11) Next, the substrate was washed with water at 50° C. to be degreased, washed with water at 25° C. and further washed with sulfuric acid. The substrate was then subjected to electroplating under the following conditions to form electroplating copper films 3 having a thickness of 20 μm in portions in which the plating resist 3 was not formed (see FIG. 38(c)).

| [Electroplating solution] | |
| --- | --- |
| Sulfuric acid | 2.24 mol/l |
| Copper sulfate | 0.26 mol/l |
| Additive | 19.5 ml/l |

(Cupracid GL, Made by Atotech Japan Co., Ltd.)

| [Electroplating conditions] | |
| --- | --- |
| Current density | 1 A/dm$^2$ |
| Time | 65 minutes |
| Temperature | 22 ± 2° C. |

(12) After peeling off the plating resists 23 with 5% NaOH, the thin film conductor layers under the plating resists 3 were etched, dissolved and removed with a solution mixture of sulfuric acid and hydrogen peroxide, thus forming conductor circuits 5 (including via-holes 7) each comprising the thin film conductor layer 12 and the electroplating copper film 13 and having a thickness of 18 μm (see FIG. 38(d)).

(13) The steps (5) to (12) were repeated to build up interlaminar insulating layers and conductor layers on further upper layers (see FIGS. 39(a) to 40(a)). Further, using a similar method to that used in the step (5), a roughened surface was formed on the conductor circuit on the outermost layer.

(14) Optical waveguides 18 having optical path conversion mirrors 19 were formed at predetermined positions on the surface of the outermost interlaminar insulating layer 2, respectively, using the following method (see FIG. 40(b)).

Namely, film-shaped optical waveguides (made by STEAG micro Parts GmbH., width: 1 mm, thickness: 20 μm) comprising PMMA and having 45°-optical path conversion mirrors formed in advance, respectively, by using a diamond saw having a 90°-V-shaped tip end, were bonded such that the side surfaces on the other ends of the optical waveguides on the optical path conversion mirror non-formed side were aligned to the side surfaces of the interlaminar insulating layers.

The bonding of the optical waveguides was performed by: applying adhesive comprising thermosetting resin onto the bonding surfaces of the optical waveguides with the interlaminar insulating layers by a thickness of 10 μm; then bonding it thereon with pressure; and curing the adhesive at 60° C. for 1 hour.

In this example, the curing treatment was performed under the conditions at 60° C. for 1 hour. In some cases, step curing may be performed. This is because stress tends to occur less frequently to the optical waveguides during bonding by performing the step curing.

(15) Next, a container was loaded with: 46.67 parts by weight of an oligomer provided with a photosensitivity (molecular weight: 4000) obtained by acrylating 50% of an epoxy group of cresol-novolak type epoxy resin (made by Nippon Kayaku Co., Ltd.), dissolved in diethylene glycol dimethyl ether (DMDG) to be 60% by weight concentration; 15.0 parts by weight of bisphenol A-type epoxy resin (trade name: Epicoat 1001, made by Yuka Shell Epoxy Co., Ltd.) dissolved in methyl ethyl ketone to be 80% by weight concentration; 1.6 parts by weight of imidazole curing agent (trade name: 2E4MZ-CN, made by Shikoku Corp.); 3.0 parts by weight of a polyvalent acrylic monomer, which was a photosensitive monomer (trade name: R604, made by Nippon Kayaku Co., Ltd.); 1.5 parts by weight of a similarly polyvalent acrylic monomer (trade name: DPE6A made by Kyoei Chemical Co., Ltd.); and 0.71 parts by weight of the dispersion type defoaming agent (S-65, made by San Nopco Ltd.), and they were stirred and mixed to prepare the mixed composition. Then, to the mixed composition, 2.0 parts by weight of benzophenone (made by Kanto Kagaku Corp.) as a photoinitiator and 0.2 parts by weight of Michler's ketone (made by Kanto Kagaku Corp.) as a photosensitizer were added to the mixed composition to obtain a solder resist composition adjusted to have a viscosity of 2.0 Pa·s at 25° C. Further, the solder resist composition was applied onto the both face of the substrate on which the optical waveguides 18 were formed by a thickness of 35 μm, dried under the conditions of 70° C. for 20 minutes and 70° C. for 30 minutes, thus forming a solder resist composition layer 14' (see FIG. 40(c)).

(16) A5 mm-thick photomask drawing a pattern of openings for forming solder bump and openings for optical paths, was firmly stuck to the solder resist composition layer on one surface of the substrate, followed by the exposure to UV rays of 1000 mJ/cm$^2$ dose and development with the DMTG solution to form openings having 200 μm diameter.

Figure 41:
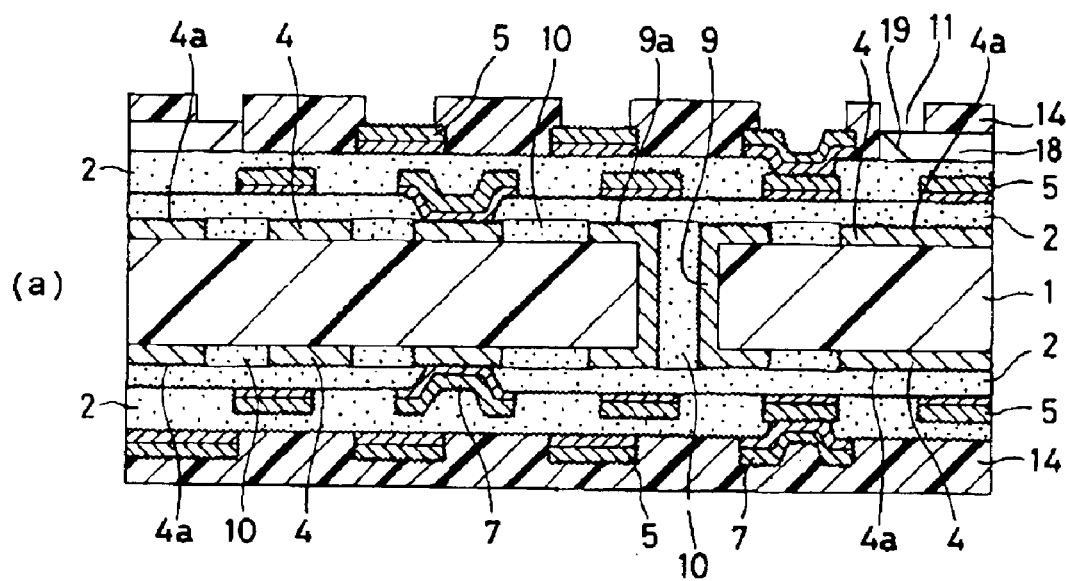
FIG. 41 is a partly cross-sectional view schematically showing part of the steps of manufacturing the multilayered printed circuit board that constitutes the device for optical communication according to the fifth group of the present invention.
Figure 41:
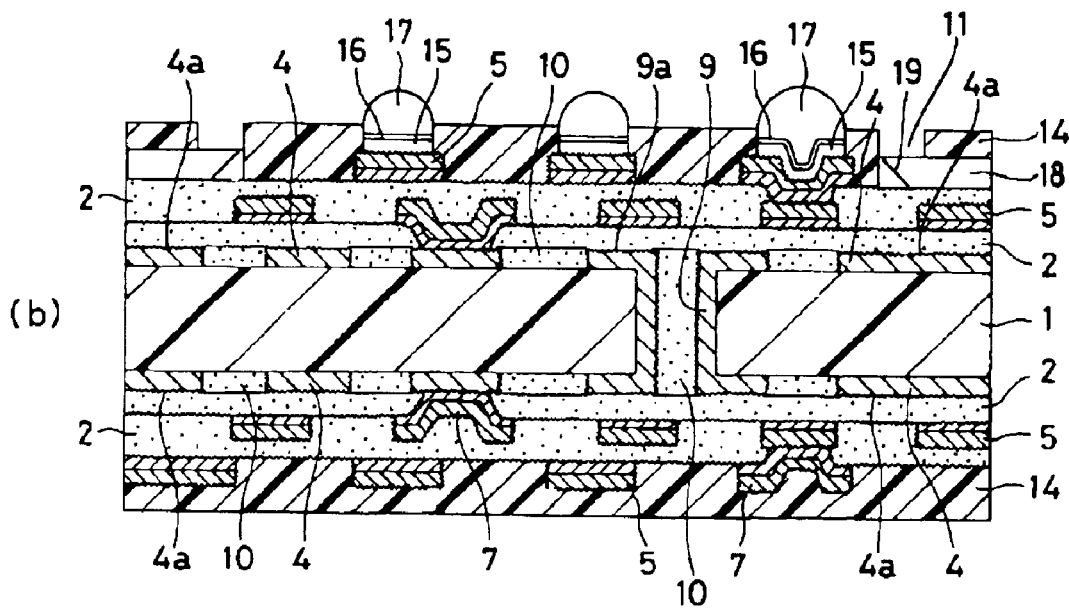

Further, heat treatments were performed at 80° C. for 1 hour, 100° C. for 1 hour, 120° C. for 1 hours, and 150° C. for 3 hours, respectively, to cure the solder resist composition layer, thus forming a solder resist layer 14 having openings for forming solder bump 15, the openings 11 for optical paths and a thickness of 20 μm (see FIG. 41(a)).

(17) Next, the substrate on which the solder resist layers 14 were formed was immersed in an electroless nickel plating solution having pH 4.5 and containing nickel chloride ($2.3\times10^{-1}$ mol/l), sodium hypophosphite ($2.8\times10^{-1}$ mol/l), and sodium citrate ($1.6\times10^{-1}$ mol/l) for 20 minutes to form 5 μm-thick nickel plating layers in the openings for forming solder bump 15, respectively. Further, the obtained substrate was immersed in an electroless gold plating solution containing potassium gold cyanide ($7.6\times10^{-3}$ mol/l), ammonium chloride ($1.9\times10^{-1}$ mol/l), sodium citrate ($1.2\times10^{-1}$ mol/l), and sodium hypophosphite ($1.7\times10^{-1}$ mol/l) under the conditions of 80° C. for 7.5 minutes to form a 0.03 μm-thick gold plating layer on each nickel plating layer, thus obtaining solder pads 16.

(18) Solder paste was printed in the openings for forming solder bump 15 formed in the solder resist layer 14 and then reflow was performed at 200° C., thereby forming solder bumps 17 in the openings for forming solder bump 15 and obtaining a multilayered printed circuit board (see FIG. 41(b)).

C. Manufacturing of an IC Mounting Device for Optical Communication

First, an IC chip was mounted on the substrate for mounting an IC chip manufactured through the steps of A and then sealed with resin, thereby obtaining a substrate for mounting an IC chip.

Next, this substrate for mounting an IC chip and the multilayered printed circuit board manufactured through the steps of B were arranged to be confronting each other at their respective predetermined positions, and then reflow was performed at 200° C. to thereby connect the solder bumps of the both substrates to form solder connection parts, thereby manufacturing an IC mounting device for optical communication (see FIG. 31).

For the IC mounting device for optical communication thus obtained, an optical fiber was attached to the exposed surface of the optical waveguide confronting the light receiving element, from the multilayered printed circuit board. A detector was attached to the exposed surface of the optical waveguide confronting the light receiving element, from the multilayered printed circuit board. Thereafter, an optical signal was transmitted through the optical fiber, the IC chip was allowed to perform arithmetic operation and then the detector detected the optical signal. As a result, a desired optical signal was able to be detected, thus demonstrating that the IC mounting device for optical communication manufactured in Example 54 had sufficiently satisfactory characteristics as a device for optical communication.

COMPARATIVE EXAMPLE 4

A substrate for mounting an IC chip was manufactured using a similar method to that of A of Comparative Example 1. In addition, an optical element-mounting substrate was manufactured similarly to the steps of B of Comparative Example 1 except that the mounting of optical elements and the formation of solder bumps were performed only on one solder resist layer on the same surface in the steps of B of Comparative Example 1.

Further, the substrate for mounting an IC chip and the optical element-mounting substrate manufactured through the respective steps were connected to the multilayered printed circuit board manufactured in the steps of B of Example 54, thus obtaining a device for optical communication.

Figure 49:
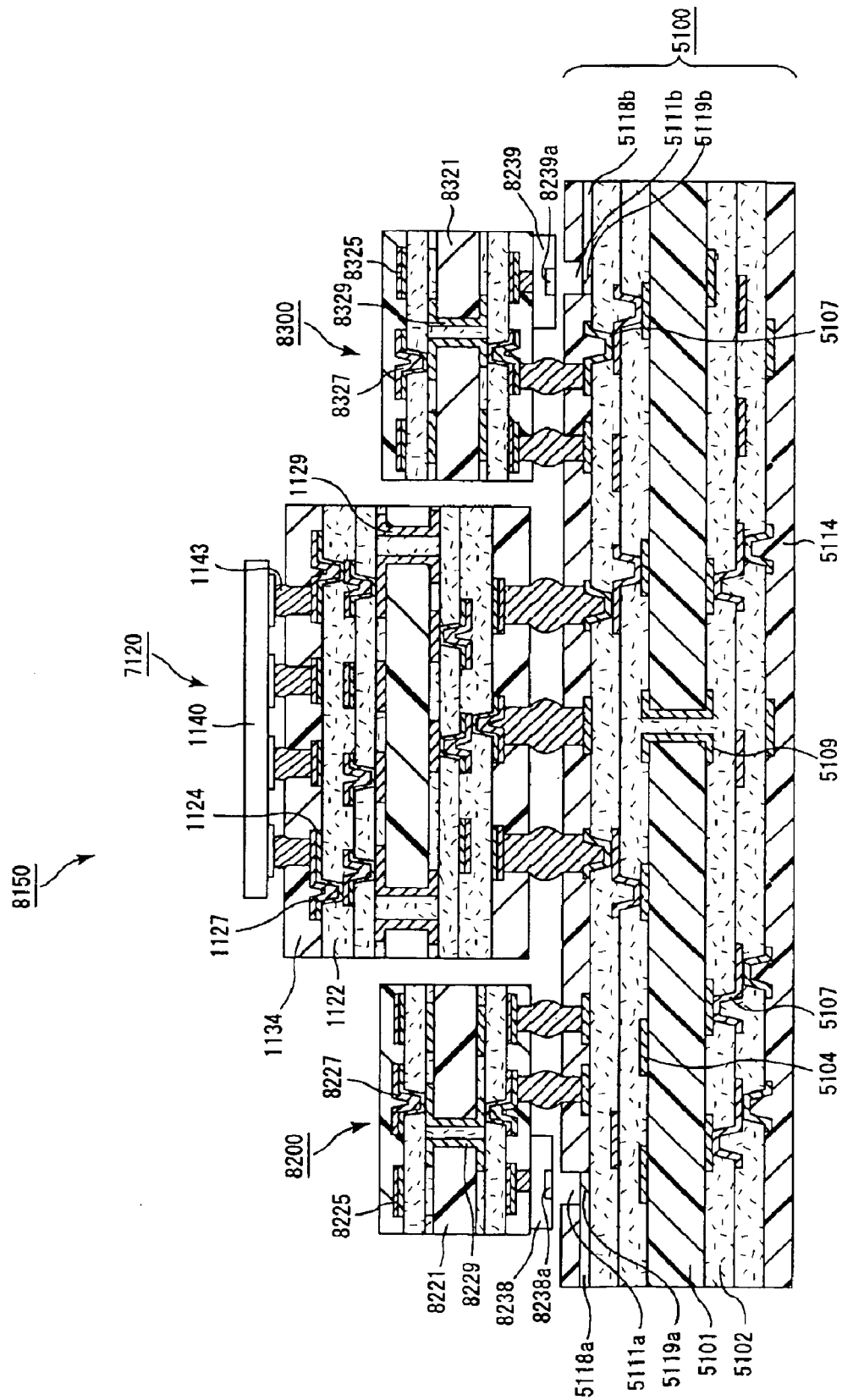
FIG. 49 is a cross-sectional view schematically showing a device for optical communication manufactured in Comparative Example 4.

Specifically, after mounting an IC chip on the substrate for mounting an IC chip 7120, the substrate for mounting an IC chip 7120 was connected to the multilayered printed circuit board 5100 through the solder bumps. In addition, a light receiving element-mounting substrate 8200 and a light emitting element-mounting substrate 8300 were connected to predetermined positions at which an optical signal can be transmitted between the optical waveguides 5118a and 5118b formed on the multilayered printed circuit board 5100, respectively, thus obtaining a device 8150 for optical communication (see FIG. 49). In FIG. 48, reference symbol 8238 denotes a light receiving element, 8238a denotes a light receiving surface, 8339 denotes a light emitting element, 8339a denotes a light emitting surface, 8221 and 8321 denote substrates, 8225 and 8325 denote conductor circuits, 8227 and 8327 denote via-holes, and 8229 and 8329 denote plated-through holes.

For the thus obtained IC mounting device for optical communication, an optical fiber was attached to the exposed surface of the optical waveguide confronting the light receiving element, from the multilayered printed circuit board, and a detector was attached to the exposed surface of the optical waveguide confronting the light receiving element, from the multilayered printed circuit board. Thereafter, an optical signal was transmitted through the optical fiber, the IC chip was allowed to perform arithmetic operation and then the detector detected the optical signal.

As a result, signal error was partially detected. The reason is considered as follows. Since the distance between the optical element and the IC chip became larger than that in the device for optical communication in Example 54, signal error due to cross-talk noise occurred.

EXAMPLE 55 to 63

A device for optical communication was manufactured similarly to Example 54 except that optical waveguides containing pulverized silica particles having a content shown in Table 9 and a particle distribution of 0.1 to 0.8 μm was used in the step (14) of process B in Example 54.

In Examples 55 to 63, optical waveguides were formed in similar manners to those of Examples 7 to 15, respectively.

TABLE 9

|  | Content of pulverized silica (% by weight) | transmissivity (%/mm) | Thermal expansion coefficient (ppm) |
|---|---|---|---|
| Example 55 | 0 | 93 | 70 |
| Example 56 | 8 | 84 | 61 |
| Example 57 | 10 | 82 | 58 |
| Example 58 | 15 | 84 | 53 |
| Example 59 | 25 | 81 | 46 |
| Example 60 | 50 | 82 | 41 |
| Example 61 | 60 | 79 | 37 |
| Example 62 | 70 | 75 | 34 |
| Example 63 | 80 | 77 | 29 |

For the devices for optical communication thus obtained in Examples 55 to 63, the presence or absence of cracks on the optical waveguide after a liquid-phase temperature cycle test were evaluated. The evaluation results are shown in Table 10.

The evaluation was conducted based on a similar evaluation method and a similar evaluation standard to those of Example 7.

TABLE 10

|  | Liquid-phase temperature cycle | | |
|---|---|---|---|
|  | 250 cycles | 500 cycles | 1000 cycles |
| Example 55 | ○ | ○ | Δ |
| Example 56 | ○ | ○ | Δ |
| Example 57 | ○ | ○ | Δ |
| Example 58 | ○ | ○ | ○ |
| Example 59 | ○ | ○ | ○ |
| Example 60 | ○ | ○ | ○ |
| Example 61 | ○ | ○ | ○ |
| Example 62 | ○ | ○ | ○ |
| Example 63 | ○ | ○ | ○ |

In Examples 55 to 63, pulverized silica particles were added to the cladding parts constituting the respective optical waveguides. Similar experiments were performed by using titania particles or alumina particles instead of the pulverized silica particles. Regarding the results, although the thermal expansion coefficient slightly different, similar results were obtained for the liquid-phase temperature cycle test.

The optical waveguides formed in Examples 55 to 63 were multi-mode waveguides. Even when devices for optical communication were manufactured similarly to Examples 55 to 63 by using single-mode optical waveguides in stead of the multi-mode optical waveguides, a predetermined optical signal was able to be transmitted.

The single-mode optical waveguide was formed as follows.

Siloxane based resin (refractive index: 1.50, transmissivity: 93%/mm, thermal expansion coefficient: 115 ppm) was prepared as resin for forming core part and siloxane based resin (refractive index: 1.48, transmissivity: 93%/mm, thermal expansion coefficient: 141 ppm) was prepared as resin for forming the cladding part. In addition, particles were added to be a predetermined mixing amount to resin for forming the cladding part if necessary. Using these resins, a single-mode optical waveguide having the cross-sectional size of the core part of 10×10 μm and the film thicknesses of the over-cladding part and the under-cladding part of 10 μm was obtained by a similar method to that in Example 7.

Further, among the optical waveguides formed by the above method, the single-mode optical waveguide having particles not mixed to the cladding part had a transmission loss of 0.43 dB/cm for signal light having a wavelength of 1.33 μm and a transmission loss of 0.84 dB/cm for signal light having a wavelength of 1.55 μm, and the single-mode optical waveguide having 50% by weight of particles mixed to the cladding part had a transmission loss of 0.41 dB/cm for signal light having a wavelength of 1.33 μm and a transmission loss of 0.82 dB/cm for signal light having a wavelength of 1.55 μm. The transmission loss was measured by the cut-back method.

The cladding part having no particles mixed had a thermal expansion coefficient of 141 ppm, and the cladding part having particles mixed by 50% by weight had a thermal expansion coefficient of 48 ppm. The optical waveguides were evaluated by performing the liquid-phase temperature cycle test for the devices for optical communication using these single-mode optical waveguides. The evaluation results were similar to those for Examples 55 to 63.

Further, an IC mounting device for optical communication shown in FIGS. 43 to 47 was manufactured by a similar method to that of Example 54 except that optical paths for transmitting optical signal were formed based on necessity and the mounting positions of the light receiving element and the light emitting element and formation positions of the optical waveguides were changed accordingly. The optical signal transmission function of this IC mounting device for optical communication was evaluated by the above-mentioned method. It was demonstrated that this IC mounting device for optical communication had sufficiently satisfactory characteristics as a device for optical communication.

The optical path for transmitting optical signal was formed by (1) putting epoxy based resin (viscosity: 100000 to 300000 cps (mPa·s), refractive index: 1.53, transmissivity: 91%/mm) on a hole plugging mask of a printer and performing screen printing to fill openings with a resin composition, (2) curing the resin composition under the conditions of 120° C. for 1 hour and 150° C. for 2 hours, and (3) grinding the resin composition protruded from the openings by #3000 grinding-paper and then grinding the resin composition using 0.05 μm-alumina particles to flatten the surface.

The transmission loss of the optical path for transmitting optical signal was 0.38 dB/mm.

INDUSTRIAL APPLICABILITY

Since the substrate for mounting an IC chips according to the first to third aspects of the first group of the present invention are formed as described above and the light receiving element and the light emitting element are mounted at the surface of each substrate, the distance between an IC chip and an optical component is short and the reliability of electric signal transmission is excellent when the IC chip is mounted on the substrate.

Further, in the substrate for mounting an IC chip according to the first to third aspects of the first group of the present invention, since it is possible to integrate electric components and optical components necessary for optical transmission with one another by mounting the IC chip, it is possible to contribute to miniatuarization of an optical transmission terminal device.

In addition, in the substrate for mounting an IC chip according to the first to third aspects of the first group of the present invention, a solder resist layer is formed on the outermost layer on the side on which the light receiving element and the light emitting element are mounted. When solder bumps are formed on the solder resist layer, the substrate for mounting an IC chip can be connected to an external substrate through the solder bumps. In this case, the substrate for mounting an IC chip can be arranged at a predetermined position because of the self alignment function of solders, so that it is possible to accurately transmit an optical signal between each of the substrate for mounting an IC chips according to the first to third aspects of the first group of the present invention and the external substrate.

Since the multilayered printed circuit board according to the second group of the present invention is formed as described above, it is possible to transmit both an optical signal and an electric signal. Further, since the optical waveguide is internalized in the multilayered printed circuit board, it is possible to contribute to miniatuarization of an optical communication terminal device.

Since the multilayered printed circuit boards according to the first and second aspects of the third group of the present invention are formed as described above, it is possible to transmit both an optical signal and an electric signal. Further, since the organic optical waveguide is formed in the multilayered printed circuit board, it is possible to contribute to miniatuarization of an optical communication terminal device.

Since the multilayered printed circuit board according to the first aspect of the fourth group of the present invention is formed as described above, it is possible to moderate stress applied to the substrate at the time of forming the optical waveguide, particularly at the time of forming the optical conversion mirror on the optical waveguide and prevent cracks and the like derived from the stress from occurring to the substrate. In addition, it is possible to moderate stress applied to the optical waveguide, which is derived from the difference of the thermal expansion coefficient between the optical waveguide and the substrate or the interlaminar insulating layer, and prevent cracks and the like derived from the stress from occurring to the optical waveguide. Therefore, there is no possibility of deterioration of the reliability of the multilayered printed circuit board due to the cracks and the like occurring to the substrate.

In addition, when a film-shaped optical waveguide having the optical path conversion mirror formed thereon in advance is bonded at the time of forming the optical waveguide, the elastic material layer can moderate stress applied to the optical waveguide and prevent scratches, cracks and the like from occurring to the optical waveguide.

Since the conductor circuits and the optical waveguide are formed on the multilayered printed circuit board, it is possible to transmit both an optical signal and an electric signal. Further, since the optical waveguide is internalized in the multilayeredprinted circuit board, it is possible to contribute to miniatuarization of an optical communication terminal device.

Since the multilayered printed circuit board according to the second aspect of the fourth group of the present invention is formed as described above, it is possible to moderate stress applied to the interlaminar insulating layers at the time of forming the optical waveguide, particularly at the time of forming the optical conversion mirror on the optical waveguide and prevent cracks and the like derived from the stress from occurring to the interlaminar insulating layer. In addition, it is possible to moderate stress applied to optical waveguide, which is derived from the difference of the thermal expansion coefficient between the optical waveguide and the interlaminar insulating waveguide or the solder resist layer, and prevent cracks or the like derived from the stress from occurring to the optical waveguide. Therefore, there is no possibility of deterioration of the reliability of the multilayered printed circuit board due to the cracks and the like occurring to the interlaminar insulating waveguide.

In addition, when a film-shaped optical waveguide having the optical path conversion mirror formed thereon in advance is bonded at the time of forming the optical waveguide, the elastic material layer can moderate stress applied to the optical waveguide and prevent scratches, cracks and the like from occurring to the optical waveguide.

Since the conductor circuits and the optical waveguide are formed on the multilayered printed circuit board, it is possible to transmit both an optical signal and an electric signal. Further, since the optical waveguide is internalized in the multilayered printed circuit board, it is possible to contribute to miniatuarization of an optical communication terminal device.

Since the device for optical communication according to the fifth group of the present invention comprises: the substrate for mounting an IC chip on which the light receiving element and the light emitting element are mounted at predetermined positions, respectively; and the multilayered printed circuit board on which the optical waveguide is formed at a predetermined position as described above, the connection loss among the mounted optical components is low and excellent connection reliability as the device for optical communication is ensured.

Since the device for optical communication according to the sixth group of the present invention comprises: the substrate for mounting an IC chip on which the light receiving element and the light emitting element are mounted at predetermined positions, respectively; and the multilayered printed circuit board on which the optical waveguide is formed at a predetermined position as described above, the connection loss among the mounted optical components is low and excellent connection reliability as the device for optical communication is ensured.

What is claimed is:

1. A substrate for mounting an IC chip being configured to be mounted on a multilayered printed circuit board having an optical waveguide and comprising a substrate and, as serially built up on both faces thereof, a conductor circuit and an interlaminar insulating layer in an alternate fashion and in repetition, wherein a light receiving element and a light emitting element are mounted on one face of said substrate for mounting an IC chip such that:

there is a space between said optical waveguide and both of said light receiving element and said light emitting element; and at least one of a light receiving part and a light emitting part is exposed.

2. The substrate for mounting an IC chip according to claim 1, wherein said one face of said substrate for mounting an IC chip faces said multilayered printed circuit board when said substrate for mounting an IC chip is mounted on said multilayered printed circuit board.

3. The substrate for mounting an IC chip according to claim 1, wherein:

said one face of said substrate for mounting an IC chip is opposite to a face of said substrate for mounting an IC chip which faces said multilayered printed circuit board when said substrate for mounting an IC chip is mounted on said multilayered printed circuit board; and said substrate for mounting an IC chip comprises at least one of an optical path connecting said light receiving part of said light receiving element to an optical signal and penetrating said substrate for mounting an IC chip and an optical path connecting said light emitting part of said light emitting element to the optical signal and penetrating said substrate for mounting an IC chip.

4. The substrate for mounting an IC chip according to claim 3, wherein said optical path is filled with a resin.

5. The substrate for mounting an IC chip according to claim 4, wherein said optical path filled with a resin has a metal layer on its wall surface.

6. A substrate for mounting an IC chip being configured to be mounted, on a multilayered printed circuit board having an optical wave guide and comprising a substrate and, as serially built up on both faces thereof, a conductor circuit and an interlaminar insulating layer in an alternate fashion and in repetition, wherein at least one of light receiving element and a light emitting element is internalized or housed at a side of said substrate for mounting an IC chip, said side confronting said multilayered printed circuit board, such that;

there is a space between said optical waveguide and said at least one of the light receiving element and the light emitting element;

at least one of a light receiving part and a light emitting part is exposed; and a surface of said at least one of the light receiving part and the light emitting part is even with or projects from a surface of said substrate for mounting an IC chip.

7. A substrate for mounting an IC chip being configured to be mounted on a multilayered printed circuit board having an optical waveguide and comprising a substrate and, as serially built up on both faces thereof, a conductor circuit and an interlaminar insulating layer in an alternate fashion and in repetition, wherein:

a side of said substrate for mounting an IC chip has at least one concave portion, said side confronting said multi-layered printed circuit board;

at least one of a light receiving element and a light emitting element is embedded in said at least one concave portion such that there is a space between said optical waveguide and said at least one of the light receiving element and the light emitting element, and a surface of at least one of a light receiving part of said light receiving element and a light emitting part of said light emitting element subsides below a surface of said substrate for mounting an IC chip; and an optical path connecting said light receiving part of said light receiving element to an optical signal and an optical path connecting said light emitting part of said light emitting element to the optical signal are secured.

8. The substrate for mounting an IC chip according to claim 7, wherein said optical path is an opening for an optical path.

9. The substrate for mounting an IC chip according to any of claims 1 to 8, wherein:

a solder resist layer is formed on an outermost layer at a side of said substrate for mounting an IC chip, said side confronts said multilayered printed circuit board; and a solder bump is formed at said solder resist layer.

10. The substrate for mounting an IC chip according to any of claims 1 to 8, wherein:

the conductor circuits with said substrate interposed therebetween are connected to each other by a plated-through hole; and the conductor circuits with said interlaminar insulating layers interposed therebetween are connected to each other by a via-hole.

11. The substrate for mounting an IC chip according to any of claims 1 to 8, wherein said light receiving element can be connected thereto by solder.

12. The substrate for mounting an IC chip according to any of claims 1 to 8, wherein said light emitting element can be connected thereto by solder.

13. The substrate for mounting an IC chip according to claim 7, wherein said optical path is filled with a resin.

14. A multilayered printed circuit board comprising a substrate and, as serially built up on both faces thereof, a conductor circuit and an interlaminar insulating layer in an alternate fashion and in repetition, wherein said multilayered printed circuit board has:

a conductor circuit, configured to mount a substrate for mounting an IC chip, on an outermost interlaminar insulating layer; and an optical waveguide on an outermost interlaminar insulating layer at a side of said multilayered printed circuit board.

15. The multilayered printed circuit board according to claim 14, wherein an optical waveguide for receiving light and an optical waveguide for emitting light are formed as said optical waveguide, and a part of said optical waveguide for receiving light and a part of said optical waveguide for emitting light are exposed at the end face of said multilayered printed circuit board so as to conduct an optical transmission with the outside.

16. The multilayered printed circuit board according to claim 14 wherein said optical waveguide is an organic optical waveguide.

17. The multilayered printed circuit board according to any of claims 14 to 16 wherein the conductor circuits with said interlaminar insulating layers interposed therebetween are connected to each other by a via-hole.

18. The multilayered printed circuit board according to any of claims 14 to 16, wherein said conductor circuit is formed by an additive method.

19. The multilayered printed circuit board according to any of claims 14 to 16, wherein a solder resist layer having an opening for an optical path is formed at an outermost layer of said multilayered printed circuit board.

20. The multilayered printed circuit board according to claim 19, wherein an opening for mounting a substrate for mounting an IC chip is formed at said solder resist layer.

21. The multilayered printed circuit board according to claim 16, wherein said organic optical waveguide comprises a cladding part having particles.

22. The multilayered printed circuit board according to claim 16, wherein:
said organic optical waveguide comprises a cladding part having particles; and
particle diameter of said particles is smaller than a communication wavelength.

23. The multilayered printed circuit board according to claim 14, wherein said outermost interlaminar insulating layer having said optical waveguide is configured to mount a substrate for mounting an IC chip thereon.

24. The multilayered printed circuit board according to claim 14, wherein:
said outermost interlaminar insulating layer having said optical waveguide is at a side opposite to a side configured to mount a substrate for mounting an IC chip thereon;
said multilayered printed circuit board further comprises an optical path for transmitting optical signal; and
said optical path extends:
from an outermost interlaminar insulating layer on which said substrate for mounting an IC chip is mounted to an outermost interlaminar insulating layer at an opposite side of said multilayered printed circuit board.

25. The multilayered printed circuit board according to claim 24, where said optical waveguide is formed directly on said outermost interlaminar insulating layer by a process comprising at least a step of applying an optical waveguide material on said outermost interlaminar insulating layer and a step of curing said optical waveguide material.

26. The multilayered printed circuit board according to claim 24 or 25, wherein said optical path is filled with a resin.

27. The multilayered printed circuit board according to claim 26, wherein said optical path filled with a resin has a metal layer on its wall surface.

28. A multilayered printed circuit board comprising:
a substrate and, as serially built up on both faces thereof, a conductor circuit and an interlaminar insulating layer in an alternate fashion and in repetitions and a solder resist layer formed as an outermost layer, wherein;
said multilayered printed circuit board has, on an outermost interlaminar insulating layer, a conductor circuit configured to mount a substrate for mounting an IC chip, and an organic optical waveguide; and
a surface of said organic optical waveguide is exposed at a part of said solder resist layer.

29. The multilayered printed circuit board according to claim 15, wherein an opening for mounting a substrate for mounting an IC chip is formed at said solder resist layer.

30. The multilayered printed circuit board according to claim 28, wherein said organic optical waveguide comprises a cladding part having particles.

31. The multilayered printed circuit board according to claim 28, wherein:
said organic optical waveguide comprises a cladding art having particles; and
particle diameter of said particles is smaller than a communication wavelength.

32. A multilayered printed circuit board comprising a substrate and, as serially built up on both faces thereof, a conductor circuit and an interlaminar insulating layer in an alternate fashion and in repetition,
wherein said multilayered printed circuit board further comprises:
a conductor circuit, configured to mount a substrate for mounting an IC chip, on an outermost interlaminar insulating layer; and
an organic optical waveguide having an under-cladding part, a core part, and an over-cladding part on an outermost interlaminar insulating layer at a side of said multilayered printed circuit board, and
said over-cladding part covers whole region of said outermost interlaminar insulating layer.

33. The multilayered printed circuit board according to any of claims 28 to 32, wherein
said organic optical waveguide comprises an optical waveguide for receiving light and an optical waveguide for emitting light, and
a part of said optical waveguide for receiving light and a part of said optical waveguide for emitting light are exposed at the end face of said multilayered printed circuit board so as to conduct an optical transmission with the outside.

34. The multilayered printed circuit board according to any of claims 28 to 32, wherein the conductor circuits with said interlaminar insulating layers interposed therebetween are connected to each other by a via-hole.

35. The multilayered printed circuit board according 5 to any of claims 28 to 32, wherein said conductor circuits are formed by an additive method.

36. The multilayered printed circuit board according to claim 32, wherein said organic optical waveguide comprises a cladding part having particles.

37. The multilayered printed circuit board according to claim 32, wherein:
said organic optical waveguide comprises a cladding part having particles; and
particle diameter of said particles is smaller than a communication wavelength.

38. A multilayered printed circuit board comprising:
a substrate and, as serially built up on both faces thereof, a conductor circuit and an interlaminar insulating layer in an alternate fashion and in repetition; and an optical waveguide formed at outer side of said substrate,
wherein said multilayered printed circuit board has:
a conductor circuit, configured to mount a substrate for mounting an IC chip, on an outermost interlaminar insulating layer; and
an elastic material layer comprising polyolefin resin and/or polyimide resin formed between said substrate and said optical waveguide.

39. A multilayered printed circuit board comprising:
a substrate and, as serially built up on both faces thereof, a conductor circuit and an interlaminar insulating layer in an alternate fashion and in repetition; and an optical waveguide formed at outer side of the outermost interlaminar insulating layer,
wherein said multilayered printed circuit board has:
a conductor circuit, configured to mount a substrate for mounting an IC chip, on an outermost interlaminar insulating layer; and
an elastic material layer comprising polyolefin resin and/or polyimide resin formed between said outermost interlaminar insulating layer and said optical waveguide.

40. The multilayered printed circuit board according to claim 38 or 39, wherein said elastic material layer has an elastic modulus of $2.5 \times 10^3$ MPa or less.

41. The multilayered printed circuit board according to claim 38 or 39, wherein said elastic material layer has an elastic modulus of 1.0 to $1.0 \times 10^3$ MPa.

42. The multilayered printed circuit board according to claim 38 or 41 wherein said optical waveguide comprises a cladding part having particles.

43. The multilayered printed circuit board according to claim 38 or 41, wherein:
said optical waveguide comprises a cladding part having particles; and
particle diameter of said particles is smaller than a communication wavelength.

44. A device for optical communication comprising:
a substrate for mounting an IC chip; and a multilayered printed circuit board having an optical waveguide, wherein:
at least one of a light receiving element and a light emitting element is mounted on a side of said substrate for mounting an IC chip such that there is a space between said optical waveguide and said at least one of the light receiving element and the light emitting element, and a light receiving part and a light emitting part are exposed, respectively, said side confronting said multilayered printed circuit board;
said optical waveguide is formed on a side of said multilayered printed circuit board, said side confronting said substrate for mounting an IC chip;
said substrate for mounting an IC chip and said multilayered printed circuit board are connected to each other by a solder connection part so as to transmit an electric signal; and
said device for optical communication is constituted such that an optical signal can be transmitted through said optical waveguide, and said light receiving element or said light emitting element.

45. The device for optical communication according to claim 44,
wherein:
said substrate for mounting an IC chip comprises a substrate and, as serially built up thereon, a conductor circuit and an interlaminar insulating layer in an alternate fashion and in repetition;
the conductor circuits with said substrate interposed therebetween are connected to each other by a plated-through hole; and
the conductor circuits with said interlaminar insulating layers interposed therebetween are connected to each other by a via-hole.

46. The device for optical communication according to claim 44 or 45, wherein
said multilayered printed circuit board comprises a substrate and, as serially built up thereon, a conductor circuit and an interlaminar insulating layer in an alternate fashion and in repetition;
the conductor circuits with said substrate interposed therebetween are connected to each other by a plated-through hole; and
the conductor circuits with said interlaminar insulating layers interposed therebetween are connected to each other by a via-hole.

47. A device for optical communication comprising:
a substrate for mounting an IC chip; and a multilayered printed circuit board having an optical waveguide
wherein
said substrate for mounting an IC chip is constituted so as to comprise a conductor circuit, an interlaminar insulating layer, and a via-hole connecting the conductor circuits with said interlaminar insulating layers interposed therebetween to each other,
at least one of a light receiving element and a light emitting element is mounted on said substrate for mounting an IC chip,
said substrate for mounting an IC chip is mounted on said multilayered printed circuit board through a solder bump for transmitting an electric signal, and
there is a space between said optical waveguide and said at least one of the light receiving element and the light emitting element.

48. The device for optical communication according to claim 47, wherein said at least one of the light receiving element and the light emitting element is mounted on a face confronting said multilayered printed circuit board.

49. The device for optical communication according to claim 47, wherein said at least one of the light receiving element and the light emitting element is mounted on an opposite face to a face confronting said multilayered printed circuit board.

50. The device for optical communication according to claim 47, wherein:
one of said light receiving element and said light emitting element is mounted on a face confronting said multilayered printed circuit board; and
the other element is mounted on an opposite face to the face confronting said multilayred printed circuit board.

51. The device for optical communication according to claim 49 or 50, wherein an optical path for transmitting optical signal is formed so as to penetrate said substrate for mounting an IC chip.

52. The device for optical communication according to claim 51, wherein said optical path is filled with a resin.

53. The device for optical communication according to claim 52, wherein said optical path filled with a resin has a metal layer on its wall surface.

54. The device for optical communication according to any of claims 47 to 50, wherein said conductor circuits and said interlaminar insulating layers are serially built up on both or one of face(s) of a substrate in an alternate fashion and in repetition.

55. The device for optical communication according to claim 54, wherein:
an optical path for transmitting optical signal between said optical waveguide and said at least one of the light receiving element and the light emitting element is formed at said multilayered printed circuit board; and
said optical path extends:
from an outermost interlaminar insulating layer on which said substrate for mounting an IC chip is mounted
to an outermost interlaminar insulating layer at an opposite side of said multilayered printed circuit board.

56. The device for optical communication according to claim 55, wherein said optical path is filled with a resin.

57. The device for optical communication according to claim 56, wherein said optical path filled with a resin has a metal layer on its wail surface.

58. The device for optical communication according to any of claims 48 to 50, wherein
 an optical path for transmitting optical signal between said optical waveguide and said at least one of the light receiving element and the light emitting element is formed at said multilayered printed circuit board, and
 said optical path extends
  from an outermost interlaminar insulating layer on which said substrate for mounting an IC chip is mounted
  to an outermost interlaminar insulating layer at an opposite side of said multilayered printed circuit board.

59. The device for optical communication according to claim 58, wherein said optical path is filled with a resin.

60. The device for optical communication according to claim 59, wherein said optical path filled with a resin has a metal layer on its wall surface.

61. The device for optical communication according to claim 44 or 47, wherein said optical waveguide comprises a cladding part having particles.

62. The device for optical communication according to claim 61, wherein:
 an optical path for transmitting optical signal between said optical waveguide and said at least one of the light receiving element and the light emitting element is formed at said multilayered printed circuit board, and said optical path extends:
  from an outermost interlaminar insulating layer-on which said substrate for mounting an IC chip is mounted
  to an outermost interlaminar insulating layer at an opposite side of said multilayered printed circuit board.

63. The device for optical communication according to claim 62, wherein said optical path is filled with a resin.

64. The device for optical communication according to claim 63, wherein said optical path filled with a resin has a metal layer on its wall surface.

65. The device for optical communication according to claim 44 or 47, wherein:
 said optical waveguide comprises a cladding part having particles; and
 article diameter of said particles is smaller than a communication wavelength.

66. The device for optical communication according to claim 65, wherein:
 an optical path for transmitting optical signal between said optical waveguide and said at least one of the light receiving element and the light emitting element is formed at said multilayered printed circuit board, and said optical path extends:
  from an outermost interlaminar insulating layer on which said substrate for mounting an IC chip is mounted
  to an outermost interlaminar insulating layer at an opposite side of said multilayered printed circuit board.

67. The device for optical communication according to claim 66, wherein said optical path is filled with a resin.

68. The device for optical communication according to claim 67, wherein said optical path filled with a resin has a metal layer on its wall surface.

* * * * *

UNITED STATES PATENT AND TRADEMARK OFFICE
CERTIFICATE OF CORRECTION

| | | |
|---|---|---|
| PATENT NO. | : 7,070,207 B2 | |
| APPLICATION NO. | : 10/419849 | |
| DATED | : July 4, 2006 | |
| INVENTOR(S) | : Motoo Asai | |

It is certified that error appears in the above-identified patent and that said Letters Patent is hereby corrected as shown below:

On the title page, item (54), please change "MULTILAYERD" to --MULTILAYERED--.

Column 143, line 56, change "claim 15" to --claim 28--.

Column 145, line 8, change "claim 38 or 41" to --claim 38 or 39--.

Column 145, line 11, change "claim 38 or 41" to --claim 38 or 39--.

Signed and Sealed this

Thirty-first Day of July, 2007

JON W. DUDAS
*Director of the United States Patent and Trademark Office*

UNITED STATES PATENT AND TRADEMARK OFFICE
CERTIFICATE OF CORRECTION

PATENT NO.        : 7,070,207 B2                                              Page 1 of 1
APPLICATION NO. : 10/419849
DATED             : July 4, 2006
INVENTOR(S)       : Motoo Asai It is certified that error appears in the above-identified patent and that said Letters Patent is hereby corrected as shown below:

On the title page, item (54), please change "MULTILAYERD" to --MULTILAYERED--.

Column 142, line 11, change "claims 1 to 8" to --claims 1 or 6 to 8--.

Column 142, line 17, change "claims 1 to 8" to --claims 1 or 6 to 8--.

Column 142, line 25, change "claims 1 to 8" to --claims 1 or 6 to 8--.

Column 142, line 28, change "claims 1 to 8" to --claims 1 or 6 to 8--.

Column 143, line 56, change "claim 15" to --claim 28--.

Column 144, line 17, change "claims 28 to 32" to --claims 28, 29 or 32--.

Column 144, line 27, change "claims 28 to 32" to --claims 28, 29 or 32--.

Column 144, line 31, change "claims 28 to 32" to --claims 28, 29 or 32--.

Column 145, line 8, change "claim 38 or 41" to --claim 38 or 39--.

Column 145, line 11, change "claim 38 or 41" to --claim 38 or 39--.

Signed and Sealed this

Eleventh Day of May, 2010

David J. Kappos
*Director of the United States Patent and Trademark Office*

UNITED STATES PATENT AND TRADEMARK OFFICE
CERTIFICATE OF CORRECTION

PATENT NO.       : 7,070,207 B2                                                                 Page 1 of 1
APPLICATION NO.  : 10/419849
DATED            : July 4, 2006
INVENTOR(S)      : Motoo Asai It is certified that error appears in the above-identified patent and that said Letters Patent is hereby corrected as shown below:

On the title page, item (54) and at Column 1, line 2, in the title, please change "MULTILAYERD" to --MULTILAYERED--.

Column 142, line 11, change "claims 1 to 8" to --claims 1 or 6 to 8--.

Column 142, line 17, change "claims 1 to 8" to --claims 1 or 6 to 8--.

Column 142, line 25, change "claims 1 to 8" to --claims 1 or 6 to 8--.

Column 142, line 28, change "claims 1 to 8" to --claims 1 or 6 to 8--.

Column 143, line 56, change "claim 15" to --claim 28--.

Column 144, line 17, change "claims 28 to 32" to --claims 28, 29 or 32--.

Column 144, line 27, change "claims 28 to 32" to --claims 28, 29 or 32--.

Column 144, line 31, change "claims 28 to 32" to --claims 28, 29 or 32--.

Column 145, line 8, change "claim 38 or 41" to --claim 38 or 39--.

Column 145, line 11, change "claim 38 or 41" to --claim 38 or 39--.

This certificate supersedes the Certificate of Correction issued May 11, 2010.

Signed and Sealed this

Twenty-second Day of June, 2010

David J. Kappos
*Director of the United States Patent and Trademark Office*